US012761559B2

(12) United States Patent
Hatakeyama

(10) Patent No.: US 12,761,559 B2
(45) Date of Patent: Oct. 13, 2026

(54) POSITIVE RESIST COMPOSITION AND PATTERNING PROCESS

(71) Applicant: Shin-Etsu Chemical Co., Ltd., Tokyo (JP)

(72) Inventor: Jun Hatakeyama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 530 days.

(21) Appl. No.: 18/215,255

(22) Filed: Jun. 28, 2023

(65) Prior Publication Data

US 2024/0027909 A1 Jan. 25, 2024

(30) Foreign Application Priority Data

Jul. 12, 2022 (JP) ................................ 2022-111900

(51) Int. Cl.
*G03F 7/039* (2006.01)
*G03F 7/20* (2006.01)

(52) U.S. Cl.
CPC .......... *G03F 7/0392* (2013.01); *G03F 7/2006* (2013.01)

(58) Field of Classification Search
CPC ........................................................ G03F 7/20
See application file for complete search history.

(56) References Cited

U.S. PATENT DOCUMENTS

2014/0308615 A1 10/2014 Echigo et al.
2017/0369616 A1 12/2017 Hatakeyama et al.
2018/0004087 A1 1/2018 Hatakeyama et al.
2019/0155155 A1 5/2019 Hatakeyama et al.
2020/0089112 A1* 3/2020 Hatakeyama ......... C07C 381/12

FOREIGN PATENT DOCUMENTS

JP 2010-256706 A 11/2010
JP 2015-161823 A 9/2015
JP 2017-219836 A 12/2017
JP 2018-4812 A 1/2018
JP 2018-5224 A 1/2018
JP 2021-110922 A 8/2021
KR 10-2020-0032659 A 3/2020
WO 2013/024777 A1 2/2013

OTHER PUBLICATIONS

Reichmanis et al., "A novel approach to o-nitrobenzyl photochemistry for resists", J. Vac. Sci. Technol., 1981, vol. 19, No. 4, pp. 1338-1342, cited in Specification (5 pages).
Office Action dated Nov. 28, 2024, issued in KR Application No. 10-2023-0087951, with English translation. (12 pages).
Office Action dated May 19, 2026, issued in counterpart JP Application No. 2023-101799, with English translation. (10 pages).

* cited by examiner

*Primary Examiner* — Chanceity N Robinson
(74) *Attorney, Agent, or Firm* — WHDA, LLP

(57) ABSTRACT

The positive resist composition comprises a compound having a nitrobenzyl ester group bonded to an iodized aromatic ring. The positive resist composition exhibits a higher sensitivity and resolution than the prior art and forms a pattern of good profile with low edge roughness or improved CDU after exposure and development. The compound has the formula (1):

(1)

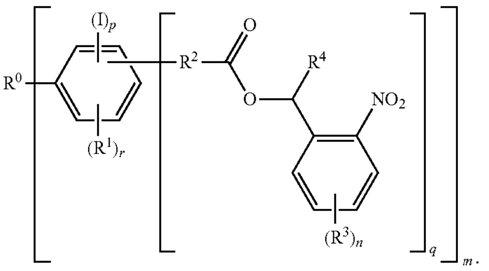

12 Claims, No Drawings

POSITIVE RESIST COMPOSITION AND PATTERNING PROCESS

CROSS-REFERENCE TO RELATED APPLICATIONS

This non-provisional application claims priority under 35 U.S.C. § 119(a) on Patent Application No. 2022-111900 filed in Japan on Jul. 12, 2022, the entire contents of which are hereby incorporated by reference.

TECHNICAL FIELD

This invention relates to a positive resist composition and a patterning process.

BACKGROUND ART

To meet the demand for higher integration density and operating speed of LSIs, the effort to reduce the pattern rule is in rapid progress. As the use of 5G high-speed communications and artificial intelligence (AI) is widely spreading, high-performance devices are needed for their processing. As the advanced miniaturization technology, manufacturing of microelectronic devices at the 5-nm node by the lithography using EUV of wavelength 13.5 nm has been implemented in a mass scale. Studies are made on the application of EUV lithography to 3-nm node devices of the next generation and 2-nm node devices of the next-but-one generation.

Since the wavelength (13.5 nm) of extreme ultraviolet (EUV) is shorter than 1/10 of the wavelength 193 nm of ArF excimer laser, the EUV lithography achieves a high light contrast, from which a high resolution is expectable. Because of the short wavelength and high energy density of EUV, an acid generator is sensitive to a small dose of photons. It is believed that the number of photons available with EUV exposure is 1/14 of that of ArF exposure. In the EUV lithography, the phenomenon that the edge roughness (LER, LWR) of line patterns or the critical dimension uniformity (CDU) of hole patterns is degraded by a variation of photon number is considered a problem.

Aiming to reduce a photon number variation, an attempt was made to render the resist film more photo-absorptive so that the number of photons absorbed in the resist film is increased. For example, among halogens, iodine is highly absorptive to EUV of wavelength 13.5 nm. Patent Documents 1 and 2 disclose to use iodized resins as the EUV resist material. Since iodine atoms are highly absorptive, i.e., absorb more photons during EUV exposure, a reduction of edge roughness is expectable. Due to their low alkaline solubility, however, the dissolution contrast is reduced, giving rise to the drawback that edge roughness is rather increased.

The introduction of iodine atoms into EUV-reactive acid generators or photo-decomposable quenchers contributes to a higher sensitivity and a lower edge roughness because the increased number of photons absorbed enhances the decomposition efficiency of acid generators or quenchers. See Patent Documents 3 and 4. However, the influence of image blur due to acid diffusion inherent to chemically amplified resist materials is yet unavoidable.

With the aim to reduce edge roughness, molecular resist materials based on low-molecular-weight compounds have been investigated. This is based on the hypothesis that the lower the molecular weight is, the more the risk is mitigated that uneven dissolution of a resist film in developer increases edge roughness. The chemically amplified molecular resist materials, however, raise the problem that edge roughness is degraded because of insufficient control of acid diffusion. Conventional polymer-based resist materials rather achieve lower edge roughness. The state-of-the-art technology fails to take advantage of the lower molecular weight of molecular resist materials.

Patent Document 5 discloses a molecular resist material comprising a highly absorptive calixarene compound containing iodine atoms. The control of acid diffusion remains unsolved.

Non-Patent Document 1 describes a resist material based on o-nitrobenzyl ester of cholic acid. Upon exposure to UV of wavelength 300 to 350 nm, the nitrobenzyl group is decomposed to release chloric acid. This is of positive tone in that the resist film in the exposed region is dissolved in alkaline developer. Since the decomposition efficiency of the nitrobenzyl group upon exposure to high-energy radiation is low, this resist material has a low sensitivity.

CITATION LIST

Patent Document 1: JP-A 2015-161823

Patent Document 2: JP-A 2018-004812

Patent Document 3: JP-A 2018-005224

Patent Document 4: JP-A 2017-219836

Patent Document 5: WO 2013/024777

Non-Patent Document 1: J. Vac. Sci. Technol., 19(4), pp. 1338-1342 (1981)

SUMMARY OF THE INVENTION

An object of the present invention is to provide a positive resist composition which exhibits a higher sensitivity and resolution than conventional positive resist compositions, and forms a pattern of good profile with reduced edge roughness and improved CDU after exposure and development, and a patterning process using the resist composition.

Making extensive investigations in search for a positive resist material capable of meeting the current requirements including high resolution, reduced edge roughness and reduced dimensional variation, the inventor has found the following. To meet the requirements, the influence of diffusion including acid diffusion should be eliminated, the molecular size be minimized, and the photo-reactive compound be more absorptive. A compound having a carboxy group bonded to an iodized aromatic group, in which the carboxy group is substituted with a photo-reactive nitrobenzyl group, is devoid of acid diffusion, achieves improvements in sensitivity and dissolution contrast due to photo-absorption, and minimizes the influence of swell in alkaline developer by virtue of a low molecular weight. Then the compound is quite effective for use as the base in a non-chemically-amplified positive resist composition. When the compound is combined with a base polymer comprising repeat units having a carboxy or phenolic hydroxy group whose hydrogen is substituted by an acid labile group, there is obtained a chemically amplified positive resist composition. This positive resist composition exhibits a high sensitivity, a significantly increased contrast of alkaline dissolution rate before and after exposure, and a high resolution, and forms a pattern of good profile with reduced edge roughness and improved CDU after exposure and development. The positive resist composition is thus suitable as a fine pattern forming material for the manufacture of VLSIs and photomasks.

In one aspect, the invention provides a positive resist composition comprising a compound having a nitrobenzyl ester group bonded to an iodized aromatic ring.

Typically, the compound having a nitrobenzyl ester group bonded to an iodized aromatic ring has the formula (1).

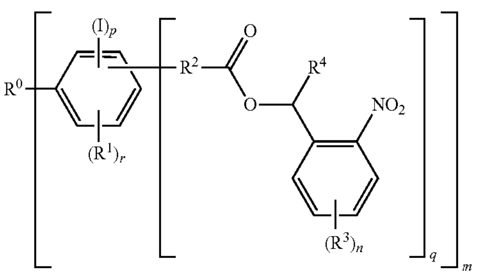
(1)

Herein m is an integer of 1 to 3, n is an integer of 0 to 4, p is an integer of 0 to 4, or an integer of 1 to 4 when m is 2 or 3, q is 1 or 2, r is an integer of 0 to 3, meeting $1 \le p+q+r \le 5$.

In case of m=1, $R^0$ is hydrogen, iodine, or a $C_{20}$-$C_{40}$ hydrocarbyl group having a steroid skeleton and optionally containing a heteroatom, in case of m=2, $R^0$ is an ether bond, thioether bond, ester bond, thioester bond, amide bond, urethane bond, urea bond, carbonate bond, or a $C_1$-$C_{40}$ hydrocarbylene group which may contain a heteroatom, and in case of m=3. $R^0$ is a $C_1$-$C_{40}$ trivalent hydrocarbon group which may contain a heteroatom; the hydrocarbyl, hydrocarbylene or trivalent hydrocarbon group may bond to the benzene ring in the formula via an ether bond, thioether bond, ester bond, thioester bond, amide bond, urethane bond, urea bond or carbonate bond, with the proviso that $R^0$ is iodine in case of m=1 and p=0.

$R^1$ is each independently hydroxy, $C_1$-$C_6$ saturated hydrocarbyl group, $C_1$-$C_6$ saturated hydrocarbyloxy group, $C_2$-$C_6$ saturated hydrocarbylcarbonyloxy group, $C_1$-$C_4$ saturated hydrocarbylsulfonyloxy group, fluorine, chlorine, bromine, amino, nitro, cyano, —$N(R^{1A})(R^{1B})$, —$N(R^{1C})$—C(═O)—$R^{1D}$, —$N(R^{1C})$—C(═O)—O—$R^{1D}$, or —$N(R^{1C})$—$S(=O)_2$—$R^{1D}$, wherein $R^{1A}$ is a $C_1$-$C_6$ saturated hydrocarbyl group, $R^{1B}$ is hydrogen or a $C_1$-$C_6$ saturated hydrocarbyl group, $R^{1C}$ is hydrogen or a $C_1$-$C_6$ saturated hydrocarbyl group, $R^{1D}$ is a $C_1$-$C_8$ aliphatic hydrocarbyl group or $C_6$-$C_{10}$ aryl group, the saturated hydrocarbyl group, saturated hydrocarbyloxy group, saturated hydrocarbylcarbonyloxy group, saturated hydrocarbylsulfonyloxy group, and aliphatic hydrocarbyl group may have some or all of the hydrogen atoms substituted by halogen and may have an ether bond or ester bond intervening in a carbon-carbon bond, and the aryl group may have some or all of the hydrogen atoms substituted by halogen or hydroxy, $R^2$ is a single bond or $C_1$-$C_6$ saturated hydrocarbylene group, $R^3$ is nitro, halogen, a $C_1$-$C_{10}$ aliphatic hydrocarbyl group, or $C_1$-$C_{10}$ aliphatic hydrocarbyloxy group, in case of n=2, 3 or 4, two $R^3$ may bond together to form a ring with the carbon atoms to which they are attached, and $R^4$ is hydrogen or a $C_1$-$C_4$ alkyl group.

The positive resist composition may further comprise a base polymer.

In one preferred embodiment, the base polymer comprises repeat units having a carboxy group whose hydrogen is substituted by an acid labile group and/or repeat units having a phenolic hydroxy group whose hydrogen is substituted by an acid labile group.

Preferably, the repeat units having a carboxy group whose hydrogen is substituted by an acid labile group have the formula (a1) and the repeat units having a phenolic hydroxy group whose hydrogen is substituted by an acid labile group has the formula (a2).

(a1)

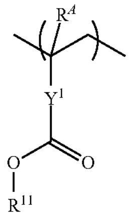

(a2)

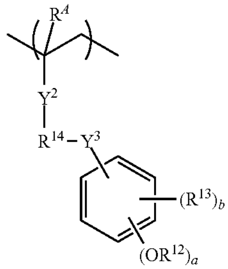

Herein $R^A$ is each independently hydrogen or methyl, $Y^1$ is a single bond, phenylene group, naphthylene group or a $C_1$-$C_{12}$ linking group containing at least one moiety selected from an ether bond, ester bond, and lactone ring. $Y^2$ is a single bond, ester bond or amide bond, $Y^3$ is a single bond, ether bond or ester bond, $R^{11}$ and $R^{12}$ are each independently an acid labile group, $R^{13}$ is fluorine, trifluoromethyl, cyano or a $C_1$-$C_6$ saturated hydrocarbyl group, $R^{14}$ is a single bond or a $C_1$-$C_6$ saturated hydrocarbylene group in which some —$CH_2$— may be replaced by an ether bond or ester bond, a is 1 or 2, b is an integer of 0 to 4, and a+b is from 1 to 5.

In one preferred embodiment, the base polymer further comprises repeat units (b) containing an adhesive group selected from hydroxy, carboxy, lactone ring, carbonate bond, thiocarbonate bond, carbonyl, cyclic acetal, ether bond, ester bond, sulfonic ester bond, cyano, amide bond, —O—C(═O)—S—, and —O—C(═O)—N(H)—.

In one preferred embodiment, the base polymer further comprises repeat units having any one of the formulae (c1) to (c3).

(c1)

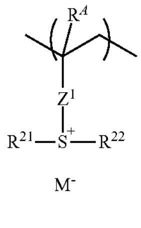

-continued (c2)

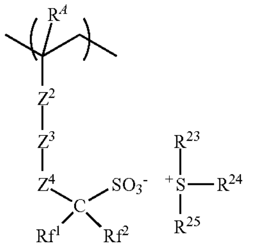

(c3)

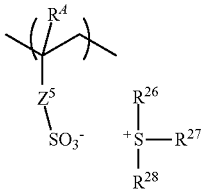

Herein $R^A$ is each independently hydrogen or methyl, $Z^1$ is a single bond, phenylene group, naphthylene group, $-O-Z^{11}-$, $-C(=O)-O-Z^{11}-$, or $-C(=O)-N(H)-Z^{11}-$, $Z^{11}$ is a $C_1$-$C_6$ aliphatic hydrocarbylene group, phenylene group, naphthylene group, or a $C_7$-$C_{18}$ group obtained by combining the foregoing, which may contain a carbonyl moiety, ester bond, ether bond or hydroxy moiety, $Z^2$ is a single bond or ester bond, $Z^3$ is a single bond, $-Z^{31}-C(=O)-O-$, $-Z^{31}-O-$, or $-Z^{31}-O-C(=O)-$, $Z^{31}$ is a $C_1$-$C_{12}$ aliphatic hydrocarbylene group, phenylene group or a $C_7$-$C_{18}$ group obtained by combining the foregoing, which may contain a carbonyl moiety, ester bond, ether bond, iodine or bromine, $Z^4$ is a single bond, methylene, or 2,2,2-trifluoro-1,1-ethanediyl, $Z^5$ is a single bond, methylene, ethylene, phenylene, fluorinated phenylene, trifluoromethyl-substituted phenylene group, $-O-Z^{51}-$, $-C(=O)-O-Z^{51}-$ or $-C(=O)-N(H)-Z^{51}-$, $Z^{51}$ is a $C_1$-$C_6$ aliphatic hydrocarbylene group, phenylene group, fluorinated phenylene group, trifluoromethyl-substituted phenylene group, or a $C_7$-$C_{18}$ group obtained by combining the foregoing, which may contain a carbonyl moiety, ester bond, ether bond or hydroxy moiety, $Rf^1$ and $Rf^2$ are each independently hydrogen, fluorine or trifluoromethyl, at least one of $Rf^1$ and $Rf^2$ being fluorine, $R^{21}$ to $R^{28}$ are each independently fluorine, chlorine, bromine, iodine or a $C_1$-$C_{20}$ hydrocarbyl group which may contain a heteroatom, a pair of $R^{23}$ and $R^{24}$ or $R^{26}$ and $R^{27}$ may bond together to form a ring with the sulfur atom to which they are attached, and $M^-$ is a non-nucleophilic counter ion.

The positive resist composition may further comprise an acid generator, organic solvent, quencher and/or surfactant.

In another aspect, the invention provides a pattern forming process comprising the steps of applying the positive resist composition defined herein onto a substrate to form a resist film thereon, exposing the resist film to high-energy radiation, and developing the exposed resist film in a developer.

Typically, the high-energy radiation is i-line, KrF excimer laser, ArF excimer laser, EB, or EUV of wavelength 3 to 15 nm.

Advantageous Effects of Invention

The positive resist composition comprising a compound having a nitrobenzyl ester group bonded to an iodized aromatic ring is a non-chemically-amplified resist composition not relying on acid-catalyzed reaction. Since it is a low-molecular-weight compound based material rather than a polymer based material, the influence of agglomeration and swell in developer is small, and the high absorption ensures a high photo-reactivity, leading to a high sensitivity and contrast. As a result, the patter profile, edge roughness and CDU after exposure are satisfactory. By combining a compound having a nitrobenzyl ester group bonded to an iodized aromatic ring with a base polymer comprising repeat units having a carboxy or phenolic hydroxy group whose hydrogen is substituted by an acid labile group, a chemically amplified positive resist composition can be formulated. This is a resist material having a higher sensitivity. By virtue of these properties, the resist composition is fully useful in commercial application and best suited as a micropatterning material for photomasks by EB lithography or for VLSIs by EB or EUV lithography. The resist composition may be used not only in the lithography for forming semiconductor circuits, but also in the formation of mask circuit patterns, micromachines, and thin-film magnetic head circuits.

DETAILED DESCRIPTION OF THE INVENTION

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. As used herein, the term "iodized" compound indicates a compound containing iodine or a compound substituted with iodine. The terms "group" and "moiety" are interchangeable. In chemical formulae, the broken line denotes a valence bond, Me stands for methyl, and Ac for acetyl.

The abbreviations and acronyms have the following meaning.

EB: electron beam
EUV: extreme ultraviolet
Mw: weight average molecular weight
Mn: number average molecular weight
Mw/Mn: molecular weight dispersity
GPC: gel permeation chromatography
PEB: post-exposure bake
PAG: photoacid generator
LER: line edge roughness
LWR: line width roughness
CDU: critical dimension uniformity Positive Resist Composition One embodiment of the invention is a positive resist composition comprising a compound having a nitrobenzyl ester group bonded to an iodized aromatic ring.

Nitrobenzyl Ester Compound

The compound having a nitrobenzyl ester group bonded to an iodized aromatic ring, which is simply referred to as "nitrobenzyl ester compound," hereinafter, is preferably represented by the formula (1).

(1)

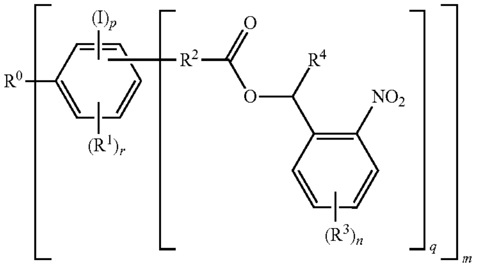

In formula (1), m is an integer of 1 to 3, n is an integer of 0 to 4, p is an integer of 0 to 4, p is an integer of 1 to 4 when m is 2 or 3, q is 1 or 2, r is an integer of 0 to 3, meeting $1 \le p+q+r \le 5$.

In formula (1), in case of m=1, $R^0$ is hydrogen, iodine, or a $C_{20}$-$C_{40}$ hydrocarbyl group having a steroid skeleton and optionally containing a heteroatom; in case of m=2, $R^0$ is an ether bond, thioether bond, ester bond, thioester bond, amide bond, urethane bond, urea bond, carbonate bond, or a $C_1$-$C_{40}$ hydrocarbylene group which may contain a heteroatom; and in case of m=3, $R^0$ is a $C_1$-$C_{40}$ trivalent hydrocarbon group which may contain a heteroatom. The hydrocarbyl, hydrocarbylene or trivalent hydrocarbon group may bond to the benzene ring in the formula via an ether bond, thioether bond, ester bond, thioester bond, amide bond, urethane bond, urea bond or carbonate bond. It is provided that $R^0$ is iodine in case of m=1 and p=0.

The $C_{20}$-$C_{40}$ hydrocarbyl group having a steroid skeleton and optionally containing a heteroatom, represented by $R^0$, preferably has the formula (1-1).

(1-1)

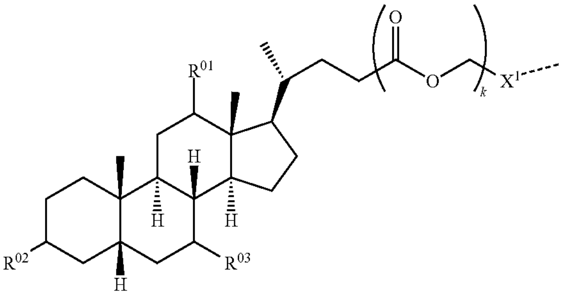

In formula (1-1), $R^{01}$ to $R^{03}$ are each independently oxo, hydroxy or a $C_2$-$C_6$ saturated hydrocarbylcarbonyloxy group. $X^1$ is a single bond, ether bond, thioether bond, ester bond, thioester bond, amide bond, urethane bond, urea bond or carbonate bond, and k is an integer of 0 to 2.

The $C_1$-$C_{40}$ hydrocarbylene group, represented by $R^0$ in case of m=2, may be saturated or unsaturated and straight, branched or cyclic. Examples thereof include $C_1$-$C_{30}$ alkanediyl groups such as methanediyl, ethane-1,1-diyl, ethane-1,2-diyl, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, heptadecane-1,17-diyl, octadecane-1,18-diyl, nonadecane-1,12-diyl, and eicosane-1,20-diyl; $C_3$-$C_{30}$ cyclic saturated hydrocarbylene groups such as cyclopentanediyl, methylcyclopentanediyl, dimethylcyclopentanediyl, trimethylcyclopentanediyl, tetramethylcyclopentanediyl, cyclohexanediyl, methylcyclohexanediyl, dimethylcyclohexanediyl, trimethylcyclohexanediyl, tetramethylcyclohexanediyl, norbornanediyl and adamantanediyl; $C_6$-$C_{30}$ arylene groups such as phenylene, methylphenylene, ethylphenylene, n-propylphenylene, isopropylphenylene, n-butylphenylene, isobutylphenylene, sec-butylphenylene, tert-butylphenylene, naphthylene, methylnaphthylene, ethylnaphthylene, n-propylnaphthylene, isopropylnaphthylene, n-butylnaphthylene, isobutylnaphthylene, sec-butylnaphthylene, tert-butylnaphthylene, biphenyldiyl, methylbiphenyldiyl, and dimethylbiphenyldiyl; and combinations thereof.

The $C_1$-$C_{40}$ trivalent hydrocarbon group, represented by $R^0$ in case of m=3, may be saturated or unsaturated and straight, branched or cyclic. Examples thereof include groups obtained by removing one hydrogen atom from the above-exemplified hydrocarbylene groups.

In the hydrocarbylene group or trivalent hydrocarbon group, some or all of the hydrogen atoms may be substituted by a moiety containing a heteroatom such as oxygen, sulfur, nitrogen or halogen, and some constituent $—CH_2—$ may be replaced by a moiety containing a heteroatom such as oxygen, sulfur or nitrogen, so that the group may contain hydroxy, cyano, fluorine, chlorine, bromine, iodine, carbonyl, ether bond, ester bond, sulfonic ester bond, carbonate bond, lactone ring, sultone ring, carboxylic anhydride (—C(═O)—O—C(═O)—) or haloalkyl moiety.

The hydrocarbylene group preferably has the formula (1-2).

$$—X^{2A}—R^{04A}—R^{04}—R^{04B}—X^{2B}— \quad (1\text{-}2)$$

In formula (1-2), $R^{04}$ is a $C_1$-$C_{20}$ saturated hydrocarbylene group which may contain a heteroatom, a $C_6$-$C_{20}$ arylene group which may contain a heteroatom, or a combination thereof. $R^{04A}$ and $R^{04B}$ are each independently a single bond, a $C_1$-$C_{10}$ saturated hydrocarbylene group which may contain a heteroatom, a $C_6$-$C_{10}$ arylene group which may contain a heteroatom, or a combination thereof. $X^{2A}$ and $X^{2B}$ are each independently a single bond, ether bond, thioether bond, ester bond, thioester bond, amide bond, urethane bond, urea bond or carbonate bond. It is preferred from the aspect of preparation that $X^{2A}$ and $X^{2B}$ be identical.

Examples of $R^{04}$ include those groups exemplified above for the alkanediyl group, cyclic saturated hydrocarbylene group, and arylene group included in the hydrocarbylene group represented by $R^0$, but of 1 to 20 carbon atoms. Examples of the $C_1$-$C_{10}$ saturated hydrocarbylene group and $C_6$-$C_{10}$ arylene group, represented by $R^{04A}$ and $R^{04B}$, include those groups exemplified above for the alkanediyl group, cyclic saturated hydrocarbylene group, and arylene group included in the hydrocarbylene group represented by $R^0$, but of 1 to 10 carbon atoms.

The trivalent hydrocarbon group preferably has the formula (1-3).

(1-3)

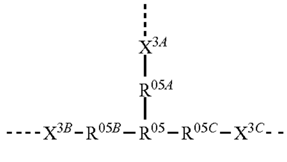

In formula (1-3), $R^{05}$ is a $C_1$-$C_{10}$ trivalent saturated hydrocarbon group which may contain a heteroatom, $C_6$-$C_{10}$ trivalent aromatic hydrocarbon group which may contain a heteroatom, or a combination thereof. $R^{05A}$, $R^{05B}$ and $R^{05C}$ are each independently a single bond, $C_1$-$C_{10}$ saturated hydrocarbylene group which may contain a heteroatom. $C_6$-$C_{10}$ arylene group which may contain a heteroatom, or a combination thereof. $X^{3A}$, $X^{3B}$ and $X^{3C}$ are each independently a single bond, ether bond, thioether bond, ester bond, thioester bond, amide bond, urethane bond, urea bond or carbonate bond. It is preferred from the aspect of preparation that $X^{3A}$, $X^{3B}$ and $X^{3C}$ be identical.

Examples of $R^{05}$ include groups obtained by removing one hydrogen atom from those groups exemplified above for the alkanediyl group, cyclic saturated hydrocarbylene group, and arylene group included in the hydrocarbylene group represented by $R^0$, but of 1 to 10 carbon atoms. Also included is the group obtained by removing three hydrogen atoms from isocyanuric acid. Examples of the $C_1$-$C_{10}$ saturated hydrocarbylene group and $C_6$-$C_{10}$ arylene group, represented by $R^{05A}$, $R^{05B}$ and $R^{05C}$ include those groups exemplified for the alkanediyl group, cyclic saturated hydrocarbylene group and arylene group included in the hydrocarbylene group represented by $R^0$, but of 1 to 10 carbon atoms.

In formula (1), $R^1$ is each independently hydroxy, $C_1$-$C_6$ saturated hydrocarbyl group, $C_1$-$C_6$ saturated hydrocarbyloxy group, $C_2$-$C_6$ saturated hydrocarbylcarbonyloxy group, $C_1$-$C_4$ saturated hydrocarbylsulfonyloxy group, fluorine, chlorine, bromine, amino, nitro, cyano, $—N(R^{1A})(R^{1B})$, $—N(R^{1C})—C(=O)—R^{1D}$, $—N(R^{1C})—C(=O)—O—R^{1D}$, or $—N(R^{1C})—S(=O)_2—R^{1D}$. $R^{1A}$ is a $C_1$-$C_6$ saturated hydrocarbyl group, $R^{1B}$ is hydrogen or a $C_1$-$C_6$ saturated hydrocarbyl group, $R^{1C}$ is hydrogen or a $C_1$-$C_6$ saturated hydrocarbyl group, $R^{1D}$ is a $C_1$-$C_8$ aliphatic hydrocarbyl group or $C_6$-$C_{10}$ aryl group. In the saturated hydrocarbyl group, saturated hydrocarbyloxy group, saturated hydrocarbylcarbonyloxy group, saturated hydrocarbylsulfonyloxy group, and aliphatic hydrocarbyl group, some or all of the hydrogen atoms may be substituted by halogen, and an ether bond or ester bond may intervene in a carbon-carbon bond. In the aryl group, some or all of the hydrogen atoms may be substituted by halogen or hydroxy.

In formula (1), $R^2$ is a single bond or $C_1$-$C_6$ saturated hydrocarbylene group. The saturated hydrocarbylene group may be straight, branched or cyclic. Examples thereof include $C_1$-$C_6$ alkanediyl groups such as methanediyl, ethane-1,1-diyl, ethane-1,2-diyl, propane-1,1-diyl, propane-1,2-diyl, propane-1,3-diyl, propane-2,2-diyl, butane-1,1-diyl, butane-1,2-diyl, butane-1,3-diyl, butane-2,3-diyl, butane-1,4-diyl, 1,1-dimethylethane-1,2-diyl, pentane-1,5-diyl, 2-methylbutane-1,2-diyl, and hexane-1,6-diyl; $C_3$-$C_6$ cyclic saturated hydrocarbylene groups such as cyclopropane-1,2-diyl, cyclobutane-1,2-diyl, cyclobutane-1,3-diyl, cyclopentane-1,1-diyl, cyclopentane-1,2-diyl, cyclopentane-1,3-diyl, cyclohexane-1,2-diyl, cyclohexane-1,3-diyl, and cyclohexane-1,4-diyl; and combinations thereof.

In formula (1), $R^3$ is nitro, halogen, a $C_1$-$C_{10}$ aliphatic hydrocarbyl group, or $C_1$-$C_{10}$ aliphatic hydrocarbyloxy group. In case of n=2, 3 or 4, two $R^3$ may bond together to form a ring with the carbon atoms to which they are attached. The aliphatic hydrocarbyl group and aliphatic hydrocarbyl moiety in the aliphatic hydrocarbyloxy group may be saturated or unsaturated and straight, branched or cyclic. Examples thereof include $C_1$-$C_{10}$ alkyl groups such as methyl, ethyl, n-propyl, isopropyl, n-butyl, isobutyl, sec-butyl, tert-butyl, n-pentyl, isopentyl, sec-pentyl, 3-pentyl, tert-pentyl, neopentyl, and n-hexyl; $C_3$-$C_{10}$ cyclic saturated hydrocarbyl groups such as cyclopropyl, cyclobutyl, cyclopentyl, cyclohexyl, adamantyl, norbornyl, cyclopropylmethyl, cyclopropylethyl, cyclobutylmethyl, cyclobutylethyl, cyclopentylmethyl, cyclopentylethyl, cyclohexylmethyl, cyclohexylethyl, methylcyclopropyl, methylcyclobutyl, methylcyclopentyl, methylcyclohexyl, ethylcyclopropyl, ethylcyclobutyl, ethylcyclopentyl, and ethylcyclohexyl; $C_2$-$C_{10}$ alkenyl groups such as vinyl, 1-propenyl, 2-propenyl, butenyl, pentenyl, hexenyl, heptenyl, nonenyl and decenyl; $C_2$-$C_{10}$ alkynyl groups such as ethynyl, propynyl, butynyl, pentynyl, hexynyl, heptynyl, octynyl, nonynyl and decynyl; $C_3$-$C_{10}$ cyclic unsaturated aliphatic hydrocarbyl groups such as cyclopentenyl, cyclohexenyl, methylcyclopentenyl, methylcyclohexenyl, ethylcyclopentenyl, ethylcyclohexenyl and norbornenyl; and combinations thereof.

In formula (1), $R^4$ is hydrogen or a $C_1$-$C_4$ alkyl group.

Examples of the nitrobenzyl ester compound are shown below, but not limited thereto.

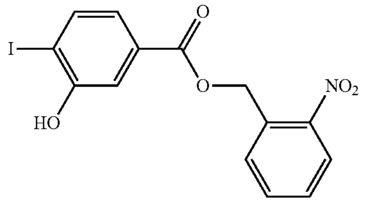

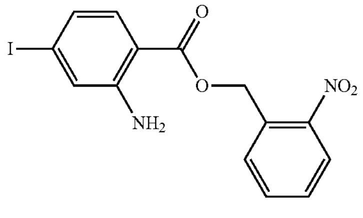

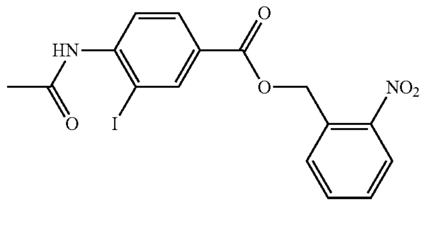

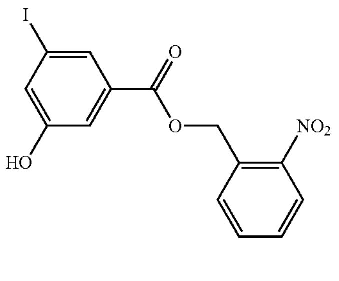

-continued
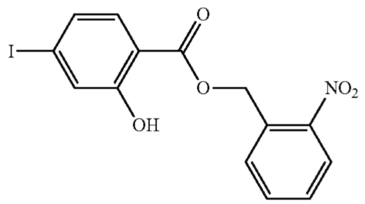
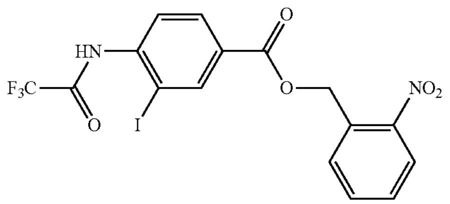
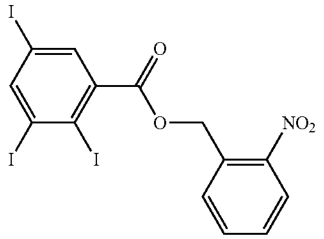
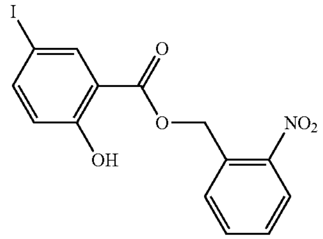
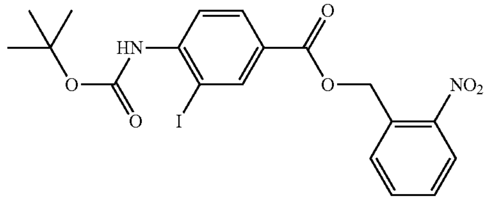
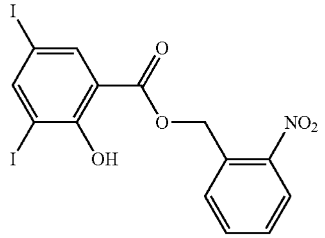
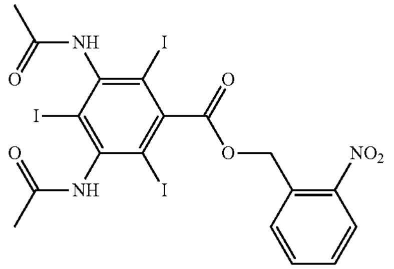
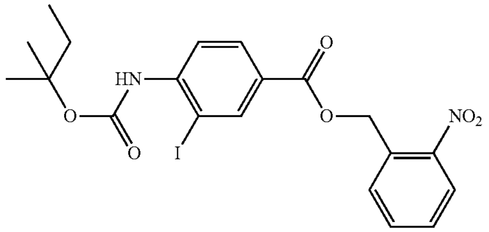
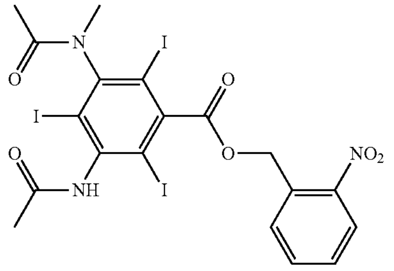
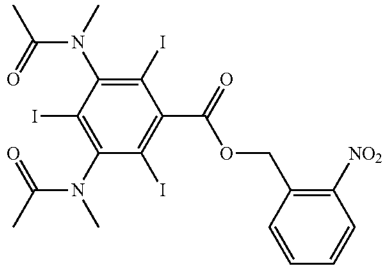
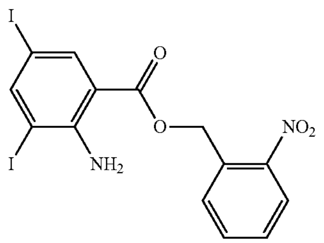
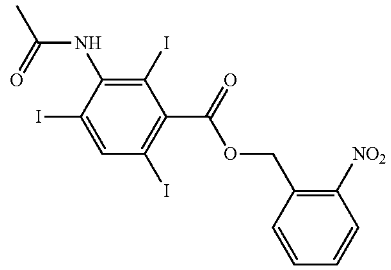
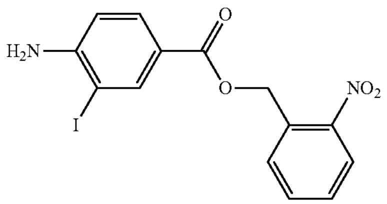

-continued
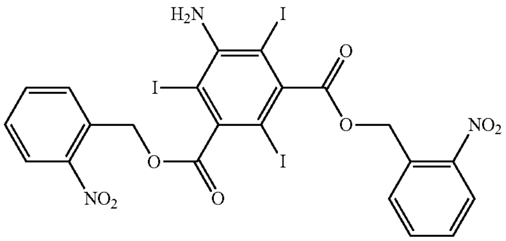
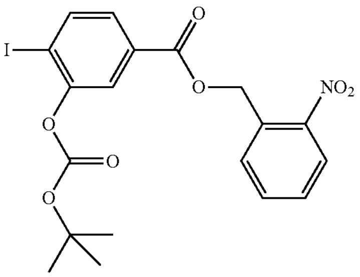
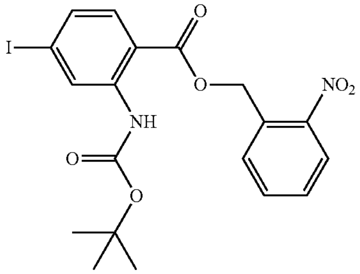
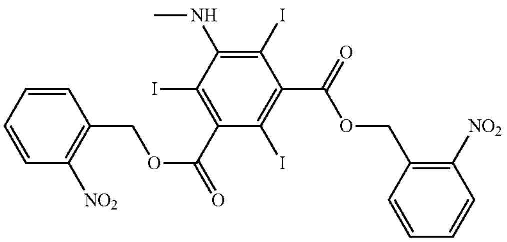
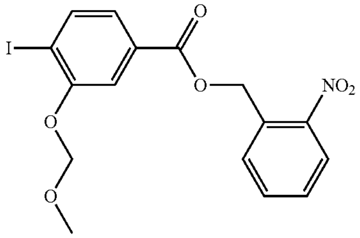
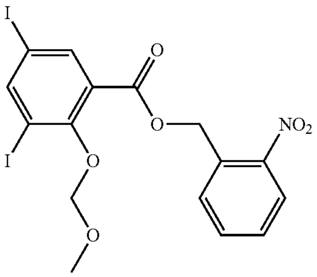
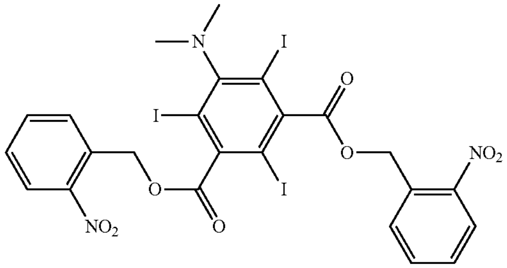
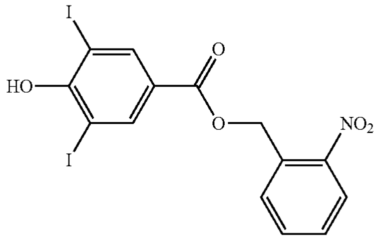
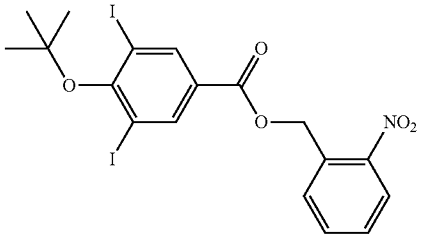
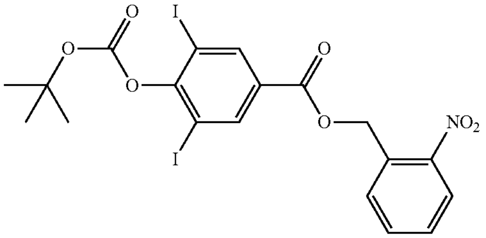
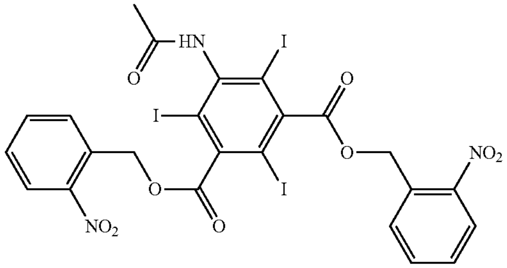
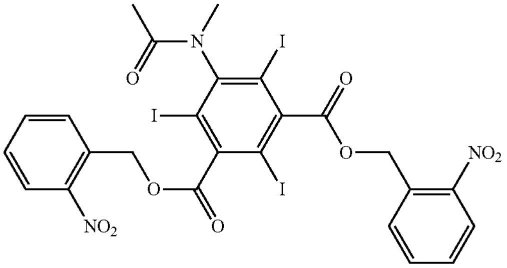

-continued
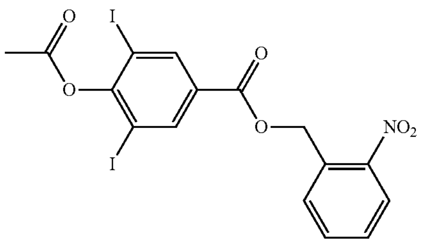
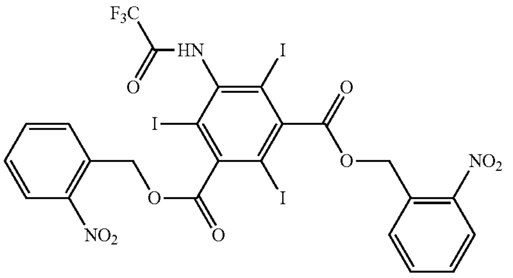
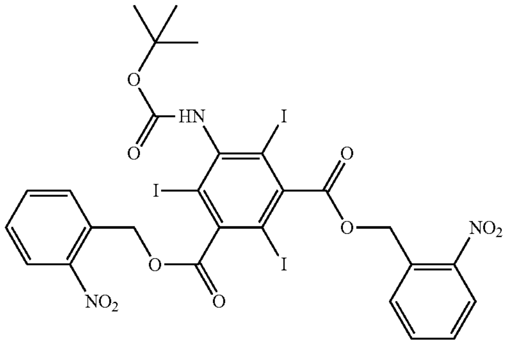
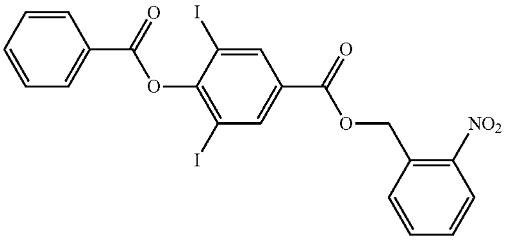
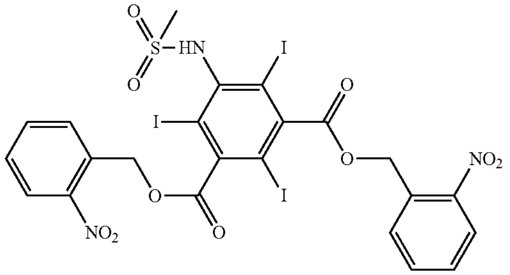
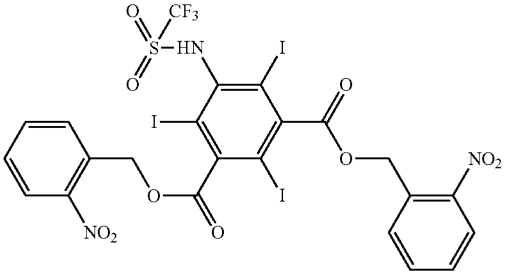
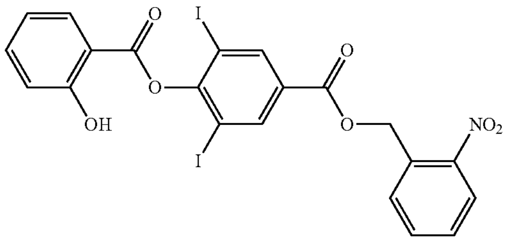
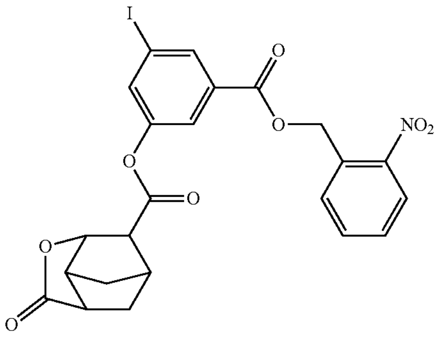
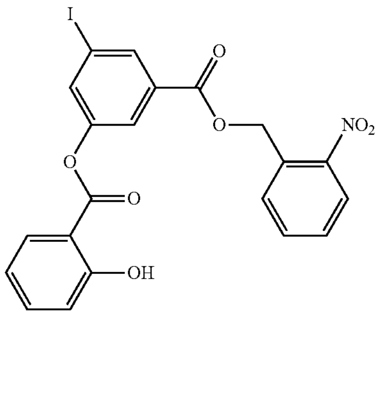

-continued
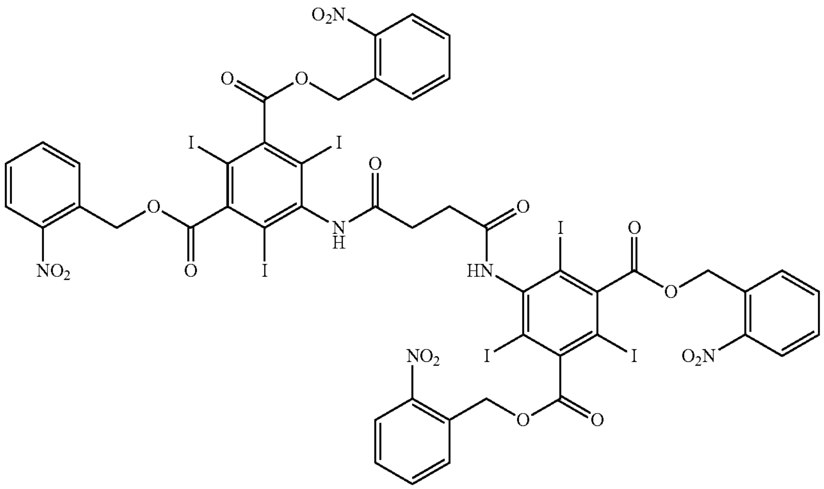
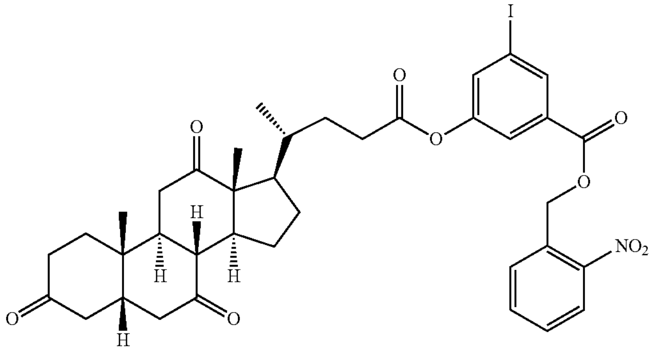
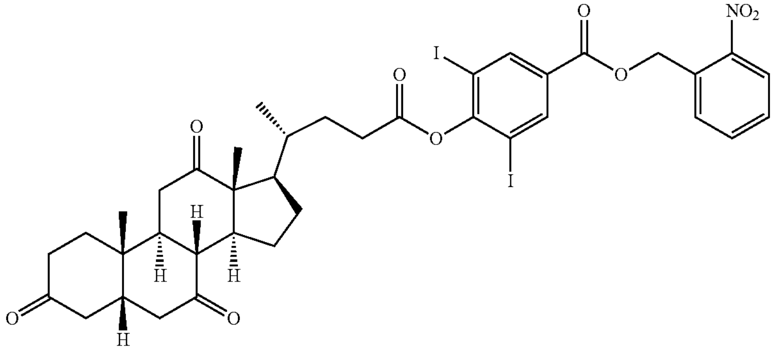
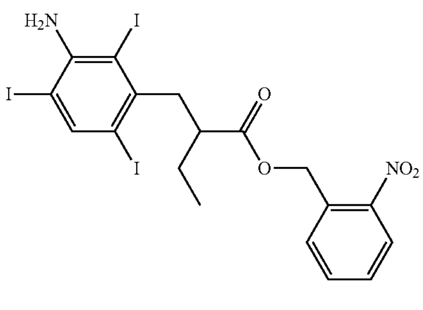
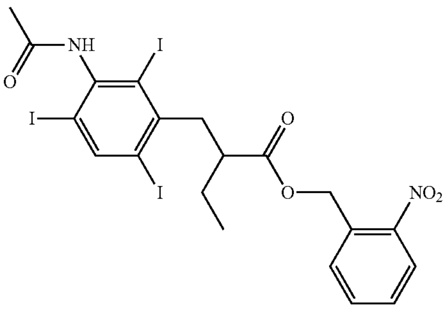

-continued
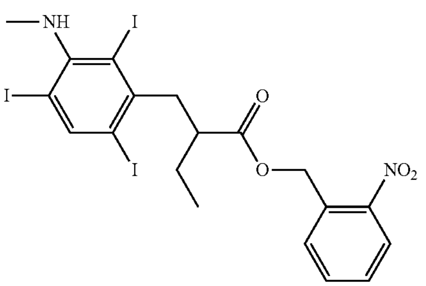
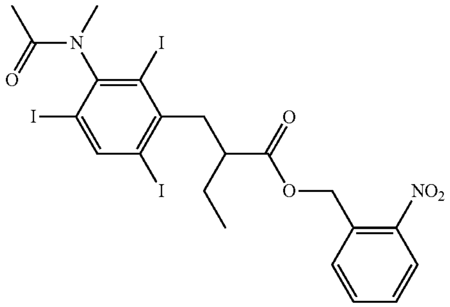
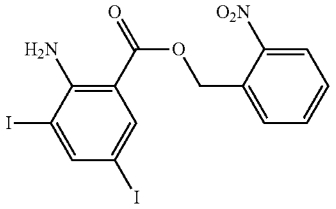
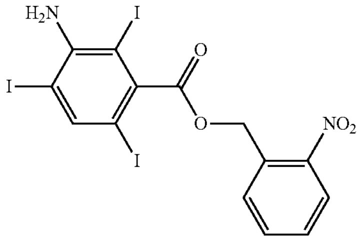
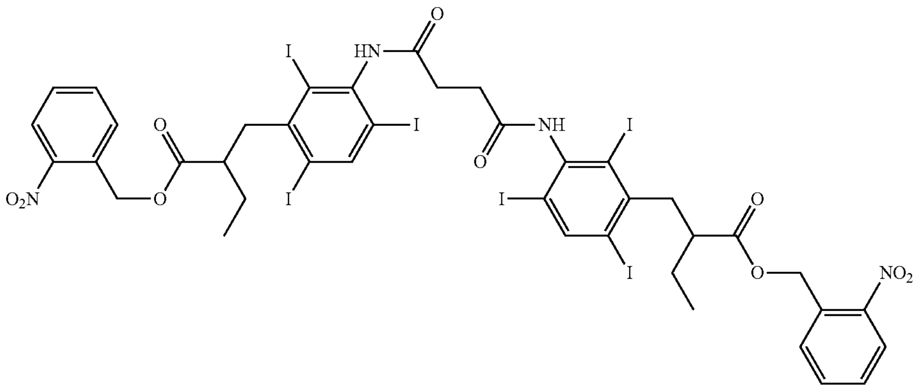
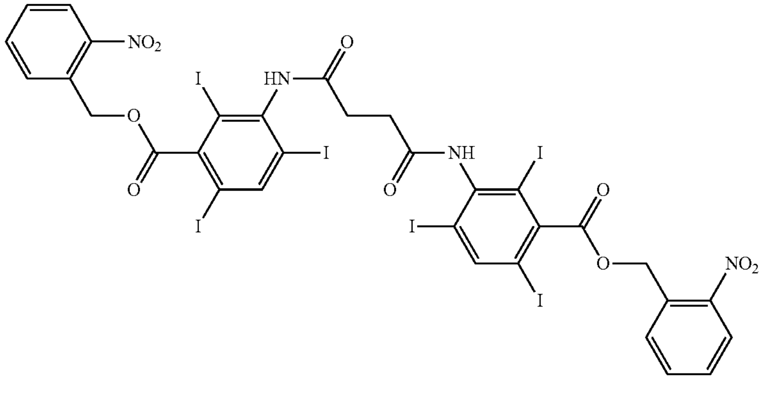

-continued
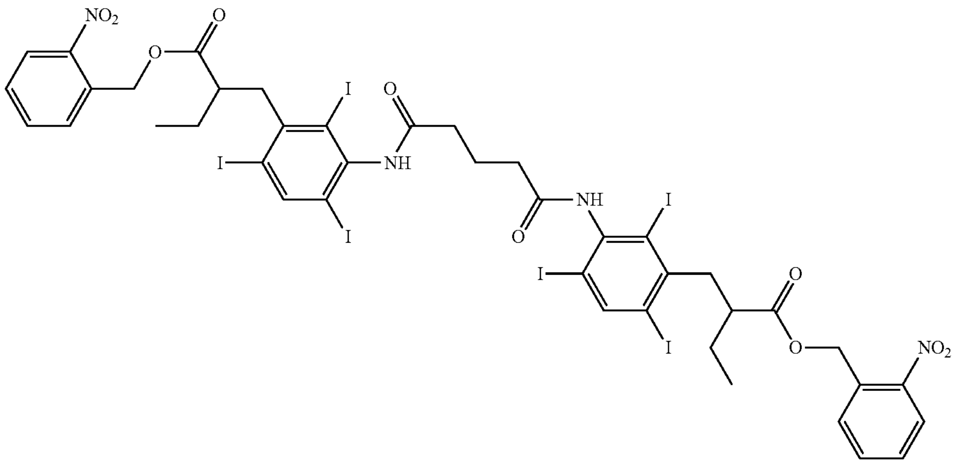
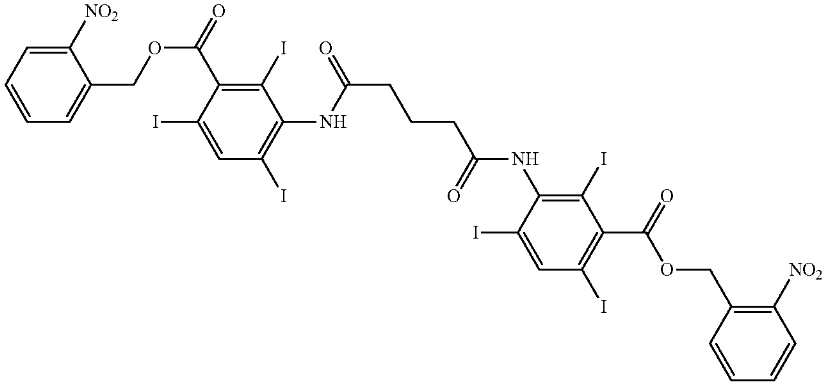
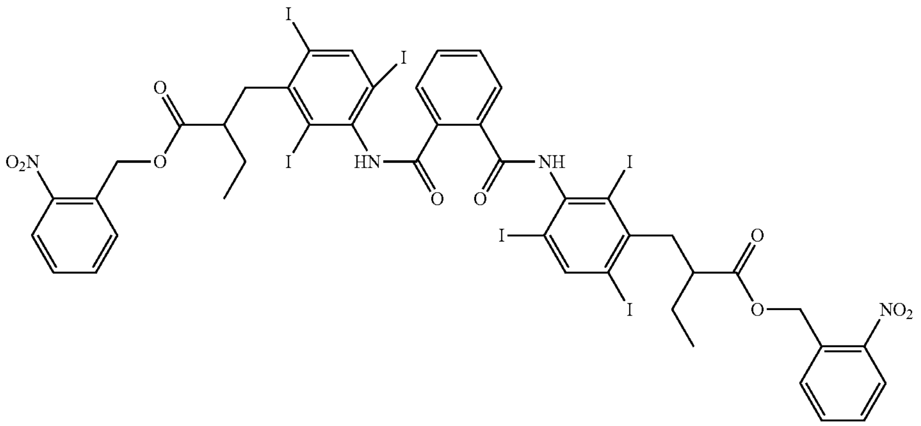
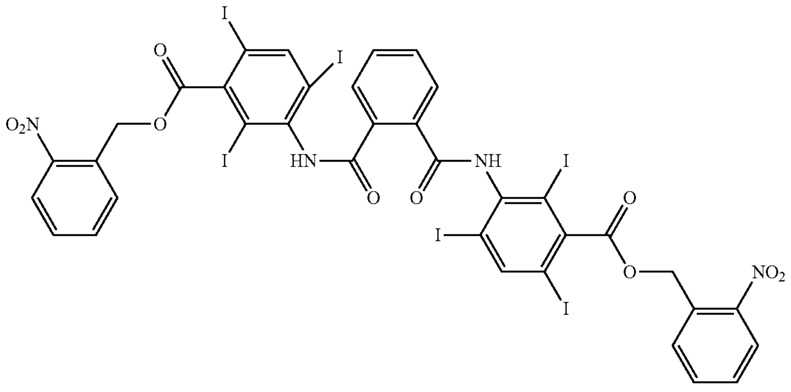

-continued
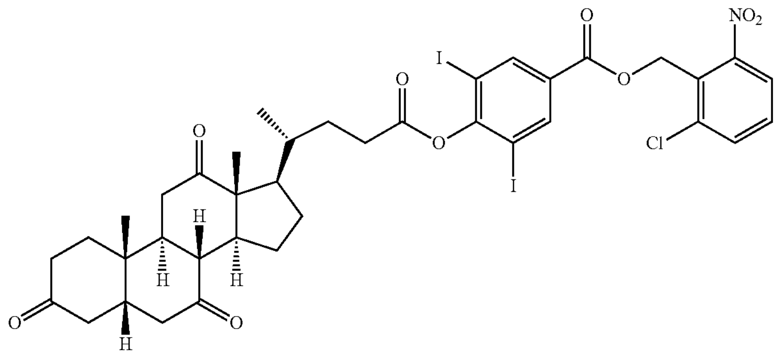
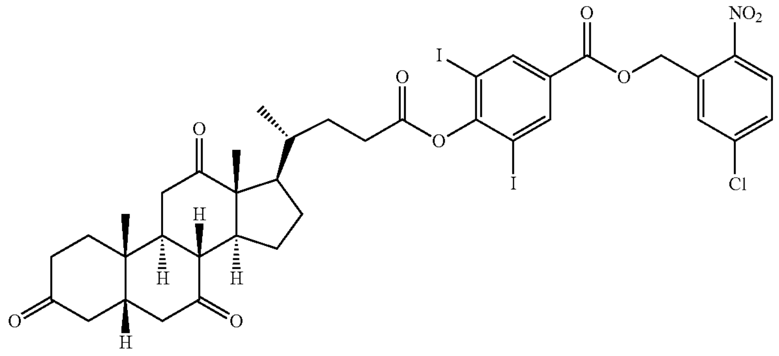
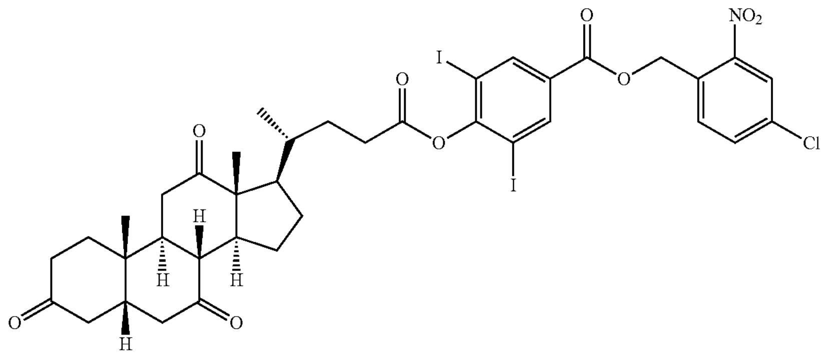
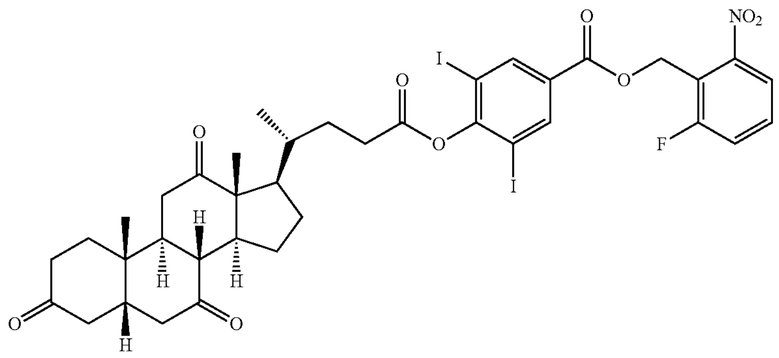

-continued
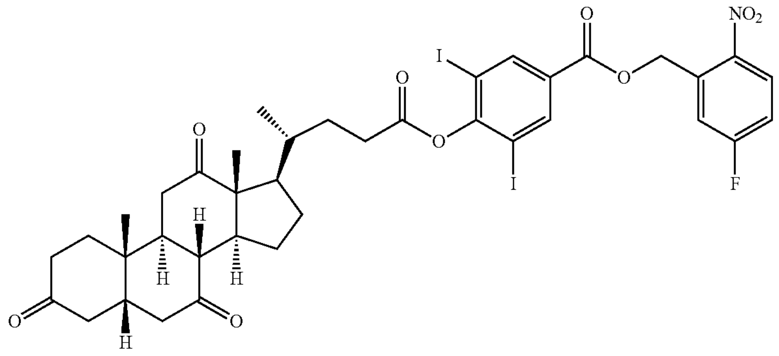
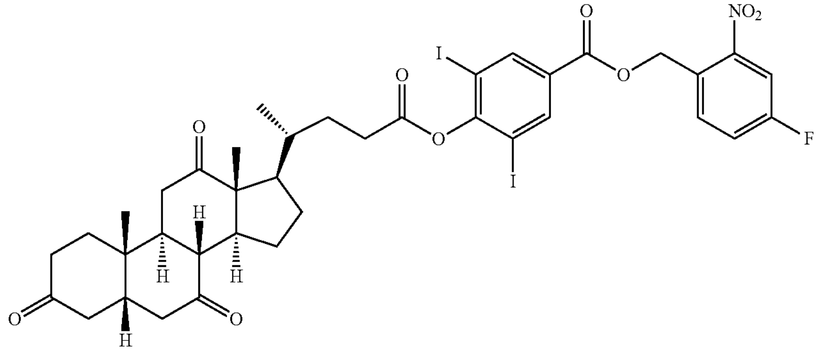
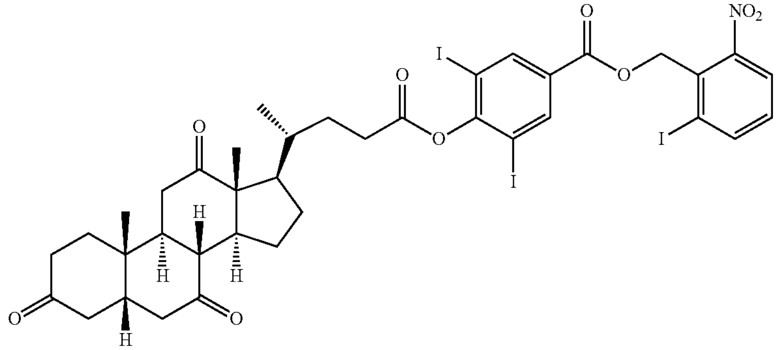
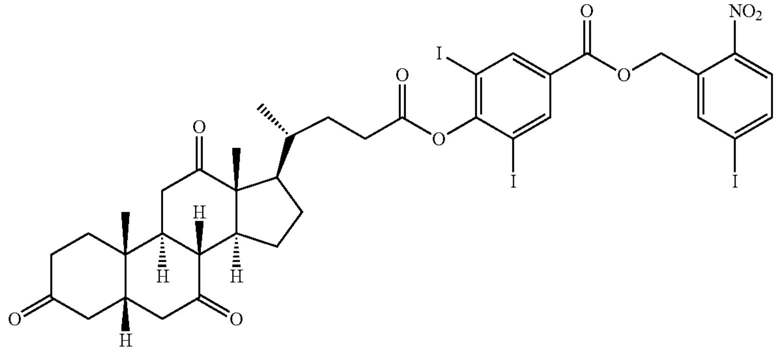

-continued
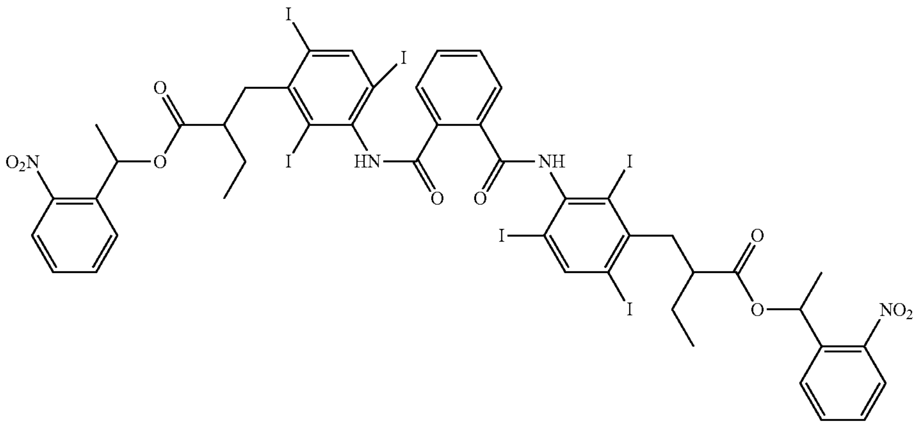
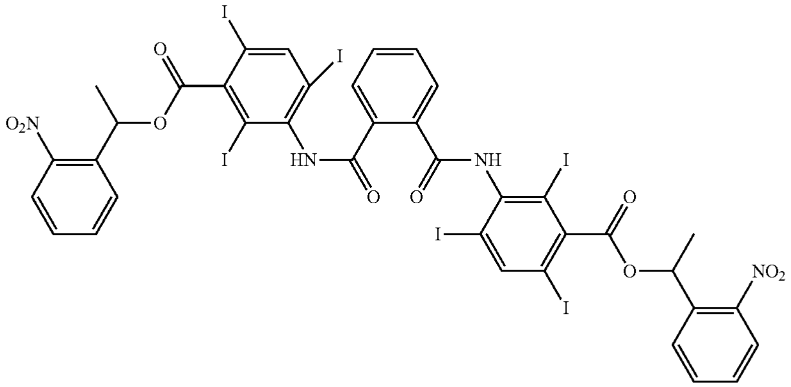
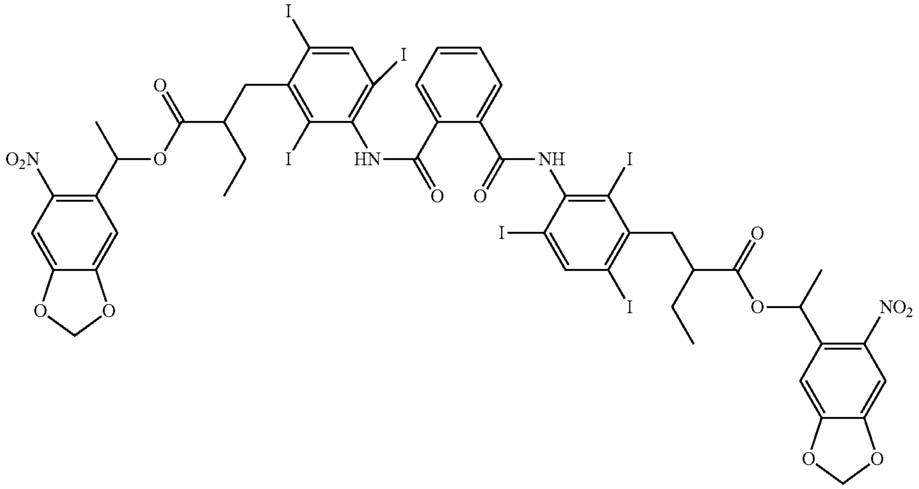

-continued
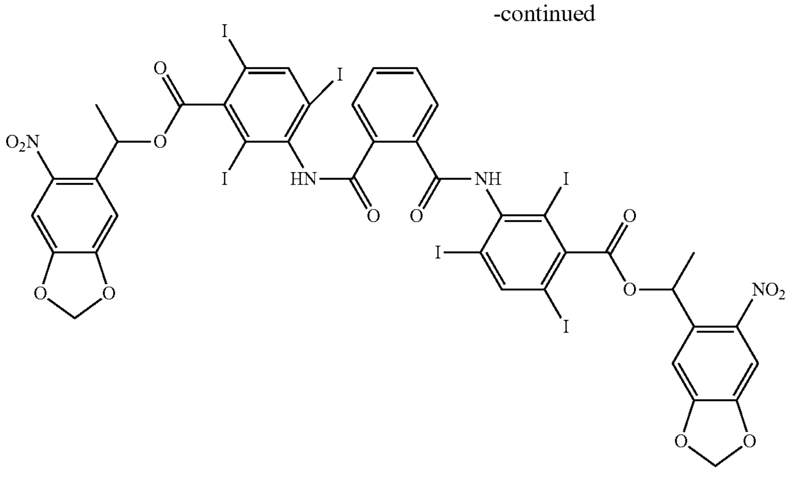
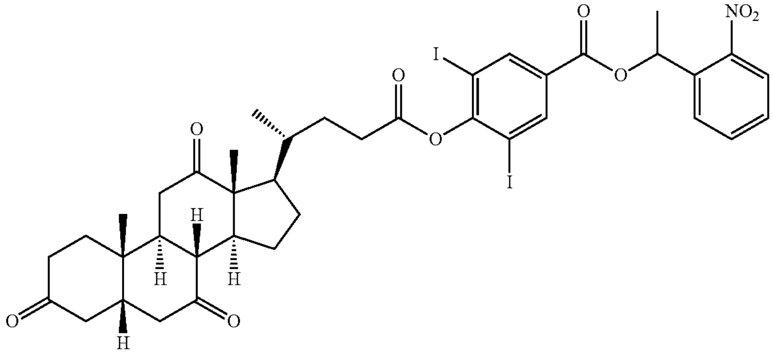
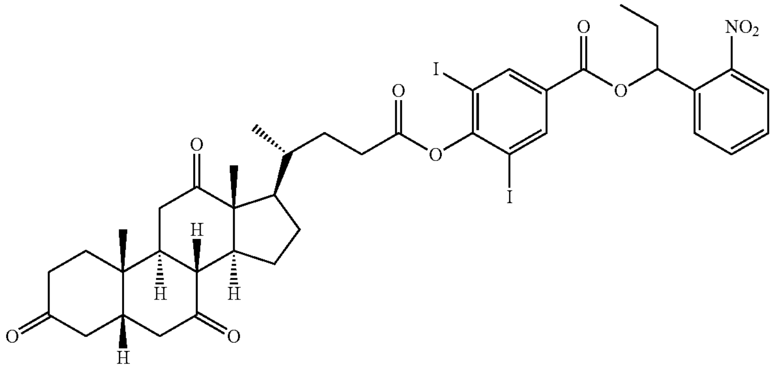
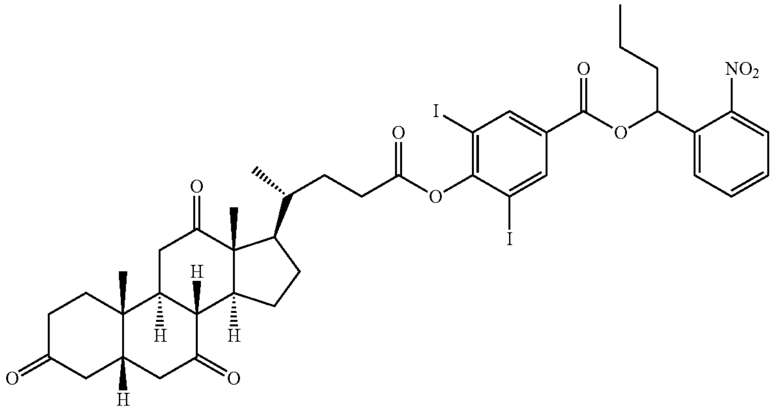

-continued
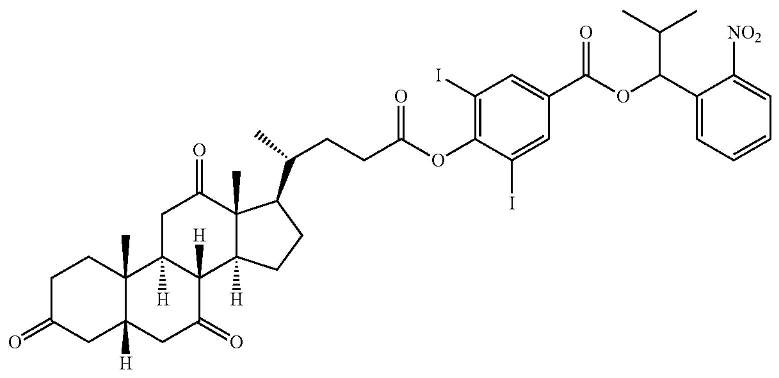
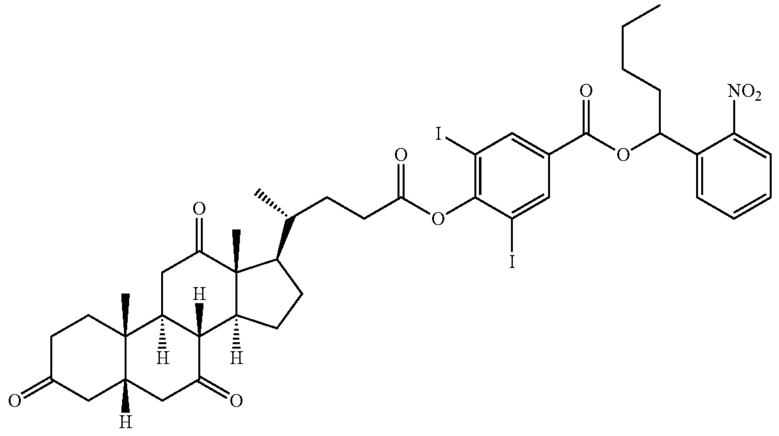
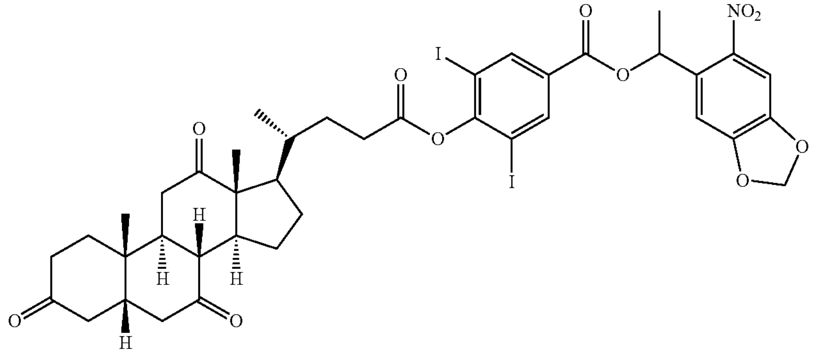
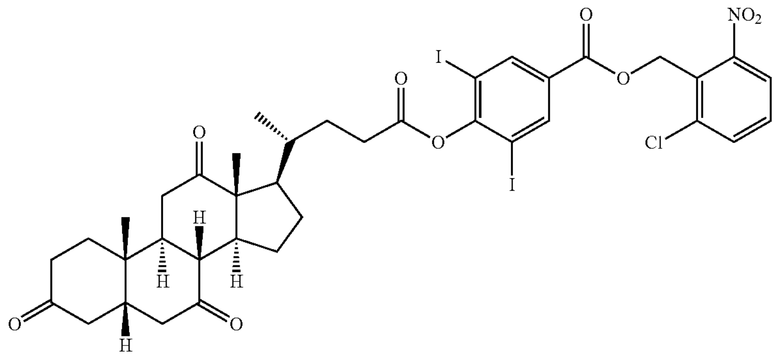

-continued
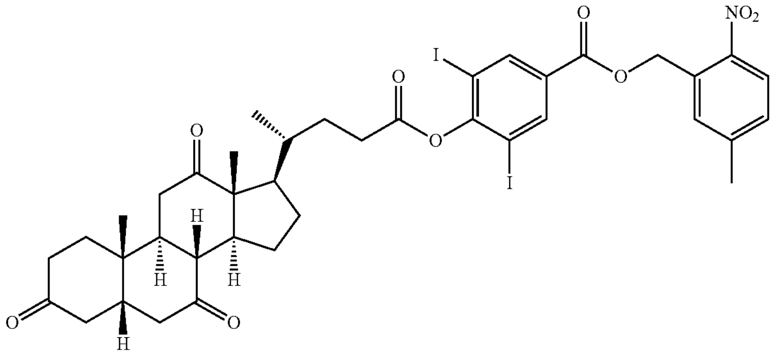
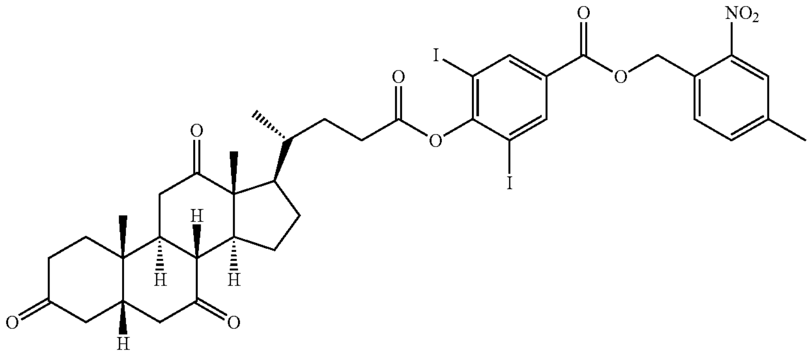
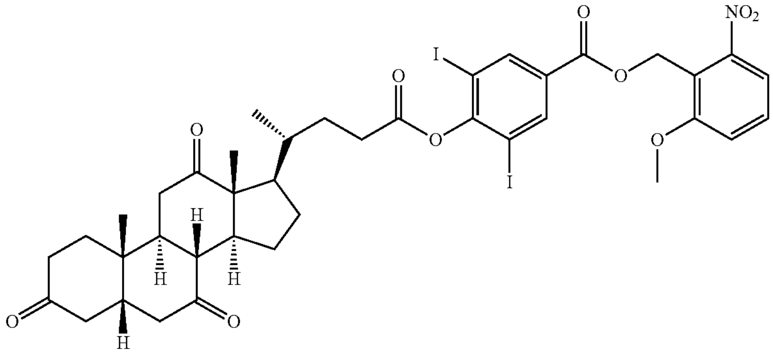
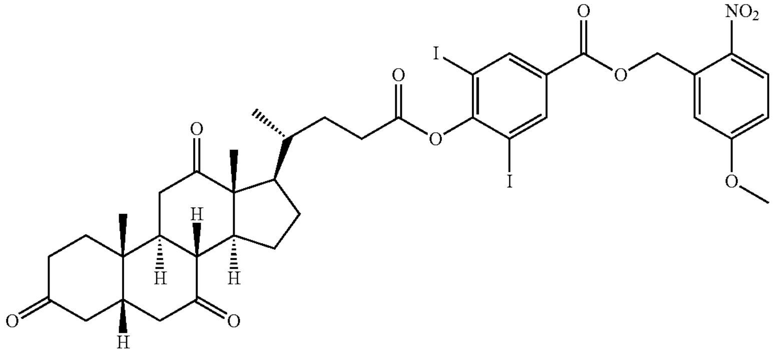

-continued
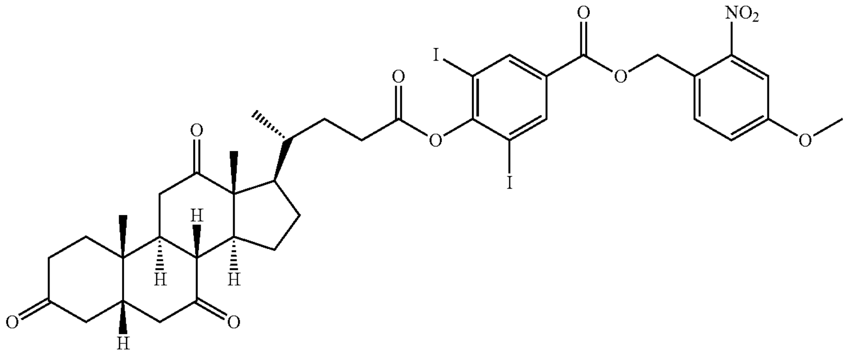
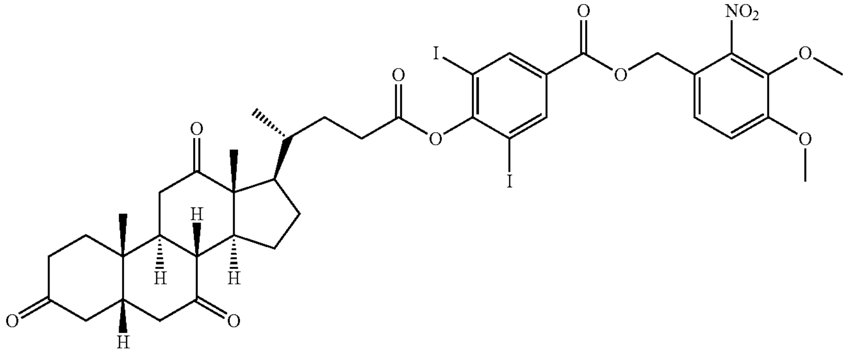
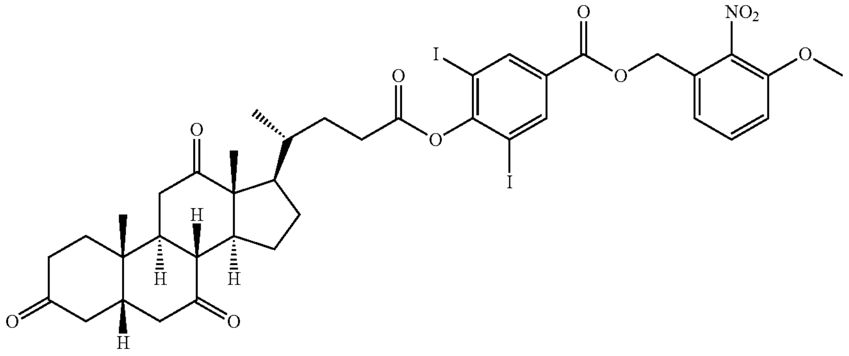
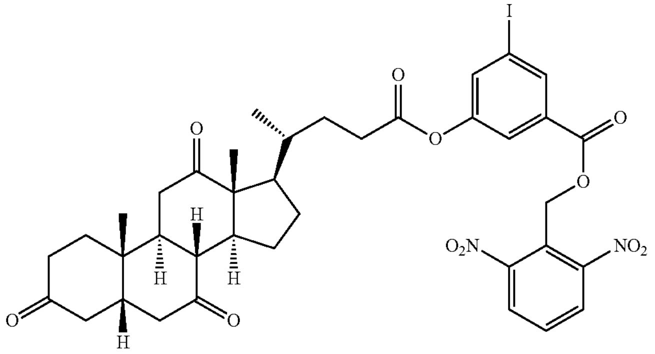

-continued
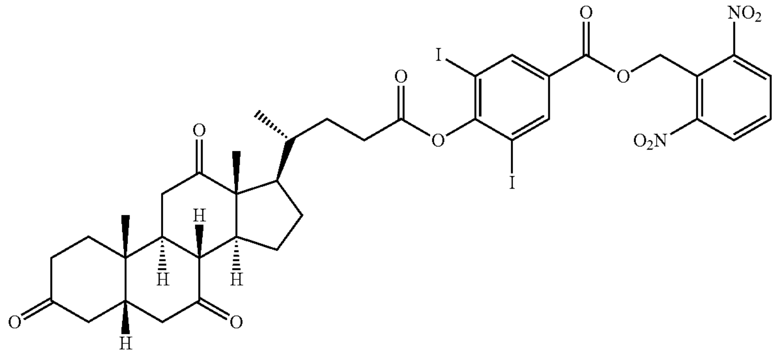
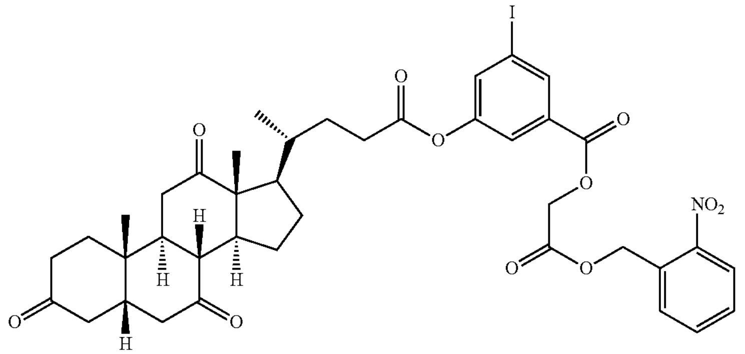
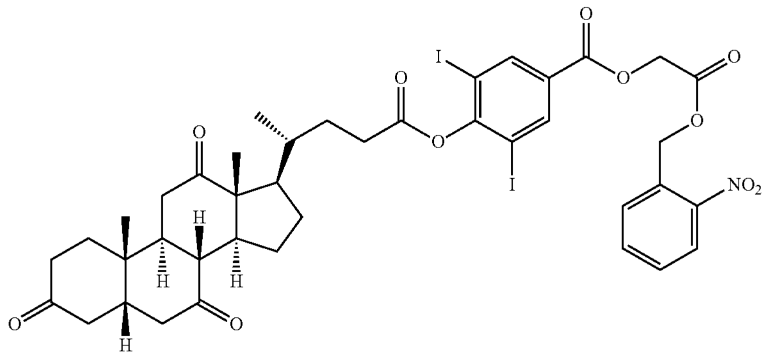
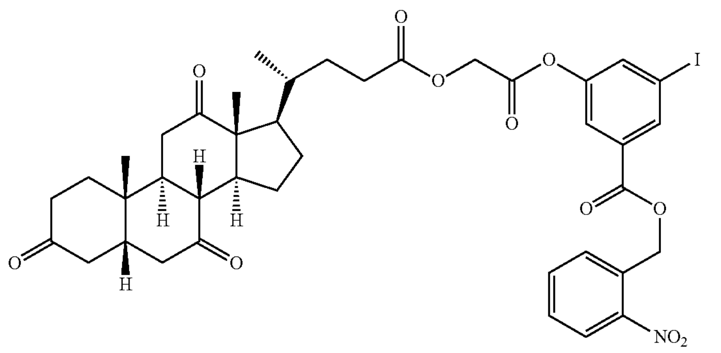

-continued
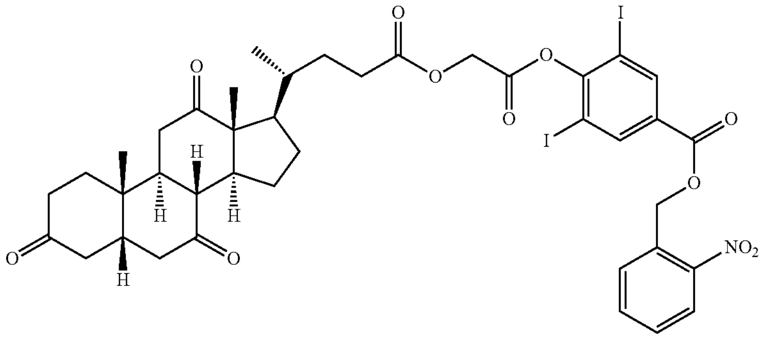
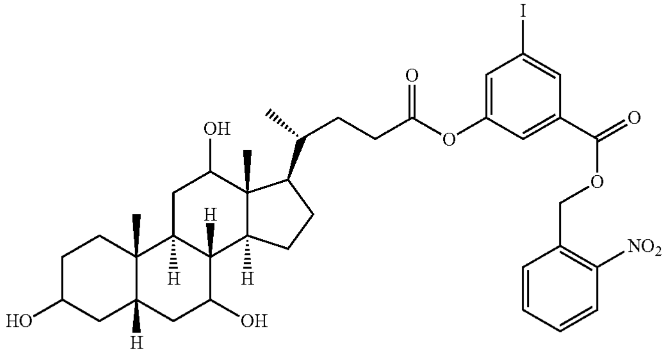
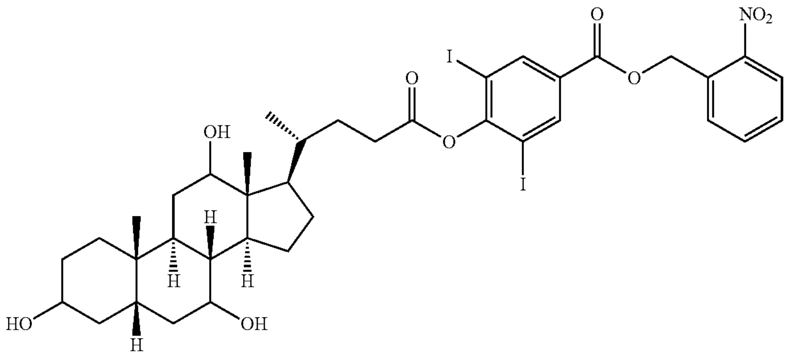
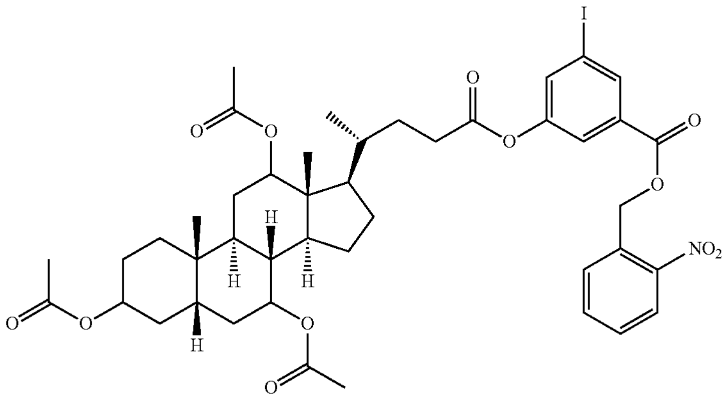

-continued
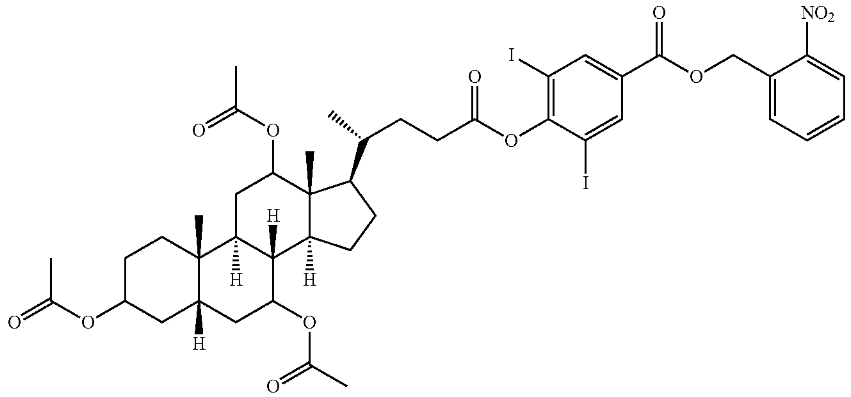
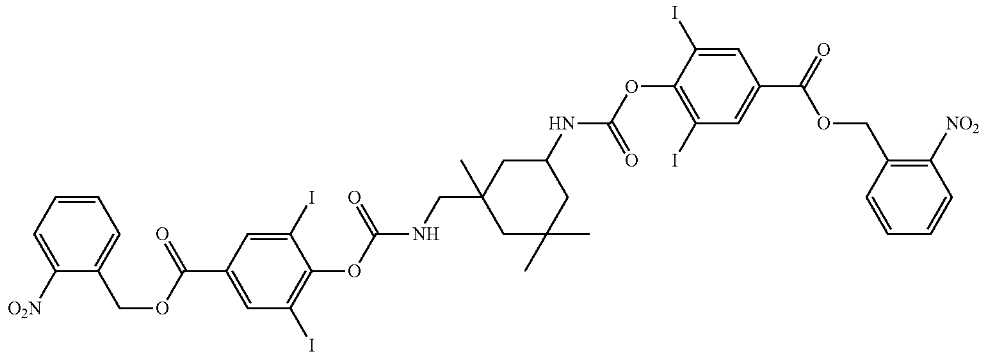
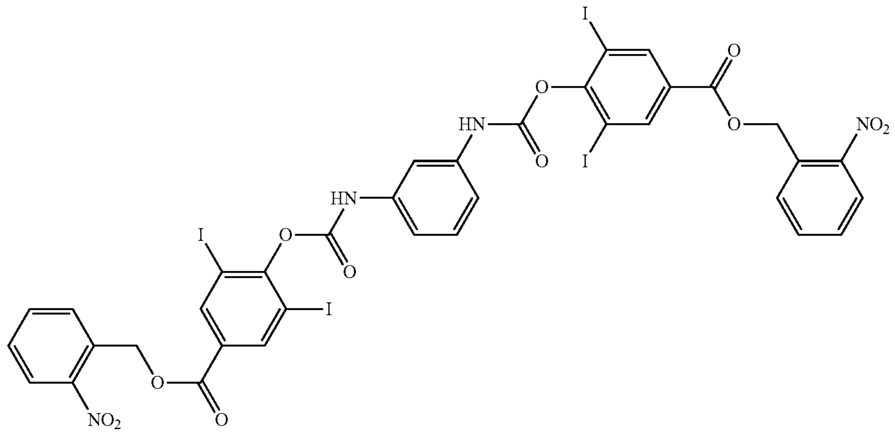
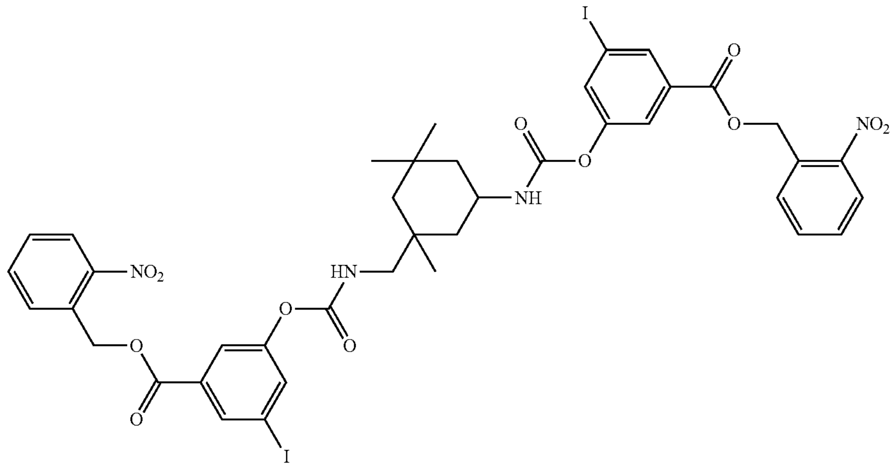

-continued
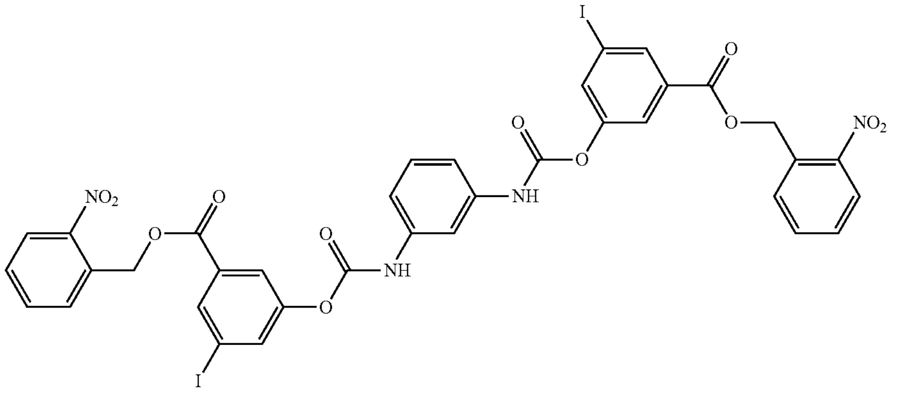
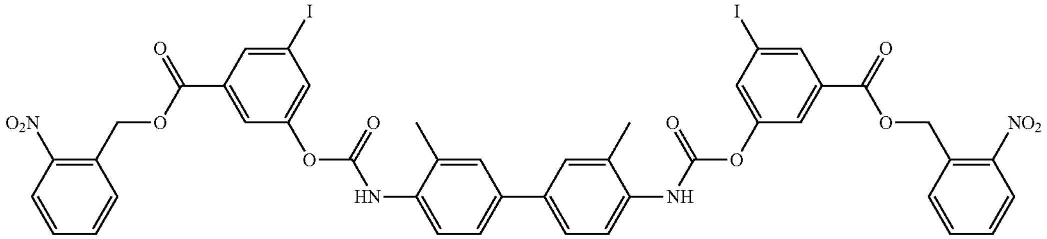
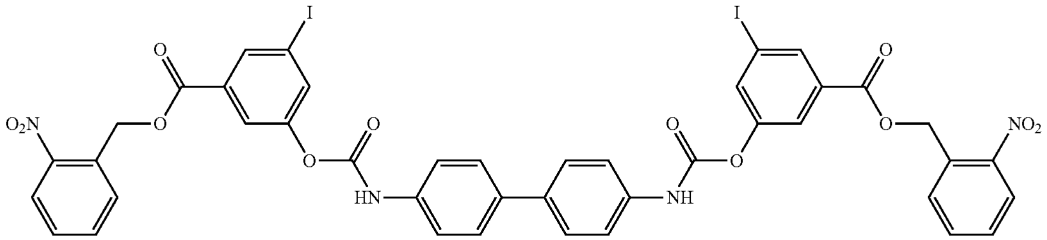
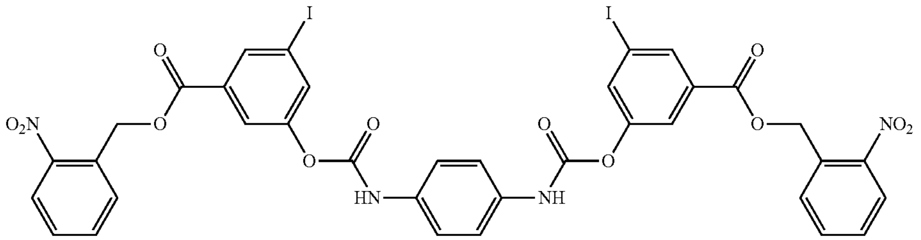
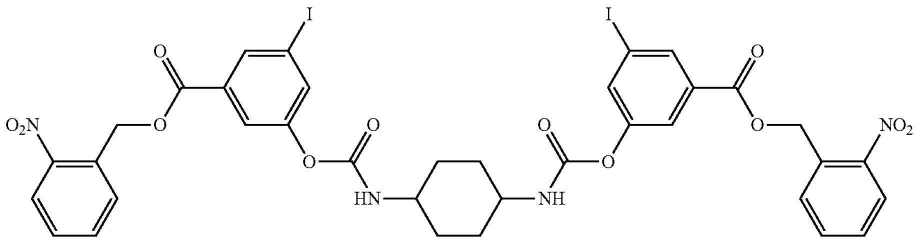
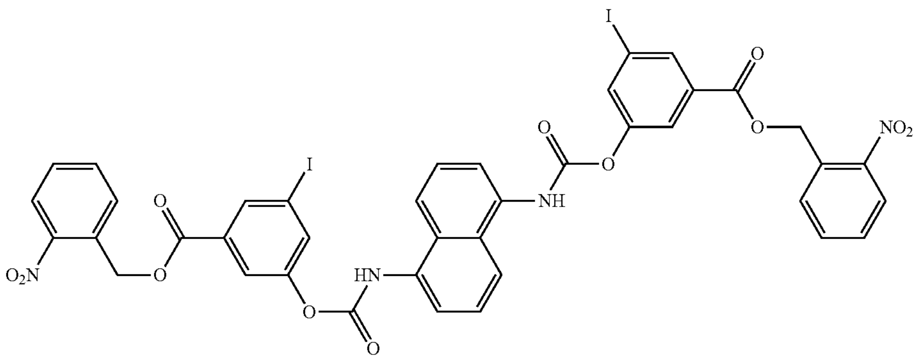

-continued
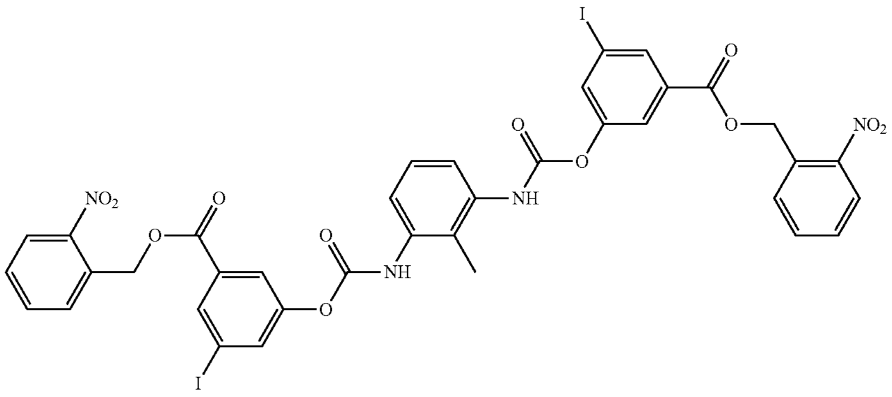
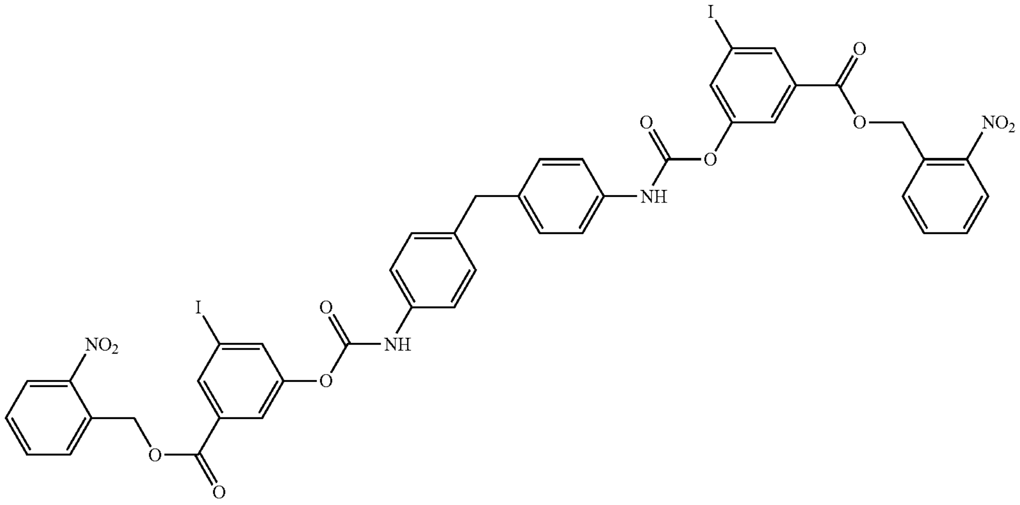
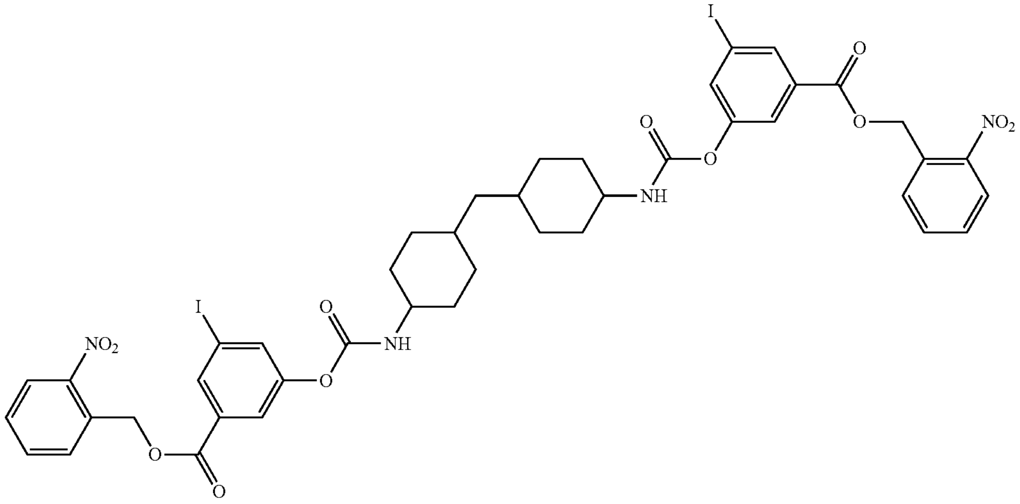

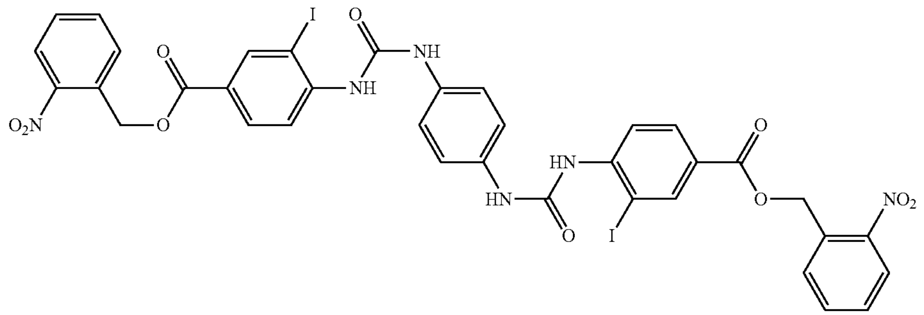
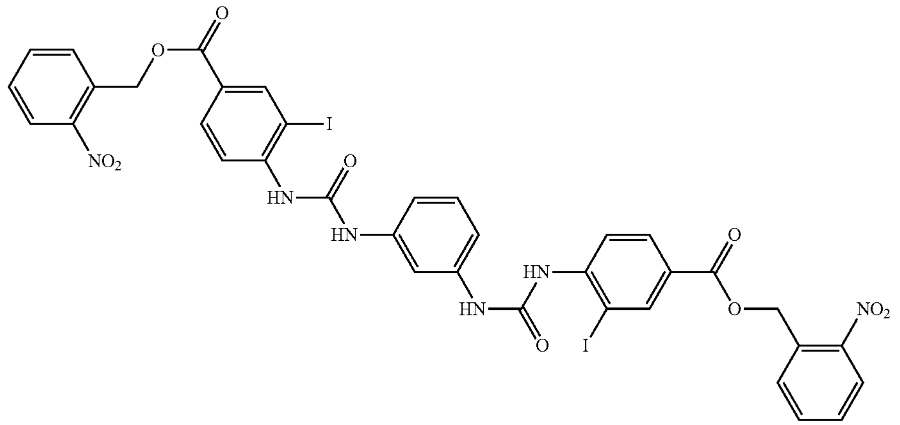
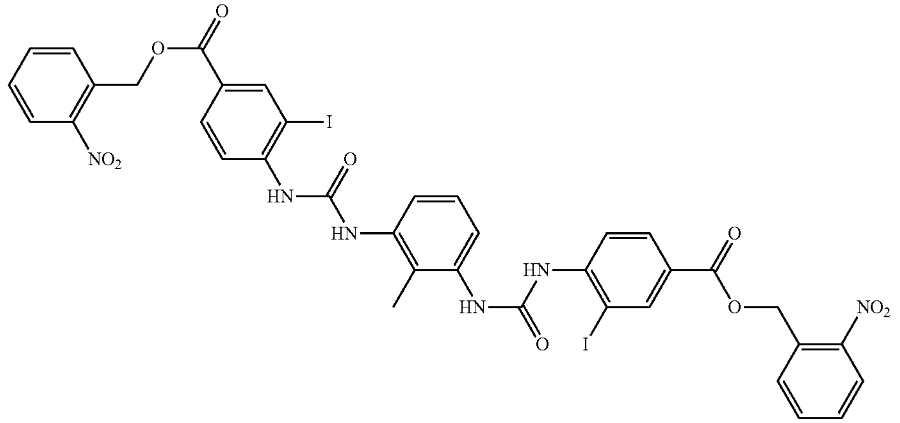
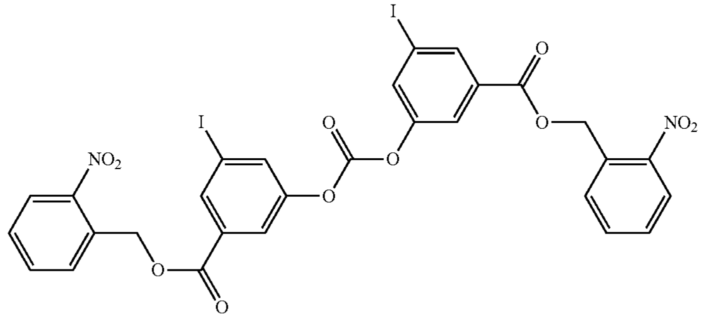

-continued
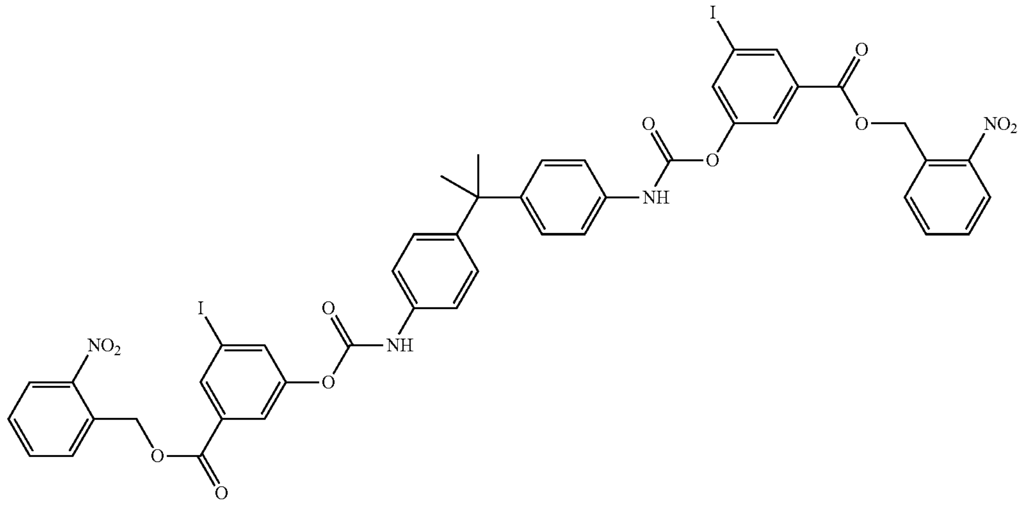
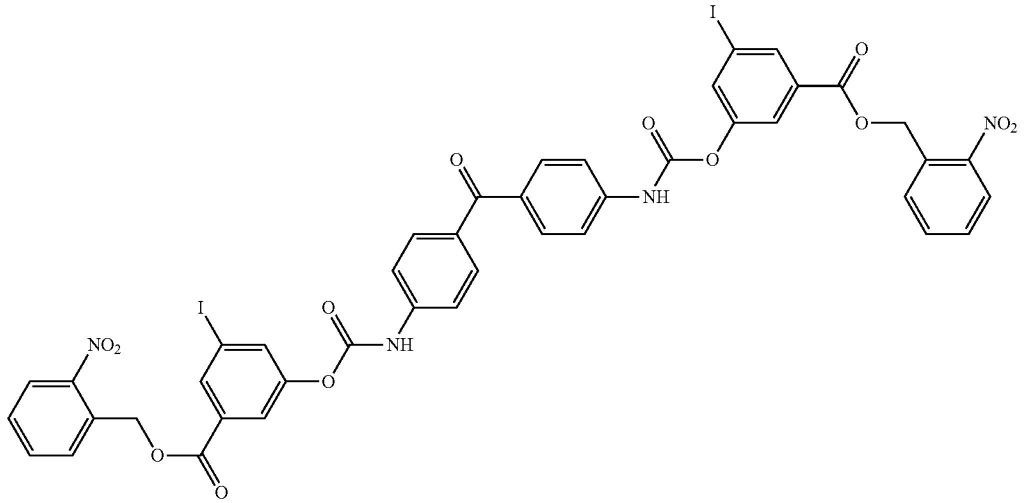
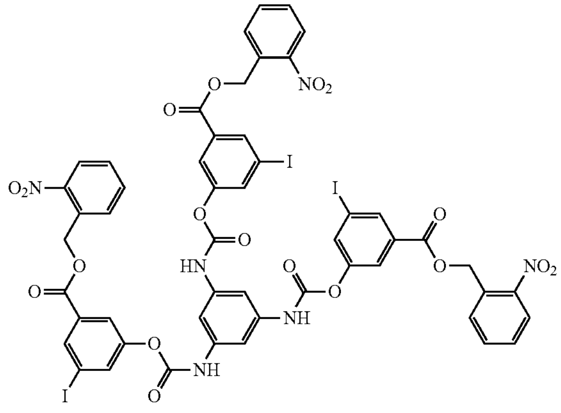
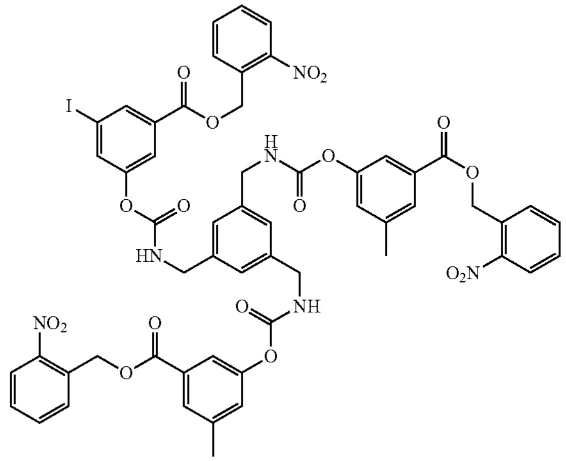

-continued
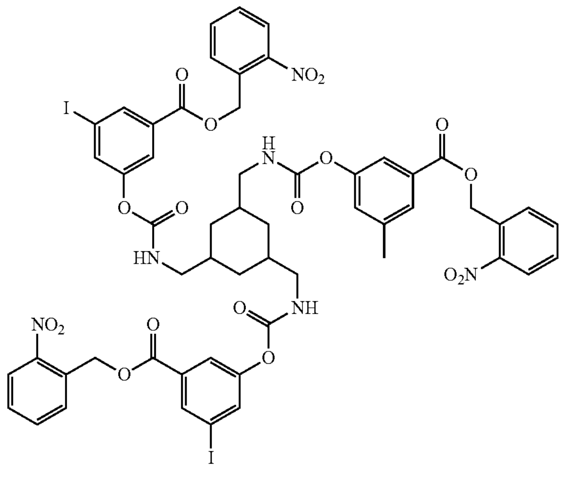
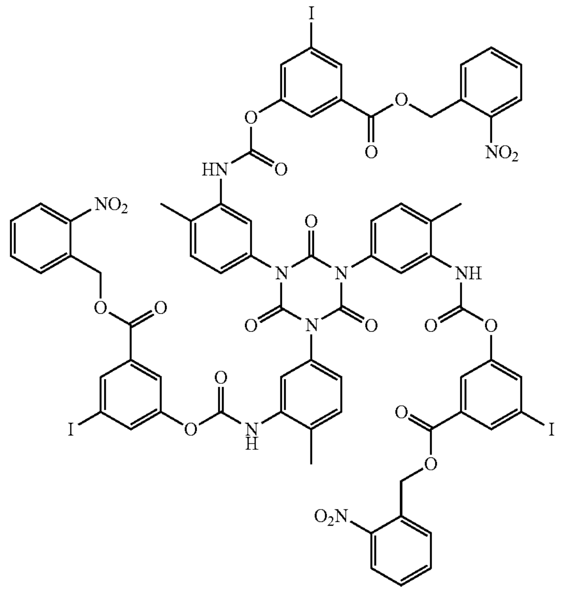
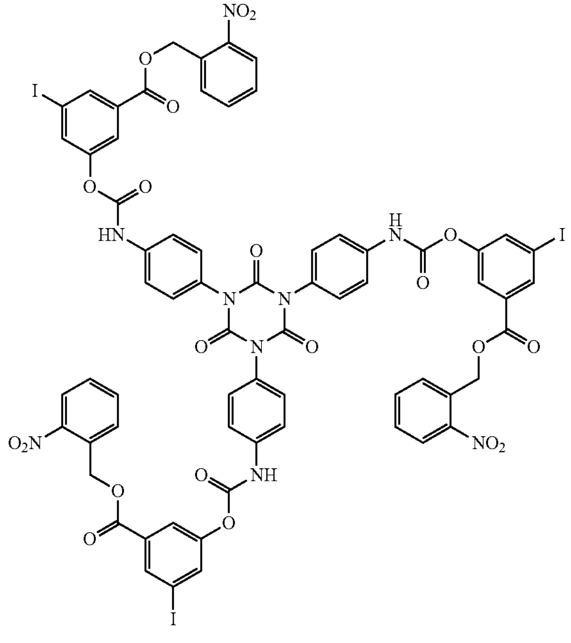
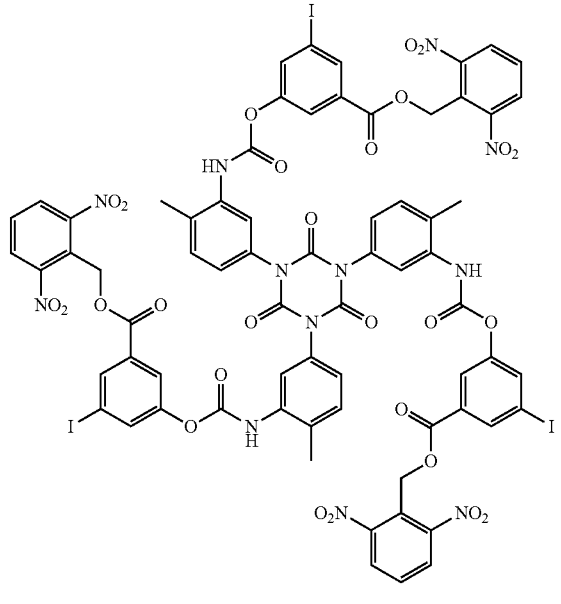

-continued
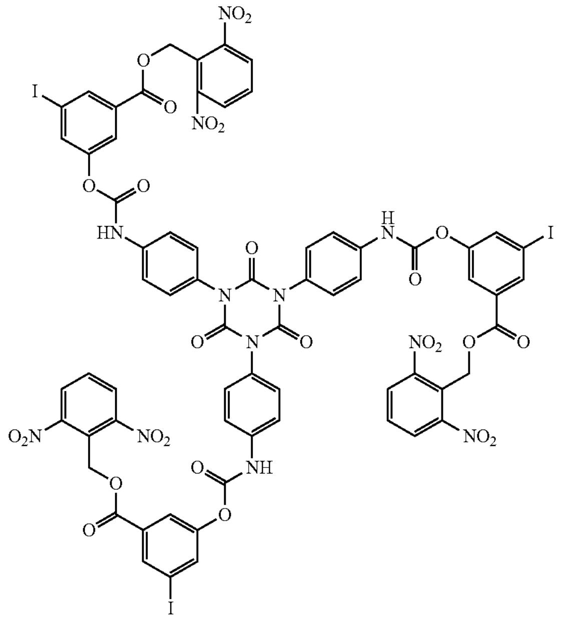
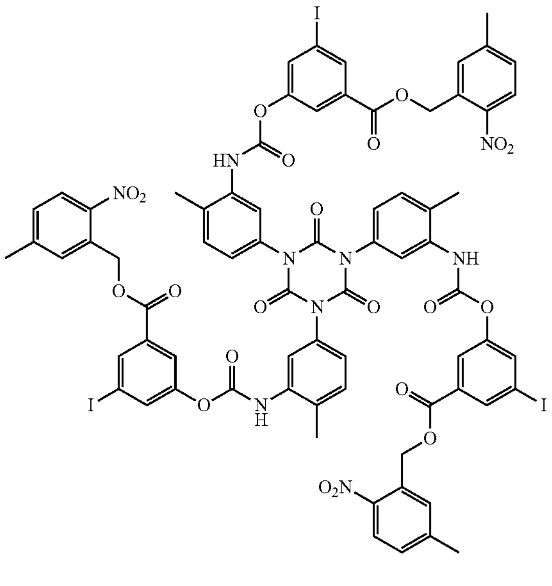
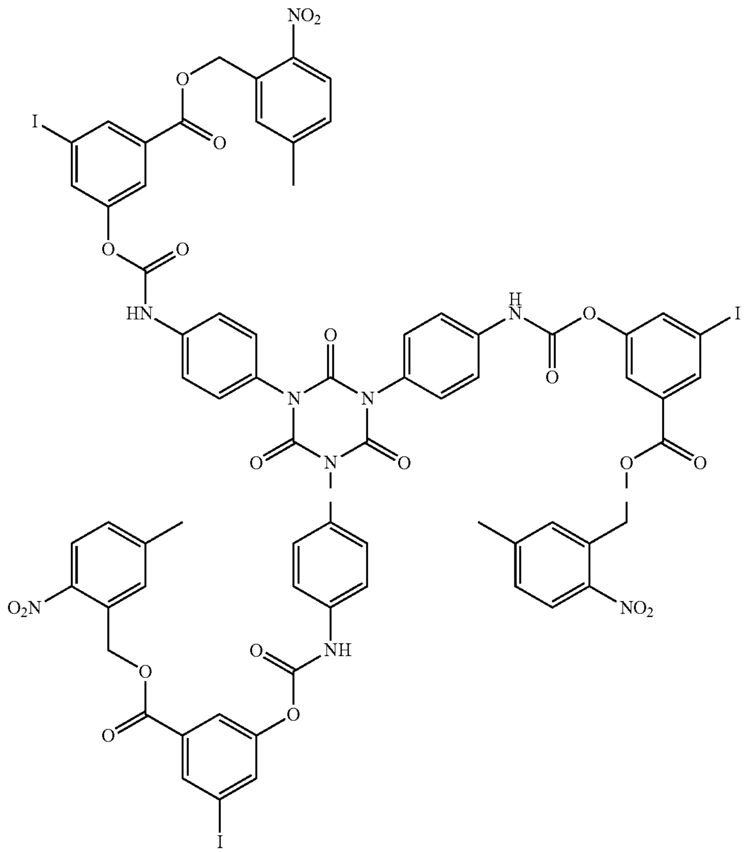

-continued
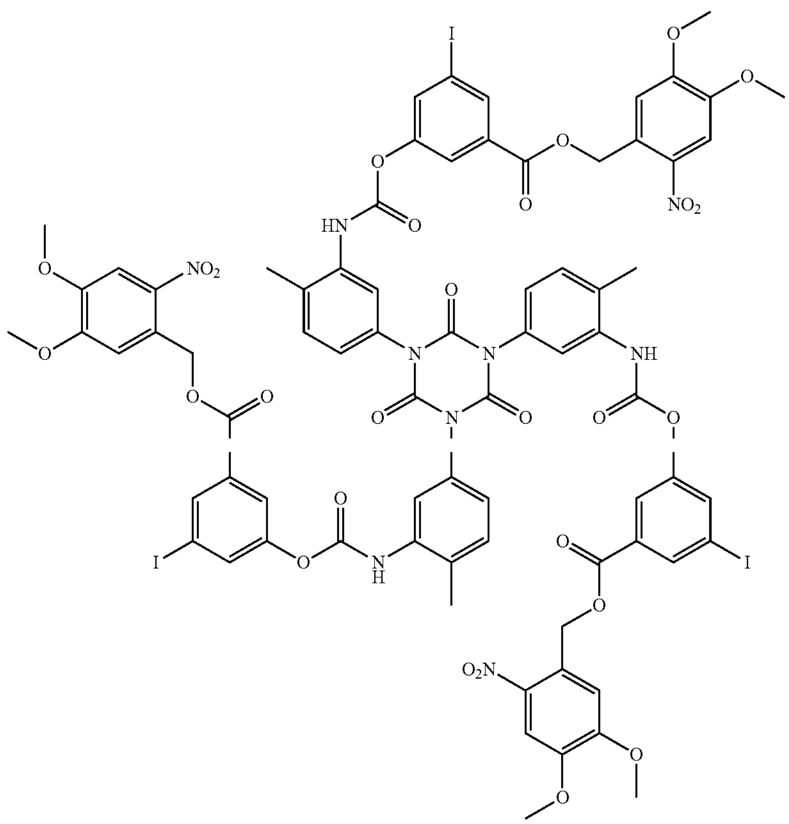
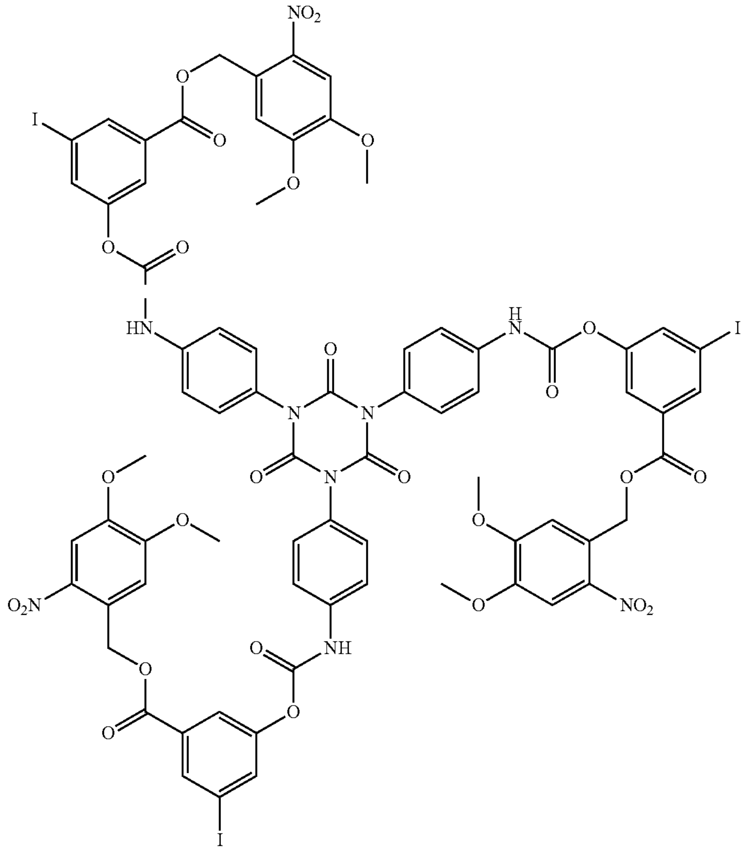

-continued
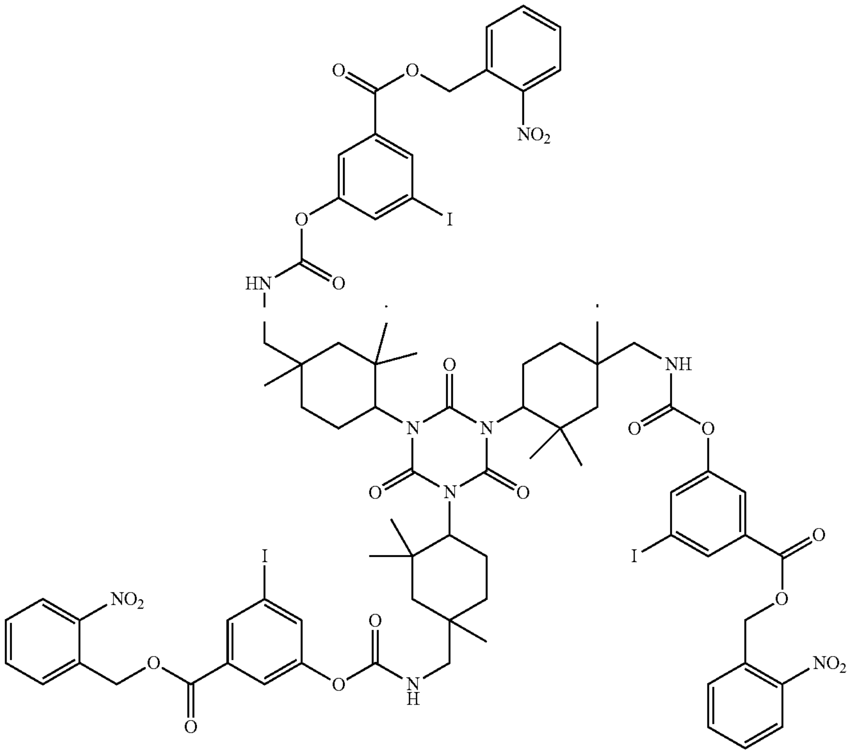
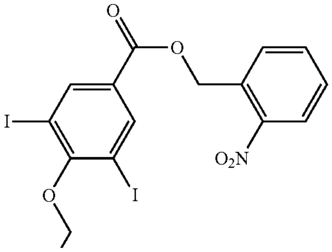
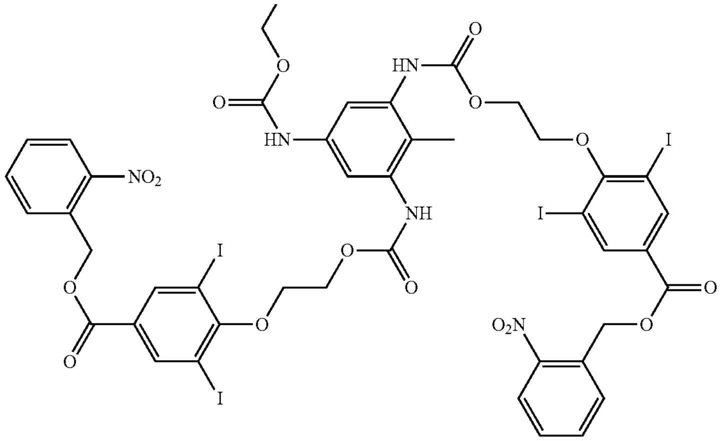

-continued
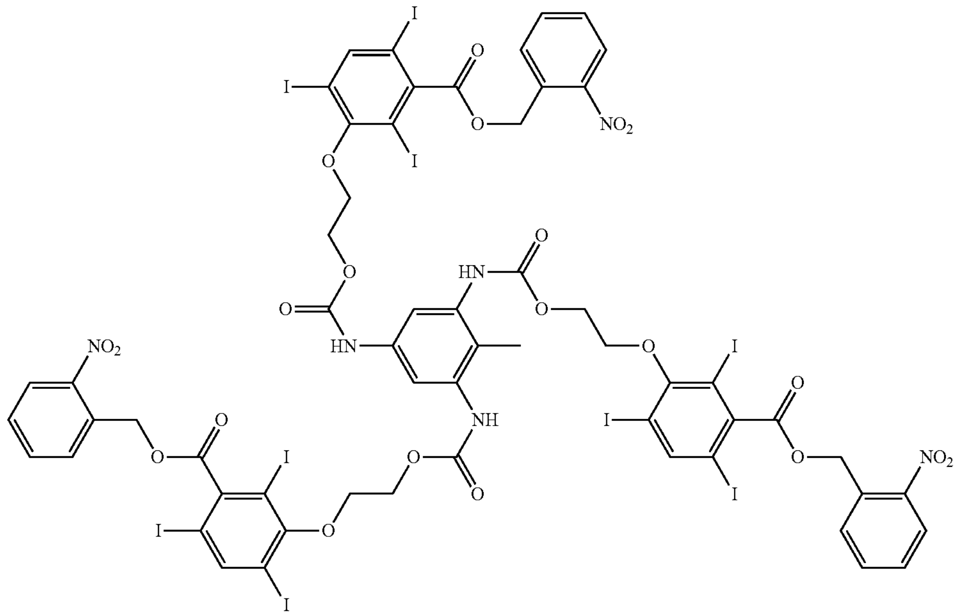
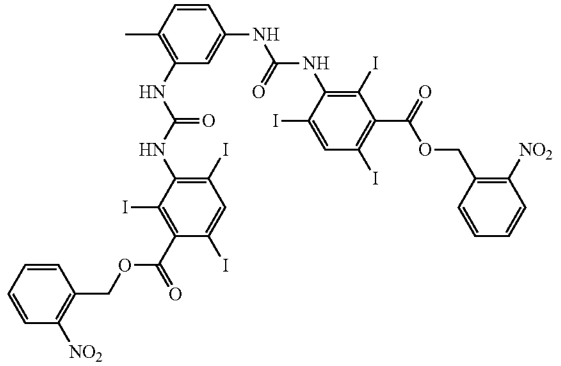
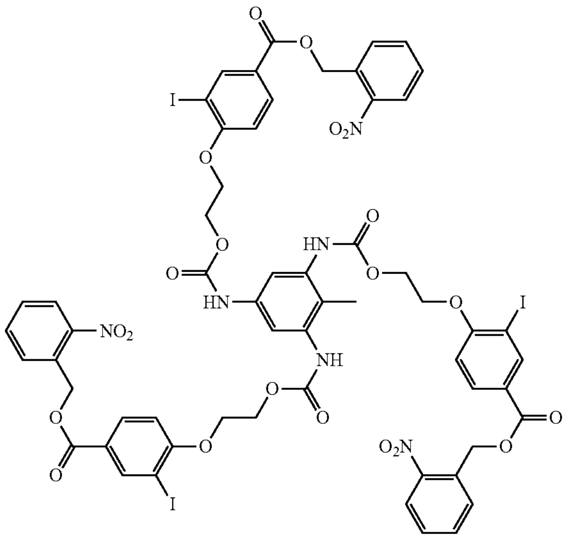
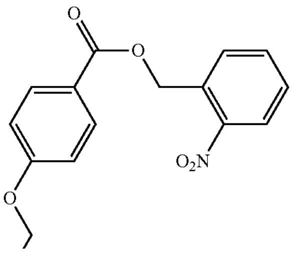

-continued
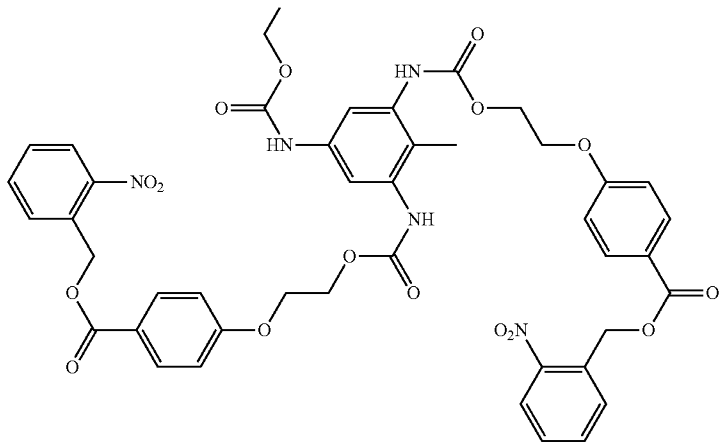
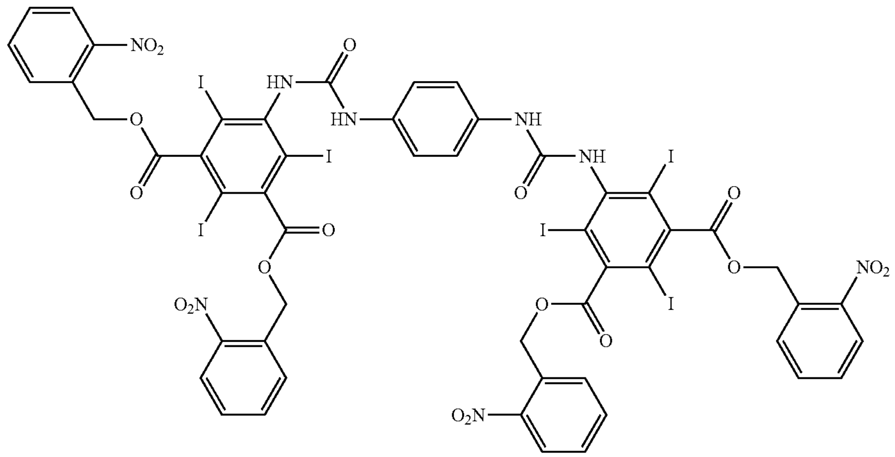
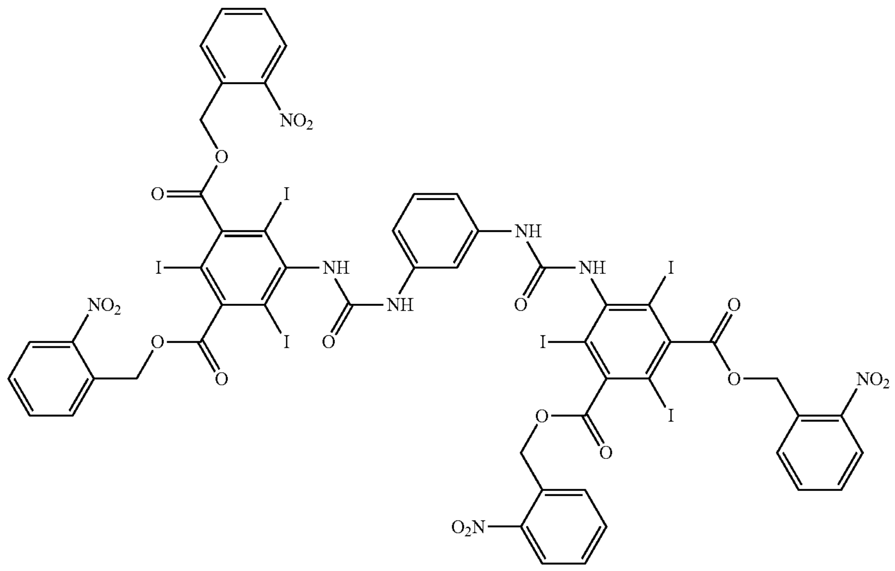

-continued
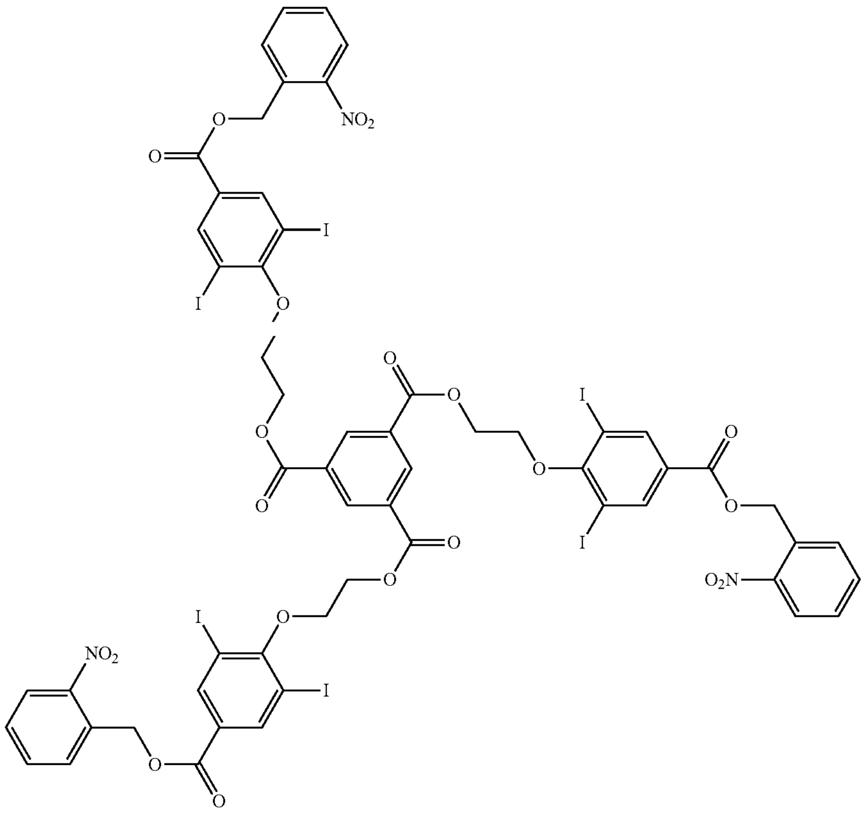
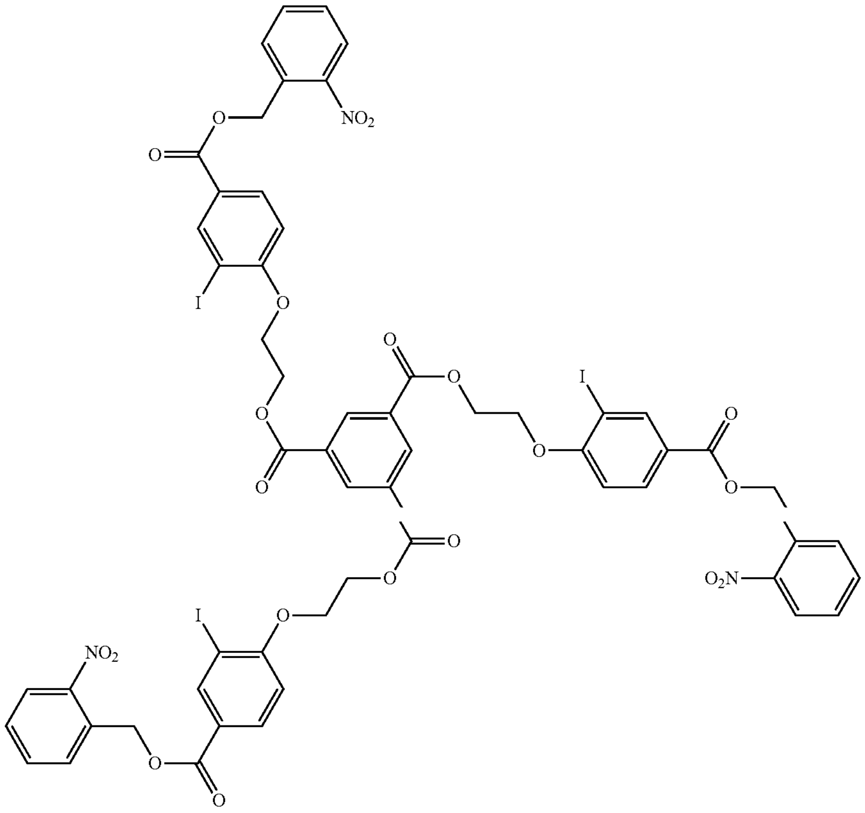

-continued
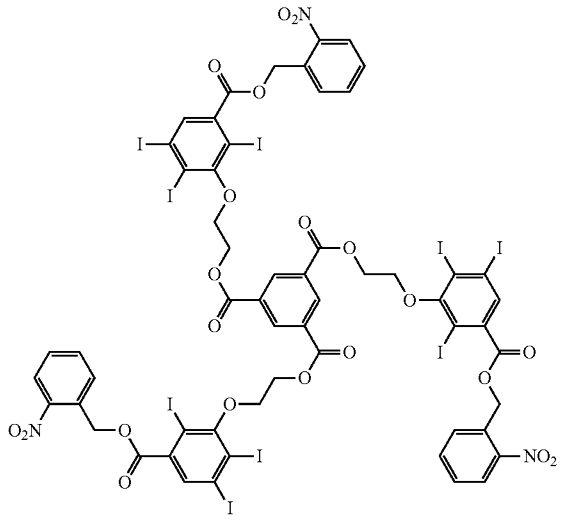
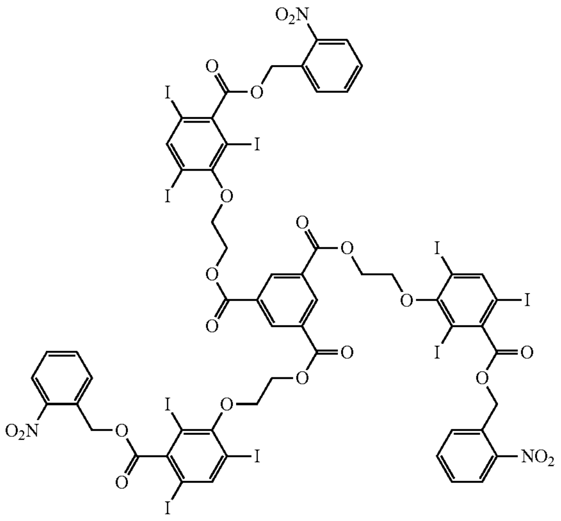
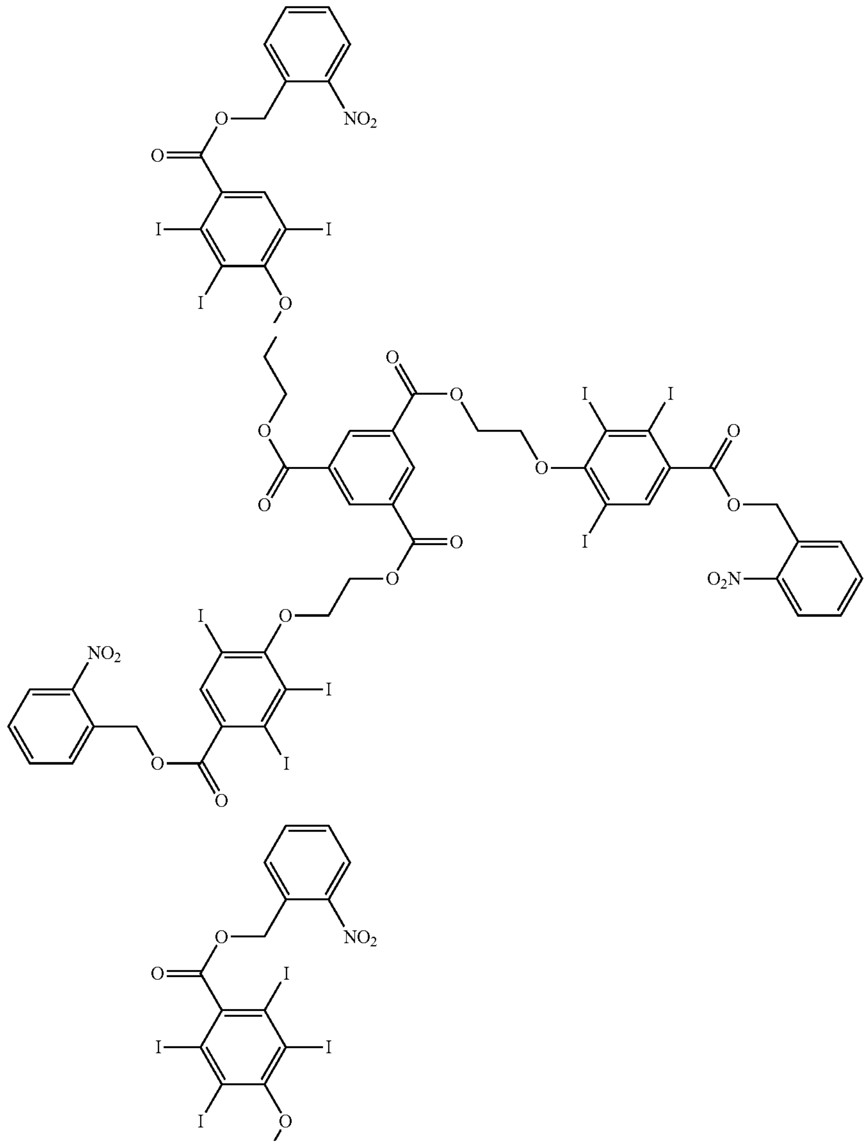

-continued

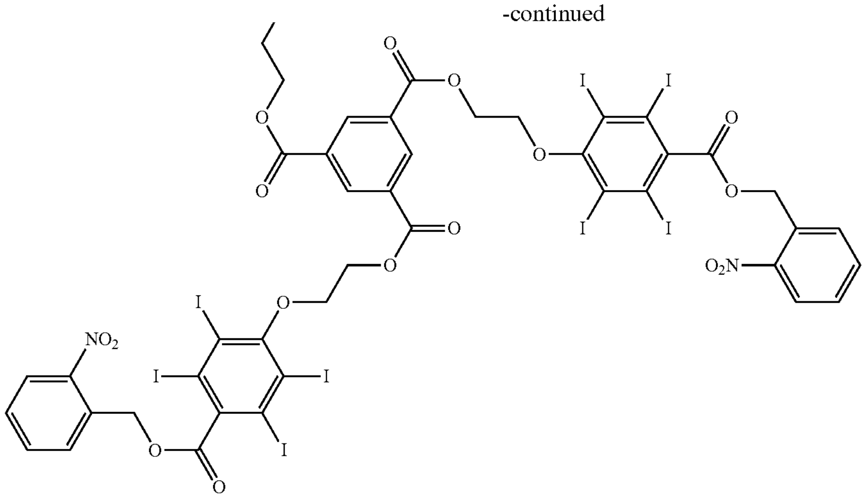

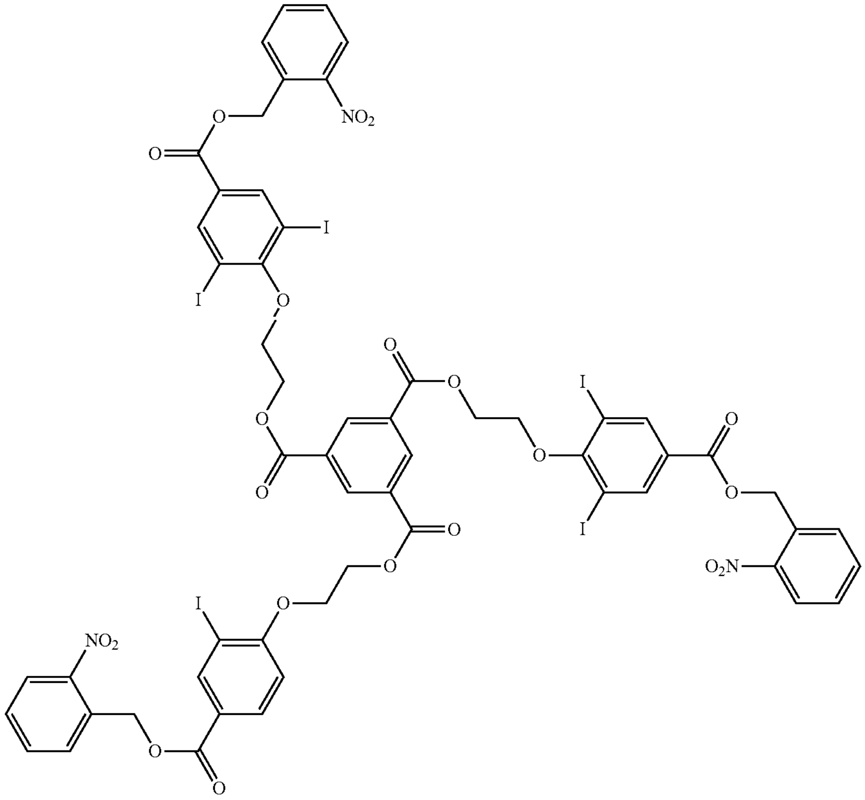 [SMILES: O=C(OCCOc1ccc(C(=O)OCc2ccccc2[N+](=O)[O-])cc1I)c1cc(C(=O)OCCOc2c(I)cc(C(=O)OCc3ccccc3[N+](=O)[O-])cc2I)cc(C(=O)OCCOc2c(I)cc(C(=O)OCc3ccccc3[N+](=O)[O-])cc2I)c1]

Base Polymer

The positive resist composition based on the nitrobenzyl ester compound may be either a molecular resist material not containing abase polymer or a resist material further comprising a base polymer.

The base polymer preferably comprises repeat units having a carboxy group whose hydrogen is substituted by an acid labile group, referred to as repeat units (a1), hereinafter and/or repeat units having a phenolic hydroxy group whose hydrogen is substituted by an acid labile group, referred to as repeat units (a2), hereinafter, for the purpose of enhancing dissolution contrast.

Typically, the repeat units (a1) have the formula (a1) and the repeat units (a2) has the formula (a2).

(a1)

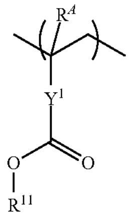

-continued (a2)

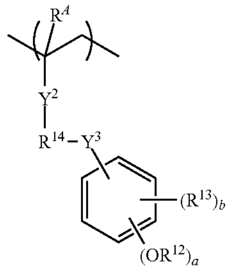

In formulae (a1) and (a2), $R^A$ is each independently hydrogen or methyl. $Y^1$ is a single bond, phenylene group, naphthylene group or a $C_1$-$C_{12}$ linking group containing at least one moiety selected from an ether bond, ester bond, and lactone ring. $Y^2$ is a single bond, ester bond or amide bond. $Y^3$ is a single bond, ether bond or ester bond. $R^{11}$ and $R^{12}$ are each independently an acid labile group. $R^{13}$ is fluorine, trifluoromethyl, cyano or a $C_1$-$C_6$ saturated hydrocarbyl group. $R^{14}$ is a single bond or a $C_1$-$C_6$ saturated hydrocarbylene group in which some —$CH_2$— may be replaced by an ether bond or ester bond. The subscript "a" is 1 or 2, "b" is an integer of 0 to 4, and a+b is from 1 to 5.

Examples of the monomer from which repeat units (a1) are derived are shown below, but not limited thereto. $R^A$ and $R^{11}$ are as defined above.

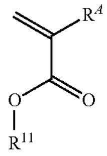

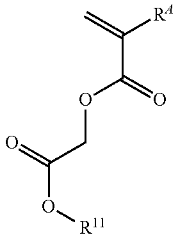

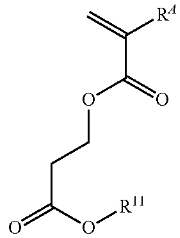

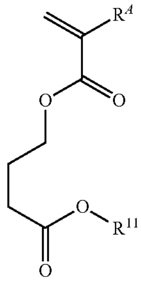

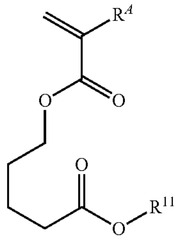

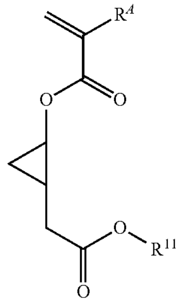

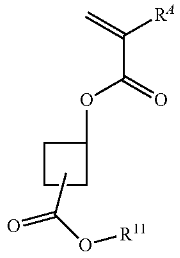

-continued

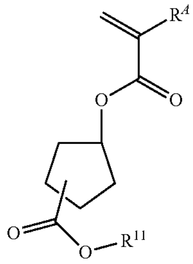

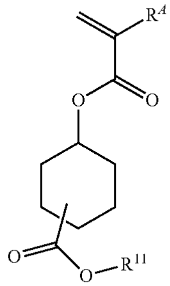

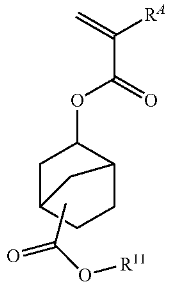

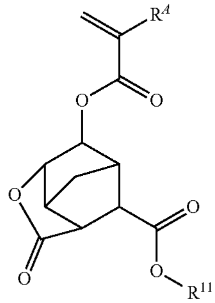

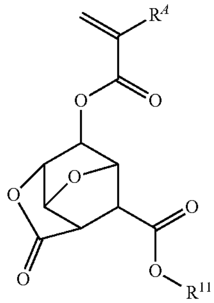

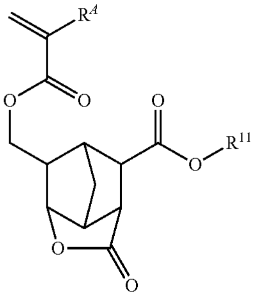

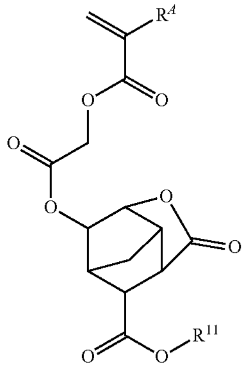

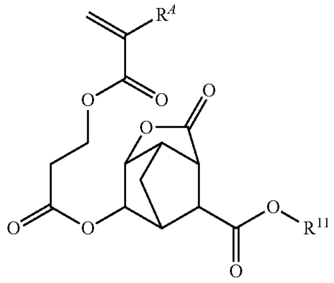

-continued
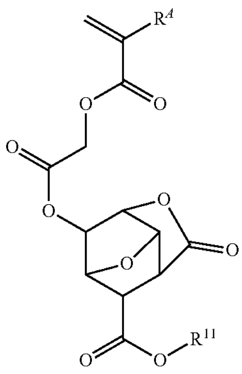
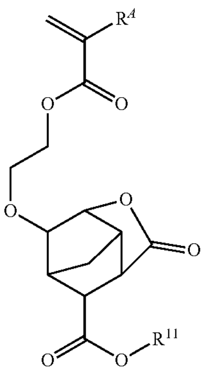
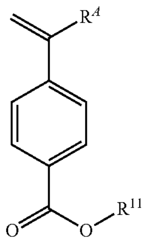
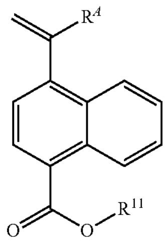
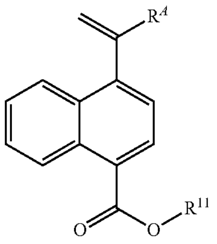
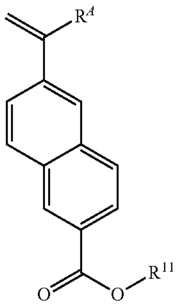
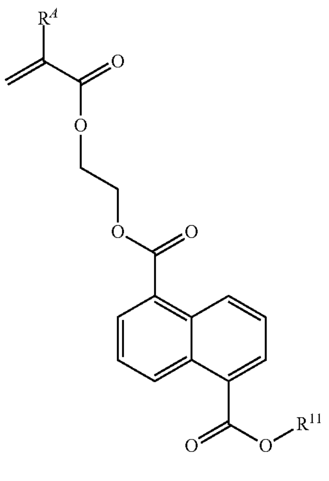
-continued
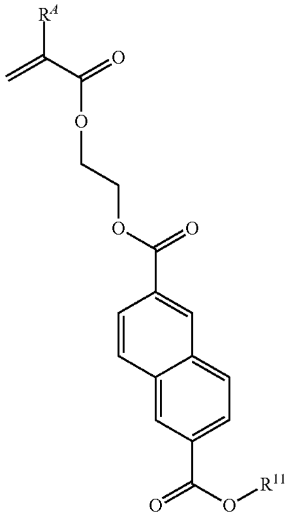
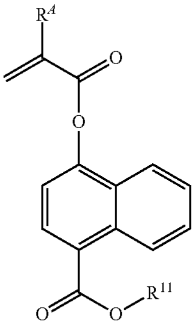
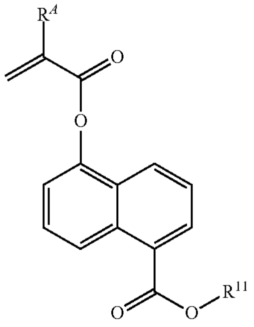
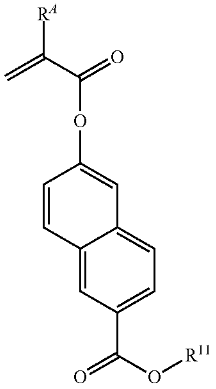
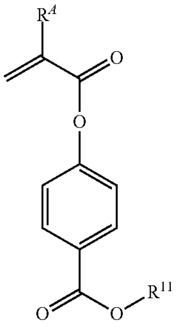
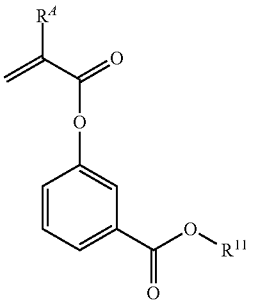
Examples of the monomer from which repeat units (a2) are derived are shown below, but not limited thereto. $R^A$ and $R^{12}$ are as defined above.

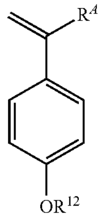
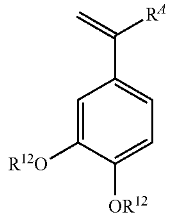
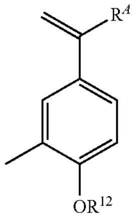
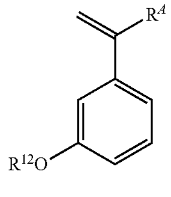
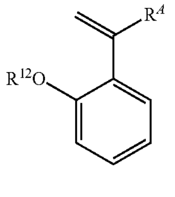
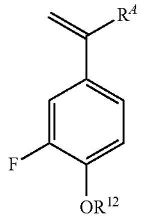
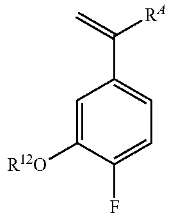
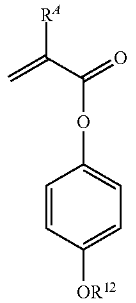
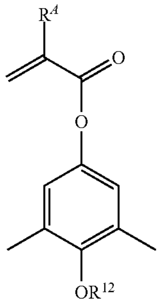
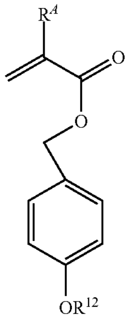
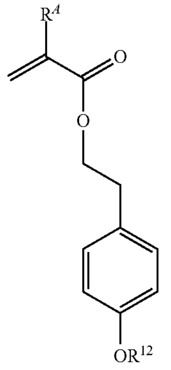
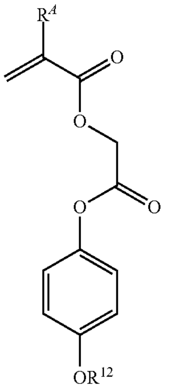

-continued

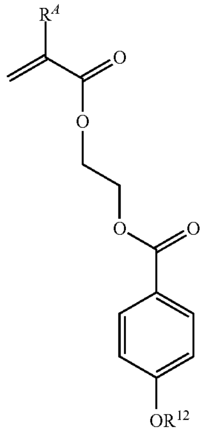
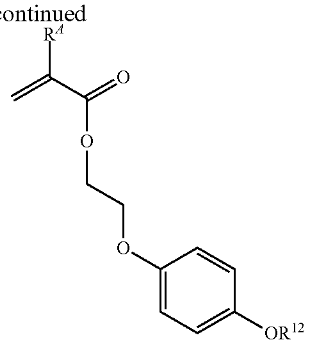

In formulae (a1) and (a2), $R^{11}$ and $R^{12}$ are each independently an acid labile group. The acid labile group may be selected from a variety of such groups, for example, groups having the following formulae (AL-1) to (AL-3).

(AL-1)

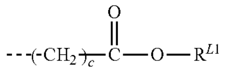

(AL-2)

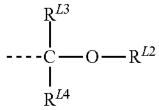

(AL-3)

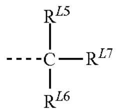

In formula (AL-1), "c" is an integer of 0 to 6. $R^{L1}$ is a $C_4$-$C_{20}$, preferably $C_4$-$C_{15}$ tertiary hydrocarbyl group, a trihydrocarbylsilyl group in which each hydrocarbyl moiety is a $C_1$-$C_6$ saturated hydrocarbyl moiety, a $C_4$-$C_{20}$ saturated hydrocarbyl group containing a carbonyl moiety, ether bond or ester bond, or a group having formula (AL-3). As used herein, the tertiary hydrocarbyl group refers to a group obtained from a tertiary hydrocarbon by eliminating the hydrogen atom on the tertiary carbon atom.

Of the groups represented by $R^{L1}$, the tertiary hydrocarbyl group may be saturated or unsaturated and branched or cyclic, and examples thereof include tert-butyl, tert-pentyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Examples of the trihydrocarbylsilyl group include trimethylsilyl, triethylsilyl and dimethyl-tert-butylsilyl. Examples of the saturated hydrocarbyl group containing a carbonyl moiety, ether bond or ester bond may be straight, branched or cyclic, preferably cyclic, and examples thereof include 3-oxocyclohexyl, 4-methyl-2-oxooxan-4-yl, 5-methyl-2-oxooxolan-5-yl, 2-tetrahydropyranyl and 2-tetrahydrofuranyl.

Examples of the acid labile group having formula (AL-1) include tert-butoxycarbonyl, tert-butoxycarbonylmethyl, tert-pentyloxycarbonyl, tert-pentyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Other examples of the acid labile group having formula (AL-1) include groups having the formulae (AL-1)-1 to (AL-1)-10.

(AL-1)-1

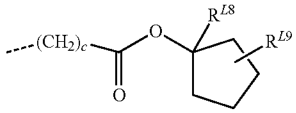

(AL-1)-2

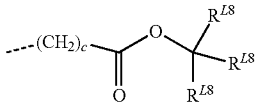

(AL-1)-3

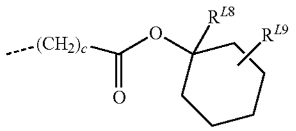

(AL-1)-4

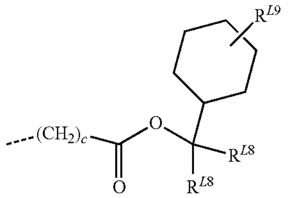

(AL-1)-5

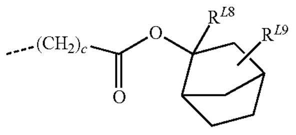

(AL-1)-6

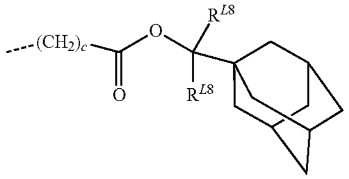

(AL-1)-7

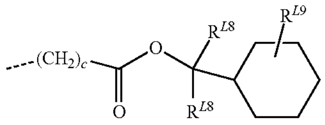

(AL-1)-8

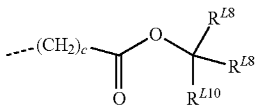

(AL-1)-9

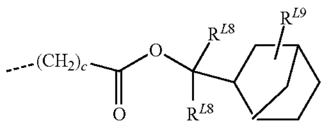

-continued (AL-1)-10

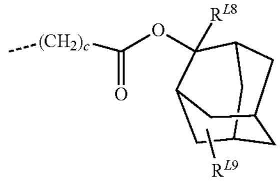

In formulae (AL-1)-1 to (AL-1)-10, "c" is as defined above. $R^{L8}$ is each independently a $C_1$-$C_{10}$ saturated hydrocarbyl group or $C_6$-$C_{20}$ aryl group. $R^{L9}$ is hydrogen or a $C_1$-$C_{10}$ saturated hydrocarbyl group. $R^{L10}$ is a $C_2$-$C_{10}$ saturated hydrocarbyl group or $C_6$-$C_{20}$ aryl group. The saturated hydrocarbyl group may be straight, branched or cyclic.

In formula (AL-2), $R^{L2}$ and $R^{L3}$ are each independently hydrogen or a $C_1$-$C_{18}$, preferably $C_1$-$C_{10}$ saturated hydrocarbyl group. The saturated hydrocarbyl group may be straight, branched or cyclic and examples thereof include methyl, ethyl, n-propyl, isopropyl, n-butyl, isobutyl, sec-butyl, tert-butyl, cyclopentyl, cyclohexyl, 2-ethylhexyl and n-octyl.

In formula (AL-2), $R^{L4}$ is a $C_1$-$C_{18}$, preferably $C_1$-$C_{10}$ hydrocarbyl group which may contain a heteroatom. The hydrocarbyl group may be saturated or unsaturated and straight, branched or cyclic. Inter alia, $C_1$-$C_{18}$ saturated hydrocarbyl groups are preferred, in which some hydrogen may be substituted by hydroxy, alkoxy, oxo, amino or alkylamino. Examples of the substituted saturated hydrocarbyl group are shown below.

$--(CH_2)_4OH$ $--(CH_2)_2O(CH_2)_3CH_3$

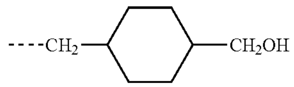 $--(CH_2)_2O(CH_2)_2OH$ $--(CH_2)_6OH$ 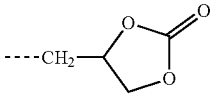

A pair of $R^{L2}$ and $R^{L3}$, $R^{L2}$ and $R^{L4}$, or $R^{L3}$ and $R^{L4}$ may bond together to form a ring with the carbon atom or carbon and oxygen atoms to which they are attached. $R^{L2}$ and $R^{L3}$, $R^{L2}$ and $R^{L4}$, or $R^{L3}$ and $R^{L4}$ which form a ring are each independently a $C_1$-$C_{18}$, preferably $C_1$-$C_{10}$ alkanediyl group. The ring thus formed is preferably of 3 to 10, more preferably 4 to 10 carbon atoms.

Of the acid labile groups having formula (AL-2), suitable straight or branched groups include those having formulae (AL-2)-1 to (AL-2)-69, but are not limited thereto.

(AL-2)-1

$----CH_2—O—CH_3$ (AL-2)-2

$----CH_2—O—CH_2—CH_3$ (AL-2)-3

$----CH_2—O—(CH_2)_2—CH_3$ (AL-2)-4

$----CH_2—O—(CH_2)_3—CH_3$ (AL-2)-5

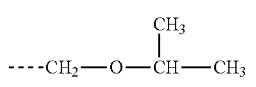

-continued
(AL-2)-6
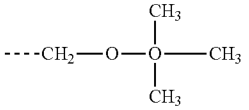
(AL-2)-7
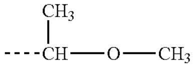
(AL-2)-8
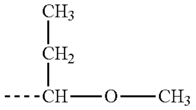
(AL-2)-9
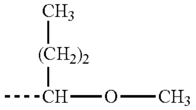
(AL-2)-10
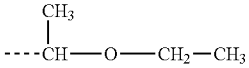
(AL-2)-11
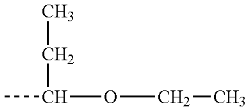
(AL-2)-12
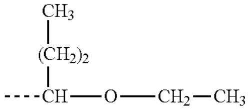
(AL-2)-13
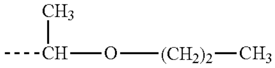
(AL-2)-14
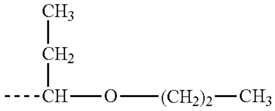
(AL-2)-15
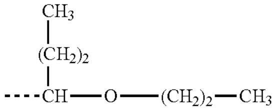
(AL-2)-16
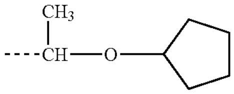
(AL-2)-17
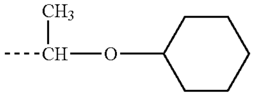
(AL-2)-18
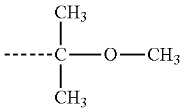
(AL-2)-19
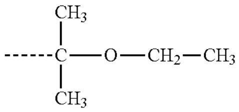
-continued
(AL-2)-20
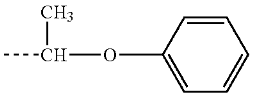
(AL-2)-21
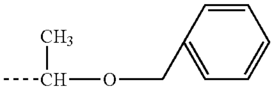
(AL-2)-22
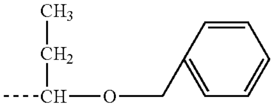
(AL-2)-23
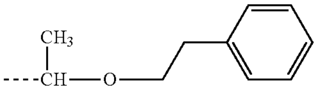
(AL-2)-24
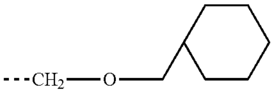
(AL-2)-25
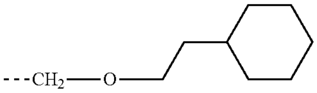
(AL-2)-26
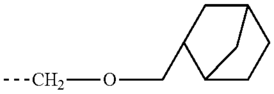
(AL-2)-27
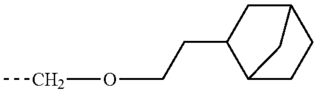
(AL-2)-28
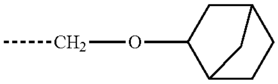
(AL-2)-29
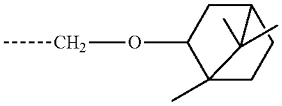
(AL-2)-30
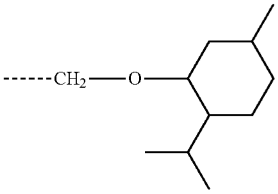
(AL-2)-31
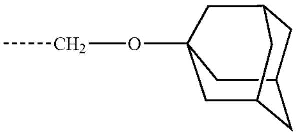
(AL-2)-32
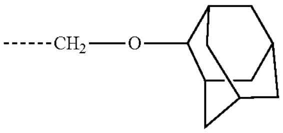

-continued
(AL-2)-33
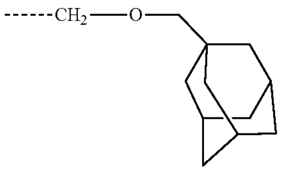
(AL-2)-34
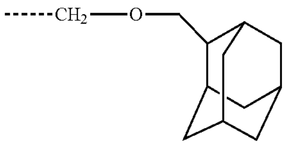
(AL-2)-35
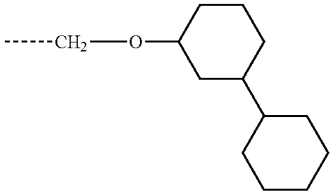
(AL-2)-36
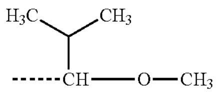
(AL-2)-37
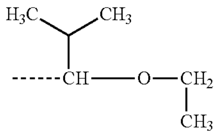
(AL-2)-38
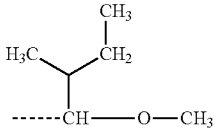
(AL-2)-39
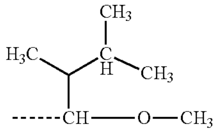
(AL-2)-40
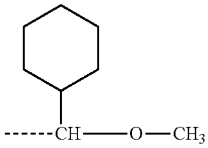
(AL-2)-41
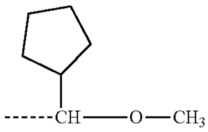
(AL-2)-42
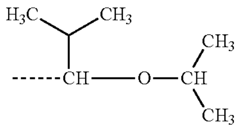
-continued
(AL-2)-43
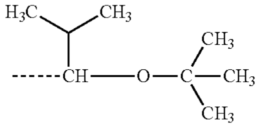
(AL-2)44
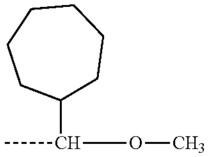
(AL-2)-45
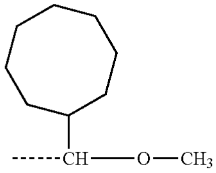
(AL-2)-46
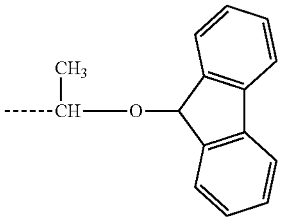
(AL-2)-47
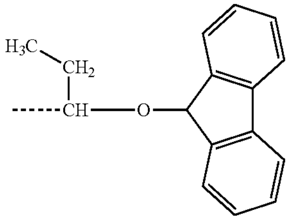
(AL-2)-48
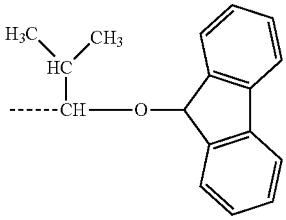
(AL-2)-49
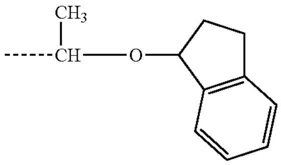
(AL-2)-50
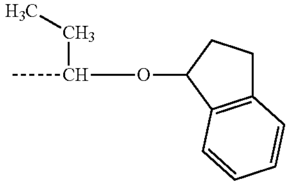

-continued
(AL-2)-51
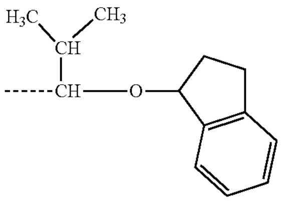
(AL-2)-52
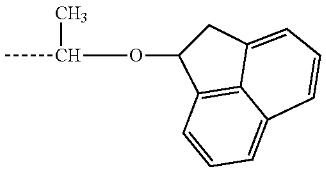
(AL-2)-53
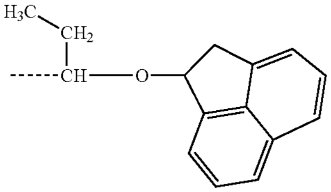
(AL-2)-54
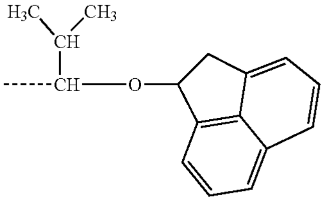
(AL-2)-55
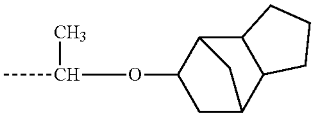
(AL-2)-56
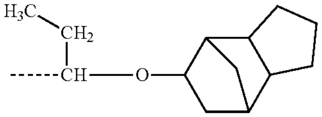
(AL-2)-57
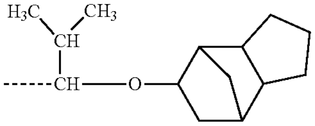
(AL-2)-58
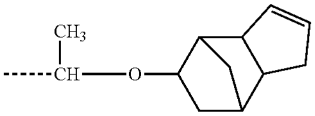
(AL-2)-59
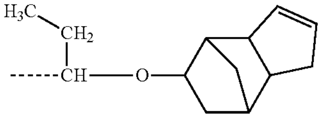
(AL-2)-60
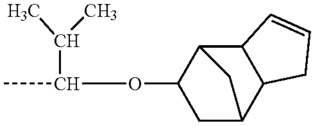
-continued
(AL-2)-61
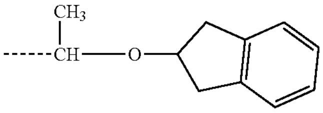
(AL-2)-62
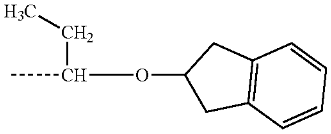
(AL-2)-63
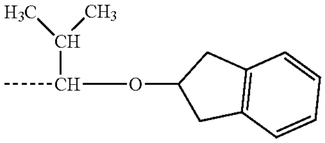
(AL-2)-64
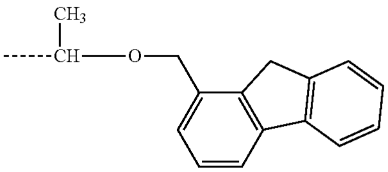
(AL-2)-65
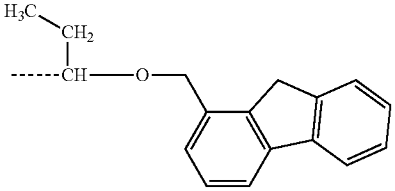
(AL-2)-66
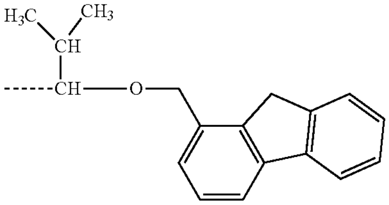
(AL-2)-67
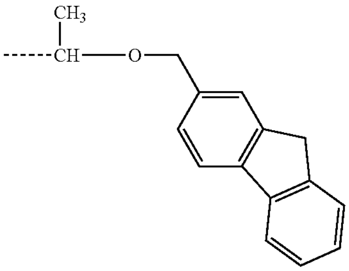
(AL-2)-68
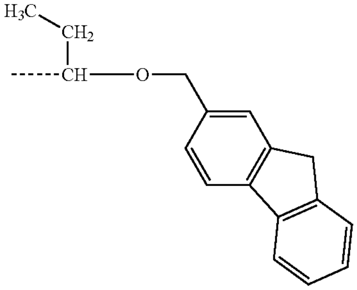

-continued (AL-2)-69

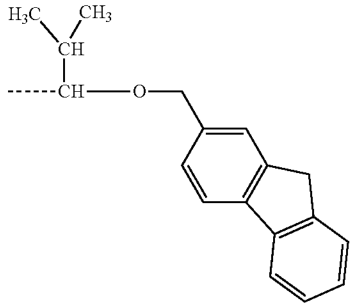

Of the acid labile groups having formula (AL-2), suitable cyclic groups include tetrahydrofuran-2-yl, 2-methyltetrahydrofuran-2-yl, tetrahydropyran-2-yl, and 2-methyltetrahydropyran-2-yl.

Also included are acid labile groups having the following formulae (AL-2a) and (AL-2b). With these acid labile groups, the base polymer may be crosslinked within the molecule or between molecules.

(AL-2a)

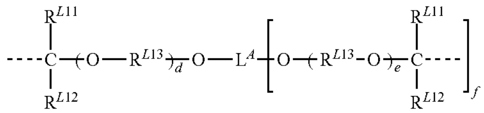

(AL-2b)

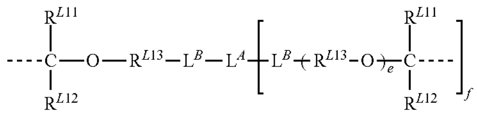

In formulae (AL-2a) and (AL-2b), $R^{L11}$ and $R^{L12}$ are each independently hydrogen or a $C_1$-$C_8$ saturated hydrocarbyl group which may be straight, branched or cyclic. Also, $R^{L11}$ and $R^{L12}$ may bond together to form a ring with the carbon atom to which they are attached, and in this case, $R^{L11}$ and $R^{L12}$ are each independently a $C_1$-$C_8$ alkanediyl group. $R^{L13}$ is each independently a $C_1$-$C_{10}$ saturated hydrocarbylene group which may be straight, branched or cyclic. The subscripts d and e are each independently an integer of 0 to 10, preferably 0 to 5, and f is an integer of 1 to 7, preferably 1 to 3.

In formulae (AL-2a) and (AL-2b), $L^A$ is a $C_1$-$C_{50}$ (f+1)-valent aliphatic saturated hydrocarbon group, $C_3$-$C_{50}$ (f+1)-valent alicyclic saturated hydrocarbon group, $C_6$-$C_{50}$ (f+1)-valent aromatic hydrocarbon group or $C_3$-$C_{50}$ (f+1)-valent heterocyclic group. In these groups, some constituent $—CH_2—$ may be replaced by a heteroatom-containing moiety, or some carbon-bonded hydrogen may be substituted by a hydroxy, carboxy, acyl moiety or fluorine. $L^A$ is preferably a $C_1$-$C_{20}$ saturated hydrocarbon group (e.g., saturated hydrocarbylene group, trivalent saturated hydrocarbon group or tetravalent saturated hydrocarbon group), or $C_6$-$C_{30}$ arylene group. The saturated hydrocarbon group may be straight, branched or cyclic. $L^B$ is —C(═O)—O—, —N(H)—C(═O)—O— or —N(H)—C(═O)—N(H)—.

Examples of the crosslinking acetal groups having formulae (AL-2a) and (AL-2b) include groups having the formulae (AL-2)-70 to (AL-2)-77.

(AL-2)-70

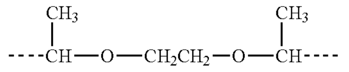

(AL-2)-71

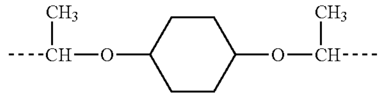

(AL-2)-72

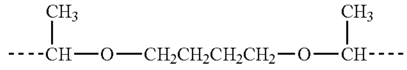

(AL-2)-73

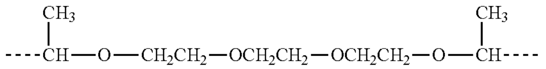

(AL-2)-74

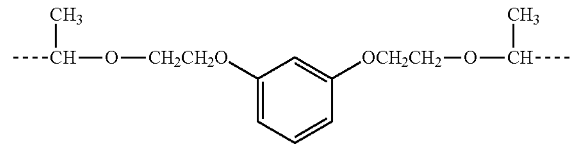

(AL-2)-75

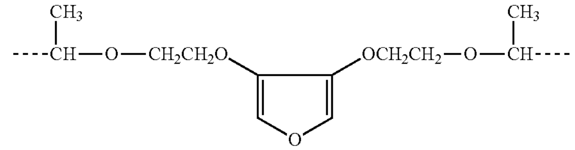

(AL-2)-76

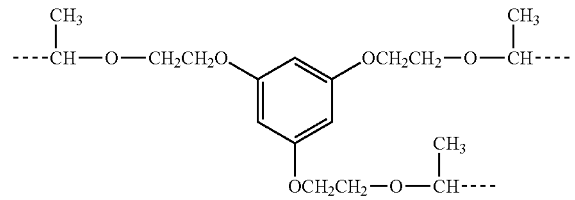

(AL-2)-77

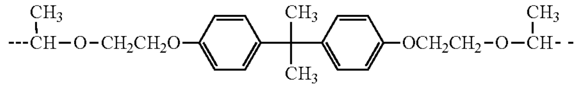

In formula (AL-3), $R^{L5}$, $R^{L6}$ and $R^{L7}$ are each independently a $C_1$-$C_{20}$ hydrocarbyl group which may contain a heteroatom such as oxygen, sulfur, nitrogen or fluorine. The hydrocarbyl group may be saturated or unsaturated and straight, branched or cyclic and examples thereof include $C_1$-$C_{20}$ alkyl groups, $C_3$-$C_{20}$ cyclic saturated hydrocarbyl groups, $C_2$-$C_{20}$ alkenyl groups, $C_3$-$C_{20}$ cyclic unsaturated hydrocarbyl groups, and $C_6$-$C_{10}$ aryl groups. A pair of $R^{L5}$ and $R^{L6}$, $R^{L5}$ and $R^{L7}$, or $R^{L6}$ and $R^{L7}$ may bond together to form a $C_3$-$C_{20}$ aliphatic ring with the carbon atom to which they are attached.

Examples of the group having formula (AL-3) include tert-butyl, 1,1-diethylpropyl, 1-ethylnorbornyl, 1-methylcyclopentyl, 1-ethylcyclopentyl, 1-isopropylcyclopentyl, 1-methylcyclohexyl, 2-(2-methyl)adamantyl, 2-(2-ethyl)adamantyl, and tert-pentyl.

Examples of the group having formula (AL-3) also include groups having the formulae (AL-3)-1 to (AL-3)-19.

(AL-3)-1
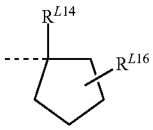
(AL-3)-2
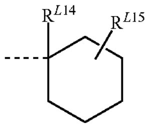
(AL-3)-3
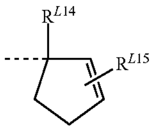
(AL-3)-4
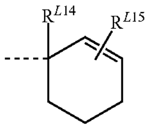
(AL-3)-5
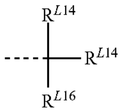
(AL-3)-6
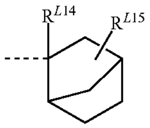
(AL-3)-7
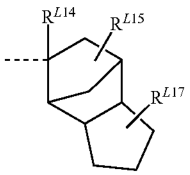
(AL-3)-8
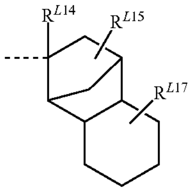
(AL-3)-9
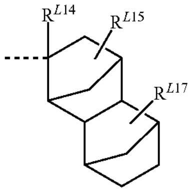
(AL-3)-10
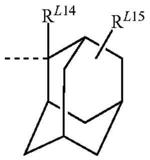
-continued
(AL-3)-11
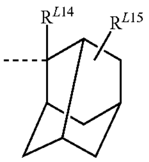
(AL-3)-12
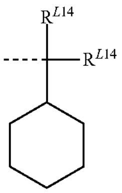
(AL-3)-13
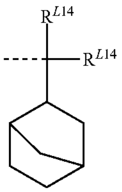
(AL-3)-14
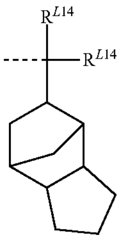
(AL-3)-15
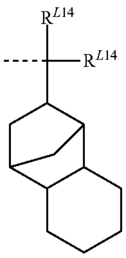
(AL-3)-16
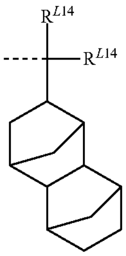
(AL-3)-17
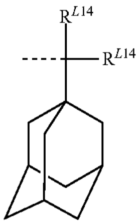

-continued (AL-3)-18

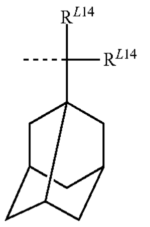

(AL-3)-19

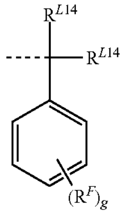

In formulae (AL-3)-1 to (AL-3)-19, $R^{L14}$ is each independently a $C_1$-$C_8$ saturated hydrocarbyl group or $C_6$-$C_{20}$ aryl group. $R^{L15}$ and $R^{L17}$ are each independently hydrogen or a $C_1$-$C_{20}$ saturated hydrocarbyl group. $R^{L16}$ is a $C_6$-$C_{20}$ aryl group. The saturated hydrocarbyl group may be straight, branched or cyclic. Typical of the aryl group is phenyl. $R^F$ is fluorine or trifluoromethyl, and g is an integer of 1 to 5.

Other examples of the group having formula (AL-3) include groups having the formulae (AL-3)-20 and (AL-3)-21. With these acid labile groups, the base polymer may be crosslinked within the molecule or between molecules.

(AL-3)-20

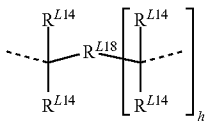

(AL-3)-21

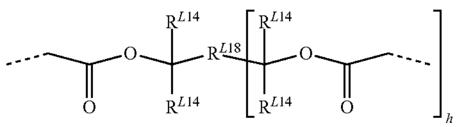

In formulae (AL-3)-20 and (AL-3)-21, $R^{L14}$ is as defined above. $R^{L18}$ is a $C_1$-$C_{20}$ (h+1)-valent saturated hydrocarbylene group or $C_6$-$C_{20}$ (h+1)-valent arylene group, which may contain a heteroatom such as oxygen, sulfur or nitrogen. The saturated hydrocarbylene group may be straight, branched or cyclic, and h is an integer of 1 to 3.

Examples of the monomer from which repeat units containing an acid labile group of formula (AL-3) are derived include (meth)acrylates (inclusive of exo-form structure) having the formula (AL-3)-22.

(AL-3)-22

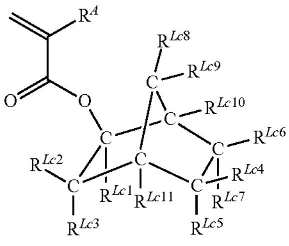

In formula (AL-3)-22, $R^A$ is as defined above. $R^{Lc1}$ is a $C_1$-$C_8$ saturated hydrocarbyl group or an optionally substituted $C_6$-$C_{20}$ aryl group; the saturated hydrocarbyl group may be straight, branched or cyclic. $R^{Lc2}$ to $R^{Lc11}$ are each independently hydrogen or a $C_1$-$C_{15}$ hydrocarbyl group which may contain a heteroatom; oxygen is a typical heteroatom. Suitable hydrocarbyl groups include $C_1$-$C_{15}$ alkyl groups and $C_6$-$C_{15}$ aryl groups. Alternatively, a pair of $R^{Lc2}$ and $R^{Lc3}$, $R^{Lc4}$ and $R^{Lc6}$, $R^{Lc4}$ and $R^{Lc7}$, $R^{Lc5}$ and $R^{Lc7}$, $R^{Lc8}$ and $R^{Lc11}$, $R^{Lc6}$ and $R^{Lc10}$, $R^{Lc8}$ and $R^{Lc9}$, or $R^{Lc9}$ and $R^{Lc10}$, taken together, may form a ring with the carbon atom to which they are attached, and in this event, the ring-forming group is a $C_1$-$C_{15}$ hydrocarbylene group which may contain a heteroatom. Also, a pair of $R^{Lc2}$ and $R^{Lc11}$, $R^{Lc8}$ and $R^{Lc11}$, or $R^{Lc4}$ and $R^{Lc6}$ which are attached to vicinal carbon atoms may bond together directly to form a double bond. The formula also represents an enantiomer.

Examples of the monomer having formula (AL-3)-22 are described in U.S. Pat. No. 6,448,420 (JP-A 2000-327633). Illustrative non-limiting examples of suitable monomers are given below. $R^A$ is as defined above.

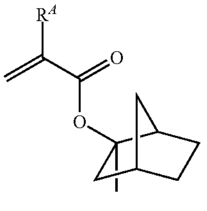

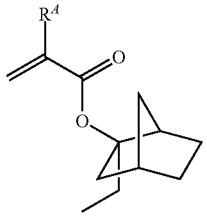

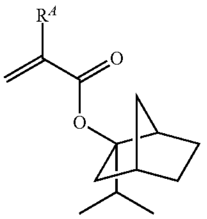

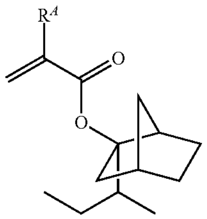

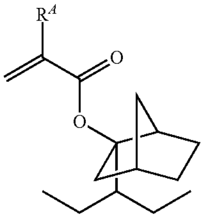

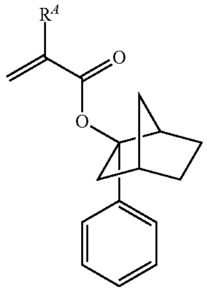

-continued

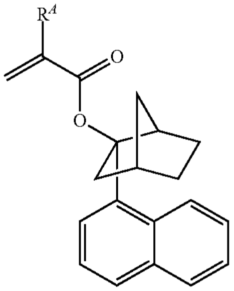

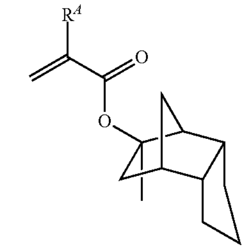

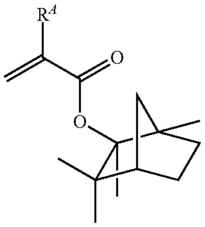

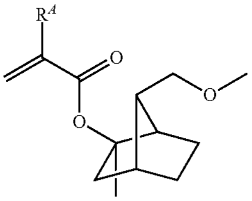

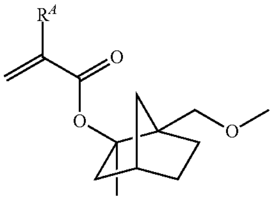

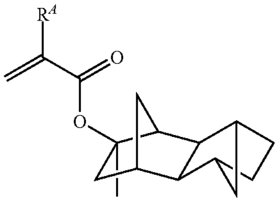

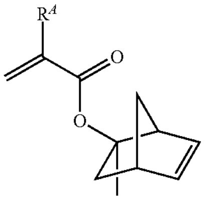

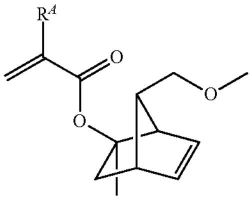

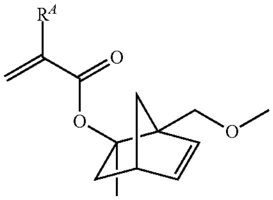

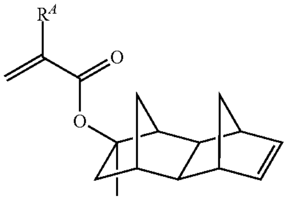

-continued

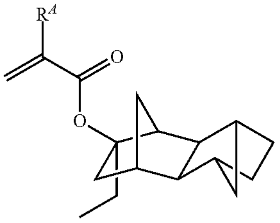

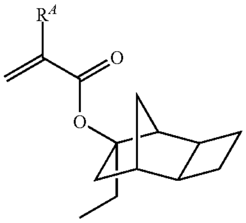

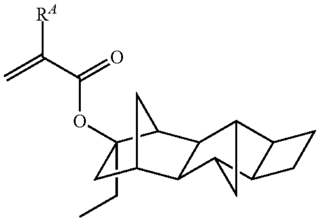

Also included in the repeat units having an acid labile group of formula (AL-3) are repeat units of (meth)acrylate having a furandiyl, tetrahydrofurandiol or oxanorbornanediyl group as represented by the following formula (AL-3)-23.

(AL-3)-23

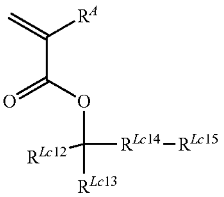

In formula (AL-3)-23, $R^A$ is as defined above. $R^{Lc12}$ and $R^{Lc13}$ are each independently a $C_1$-$C_{10}$ hydrocarbyl group, or $R^{Lc12}$ and $R^{Lc13}$, taken together, may form an aliphatic ring with the carbon atom to which they are attached. $R^{Lc14}$ is furandiyl, tetrahydrofurandiyl or oxanorbornanediyl. $R^{Lc15}$ is hydrogen or a $C_1$-$C_{10}$ hydrocarbyl group which may contain a heteroatom. The hydrocarbyl group may be straight, branched or cyclic, and examples thereof include $C_1$-$C_{10}$ saturated hydrocarbyl groups.

Examples of the monomer having formula (AL-3)-23 are shown below, but not limited thereto. Herein $R^A$ is as defined above.

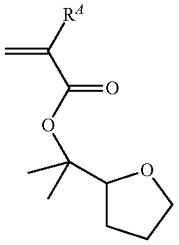
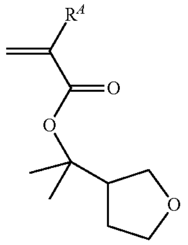
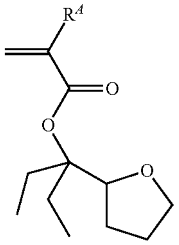
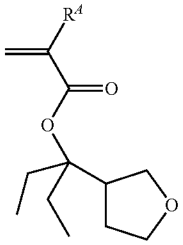
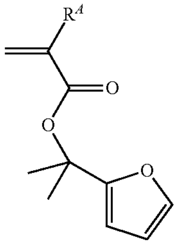
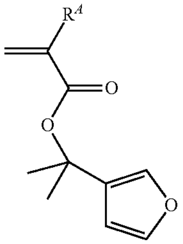
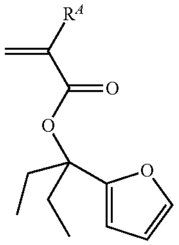
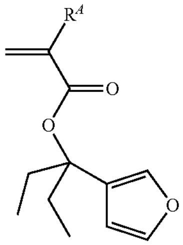
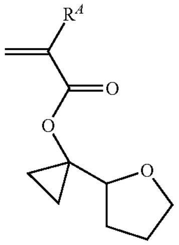
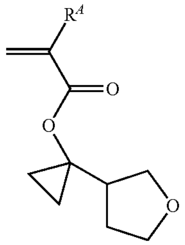
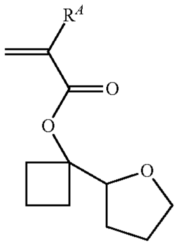
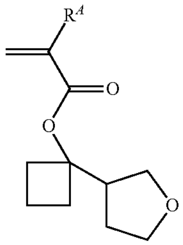
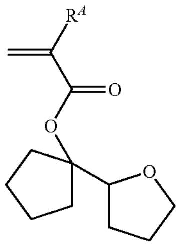
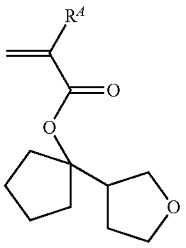
-continued
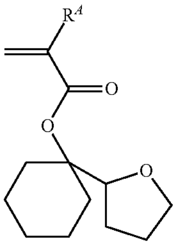
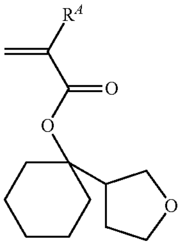
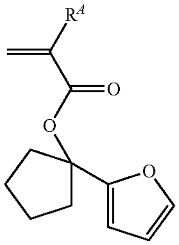
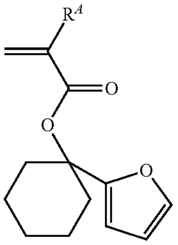
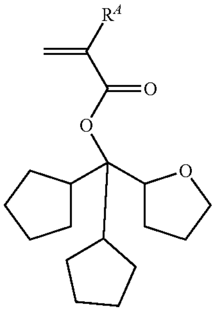
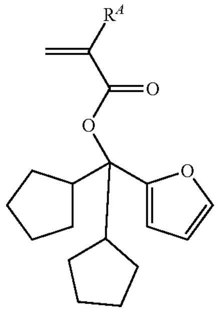
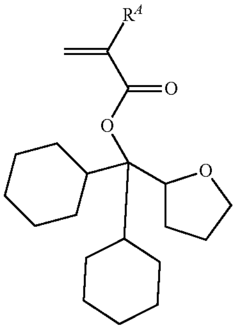
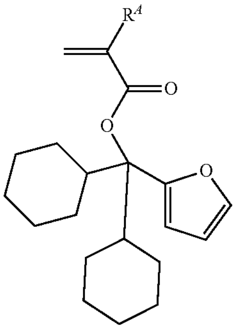
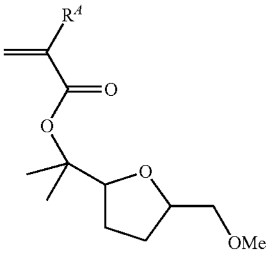

-continued
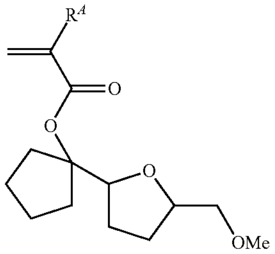
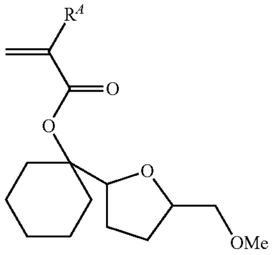
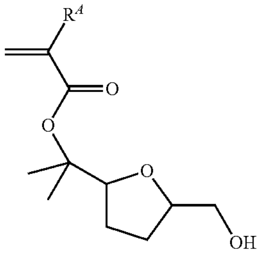
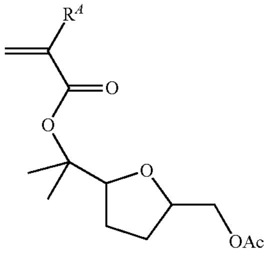
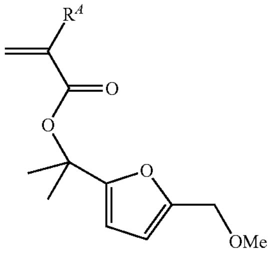
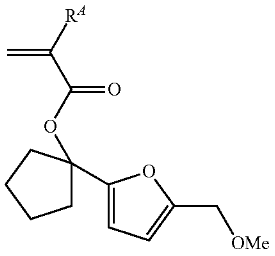
-continued
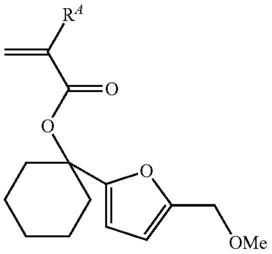
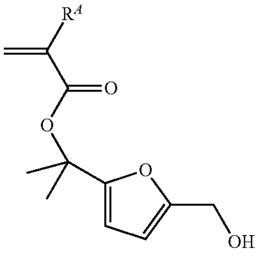
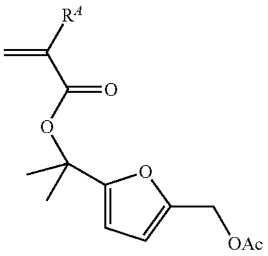
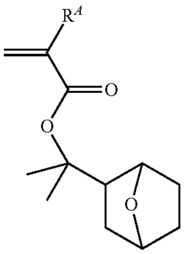
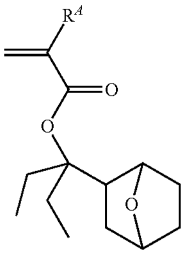
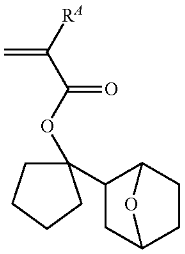
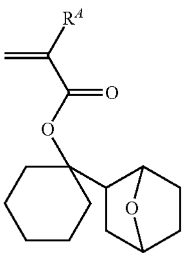
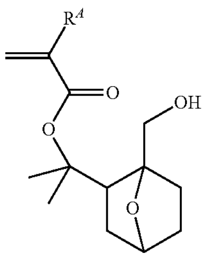

-continued

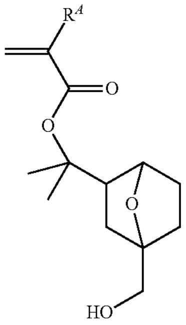
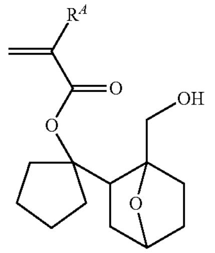
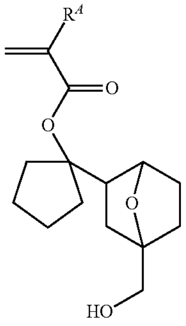
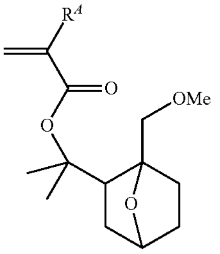
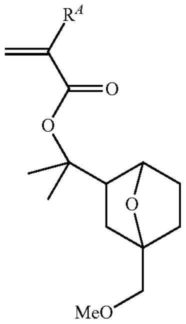
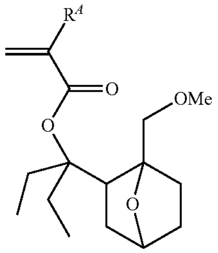
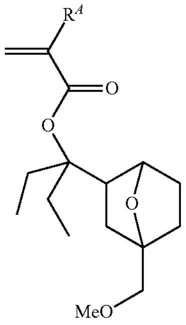
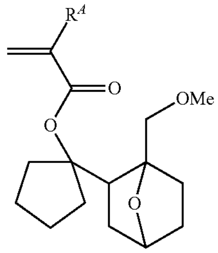
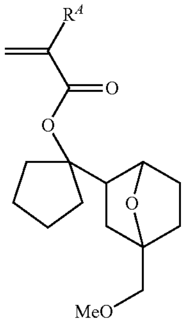
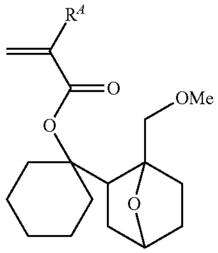

-continued

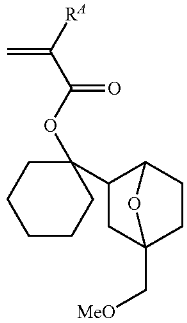
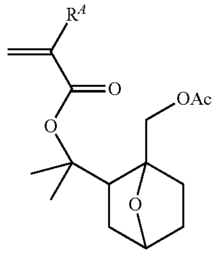
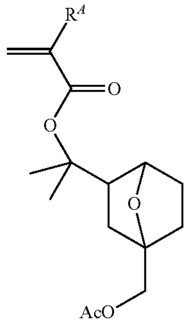
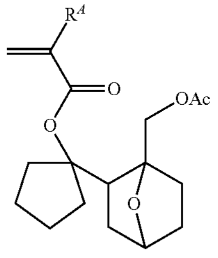
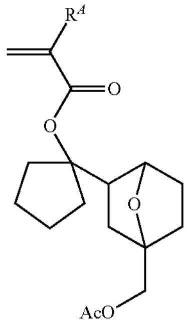

The base polymer may further comprise repeat units (b) having an adhesive group. The adhesive group is selected from hydroxy, carboxy, lactone ring, carbonate bond, thiocarbonate bond, carbonyl, cyclic acetal, ether bond, ester bond, sulfonic ester bond, cyano, amide bond, —O—C(═O)—S— and —O—C(═O)—N(H)—.

Examples of the monomer from which repeat units (b) are derived are given below, but not limited thereto. Herein $R^A$ is as defined above.

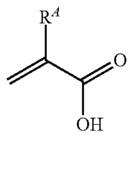
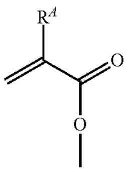
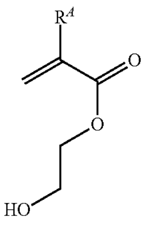

-continued
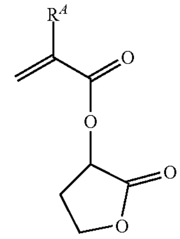
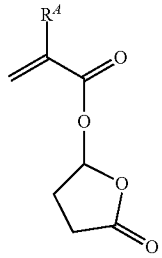
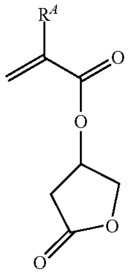
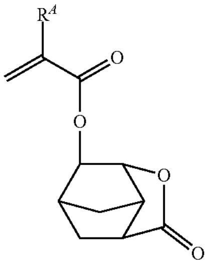
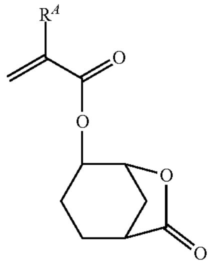
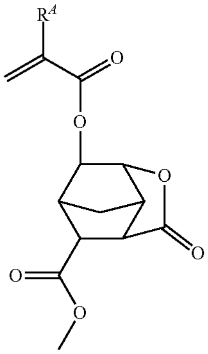
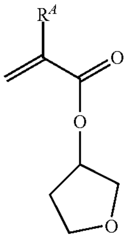
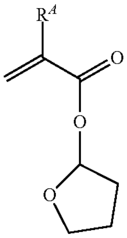
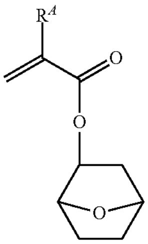
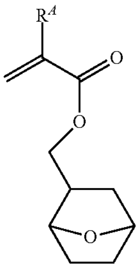
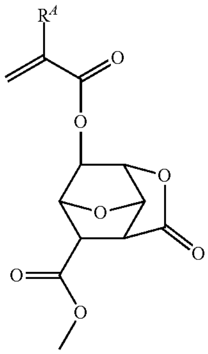
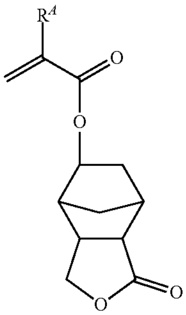
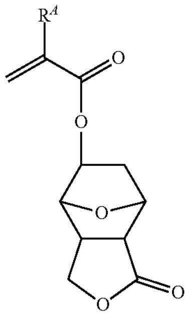
-continued
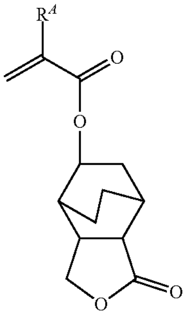
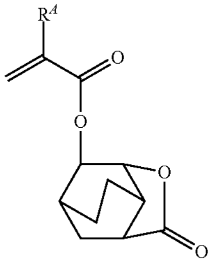
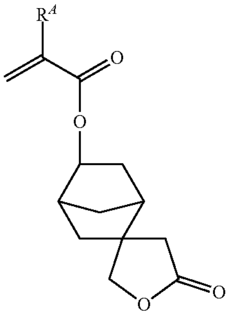
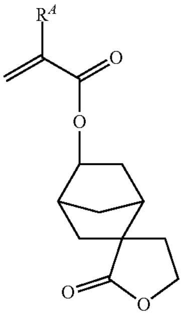
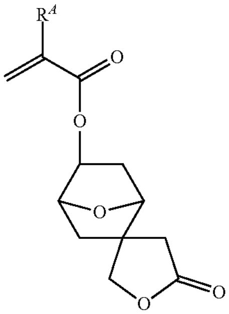
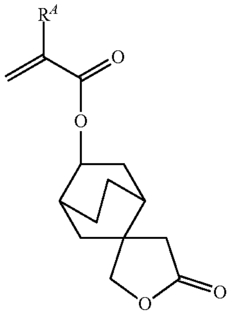
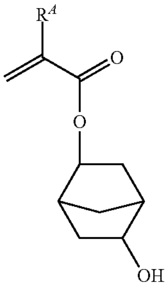
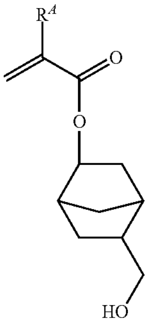
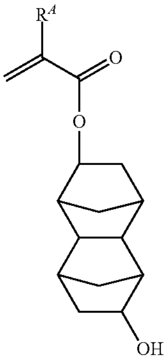
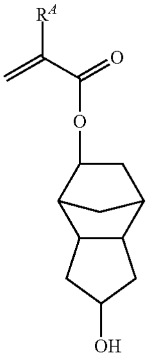
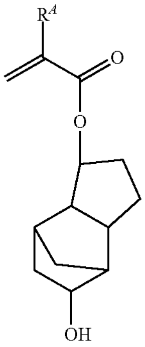
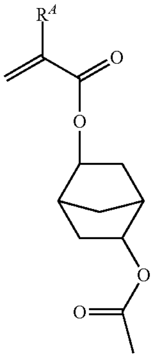

-continued
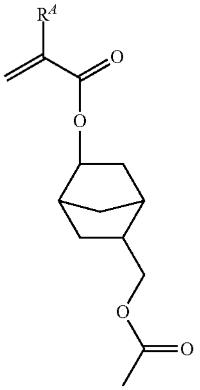
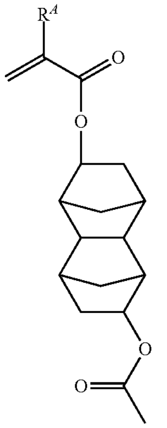
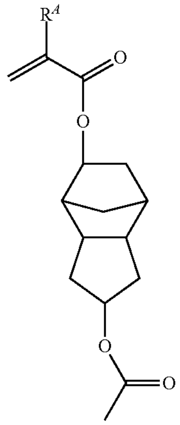
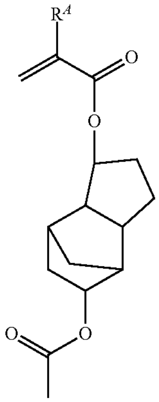
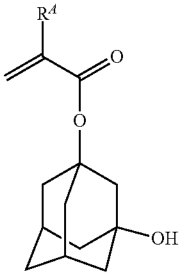
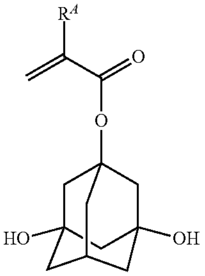
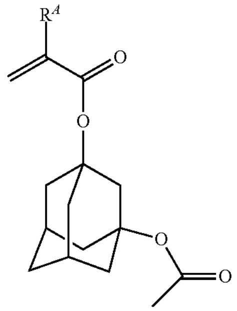
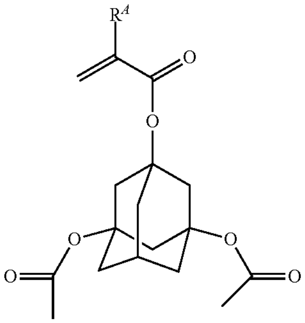
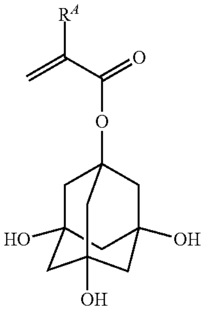
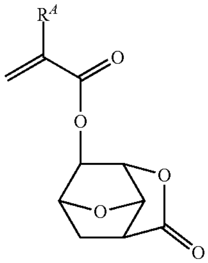
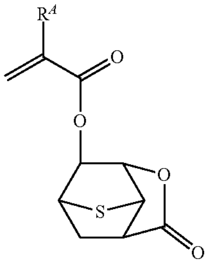
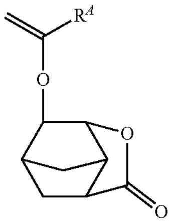
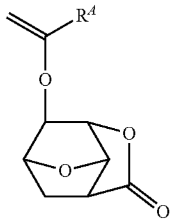
-continued
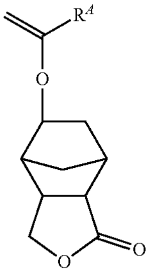
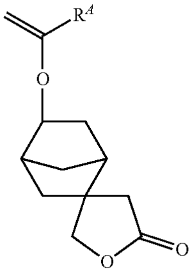
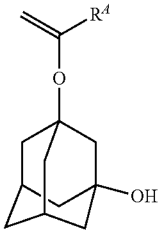
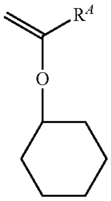
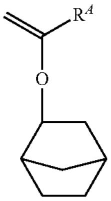
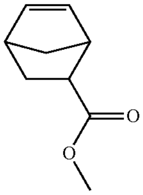
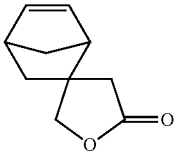
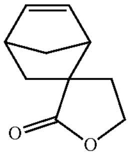
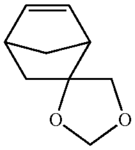
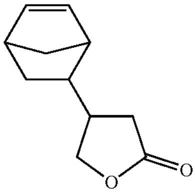
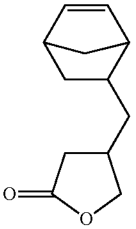
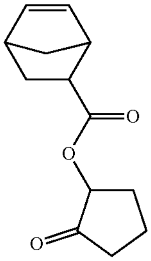
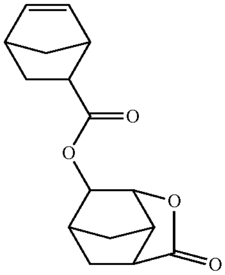
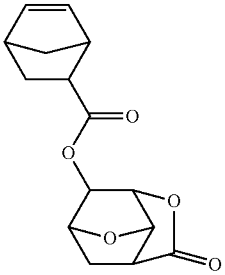
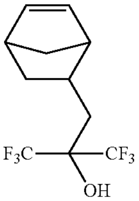
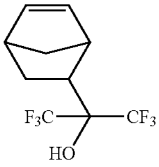
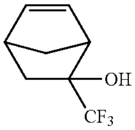
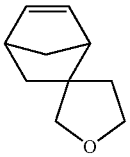
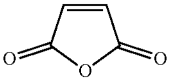
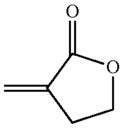
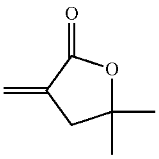
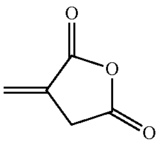
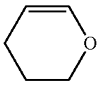

-continued
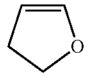
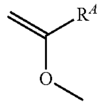
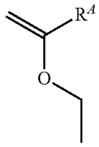
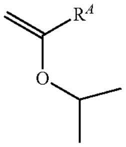
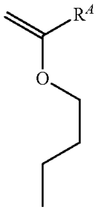
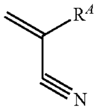
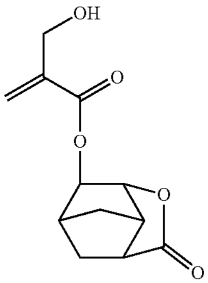
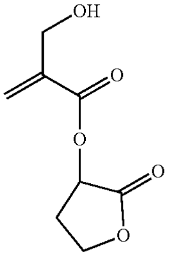
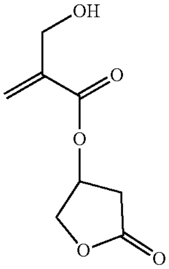
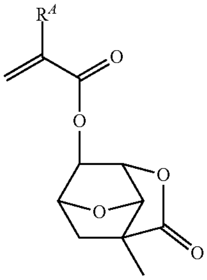
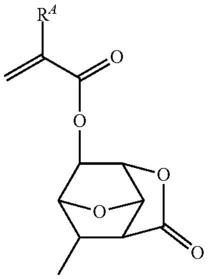
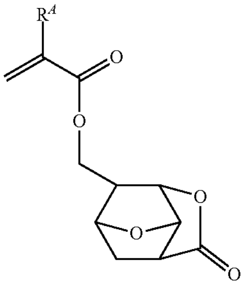
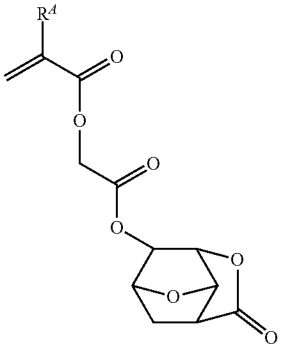
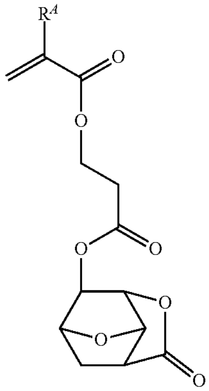
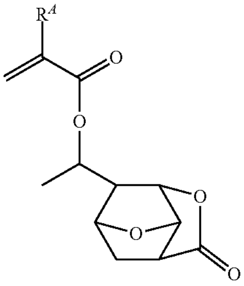
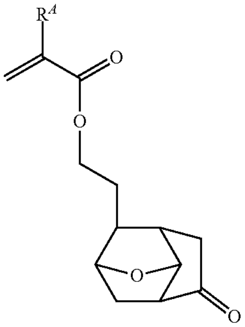
-continued
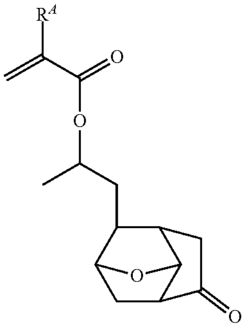
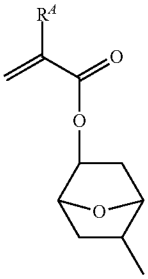
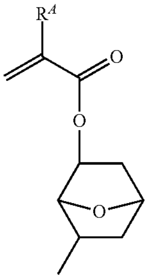
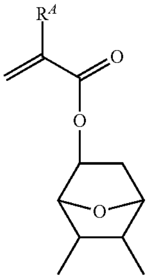
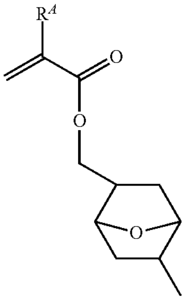
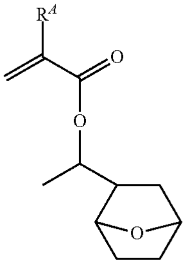
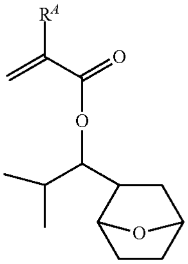
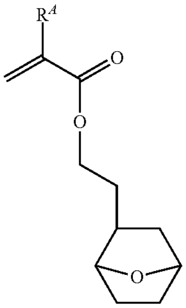
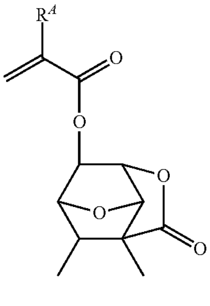
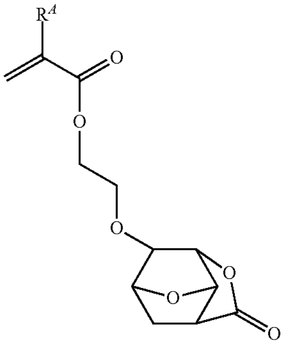
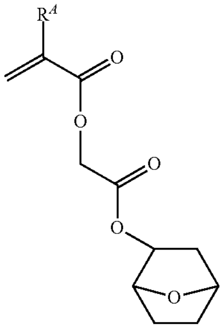

-continued
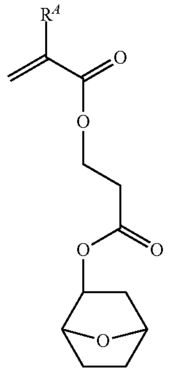
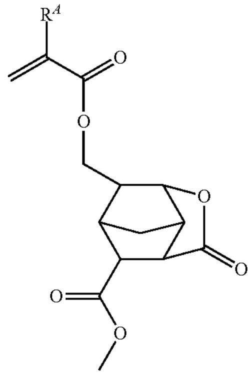
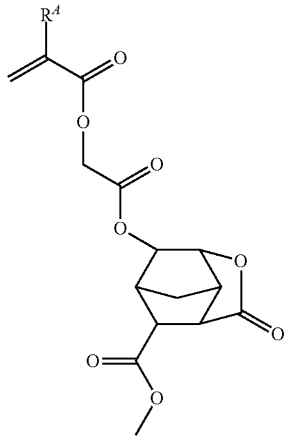
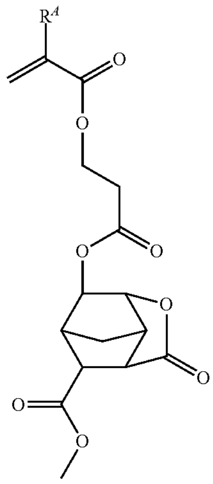
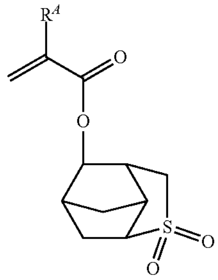
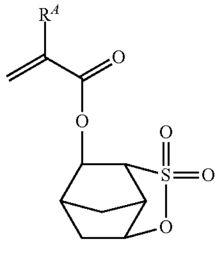
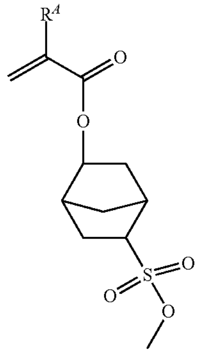
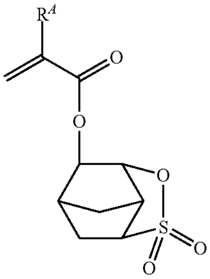
-continued
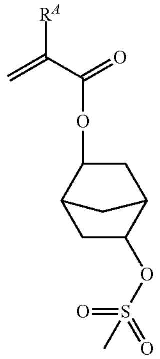
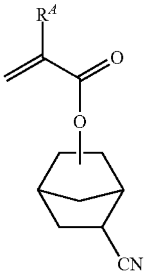
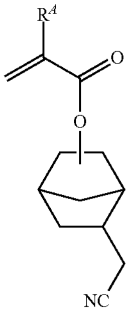
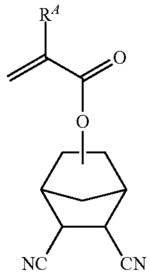
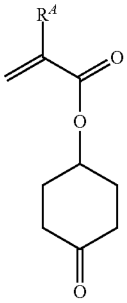
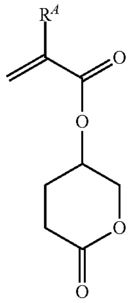
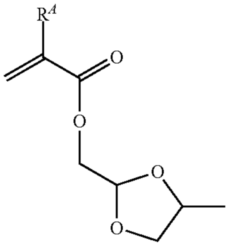
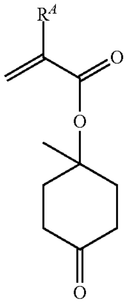
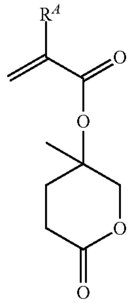
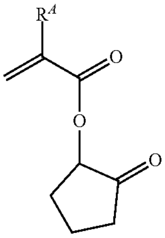
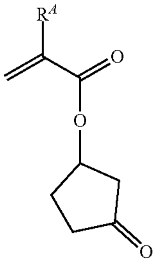
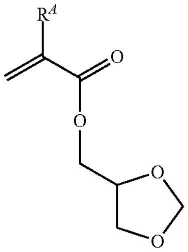
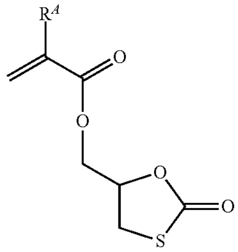
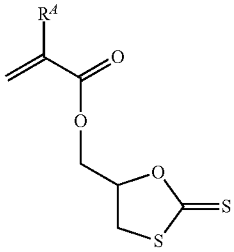

-continued
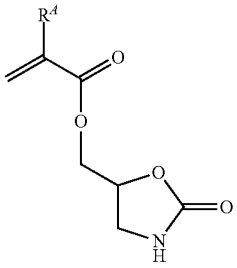
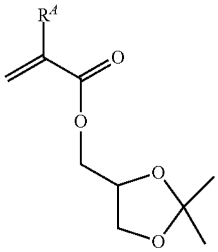
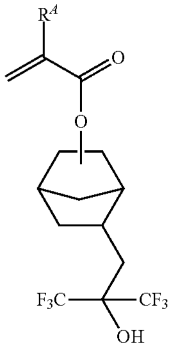
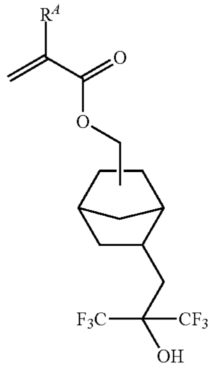
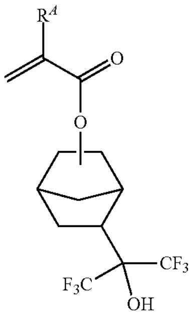
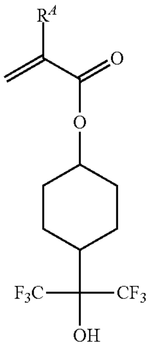
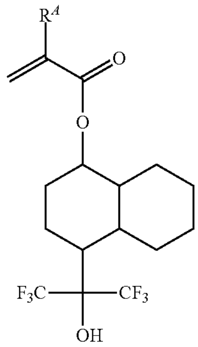
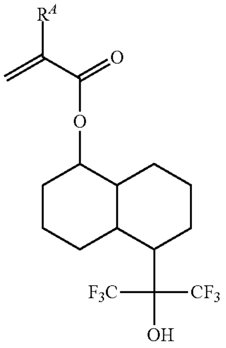
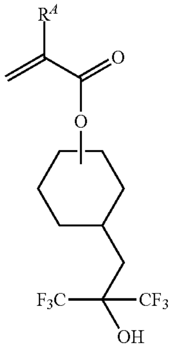
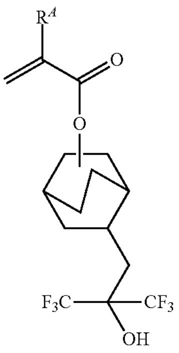
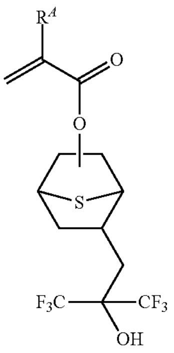
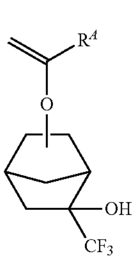
-continued
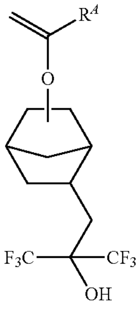
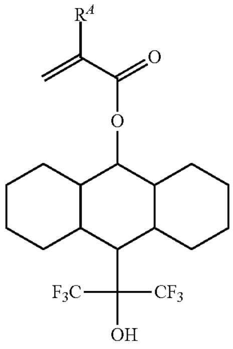
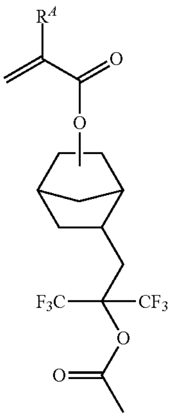
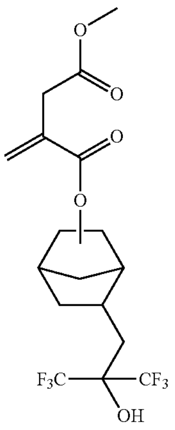
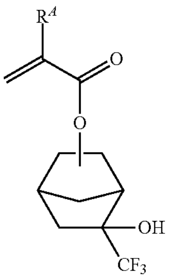
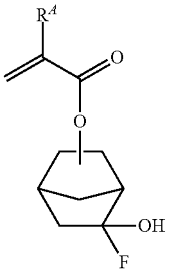
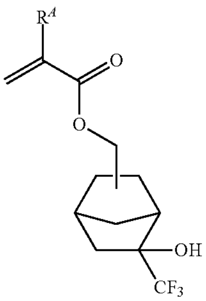
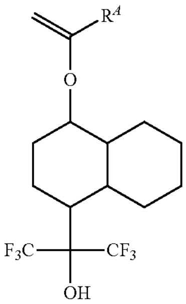
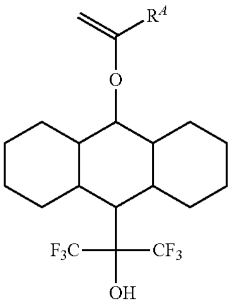

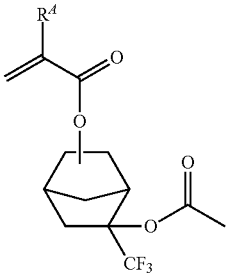
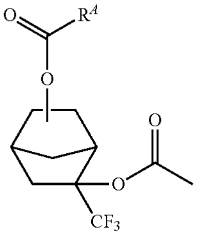
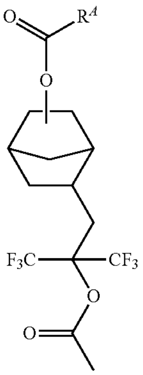
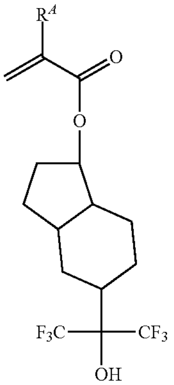
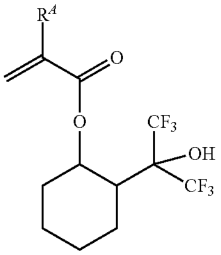
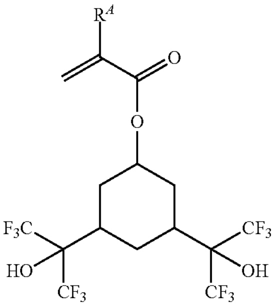
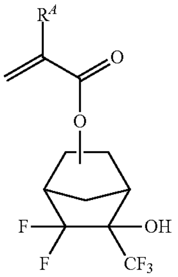
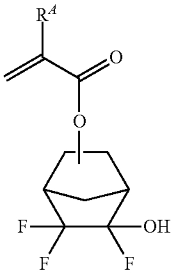
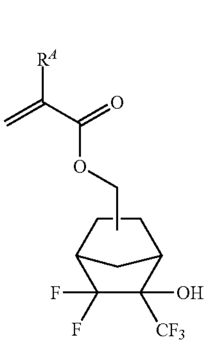
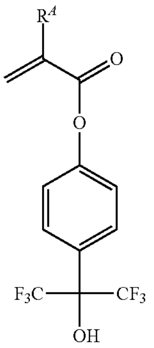
-continued
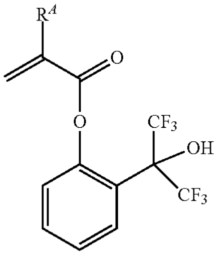
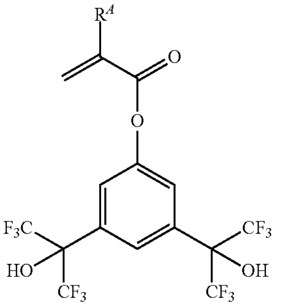
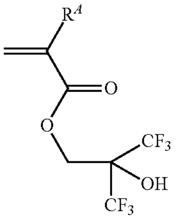
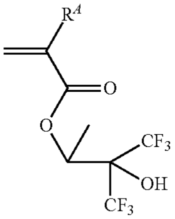
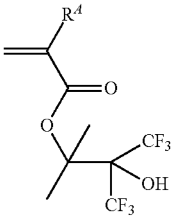
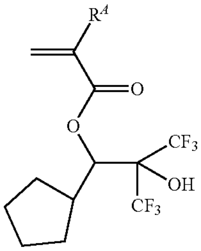
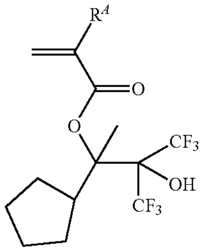
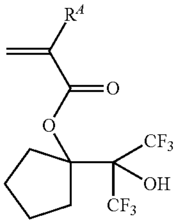
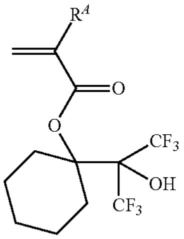
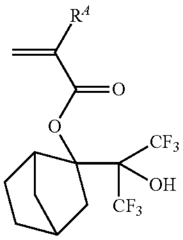
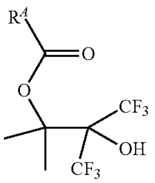
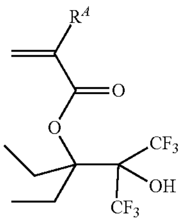
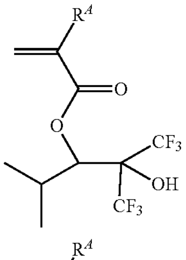
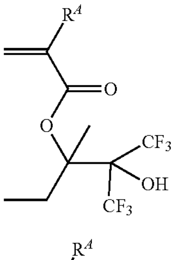
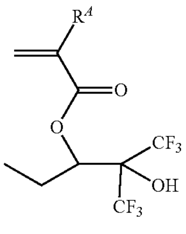
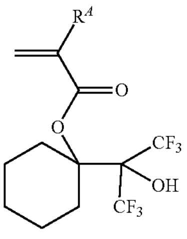

-continued
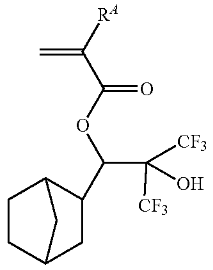
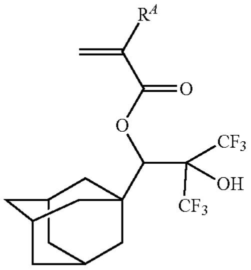
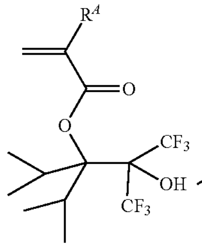
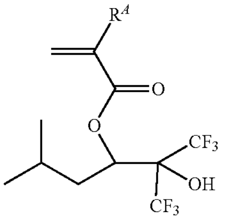
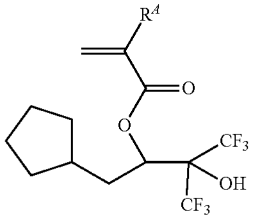
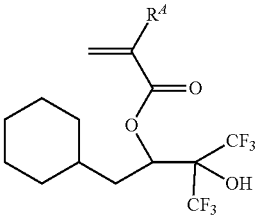
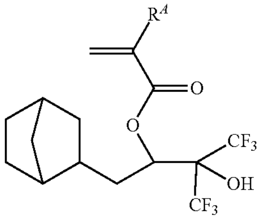
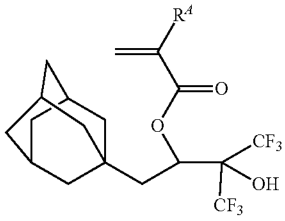
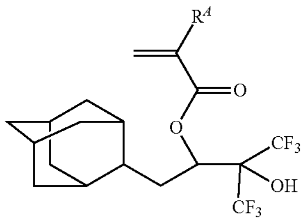
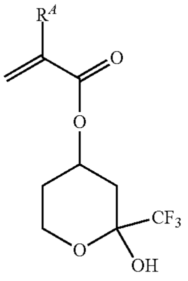
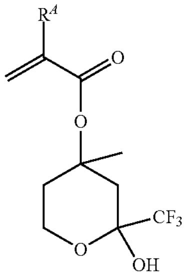
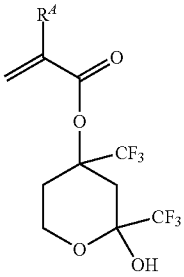
-continued
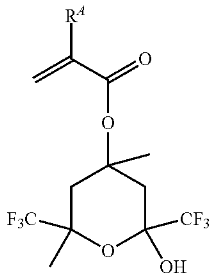
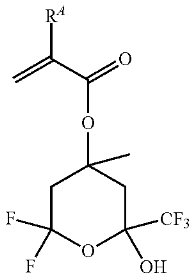
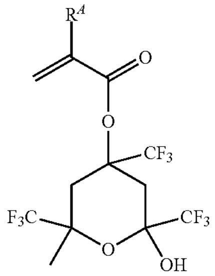
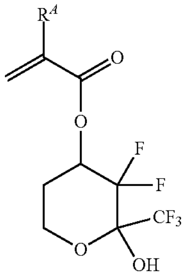
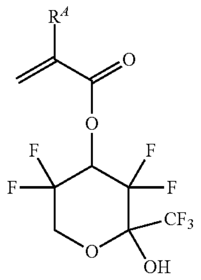
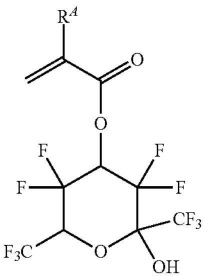
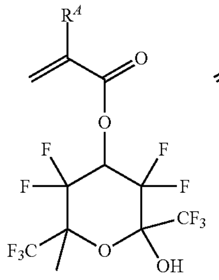
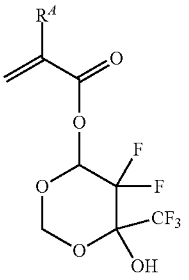
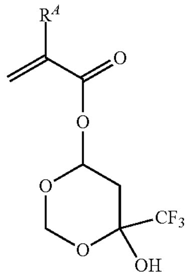
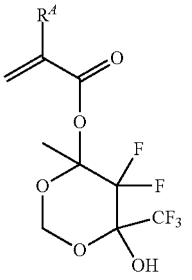
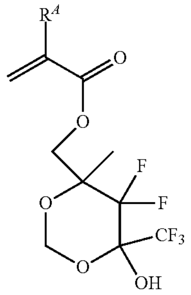
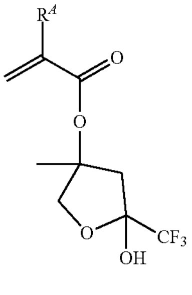

-continued
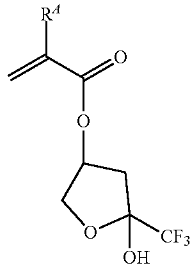
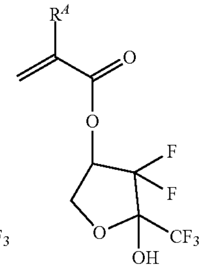
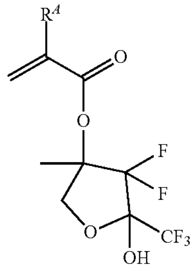
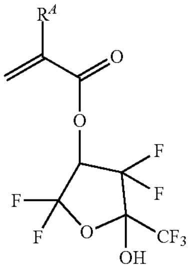
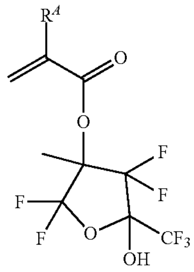
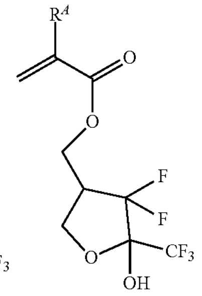
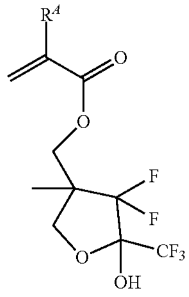
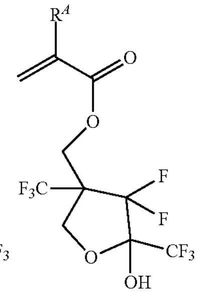
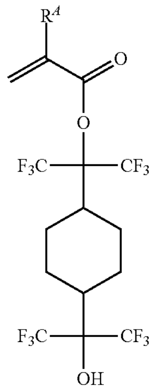
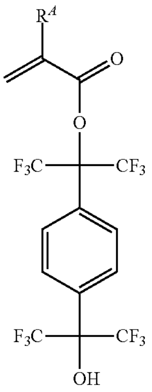
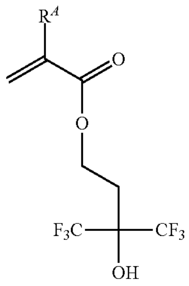
-continued
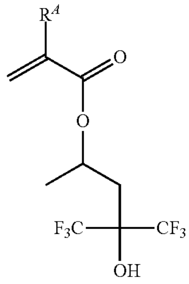
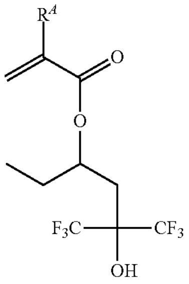
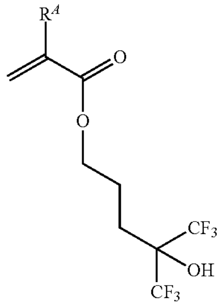
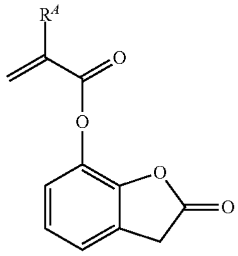
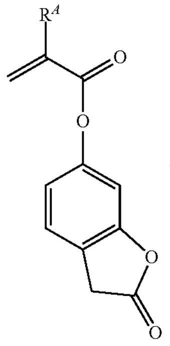
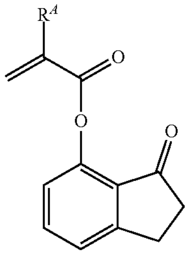
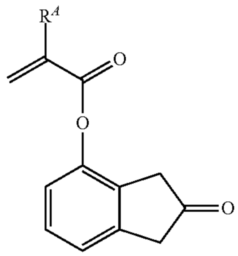
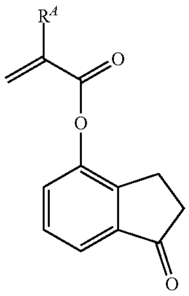
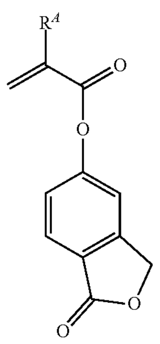
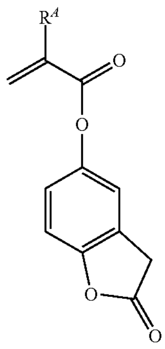
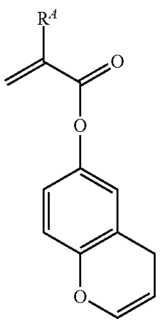

-continued
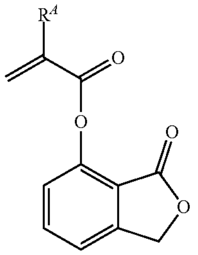
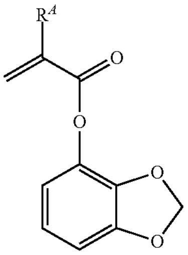
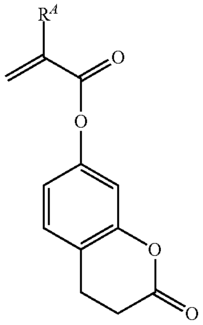
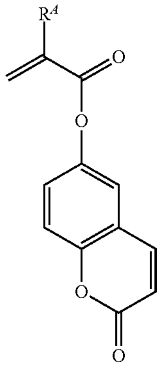
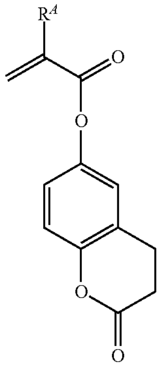
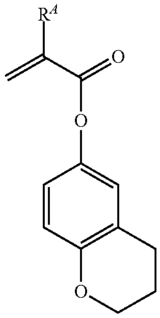
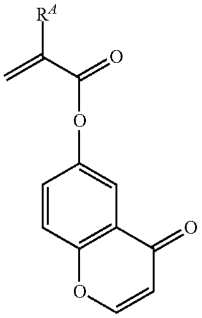
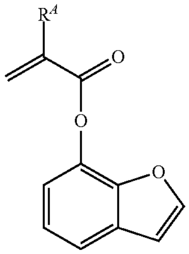
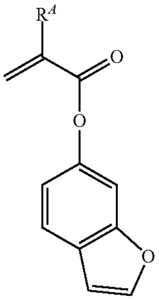
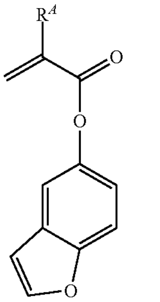
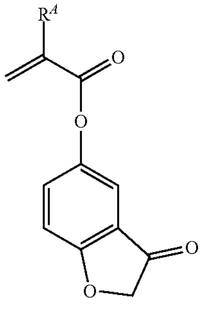
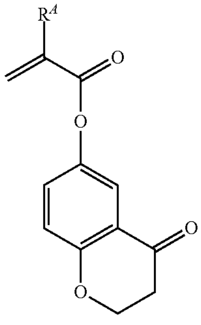
-continued
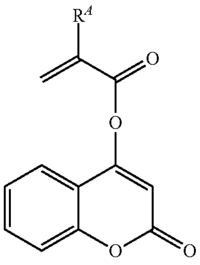
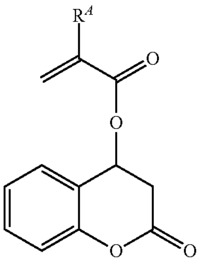
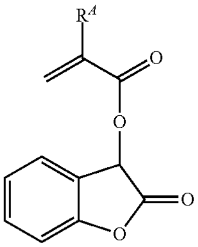
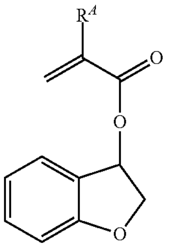
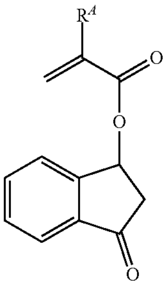
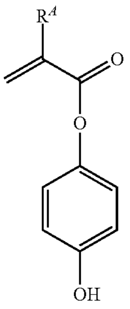
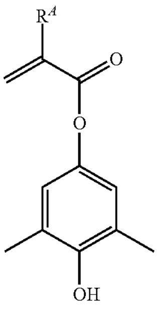
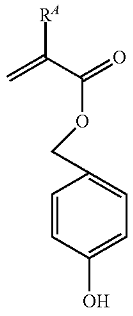
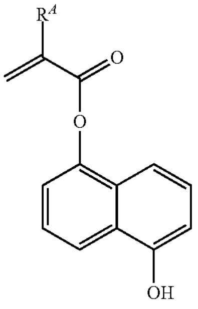
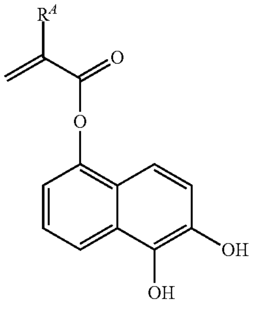
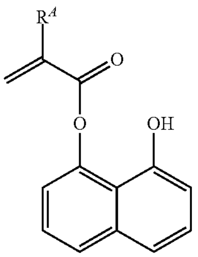
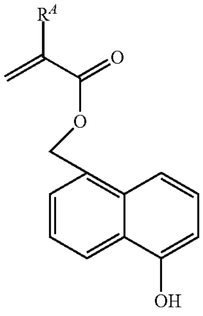

-continued
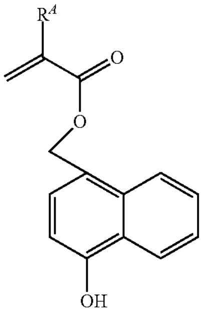
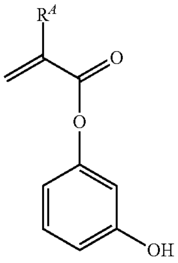
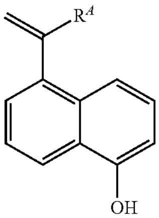
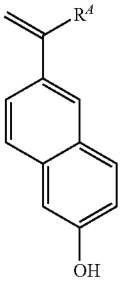
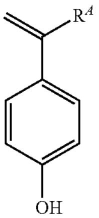
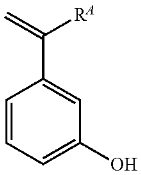
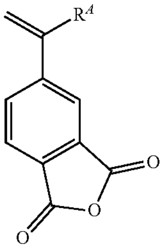
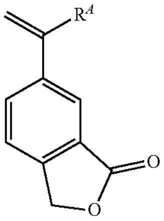
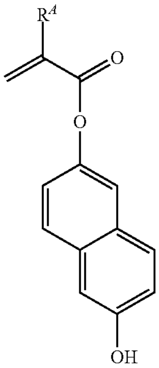
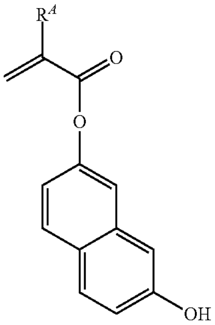
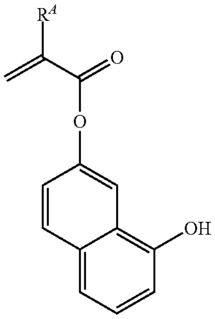
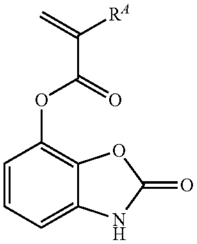
-continued
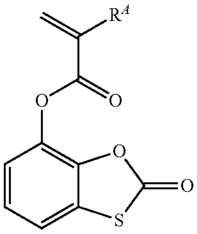
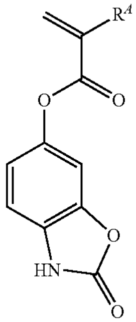
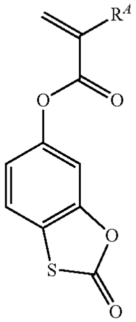
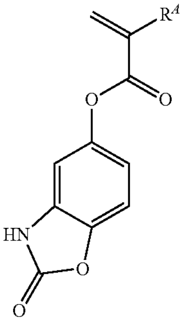
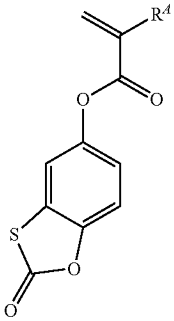
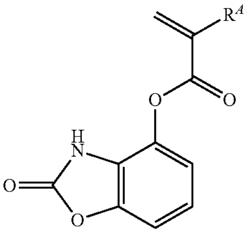
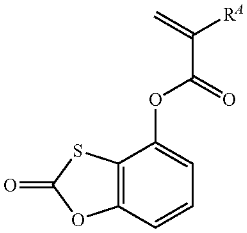
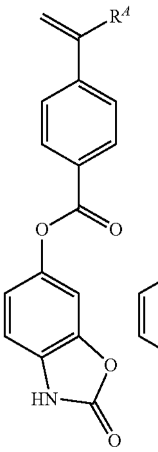
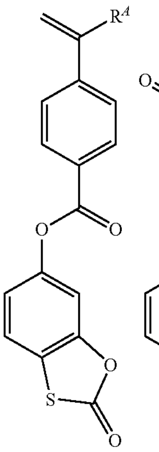
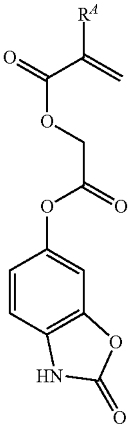

-continued

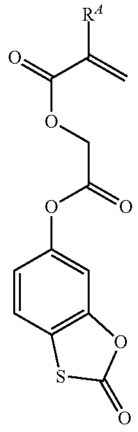

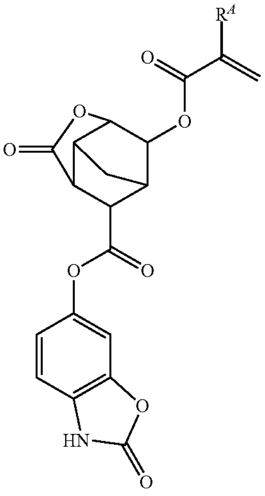

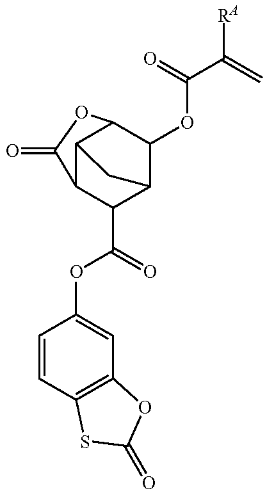

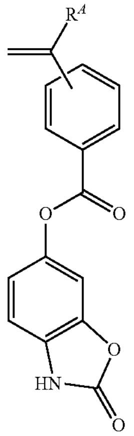

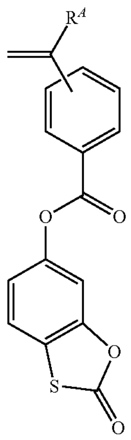

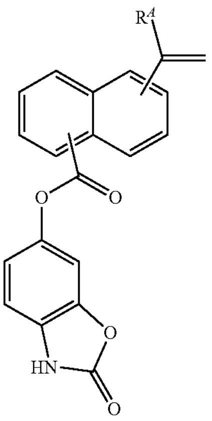

-continued

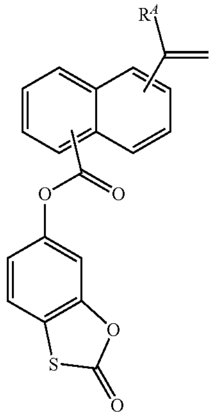

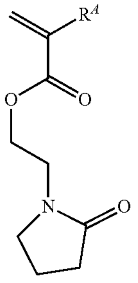

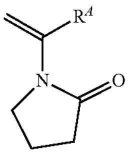

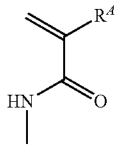

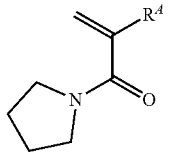

In a further embodiment, the base polymer may comprise repeat units (c) of at least one type selected from repeat units having the following formulae (c1), (c2) and (c3). These units are also referred to as repeat units (c1), (c2) and (c3).

(c1)

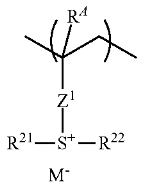

(c2)

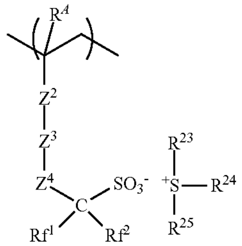

(c3)

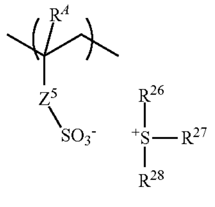

In formulae (c1) to (c3), $R^A$ is each independently hydrogen or methyl. $Z^1$ is a single bond, phenylene, naphthylene, —O—$Z^{11}$—, —C(═O)—O—$Z^{11}$— or —C(═O)—N(H)—$Z^{11}$—, wherein $Z^{11}$ is a $C_1$-$C_6$ aliphatic hydrocarbylene group, phenylene, naphthylene, or a $C_7$-$C_{18}$ group obtained by combining the foregoing, which may contain a carbonyl moiety, ester bond, ether bond or hydroxy moiety. $Z^2$ is a single bond or ester bond. $Z^3$ is a single bond, —$Z^{31}$—C(═O)—O—, —$Z^{31}$—O—, or —$Z^{31}$—O—C(═O)—, wherein $Z^{31}$ is a $C_1$-$C_{12}$ aliphatic hydrocarbylene group, phenylene group, or a $C_7$-$C_{18}$ group obtained by combining the foregoing, which may contain a carbonyl moiety, ester bond, ether bond, iodine or bromine. $Z^4$ is a single bond, methylene or 2,2,2-trifluoro-1,1-ethanediyl. $Z^5$ is a single bond, methylene, ethylene, phenylene, fluorinated phenylene, trifluoromethyl-substituted phenylene, —O—$Z^{51}$—, —C(═O)—O—$Z^{51}$—, or —C(═O)—N(H)—$Z^{51}$—, wherein $Z^{51}$ is a $C_1$-$C_6$ aliphatic hydrocarbylene group, phenylene, fluorinated phenylene, trifluoromethyl-substituted phenylene group or a $C_7$-$C_{18}$ group obtained by combining the foregoing, which may contain a carbonyl moiety, ester bond, ether bond or hydroxy moiety.

In formula (c2), $Rf^1$ and $Rf^2$ are each independently hydrogen, fluorine or trifluoromethyl, at least one thereof being fluorine. Preferably, both $Rf^1$ and $Rf^2$ are fluorine.

In formulae (c1) to (c3), $R^{21}$ to $R^{28}$ are each independently fluorine, chlorine, bromine, iodine or a $C_1$-$C_{20}$ hydrocarbyl group which may contain a heteroatom. The hydrocarbyl group may be saturated or unsaturated and straight, branched or cyclic. Examples thereof are as exemplified above for $R^{101}$ to $R^{105}$ in formulae (2-1) and (2-2).

A pair of $R^{23}$ and $R^{24}$, or $R^{26}$ and $R^{27}$ may bond together to form a ring with the sulfur atom to which they are attached. Examples of the ring are as will be exemplified later for the ring that $R^{101}$ and $R^{102}$ in formula (2-1), taken together, form with the sulfur atom to which they are attached.

In formula (c1), $M^-$ is a non-nucleophilic counter ion. Examples of the non-nucleophilic counter ion include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide ions such as bis(trifluoromethylsulfonyl)imide, bis(perfluoroethylsulfonyl)imide and bis(perfluorobutylsulfonyl)imide; and methide ions such as tris(trifluoromethylsulfonyl)methide and tris(perfluoroethylsulfonyl)methide.

Also included are sulfonate ions having fluorine substituted at α-position as represented by the formula (c1-1) and sulfonate ions having fluorine substituted at α-position and trifluoromethyl at β-position as represented by the formula (c1-2).

$$R^{31}—CF_2—SO_3^- \quad (c1\text{-}1)$$

(c1-2)

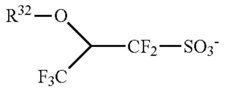

In formula (c1-1), $R^{31}$ is hydrogen or a $C_1$-$C_{20}$ hydrocarbyl group which may contain an ether bond, ester bond, carbonyl moiety, lactone ring, or fluorine atom. The hydrocarbyl group may be saturated or unsaturated and straight, branched or cyclic. Examples thereof are as will be exemplified later for the hydrocarbyl group $R^{111}$ in formula (2A').

In formula (c1-2), $R^{32}$ is hydrogen, or a $C_1$-$C_{30}$ hydrocarbyl group or $C_2$-$C_{30}$ hydrocarbylcarbonyl group, which may contain an ether bond, ester bond, carbonyl moiety or lactone ring. The hydrocarbyl group and the hydrocarbyl moiety in the hydrocarbylcarbonyl group may be saturated or unsaturated and straight, branched or cyclic. Examples thereof are as will be exemplified later for the hydrocarbyl group $R^{111}$ in formula (2A').

Examples of the cation in the monomer from which repeat unit (c1) is derived are shown below, but not limited thereto. $R^A$ is as defined above.

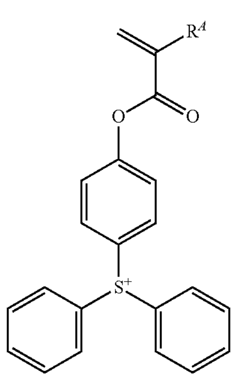

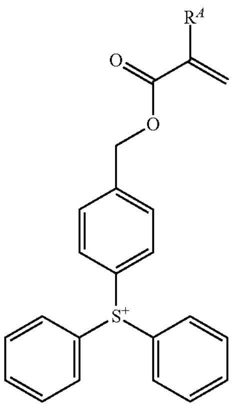

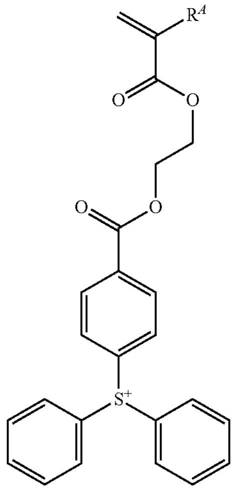

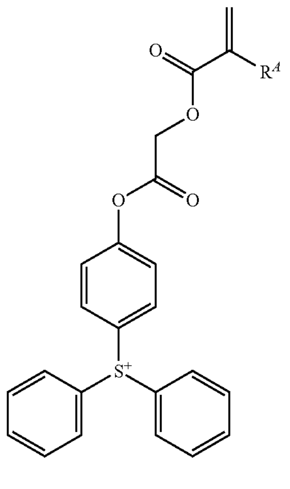

-continued
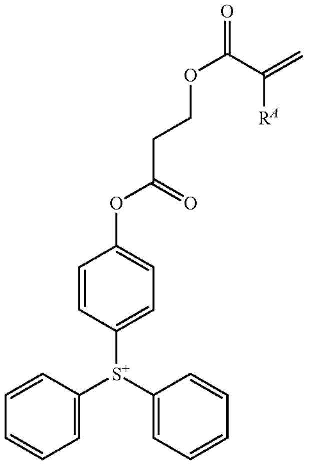
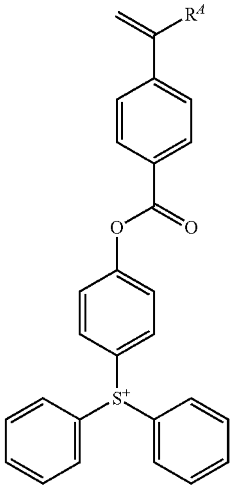
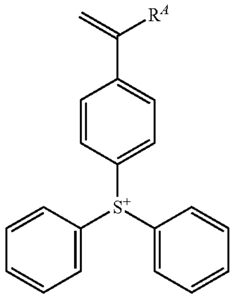
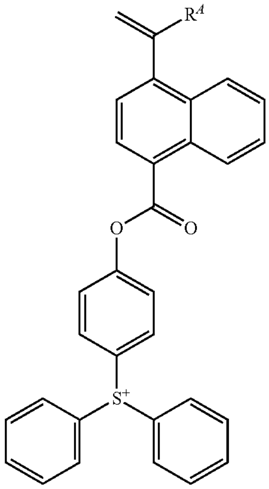
-continued
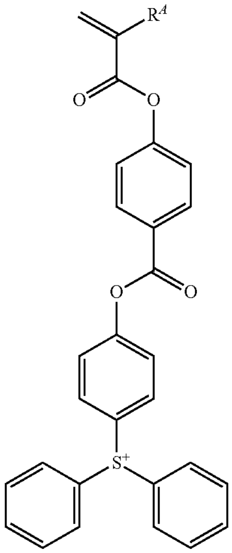
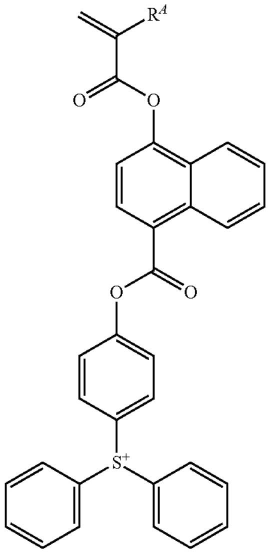
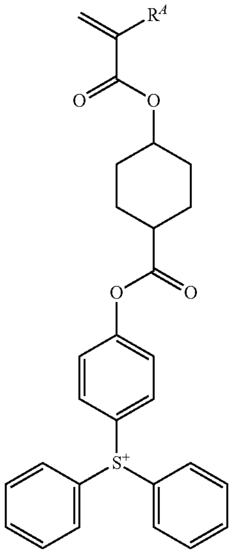
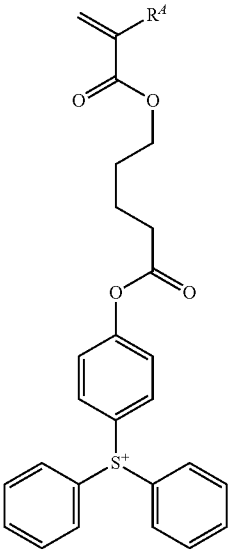

-continued
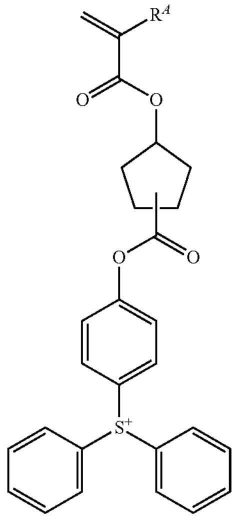
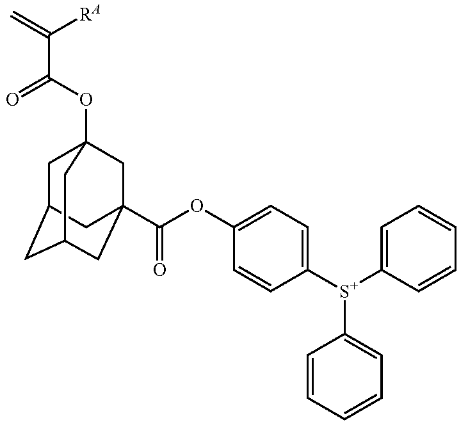
Examples of the cation in the monomer from which repeat unit (c2) or (c3) is derived are as will be exemplified later for the cation in the sulfonium salt having formula (2-1).
Examples of the anion in the monomer from which repeat unit (c2) is derived are shown below, but not limited thereto. $R^A$ is as defined above.
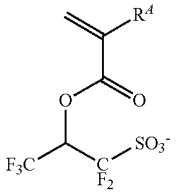
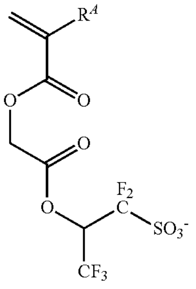
-continued
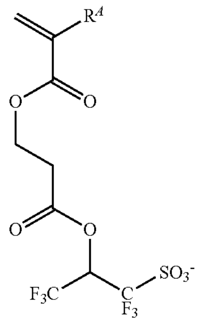
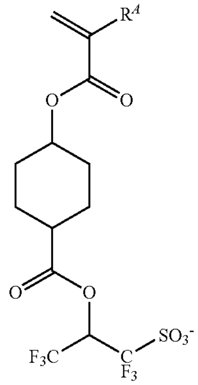
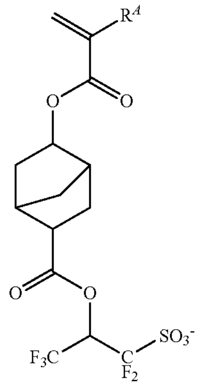
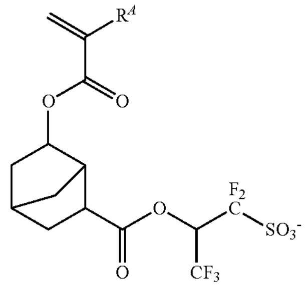
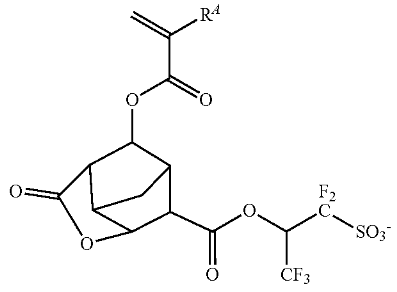
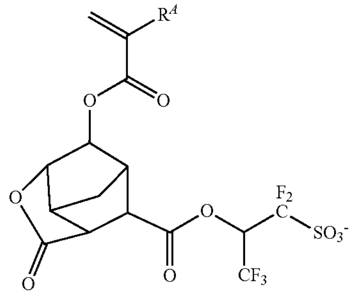
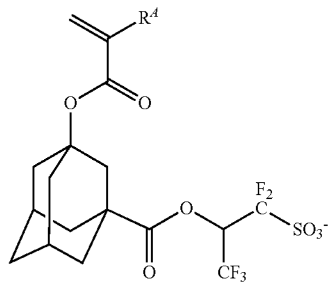

-continued
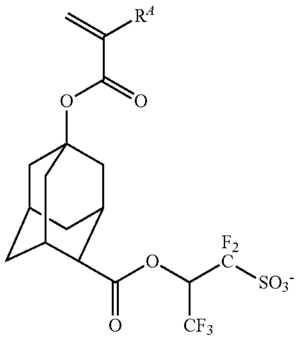
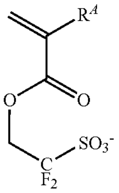
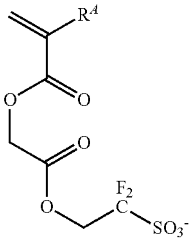
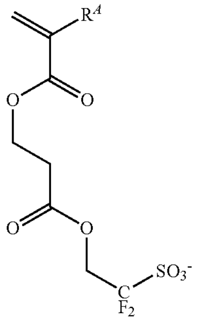
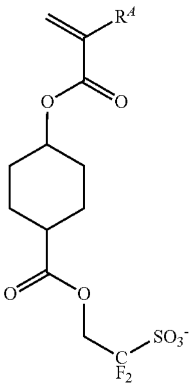
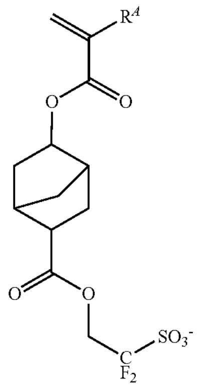
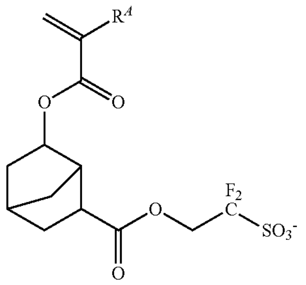
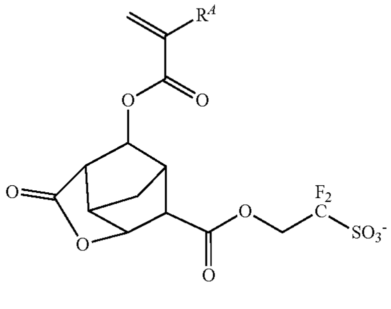
-continued
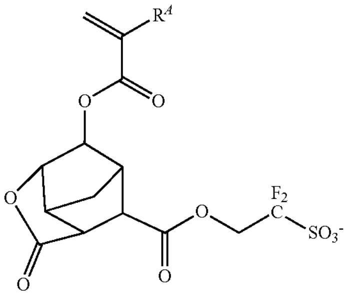
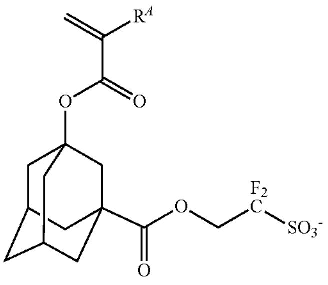
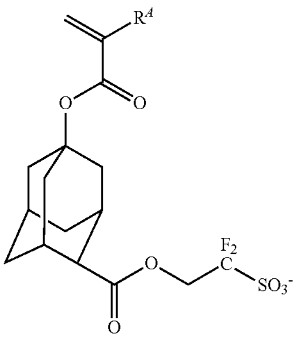
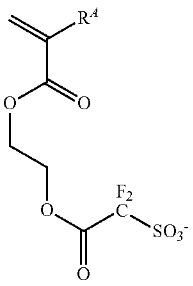
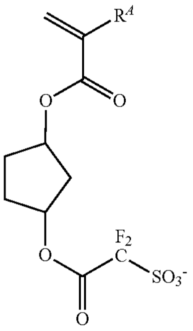
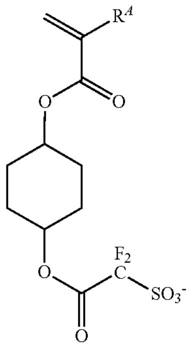
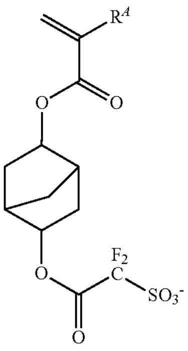
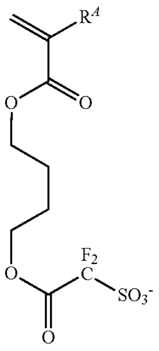

-continued
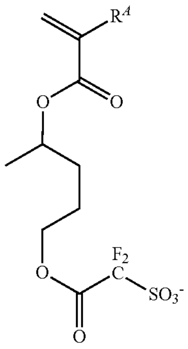
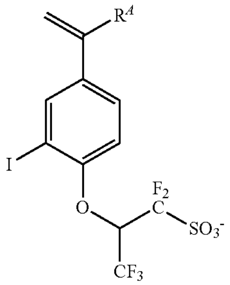
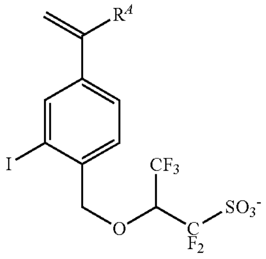
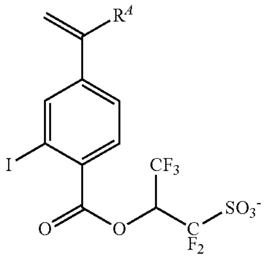
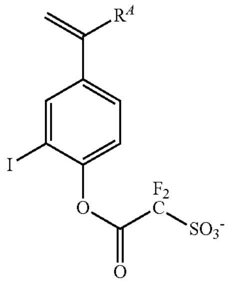
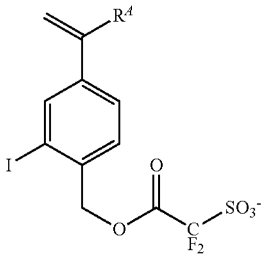
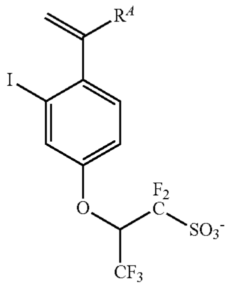
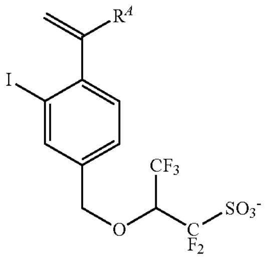
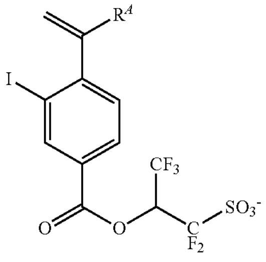
-continued
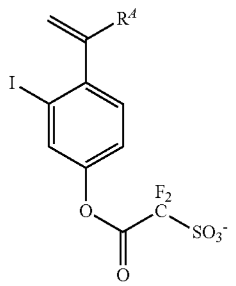
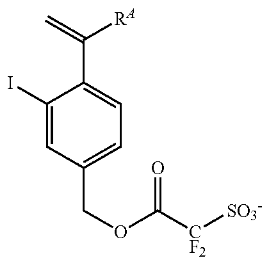
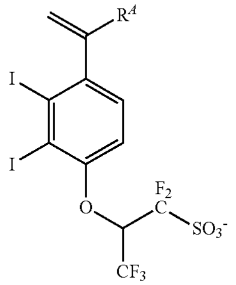
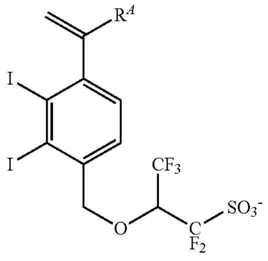
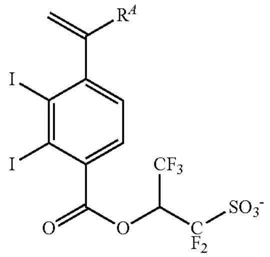
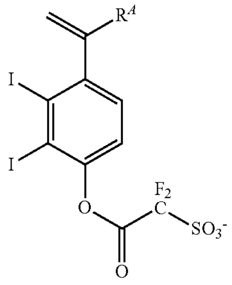
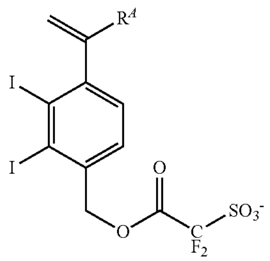
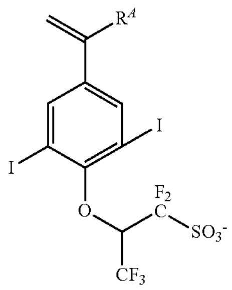
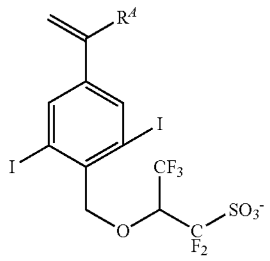
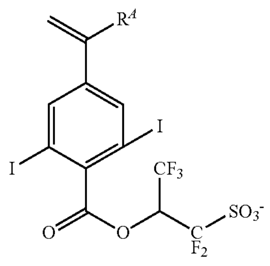
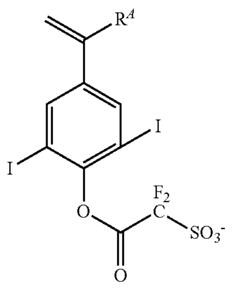

-continued
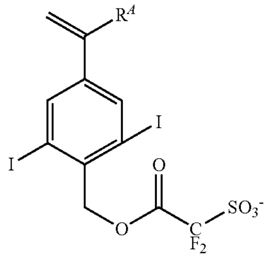
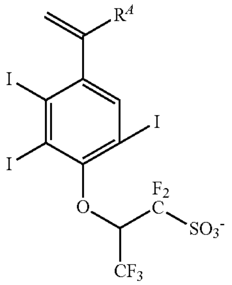
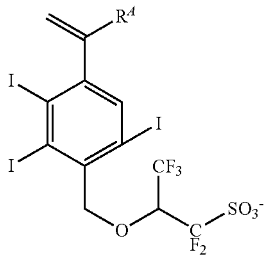
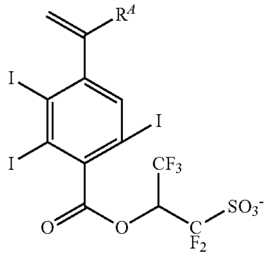
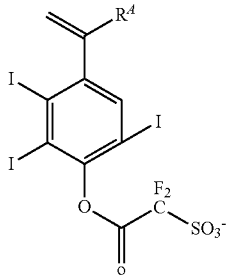
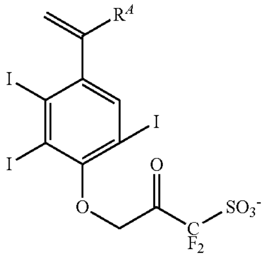
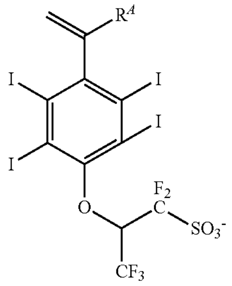
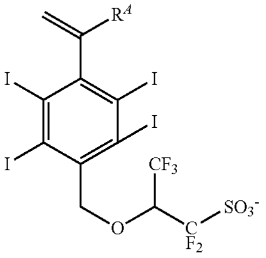
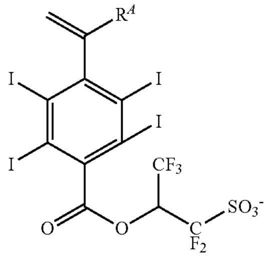
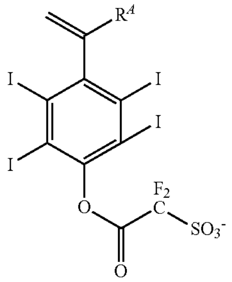
-continued
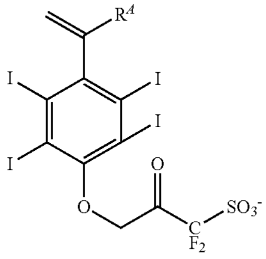
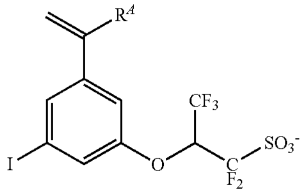
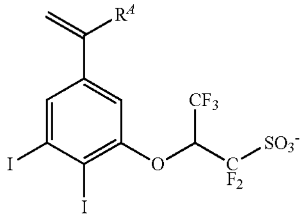
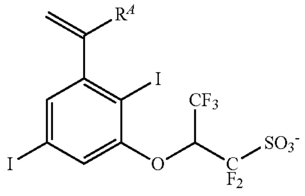
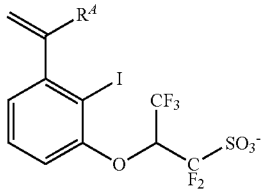
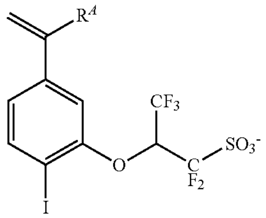
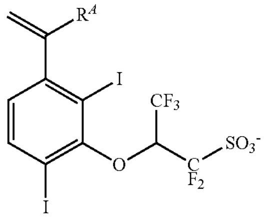

-continued
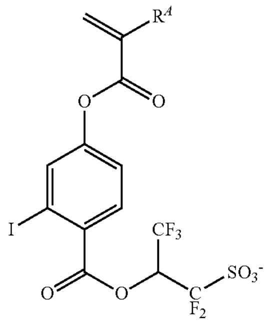
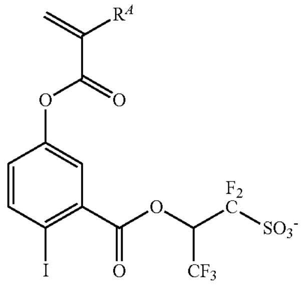
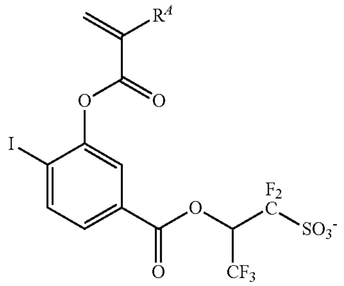
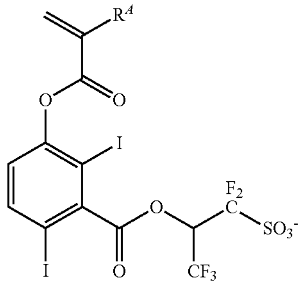
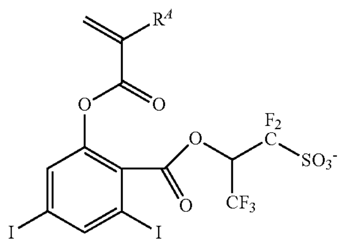
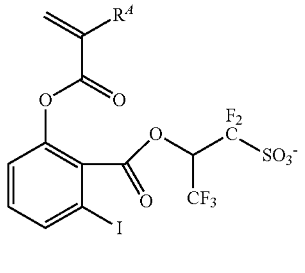
-continued
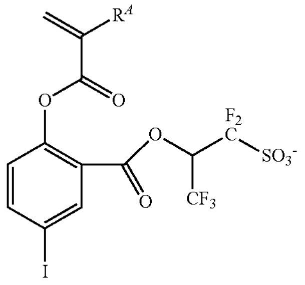
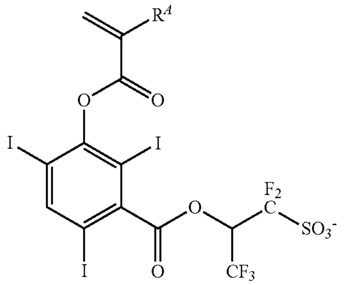
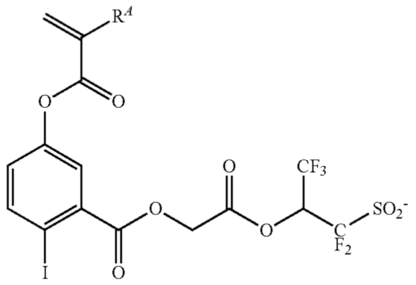
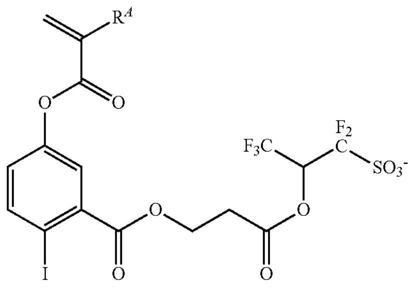
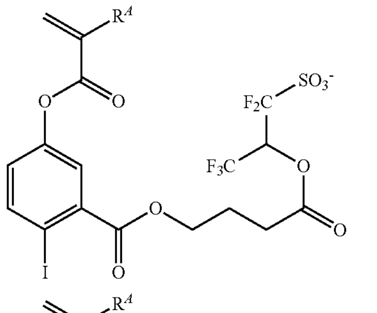
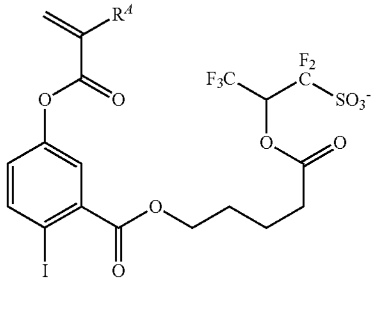

-continued
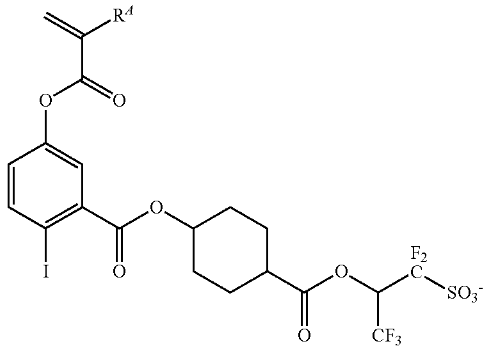
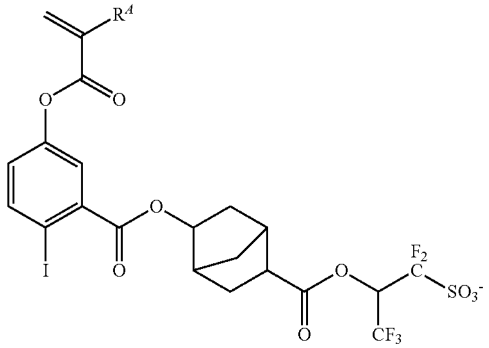
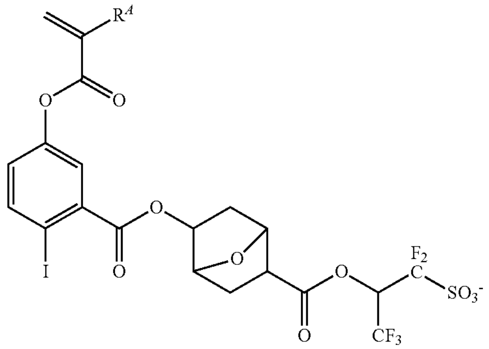
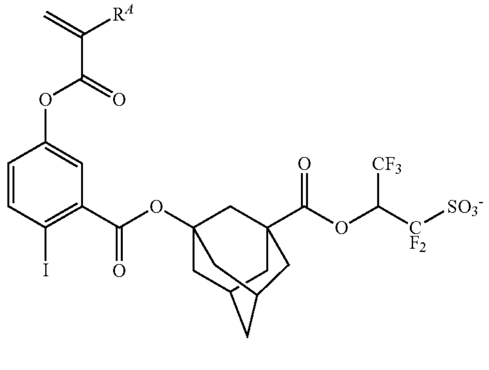
-continued
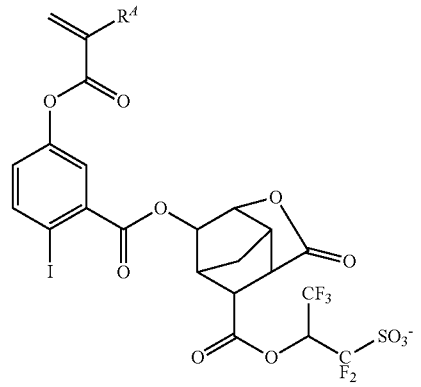
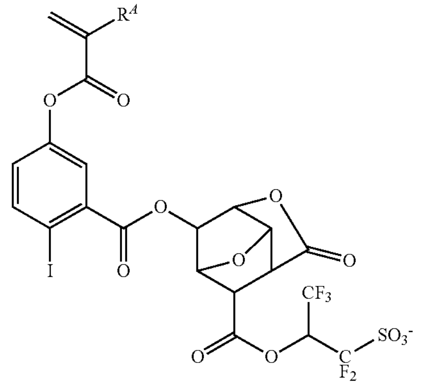
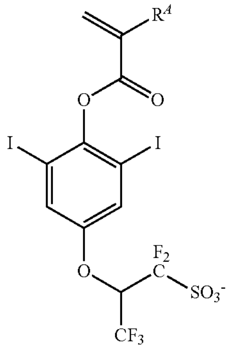
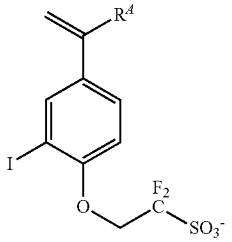
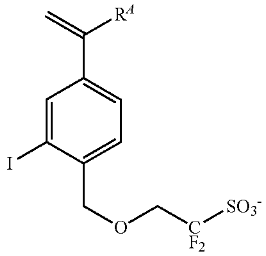
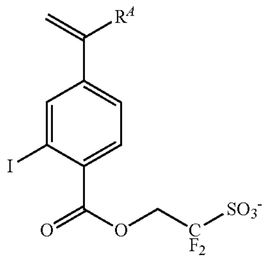
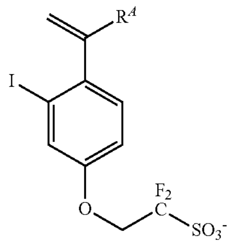

-continued
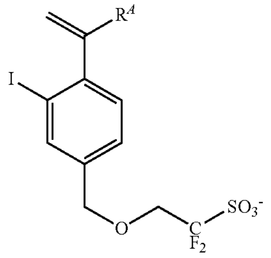
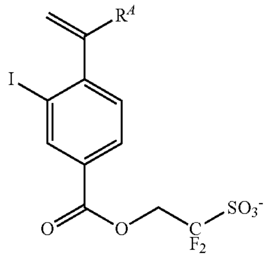
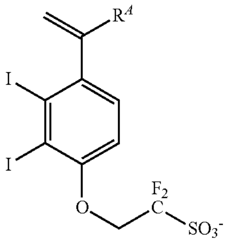
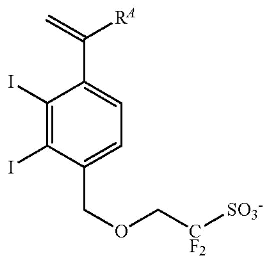
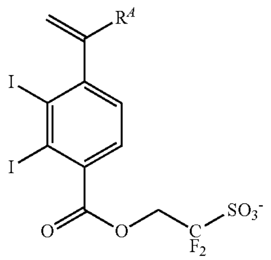
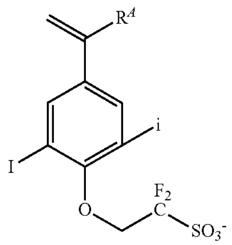
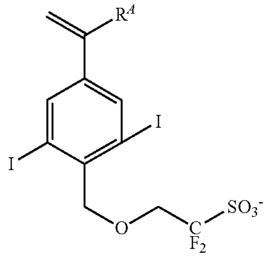
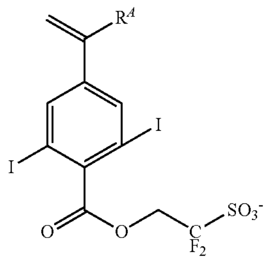
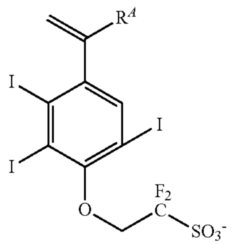
-continued
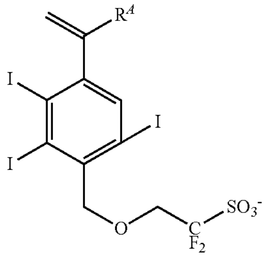
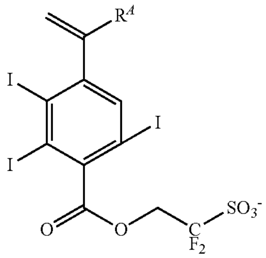
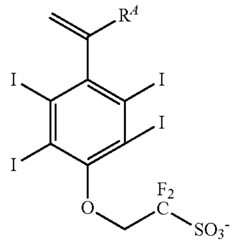
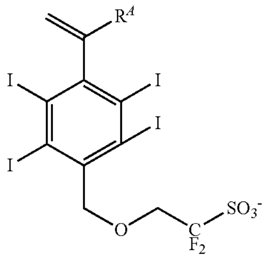
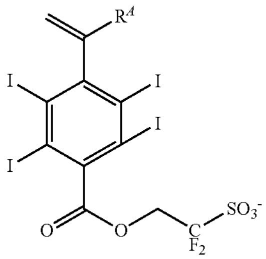
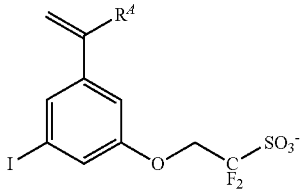
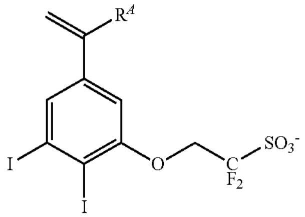
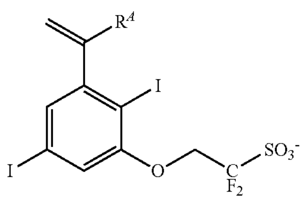

-continued
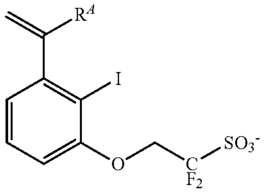
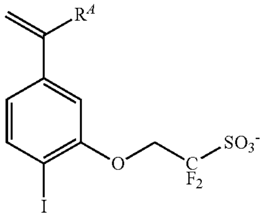
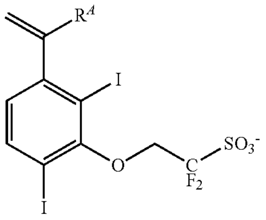
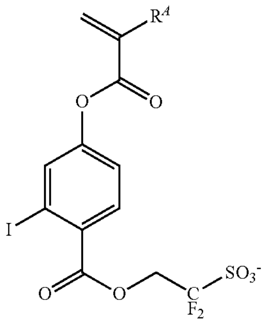
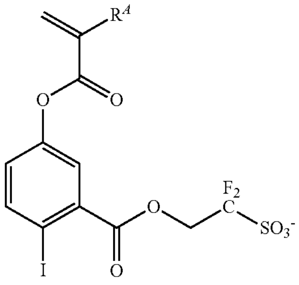
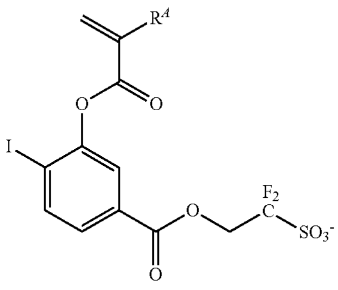
-continued
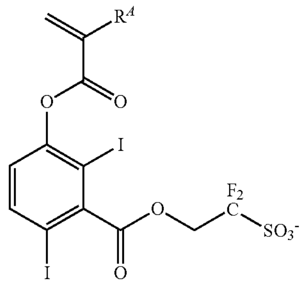
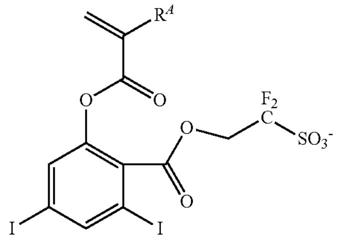
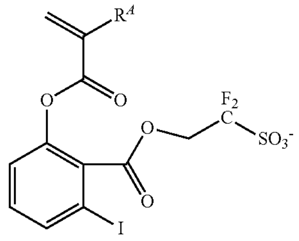
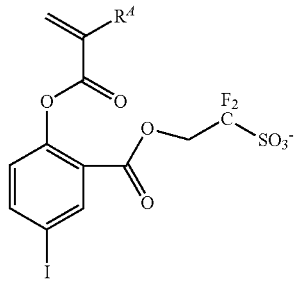
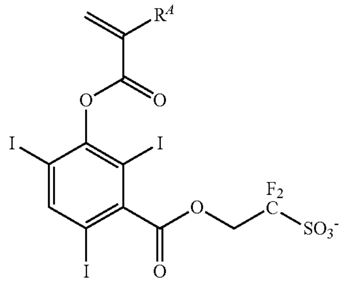
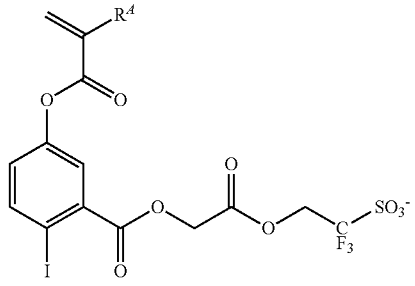

-continued
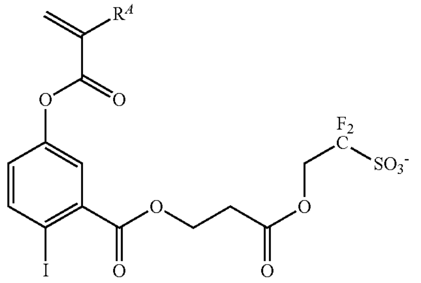
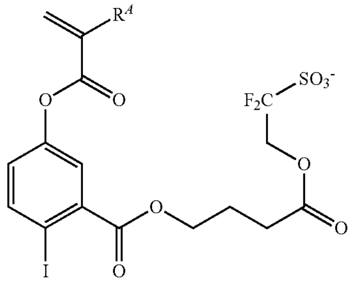
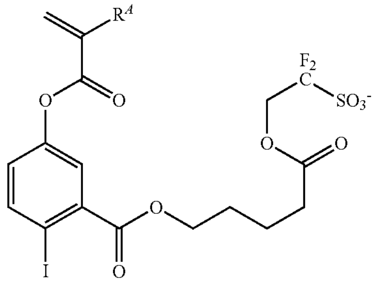
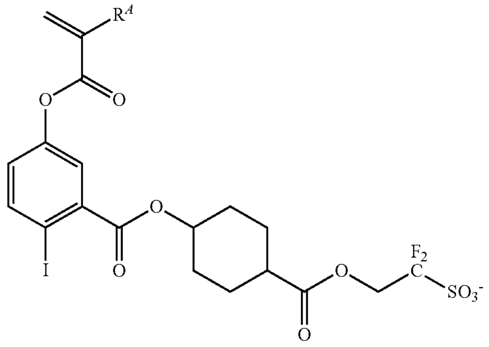
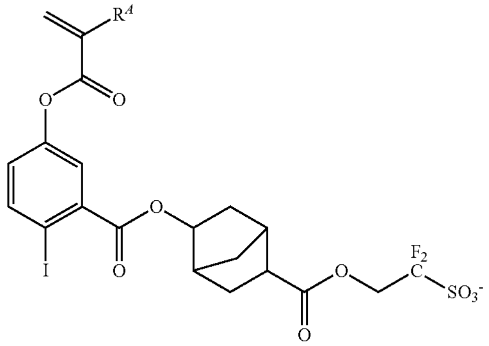
-continued
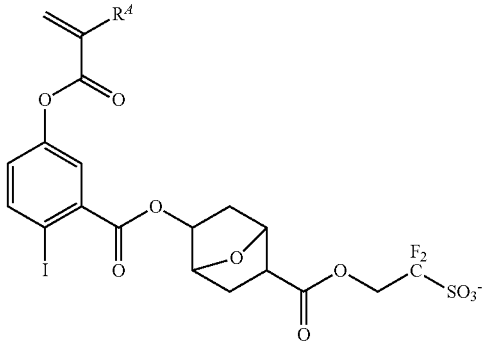
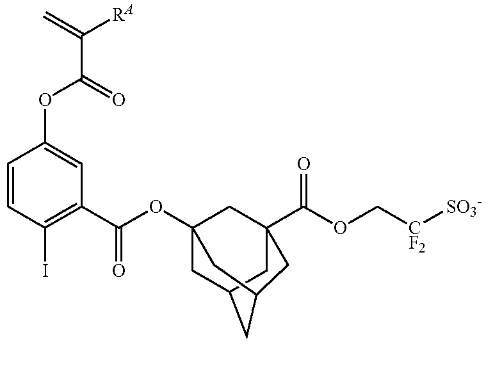
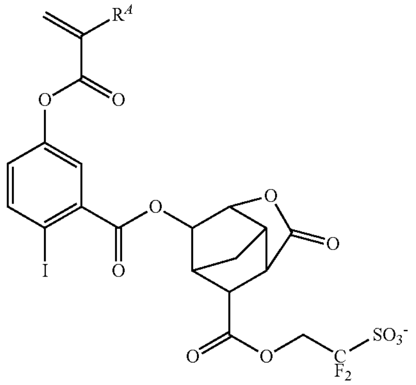
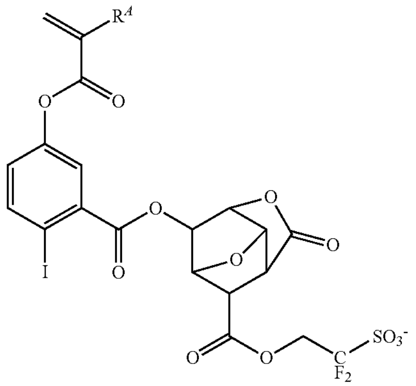

-continued

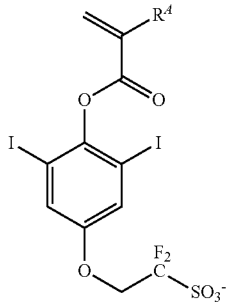

Examples of the anion in the monomer from which repeat unit (c3) is derived are shown below, but not limited thereto. $R^A$ is as defined above.

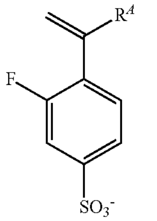
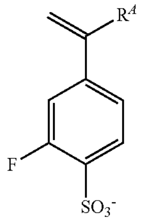
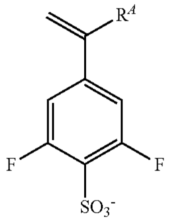
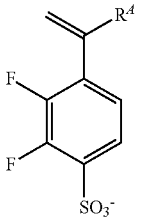
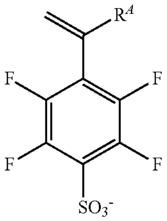
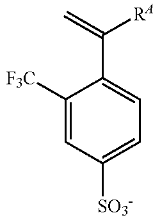
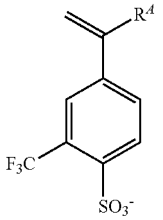
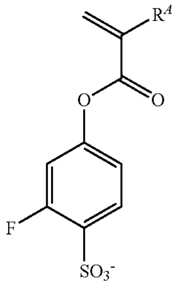
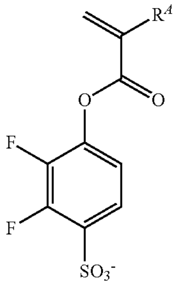
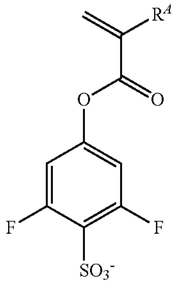
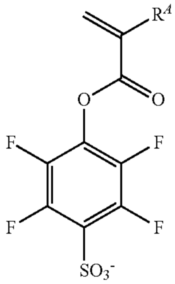

-continued

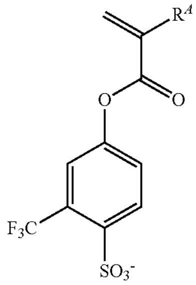
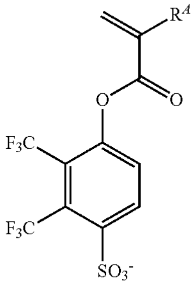
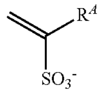
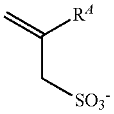

Repeat units (c1) to (c3) have the function of acid generator. The attachment of an acid generator to the polymer main chain is effective in restraining acid diffusion, thereby preventing a reduction of resolution due to blur by acid diffusion. Also, LWR and CDU are improved since the acid generator is uniformly distributed. When a base polymer comprising repeat units (c) is used, that is, in case of polymer-bound acid generator, an acid generator of addition type (to be described later) may be omitted.

The base polymer may further comprise repeat units (d) which are free of an amino group and contain iodine. Examples of the monomer from which the iodized units are derived are shown below, but not limited thereto. Herein $R^A$ is as defined above.

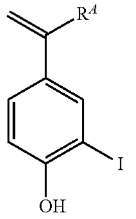
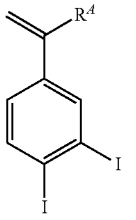
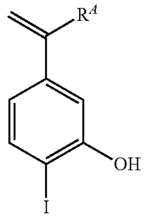
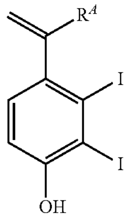
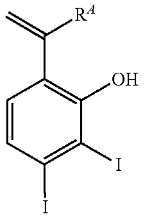
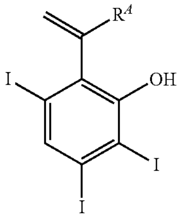
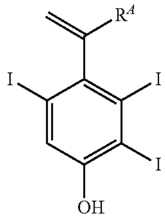
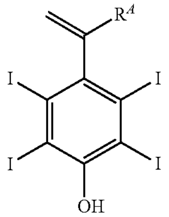
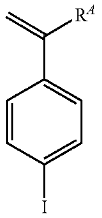
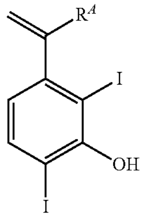
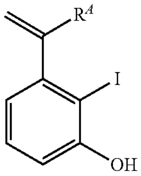
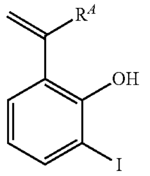

-continued
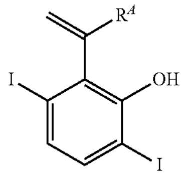
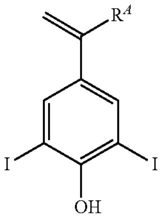
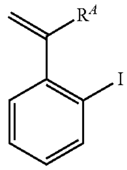
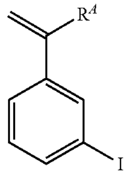
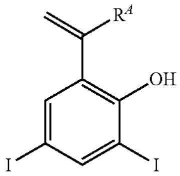
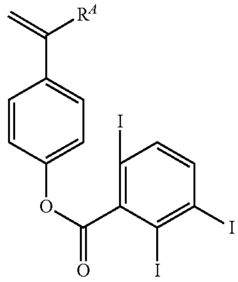
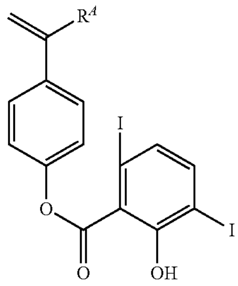
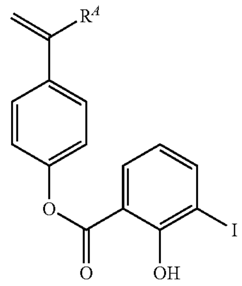
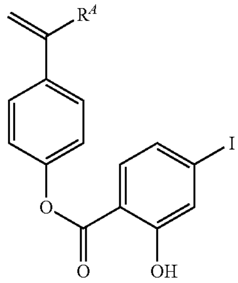
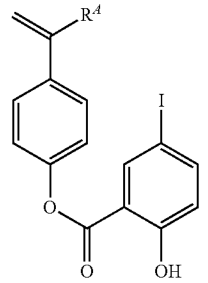
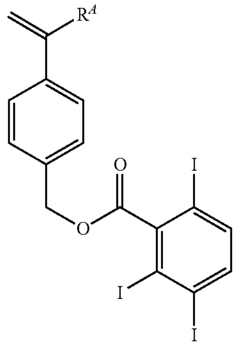
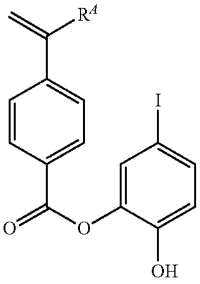
-continued
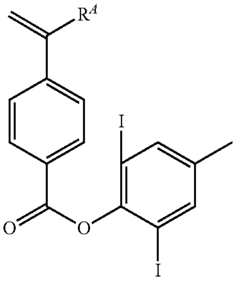
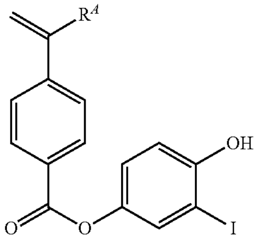
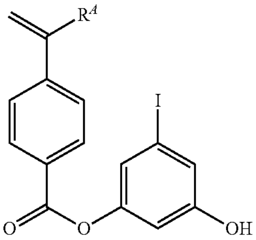
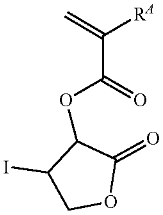
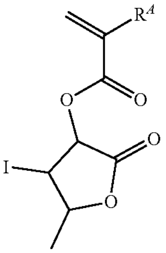
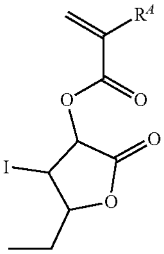
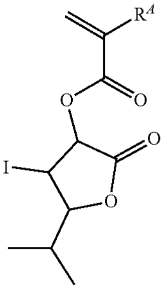
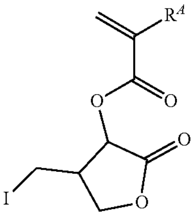
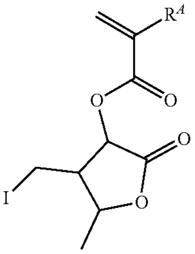
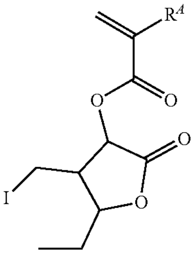
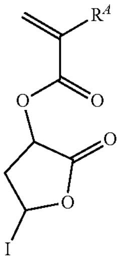
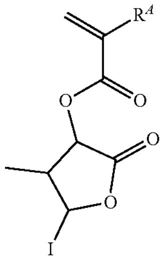
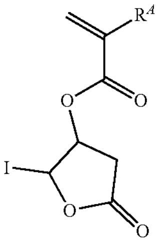

-continued

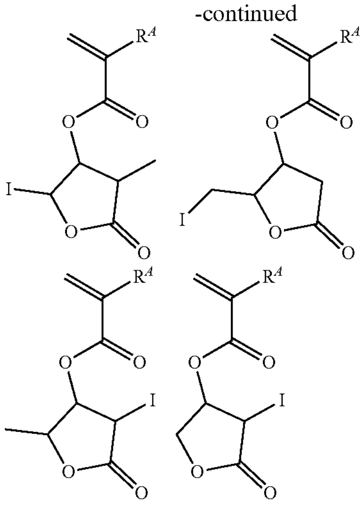

Besides the repeat units described above, the base polymer may further comprise repeat units (e) which are derived from styrene, vinylnaphthalene, indene, acenaphthylene, coumarin, and coumarone.

In the base polymer comprising repeat units (a1), (a2), (b), (c1), (c2), (c3), (d) and (e), a fraction of these units is: preferably $0\le a1\le 0.9$, $0\le a2\le 0.9$, $0<a1+a2\le 0.9$, $0\le b\le 0.9$, $0\le c1\le 0.5$, $0\le c2\le 0.5$, $0\le c3\le 0.5$, $0\le c1+c2+c3\le 0.5$, $0\le d\le 0.5$, and $0\le e\le 0.5$; more preferably $0\le a1\le 0.8$, $0\le a2\le 0.8$, $0<a1+a2\le 0.8$, $0\le b\le 0.8$, $0\le c1\le 0.4$, $0\le c2\le 0.4$, $0\le c3\le 0.4$, $0\le c1+c2+c3\le 0.4$, $0\le d\le 0.4$, and $0\le e\le 0.4$; and even more preferably $0\le a1\le 0.7$, $0\le a2\le 0.7$, $0<a1+a2\le 0.7$, $0\le b\le 0.7$, $0\le c1\le 0.3$, $0\le c2\le 0.3$, $0\le c3\le 0.3$, $0\le c1+c2+c3\le 0.3$, $0\le d\le 0.3$, and $0\le e\le 0.3$. Notably, $a1+a2+b+c1+c2+c3+d+e=1.0$.

The base polymer may be synthesized by any desired methods, for example, by dissolving one or more monomers selected from the monomers corresponding to the foregoing repeat units in an organic solvent, adding a radical polymerization initiator thereto, and heating for polymerization. Examples of the organic solvent which can be used for polymerization include toluene, benzene, tetrahydrofuran (THF), diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the reaction temperature is 50 to 80° C., and the reaction time is 2 to 100 hours, more preferably 5 to 20 hours.

When a monomer having a hydroxy group is copolymerized, the hydroxy group may be replaced by an acetal group susceptible to deprotection with acid, typically ethoxyethoxy, prior to polymerization, and the polymerization be followed by deprotection with weak acid and water. Alternatively, the hydroxy group may be replaced by an acetyl, formyl, pivaloyl or similar group prior to polymerization, and the polymerization be followed by alkaline hydrolysis.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the polymer product to hydroxystyrene or hydroxyvinylnaphthalene. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 hours.

The base polymer should preferably have a weight average molecular weight (Mw) in the range of 1,000 to 500,000, and more preferably 2,000 to 30,000, as measured by GPC versus polystyrene standards using tetrahydrofuran (THF) solvent. With too low a Mw, the resist composition may become less heat resistant. A polymer with too high a Mw may lose alkaline solubility and give rise to a footing phenomenon after pattern formation.

If a base polymer has a wide molecular weight distribution or dispersity (Mw/Mn), which indicates the presence of lower and higher molecular weight polymer fractions, there is a possibility that foreign matter is left on the pattern or the pattern profile is degraded. The influences of Mw and Mw/Mn become stronger as the pattern rule becomes finer. Therefore, the base polymer should preferably have a narrow dispersity (Mw/Mn) of 1.0 to 2.0, especially 1.0 to 1.5, in order to provide a resist composition suitable for micropatterning to a small feature size.

In the embodiment wherein the positive resist composition contains a base polymer, the base polymer is preferably present in an amount of 10 to 1,000 parts by weight, more preferably 20 to 500 parts by weight, even more preferably 50 to 200 parts by weight per 100 parts by weight of the nitrobenzyl ester compound. The base polymer may be a blend of two or more polymers which differ in compositional ratio, Mw or Mw/Mn.

Acid Generator

The positive resist composition may contain an acid generator capable of generating a strong acid, also referred to as acid generator of addition type. As used herein, the "strong acid" is a compound having a sufficient acidity to induce deprotection reaction of acid labile groups on the base polymer.

The acid generator is typically a compound (PAG) capable of generating an acid upon exposure to actinic ray or radiation. Although the PAG used herein may be any compound capable of generating an acid upon exposure to high-energy radiation, those compounds capable of generating sulfonic acid, imidic acid (imide acid) or methide acid are preferred. Suitable PAGs include sulfonium salts, iodonium salts, sulfonyldiazomethane, N-sulfonyloxyimide, and oxime-O-sulfonate acid generators. Suitable PAGs are as exemplified in U.S. Pat. No. 7,537,880 (JP-A 2008-111103, paragraphs [0122]-[0142]).

As the PAG used herein, sulfonium salts having the formula (2-1) and iodonium salts having the formula (2-2) are also preferred.

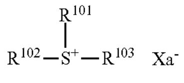

(2-1)

$$R^{104}-I^{+}-R^{105}\quad Xa^{-}$$

(2-2)

In formulae (2-1) and (2-2), $R^{101}$ to $R^{105}$ are each independently fluorine, chlorine, bromine, iodine or a $C_1$-$C_{20}$ hydrocarbyl group which may contain a heteroatom. The $C_1$-$C_{20}$ hydrocarbyl group may be saturated or unsaturated and straight, branched or cyclic. Examples thereof include $C_1$-$C_{20}$ alkyl groups such as methyl, ethyl, n-propyl, isopropyl, n-butyl, isobutyl, sec-butyl, tert-butyl, n-pentyl, n-hexyl, n-octyl, n-nonyl, n-decyl, undecyl, dodecyl, tridecyl, tetradecyl, pentadecyl, heptadecyl, octadecyl, nonadecyl and icosyl; $C_3$-$C_{20}$ cyclic saturated hydrocarbyl groups such as cyclopropyl, cyclopentyl, cyclohexyl, cyclopropylmethyl, 4-methylcyclohexyl, cyclohexylmethyl, norbornyl, and adamantyl; $C_2$-$C_{20}$ alkenyl groups such as vinyl, propenyl, butenyl and hexenyl; $C_2$-$C_{20}$ alkynyl groups such as ethynyl, propynyl, and butynyl; $C_3$-$C_{20}$ cyclic unsaturated aliphatic hydrocarbyl groups such as cyclohexenyl and norbornenyl; $C_6$-$C_{20}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, and tert-butylnaphthyl; $C_7$-$C_{20}$ aralkyl groups such as benzyl and phenethyl; and combinations thereof.

In the hydrocarbyl group, some or all of the hydrogen atoms may be substituted by a moiety containing a heteroatom such as oxygen, sulfur, nitrogen or halogen, and some constituent —$CH_2$— may be replaced by a moiety containing a heteroatom such as oxygen, sulfur or nitrogen, so that the group may contain a hydroxy, fluorine, chlorine, bromine, iodine, cyano, carbonyl, ether bond, ester bond, sulfonic ester bond, carbonate bond, lactone ring, sultone ring, carboxylic anhydride (—C(=O)—O—C(=O)—), or haloalkyl moiety.

$R^{101}$ and $R^{102}$ may bond together to form a ring with the sulfur atom to which they are attached. Exemplary preferred rings are shown below.

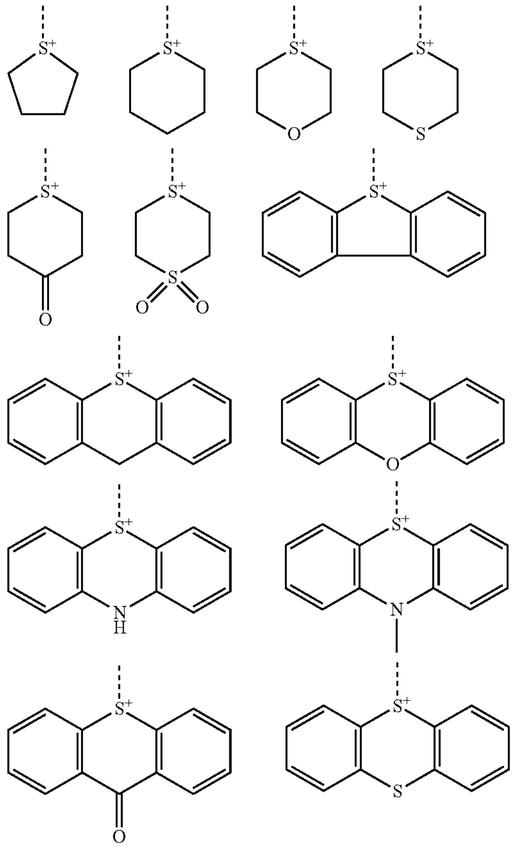

-continued

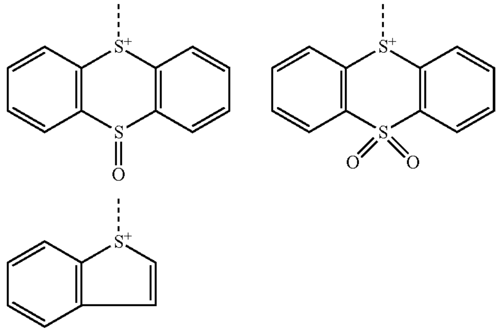

Herein the broken line designates a point of attachment to $R^{103}$.

Examples of the cation in the sulfonium salt having formula (2-1) are shown below, but not limited thereto.

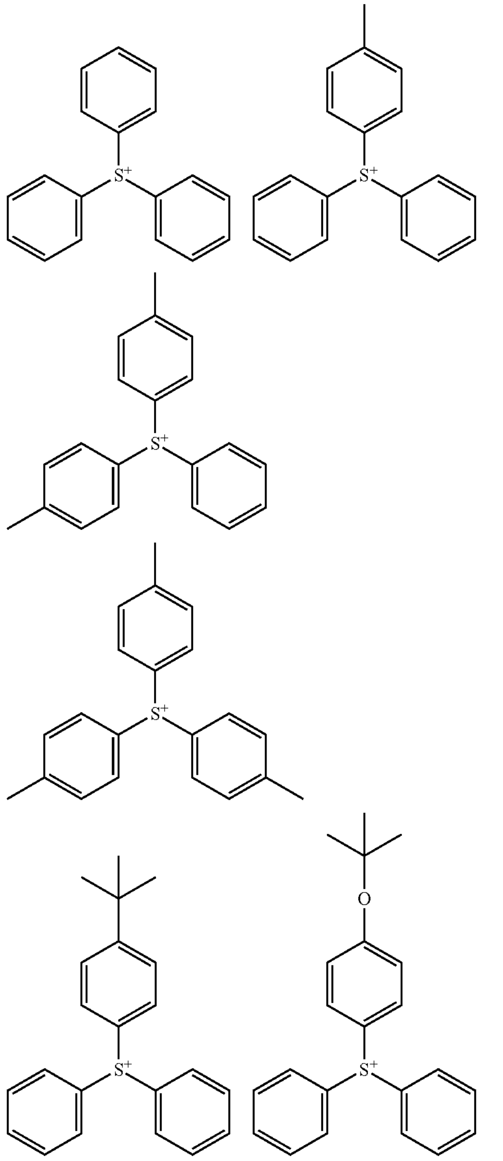

-continued
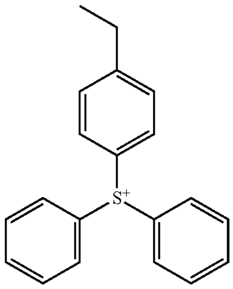
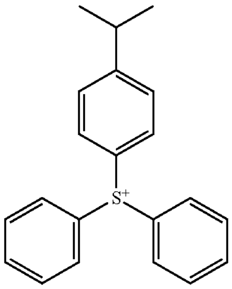
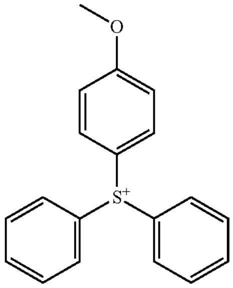
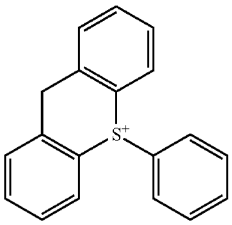
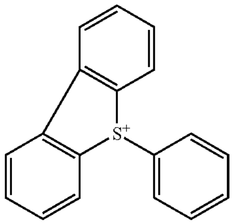
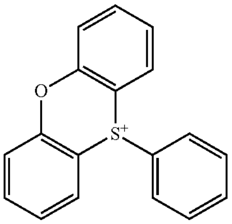
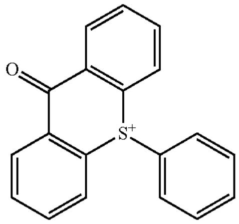
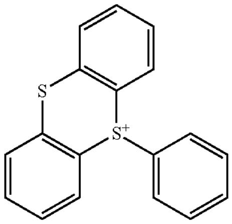
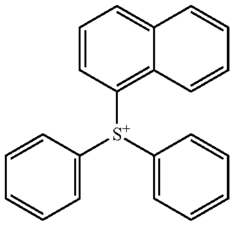
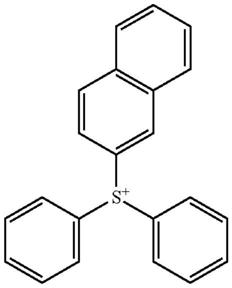
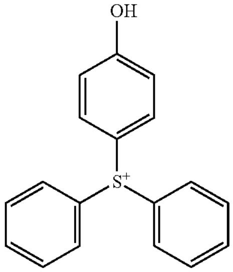
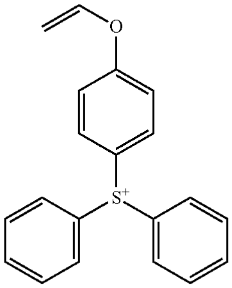
-continued
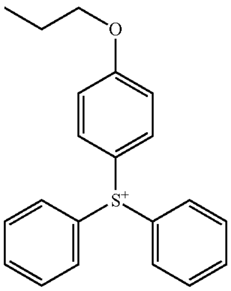
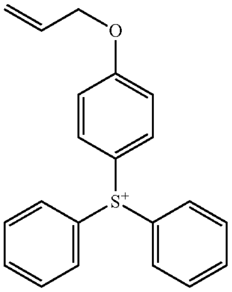
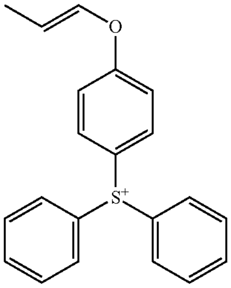
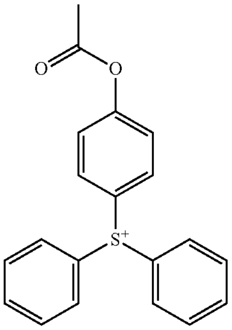
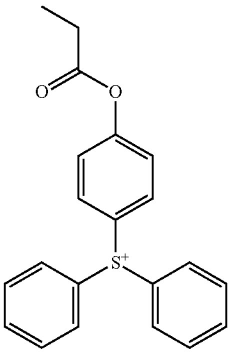
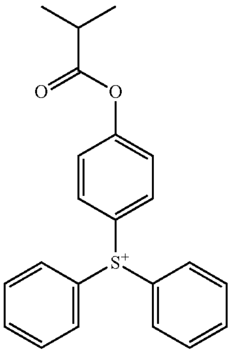
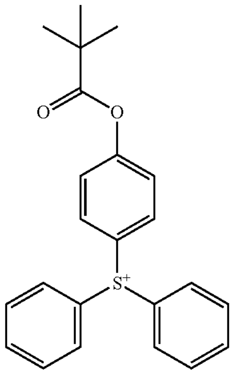
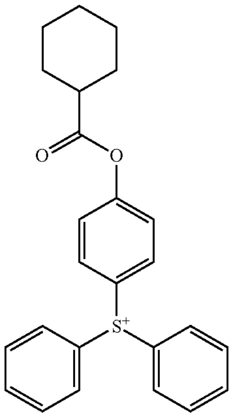

-continued
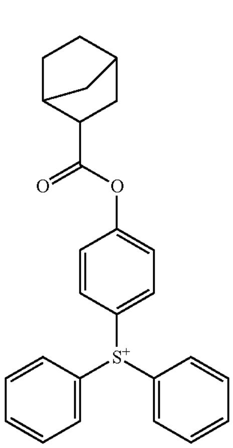
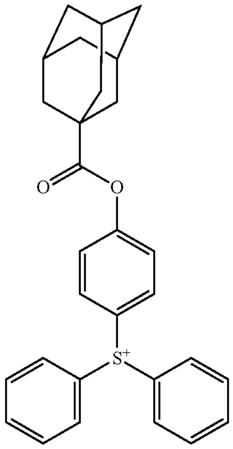
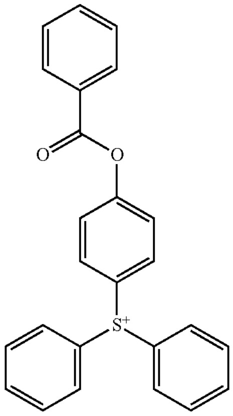
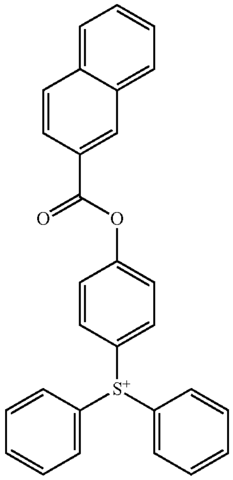
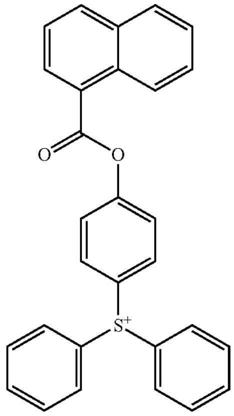
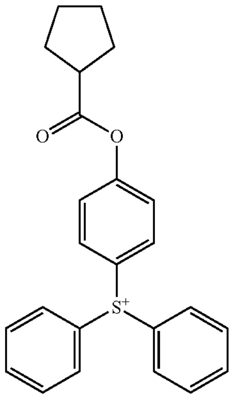
-continued
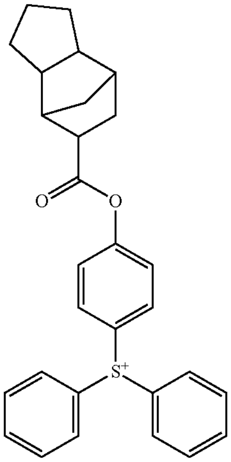
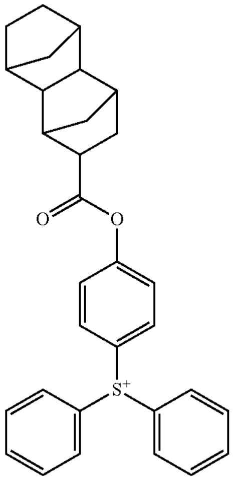
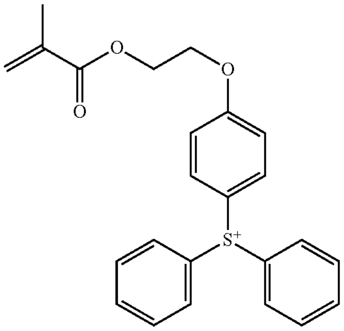
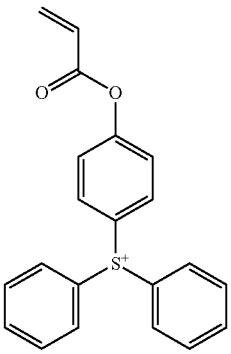
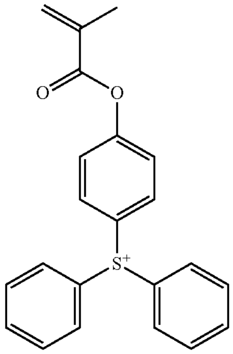
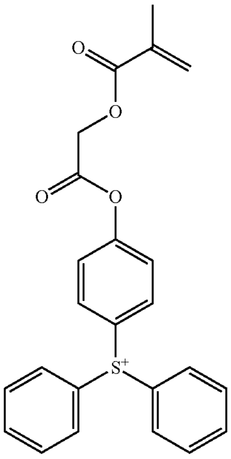

-continued
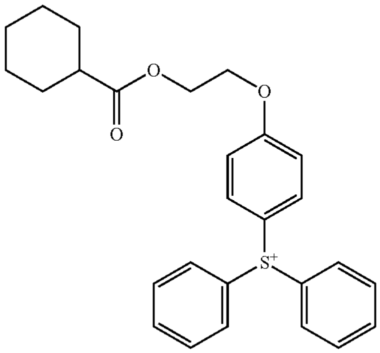
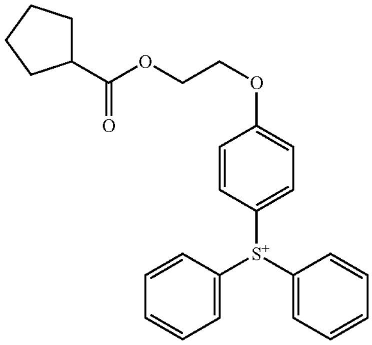
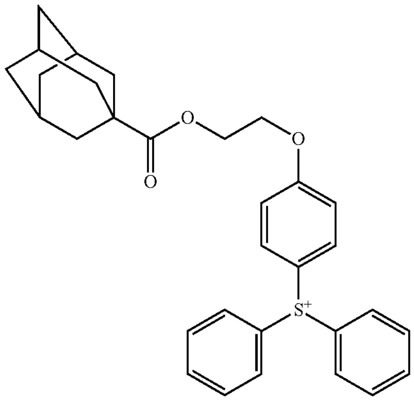
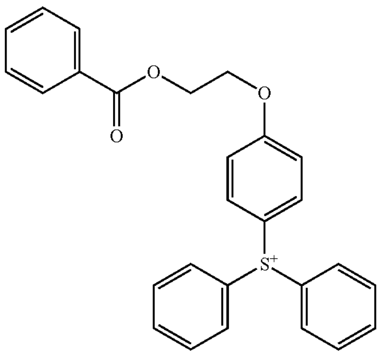
-continued
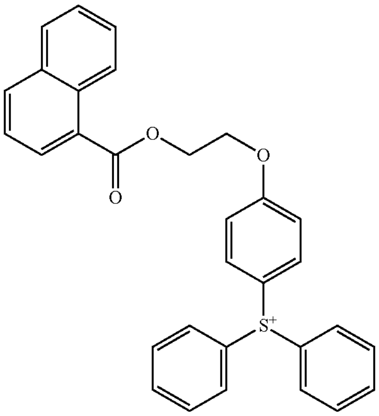
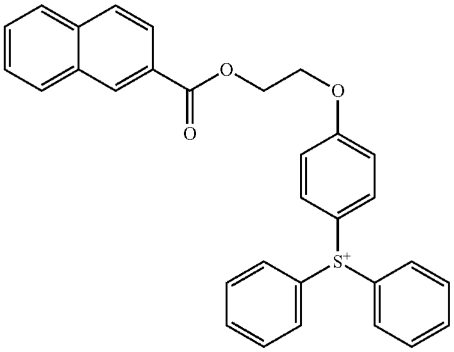
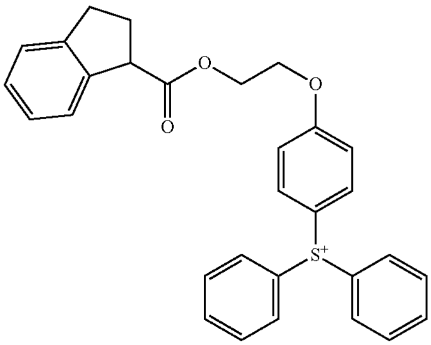
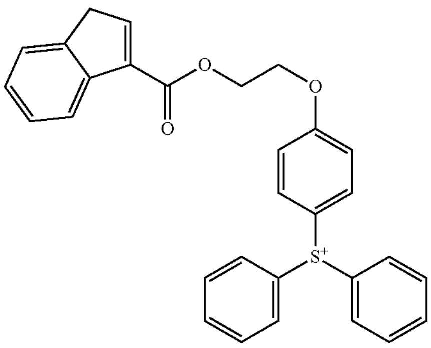

-continued
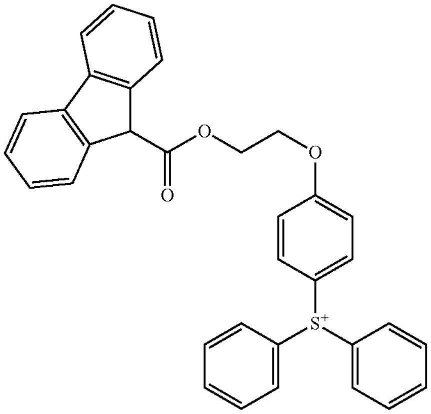
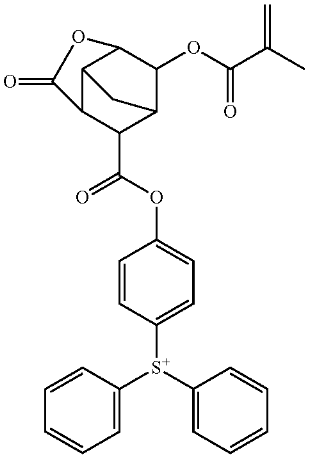
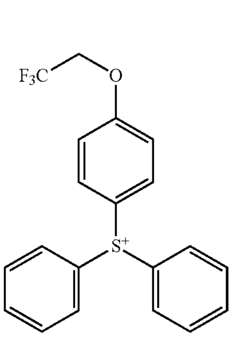
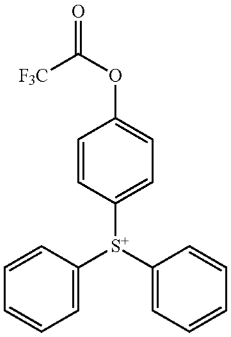
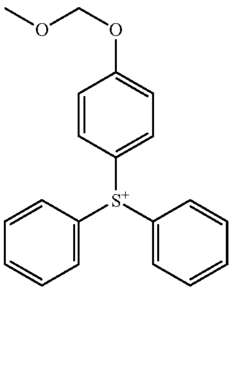
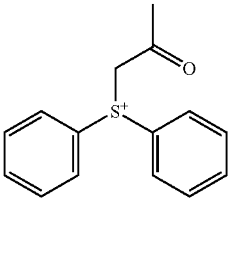
-continued
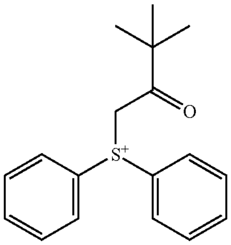
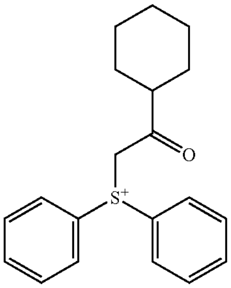
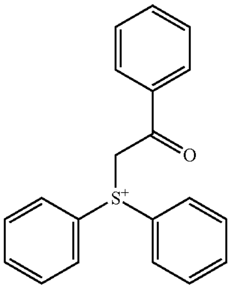
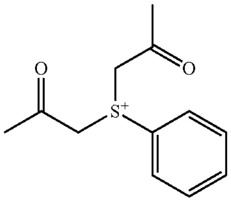
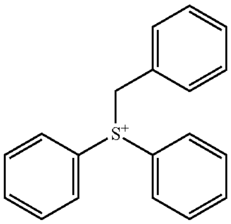
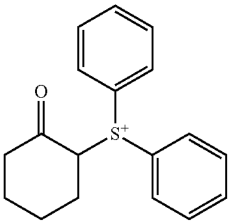
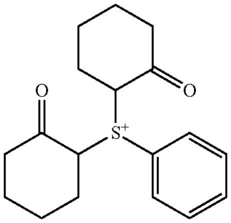
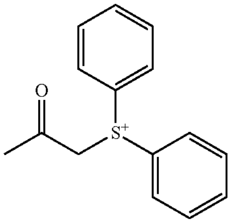
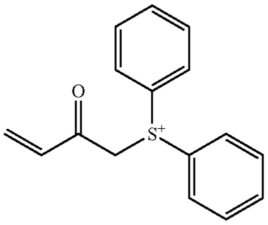
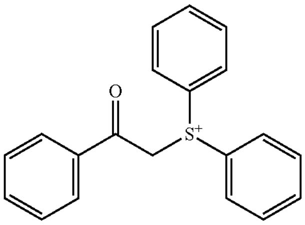
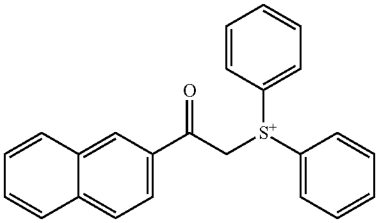

-continued
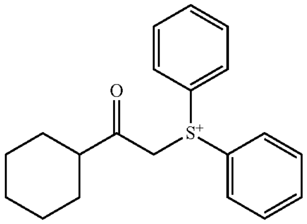
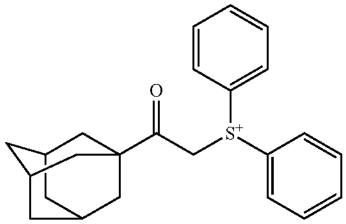
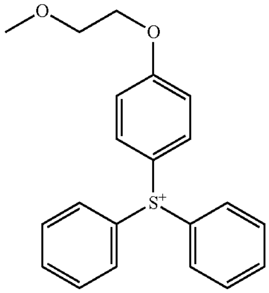
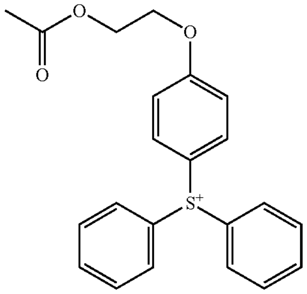
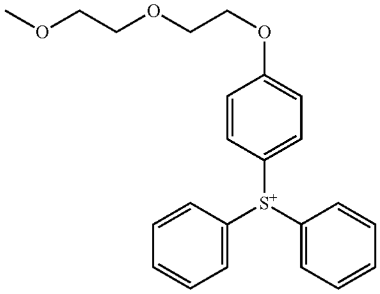
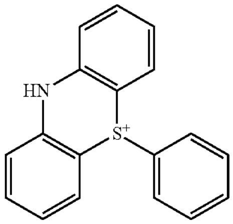
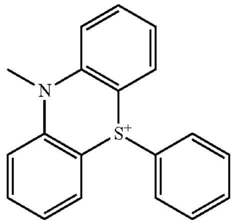
-continued
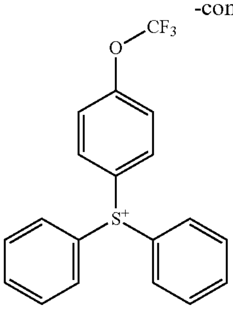
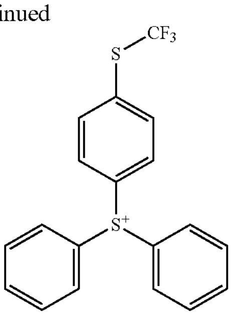
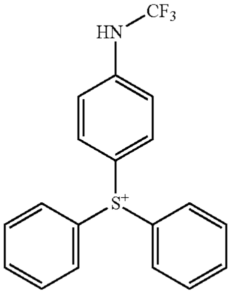
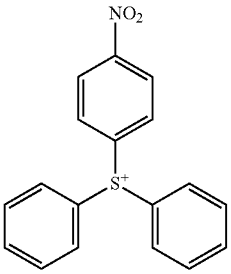
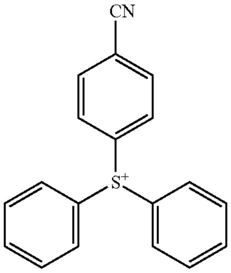
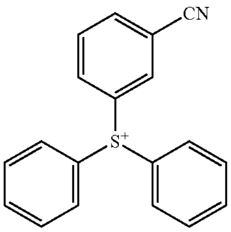
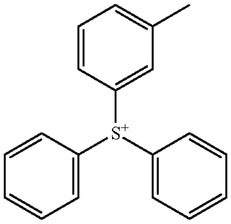
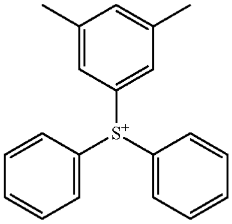
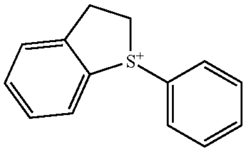
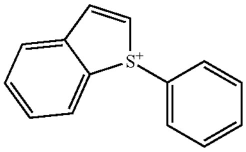
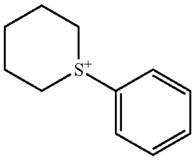
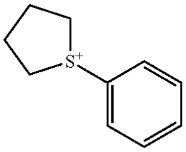
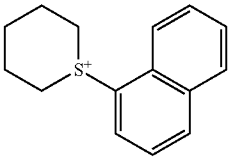
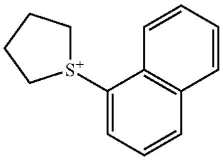
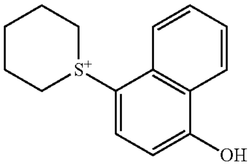
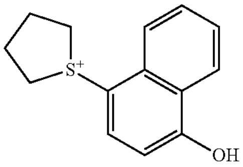

-continued
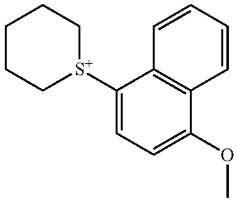
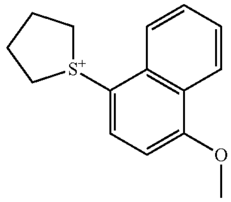
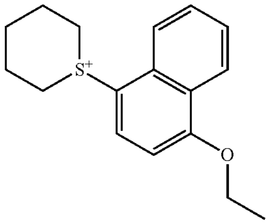
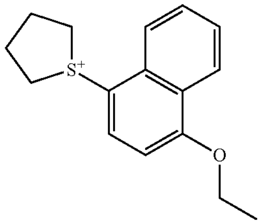
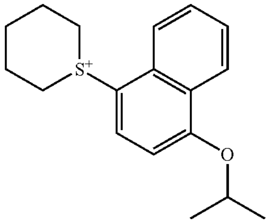
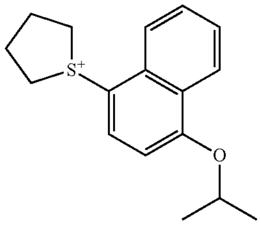
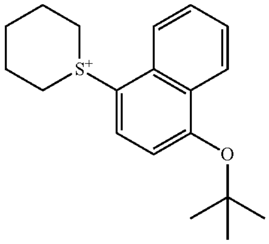
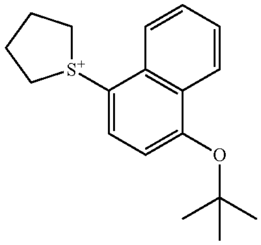
-continued
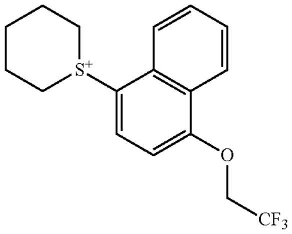
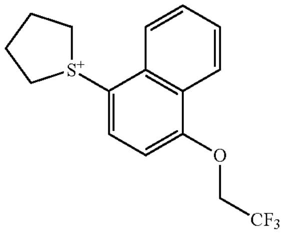
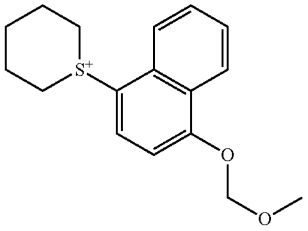
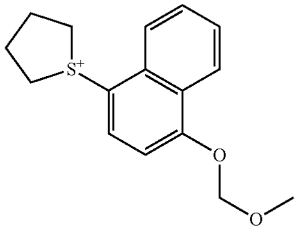
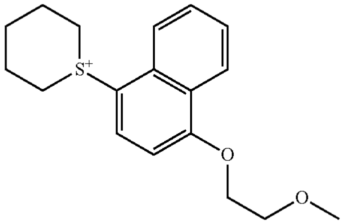
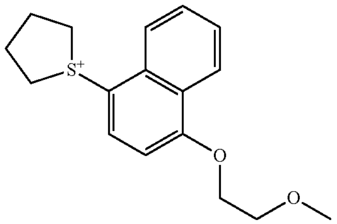
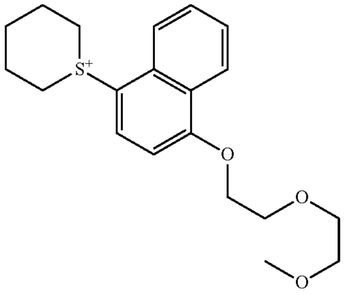

-continued
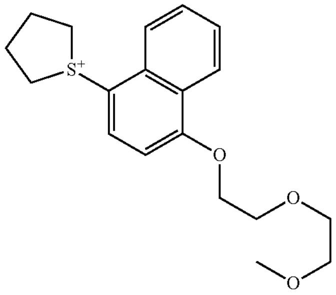
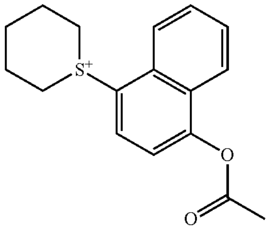
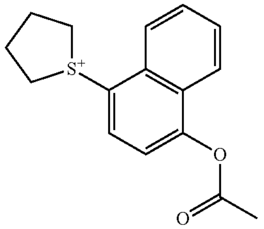
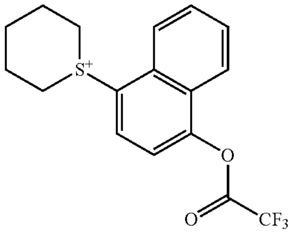
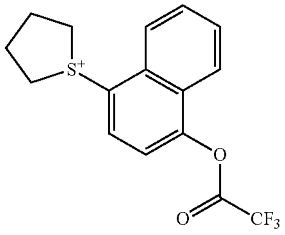
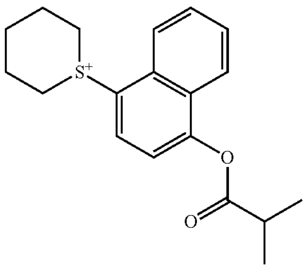
-continued
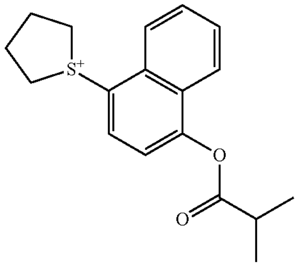
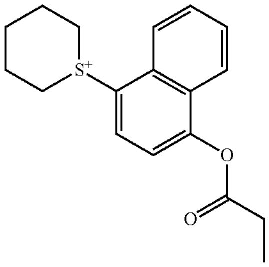
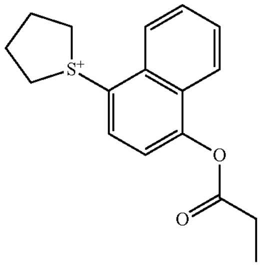
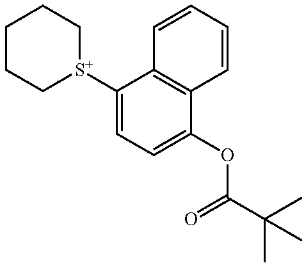
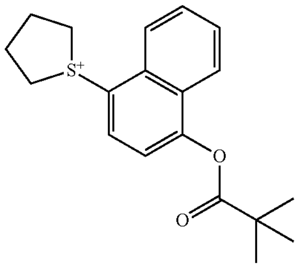
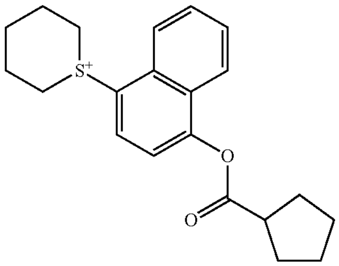

-continued
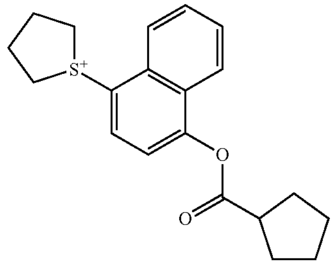
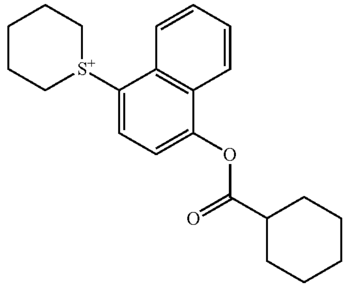
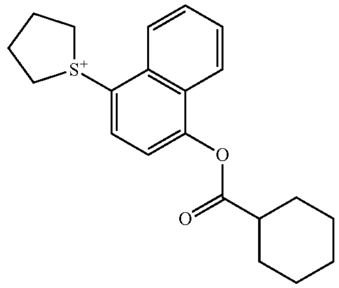
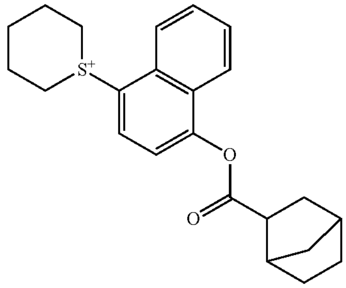
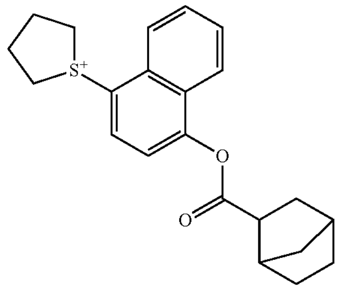
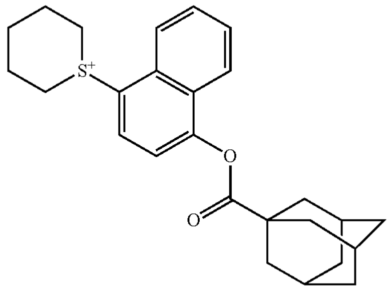
-continued
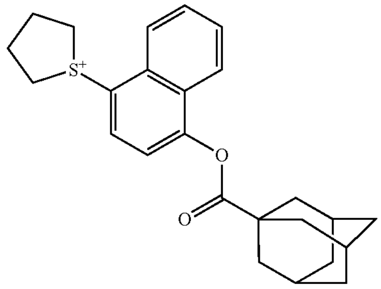
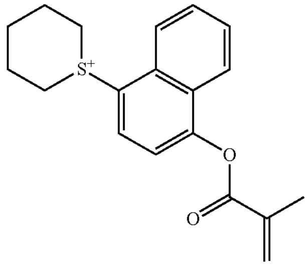
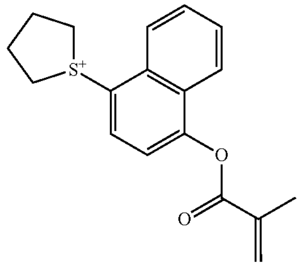
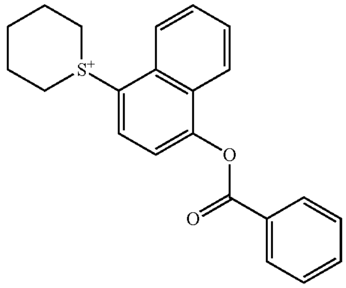
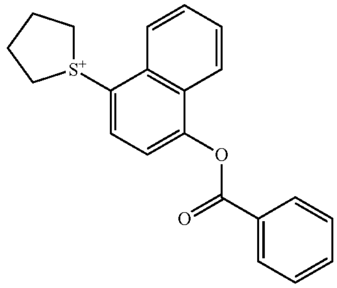
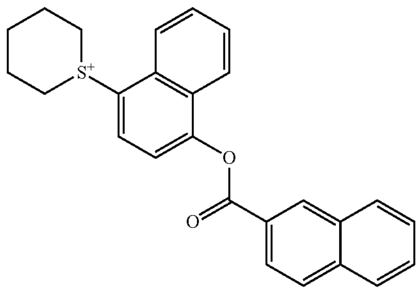

-continued
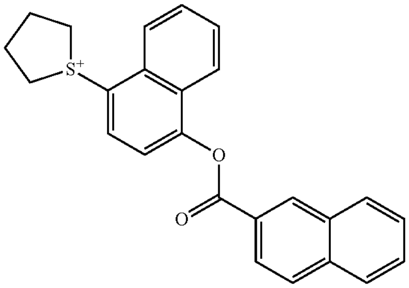
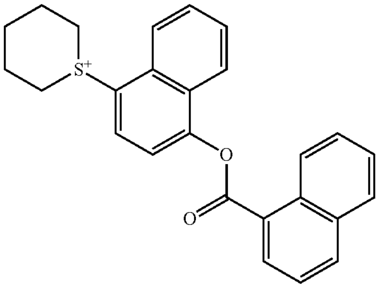
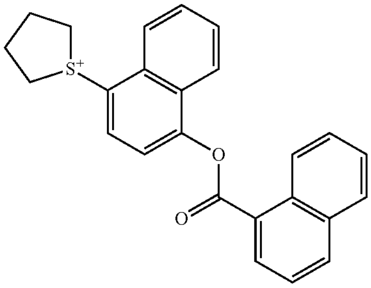
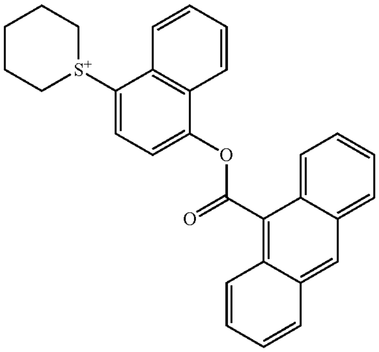
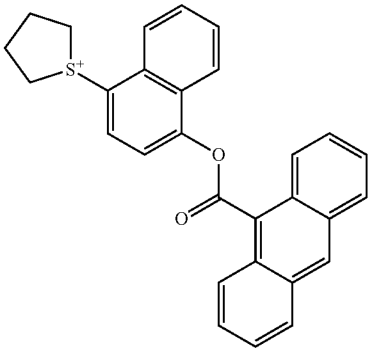
-continued
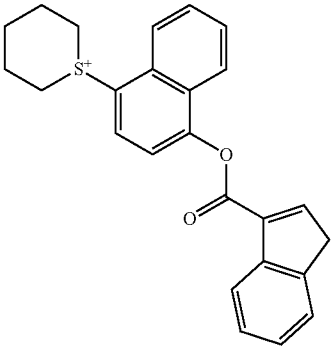
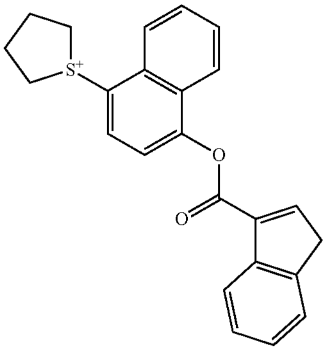
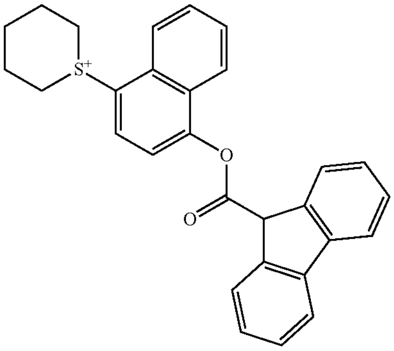
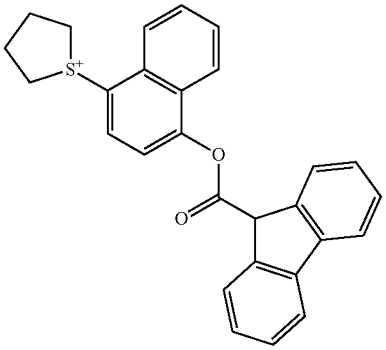
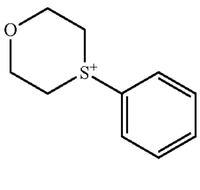
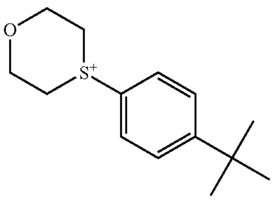

-continued
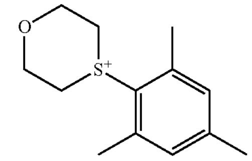
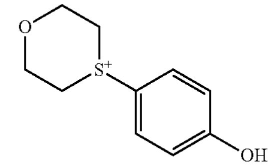
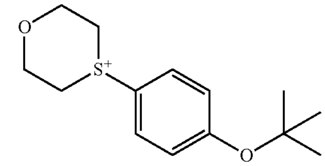
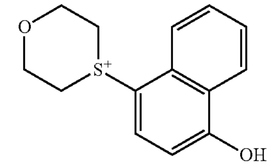
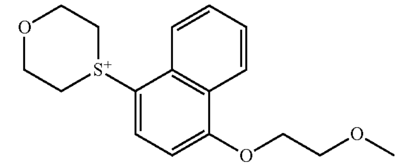
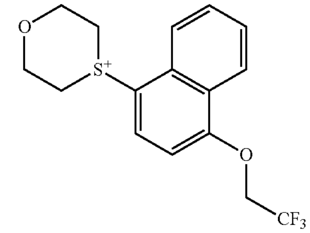
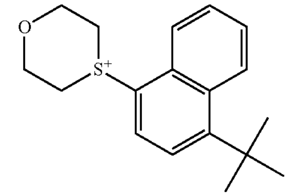
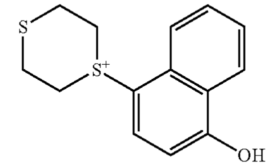
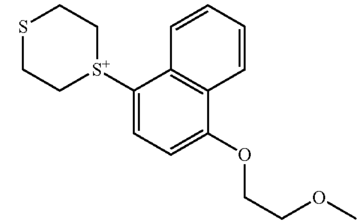
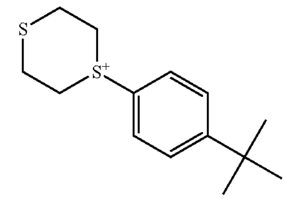
-continued
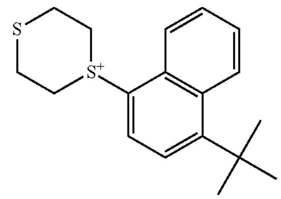
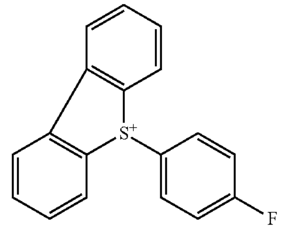
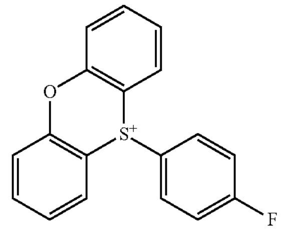
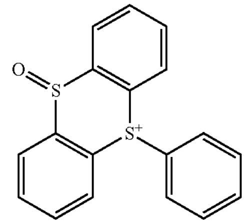
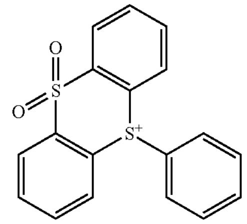
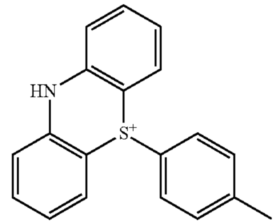
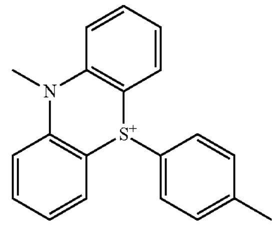

-continued
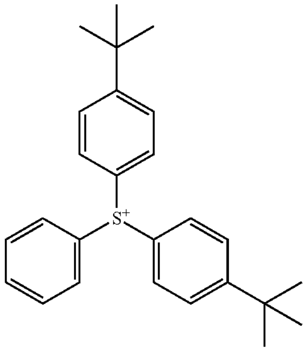
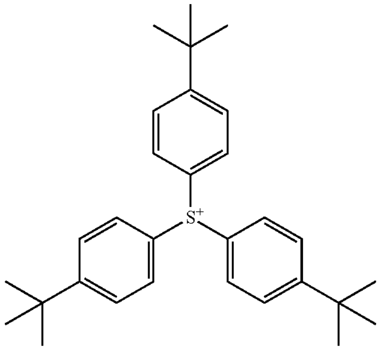
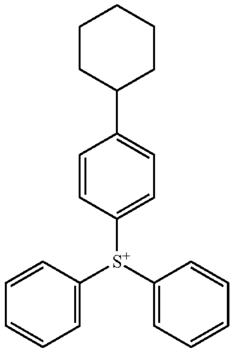
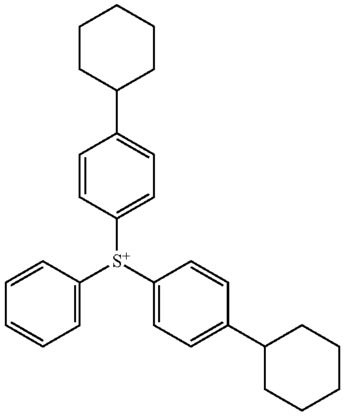
-continued
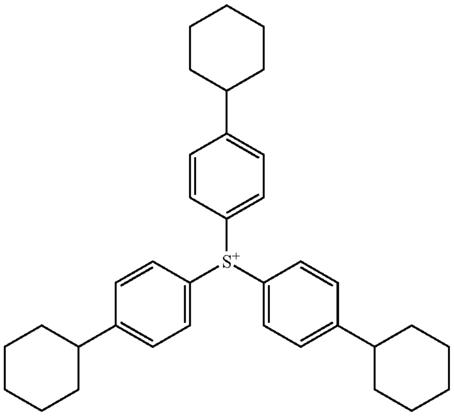
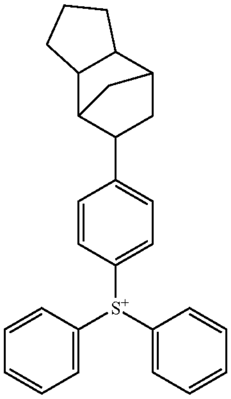
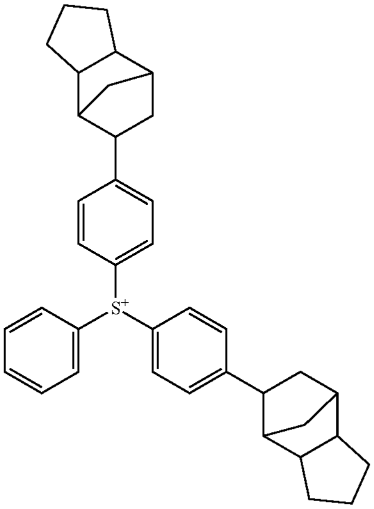

-continued
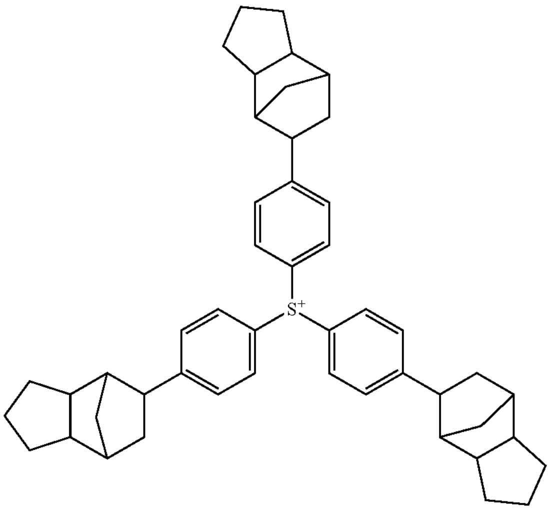
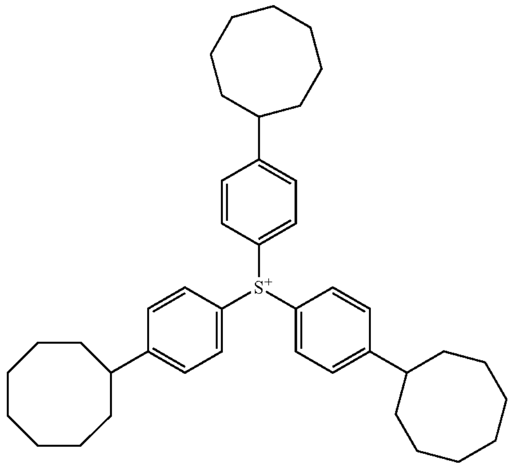
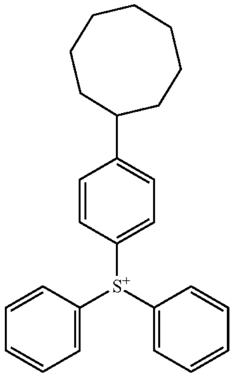
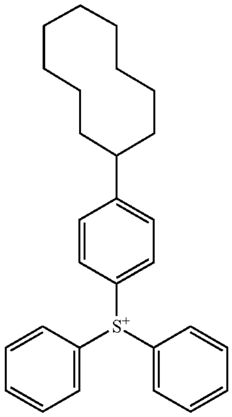
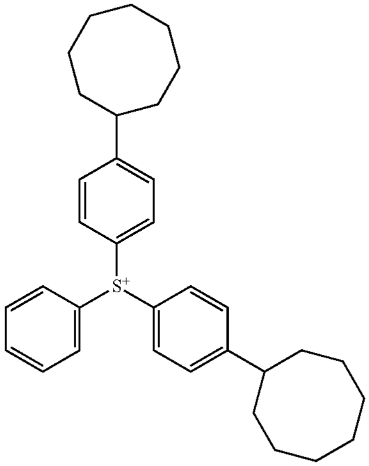
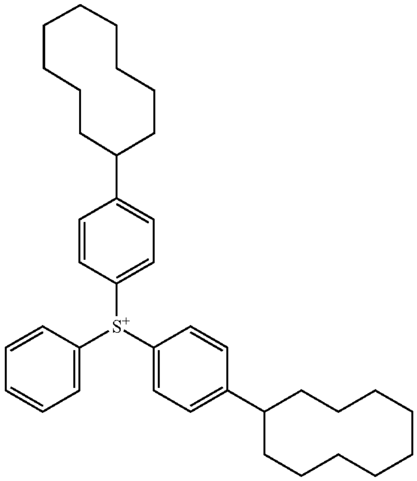

-continued
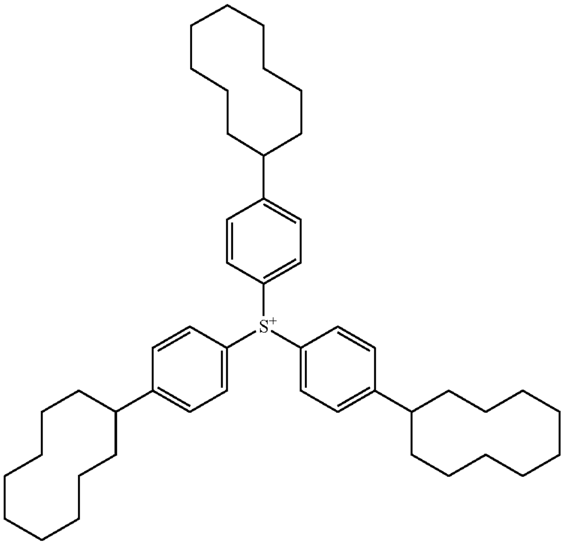
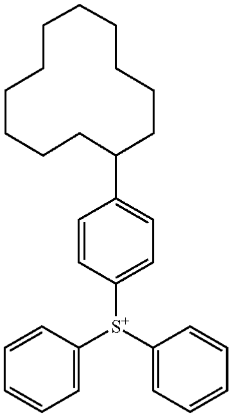
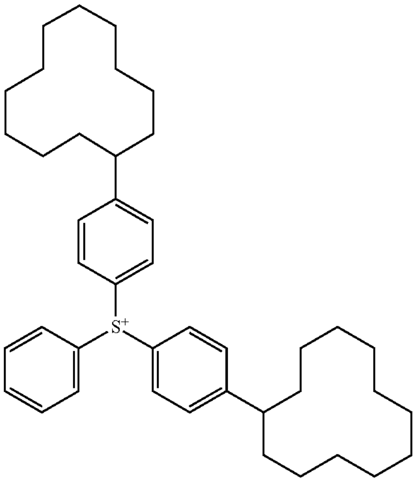
-continued
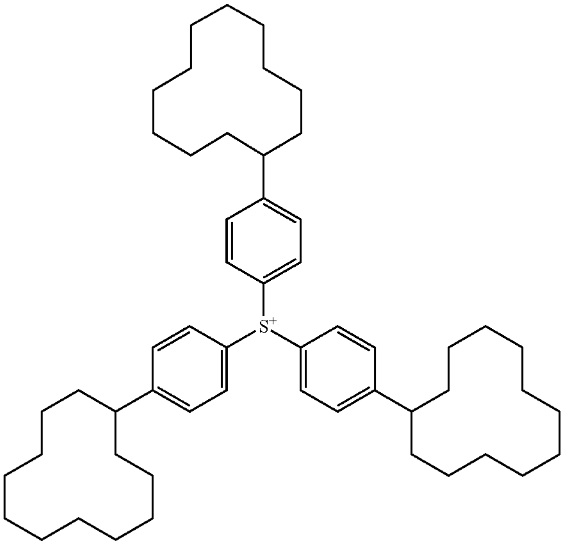
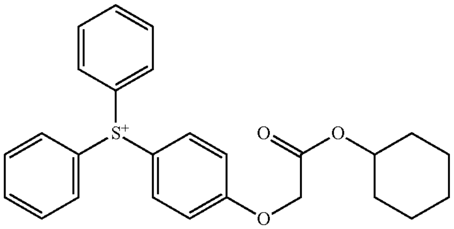
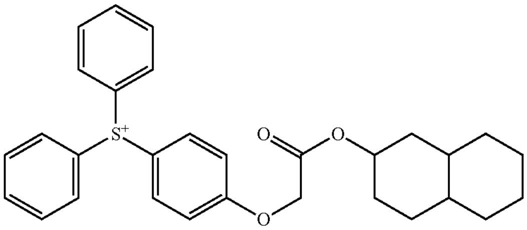
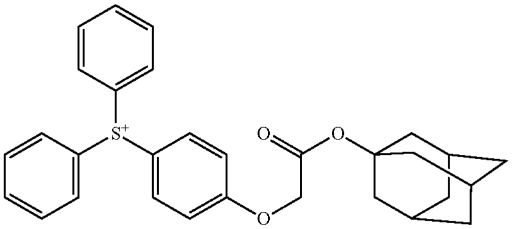
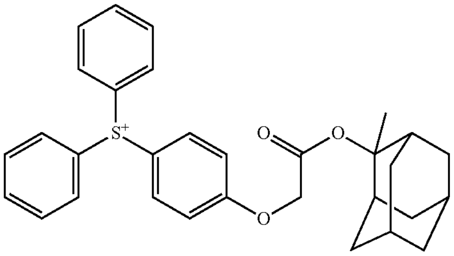
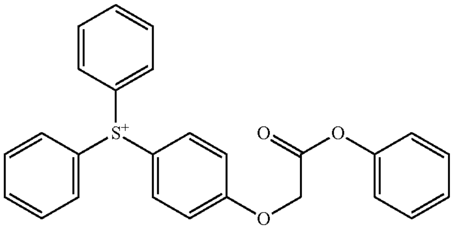

-continued
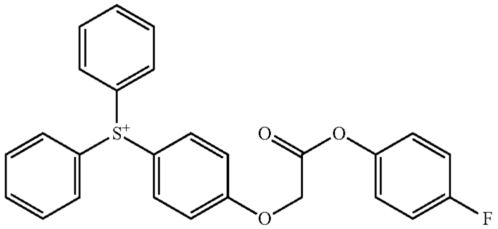
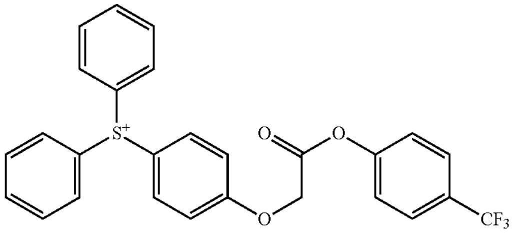
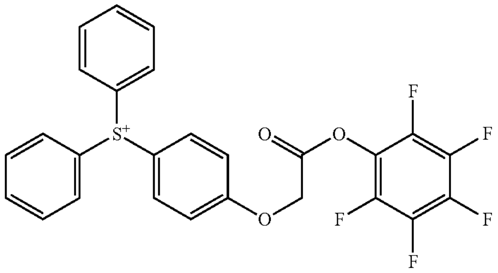
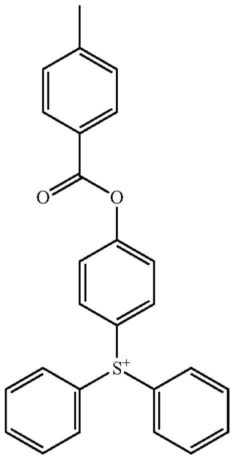
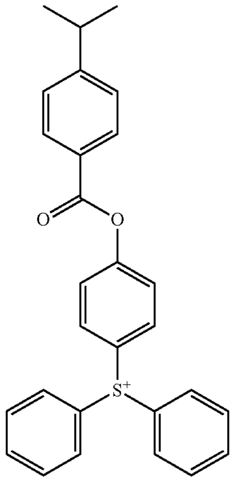
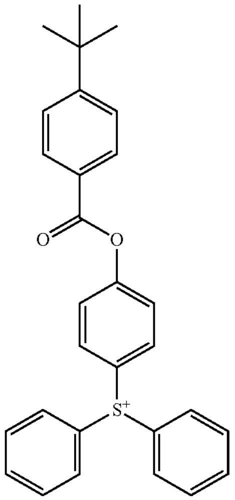
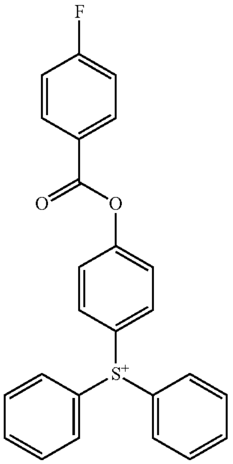
-continued
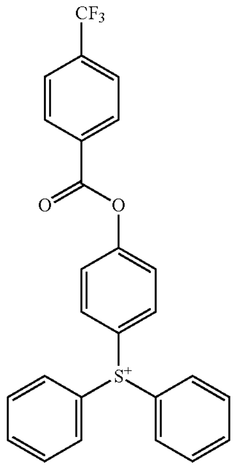
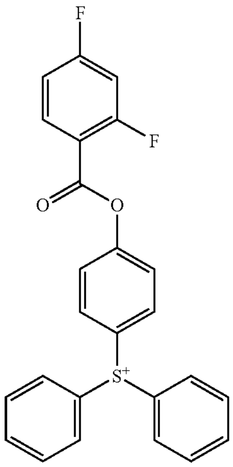
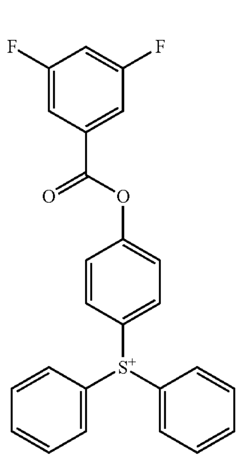
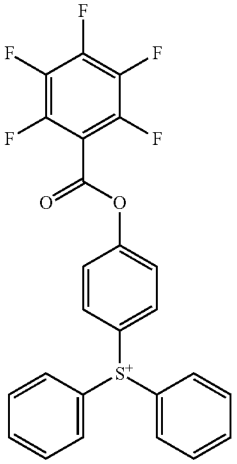
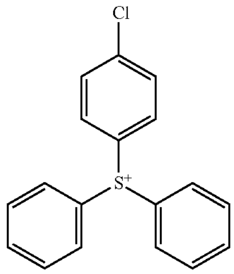
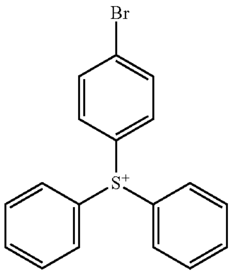
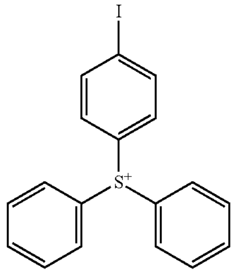
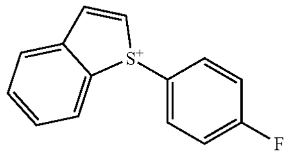

-continued
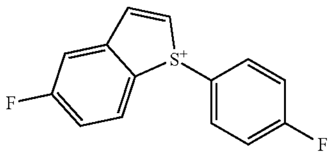
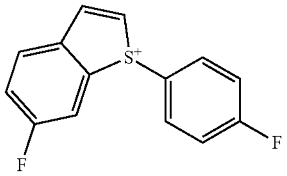
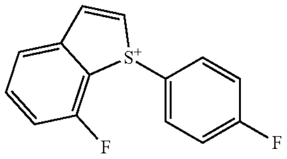
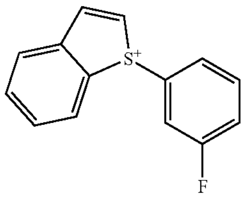
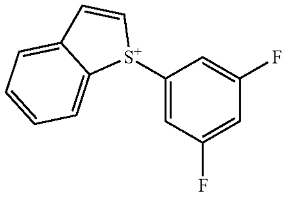
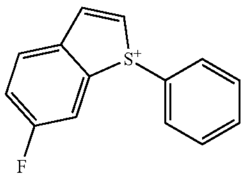
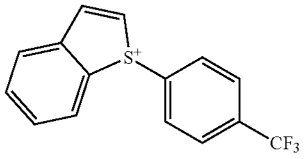
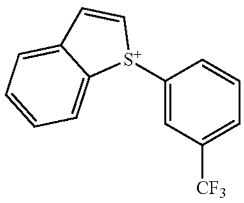
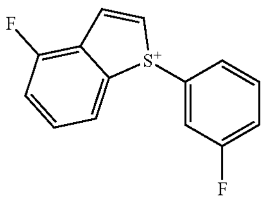
-continued
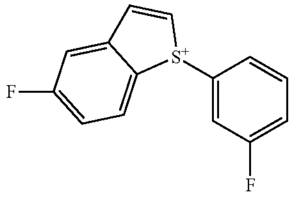
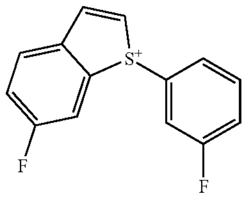
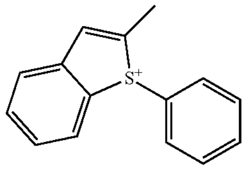
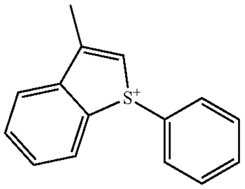
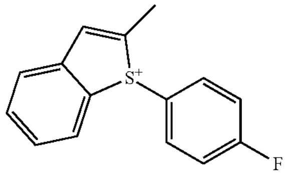
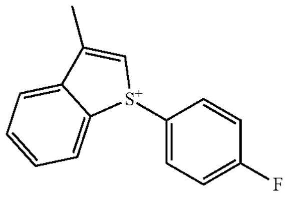
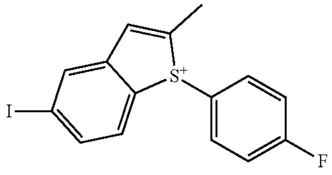
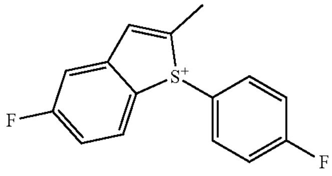
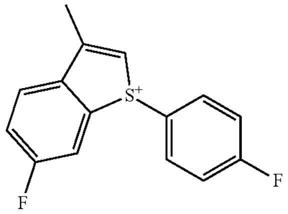
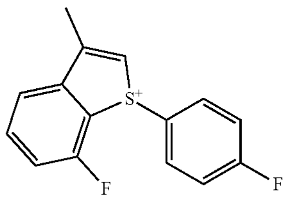

-continued
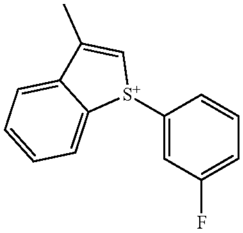
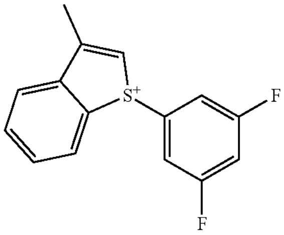
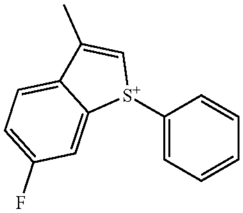
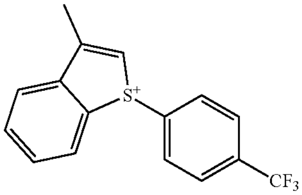
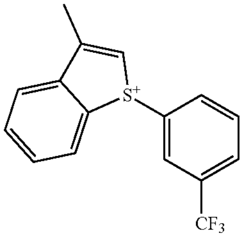
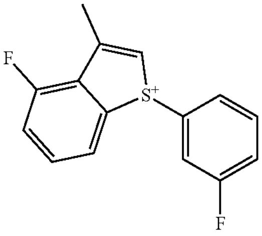
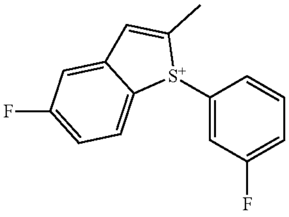
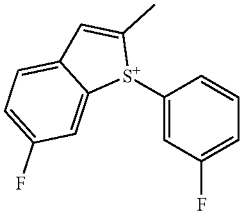
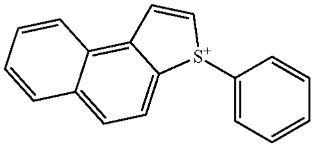
-continued
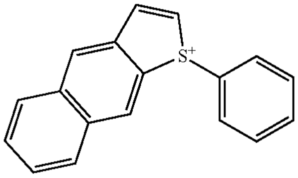
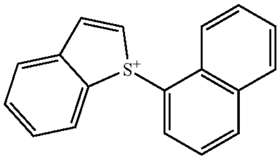
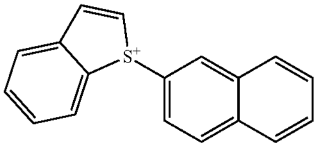
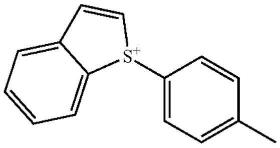
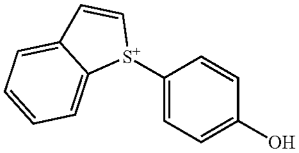
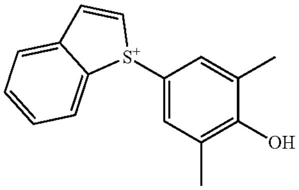
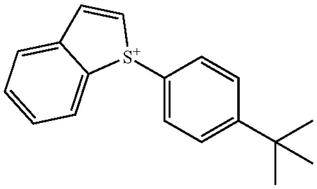
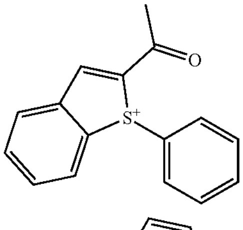
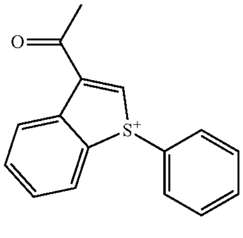
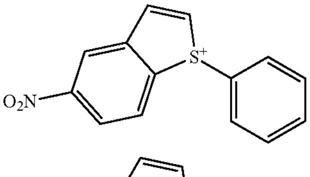
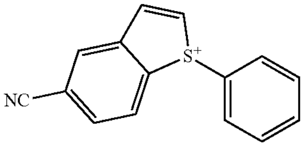

-continued
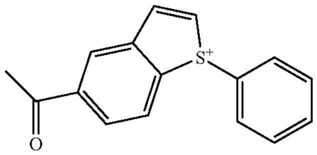
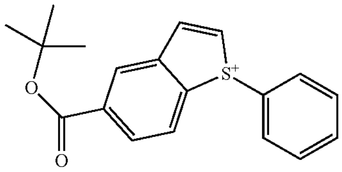
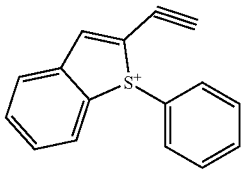
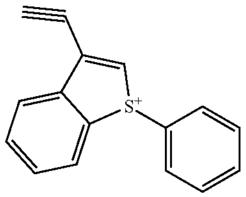
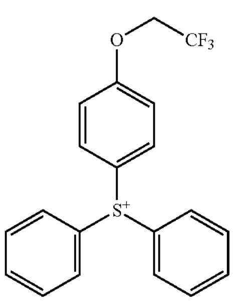
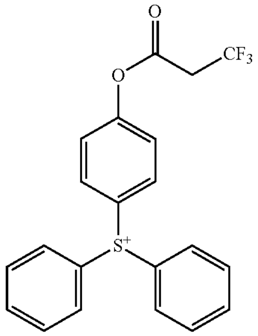
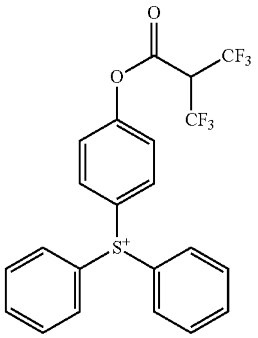
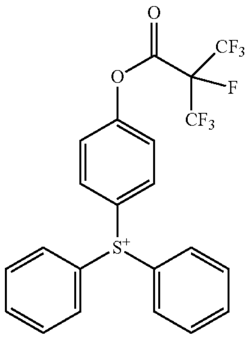
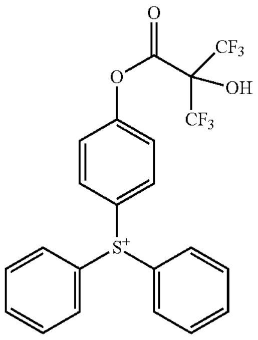
-continued
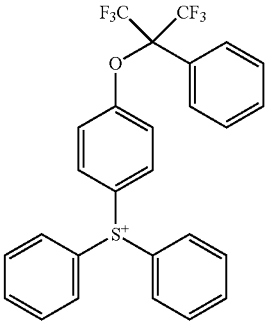
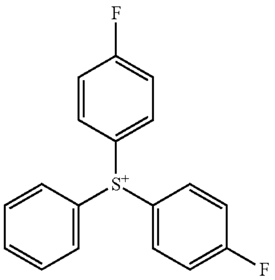
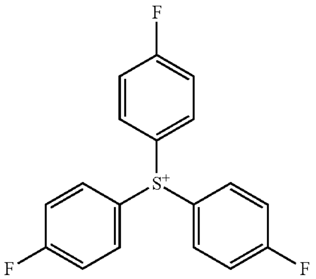
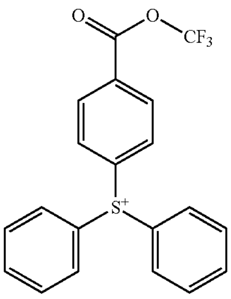
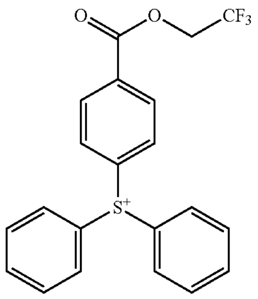
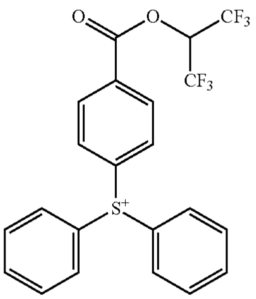

-continued
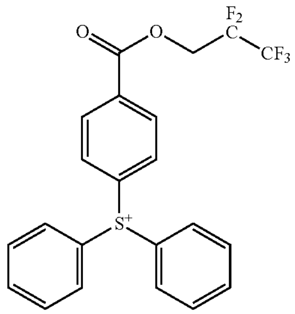
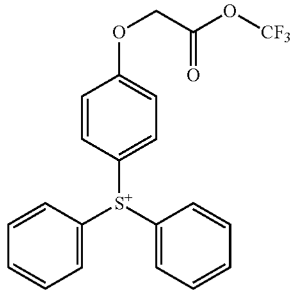
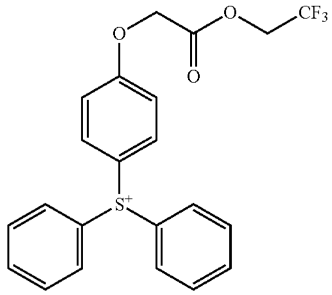
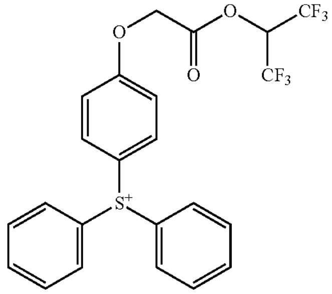
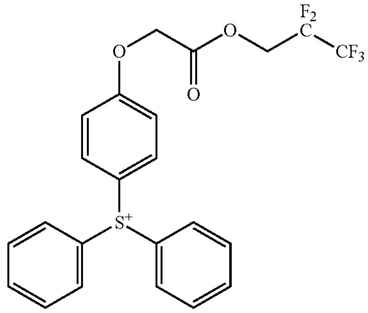 [SMILES: O=C(COc1ccc([S+](c2ccccc2)c2ccccc2)cc1)OCC(F)(F)C(F)(F)F]
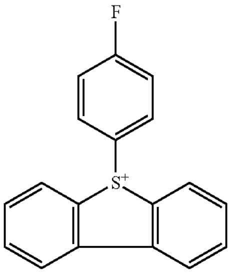
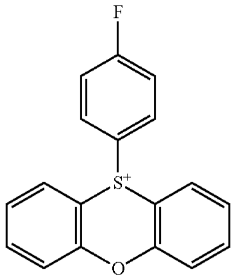
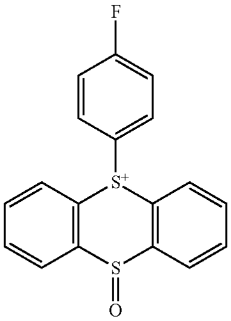
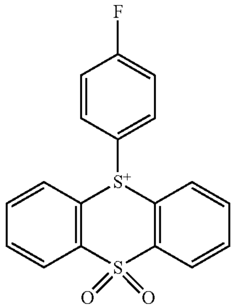
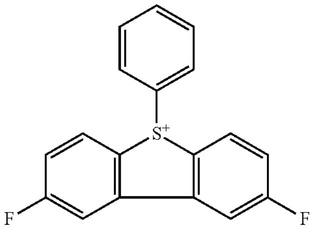
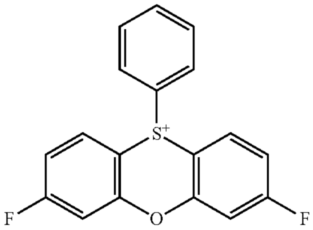
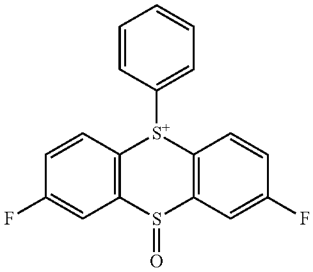
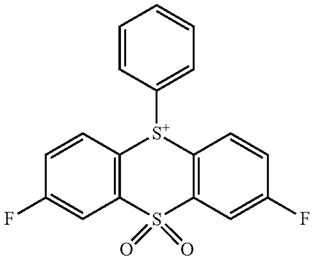

-continued
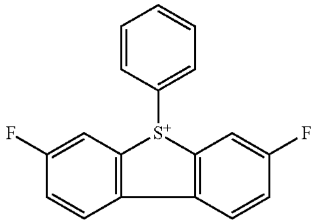
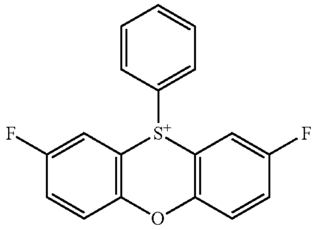
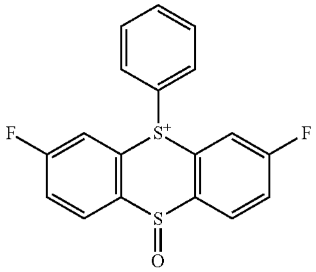
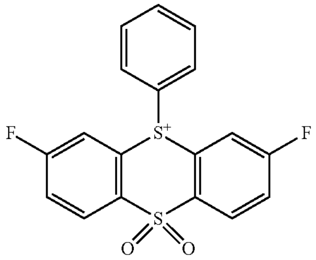
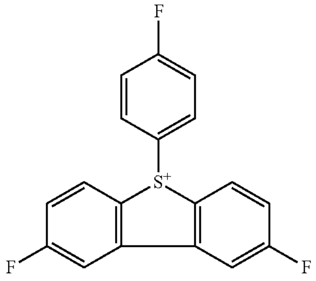
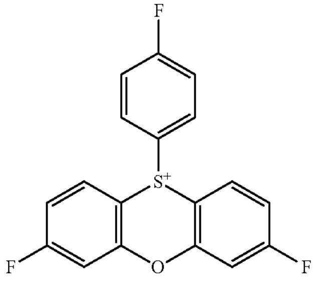
-continued
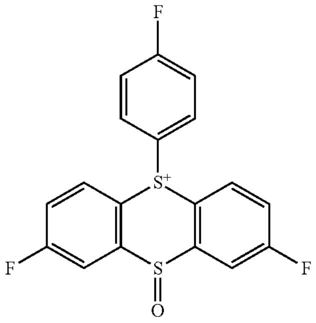
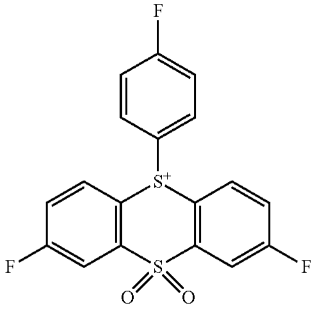
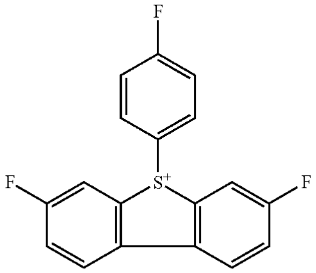
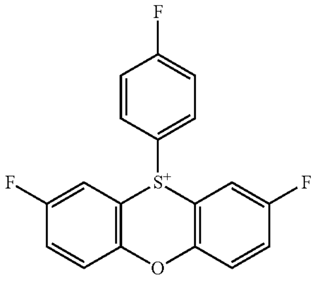
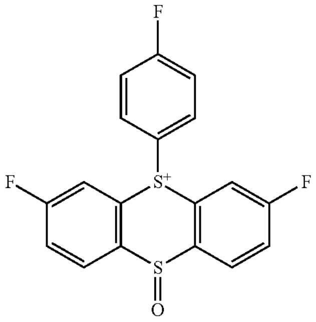

-continued
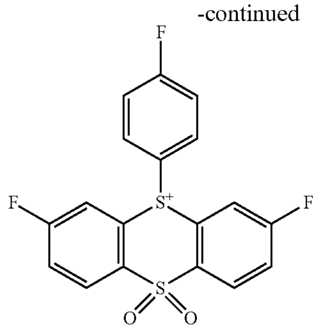
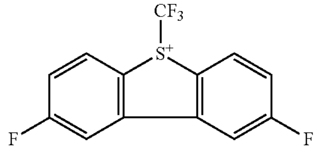
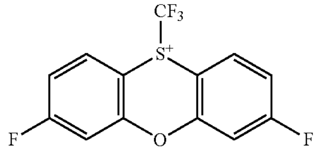
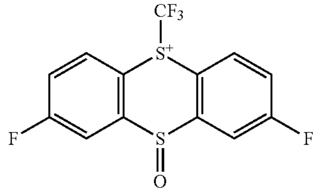
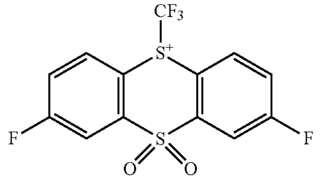
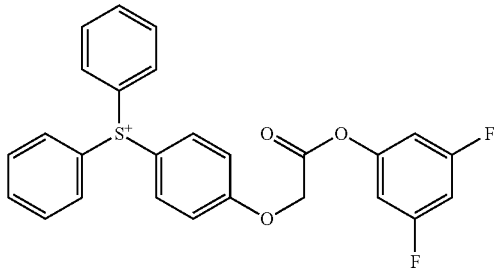
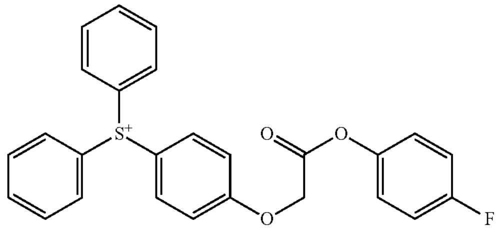
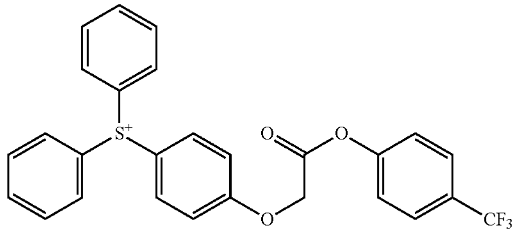
-continued
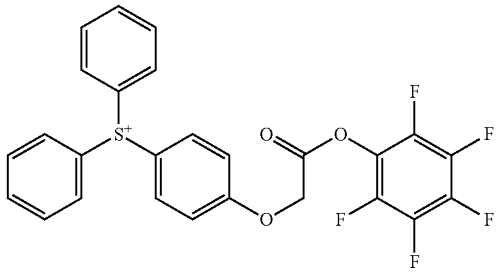
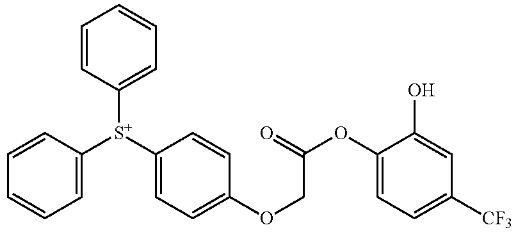
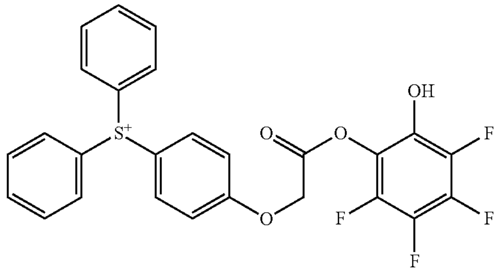
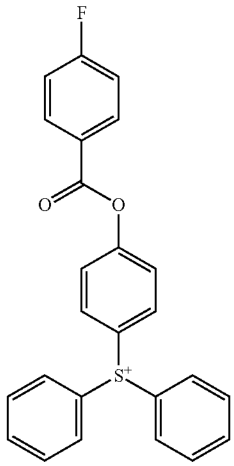
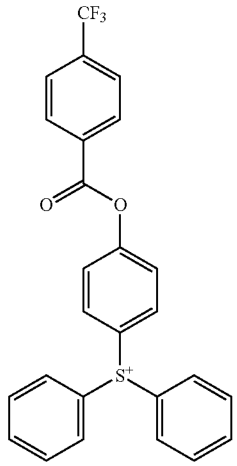
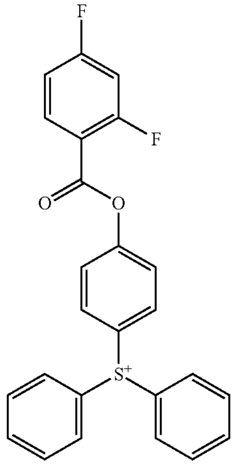
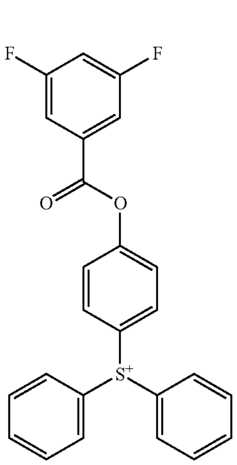

-continued
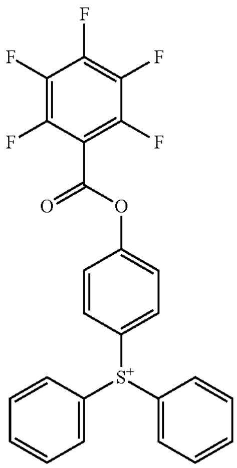
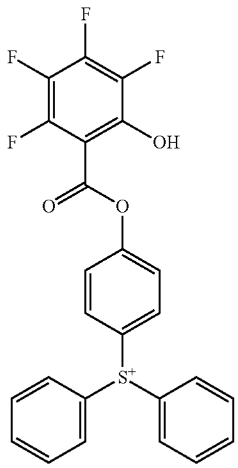
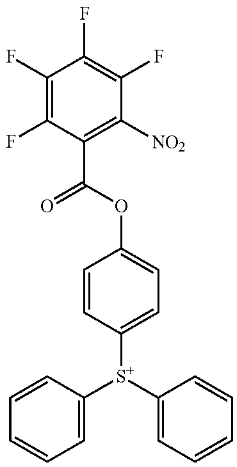
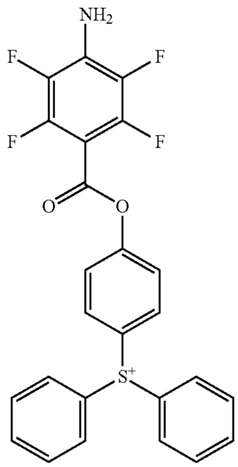
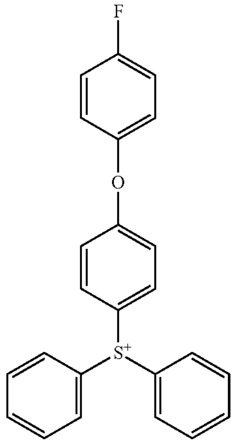
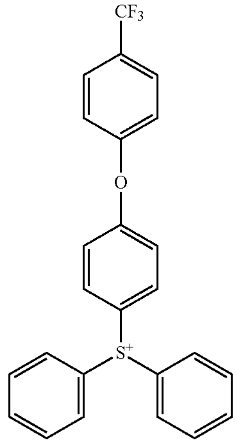
-continued
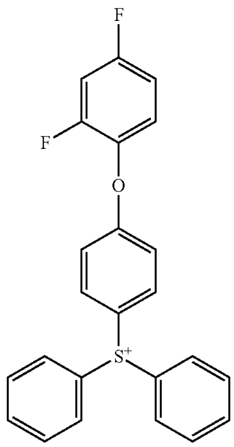
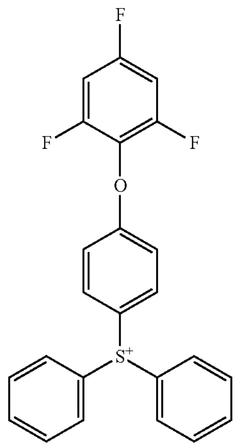
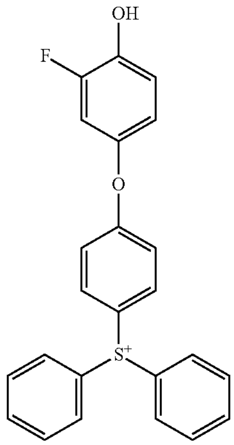
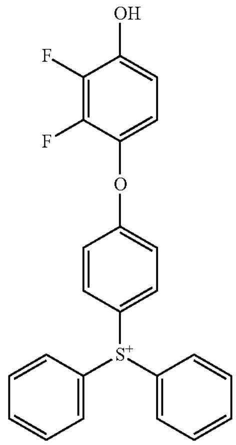
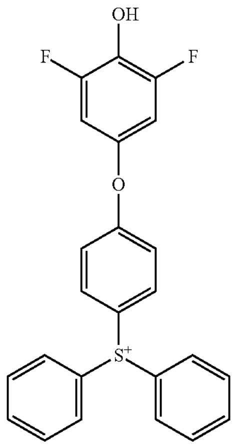
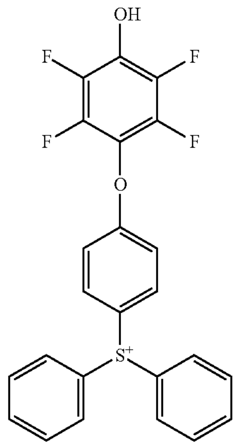
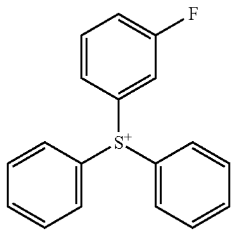
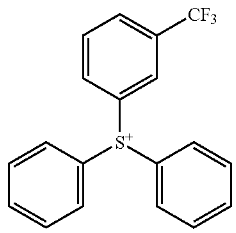

-continued
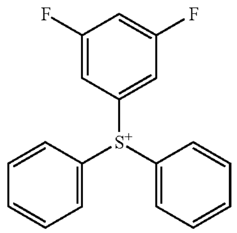
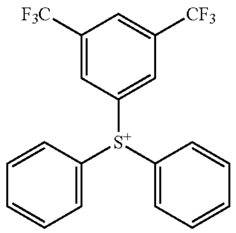
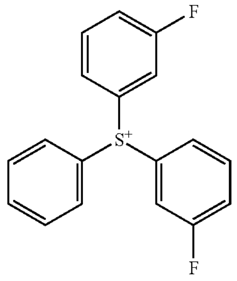
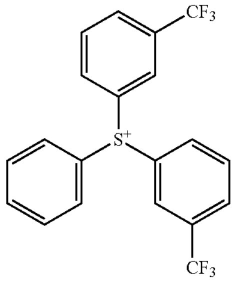
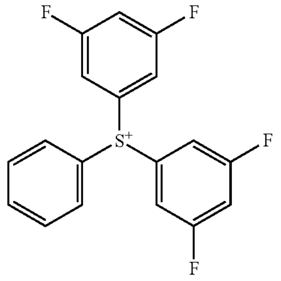
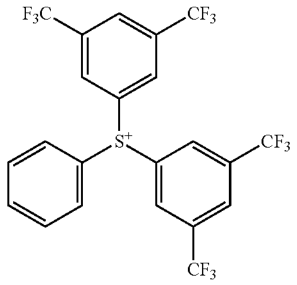
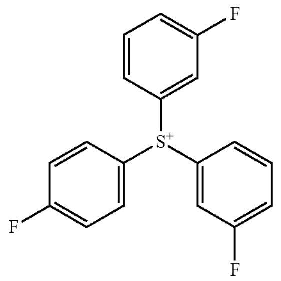
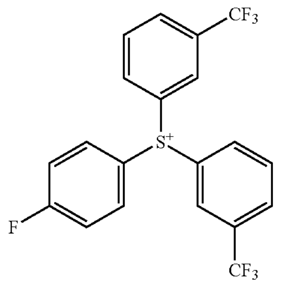
-continued
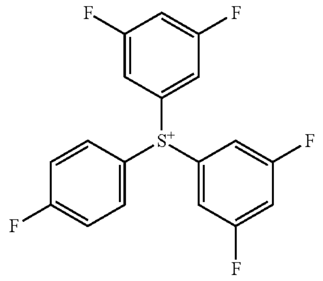
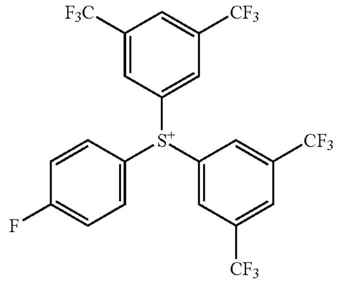
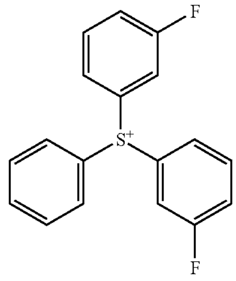
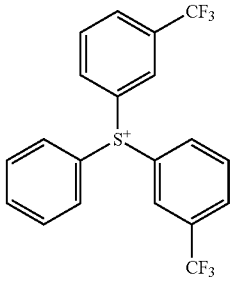
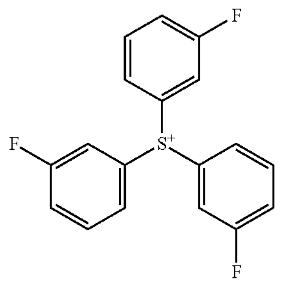
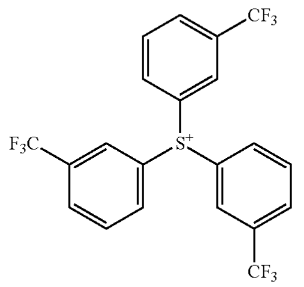
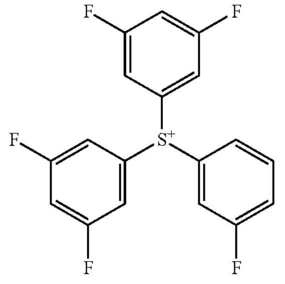

-continued
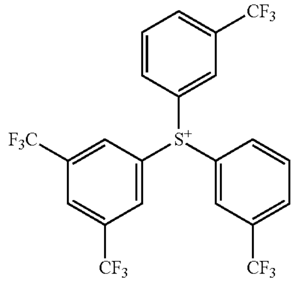
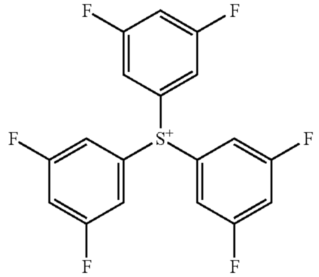
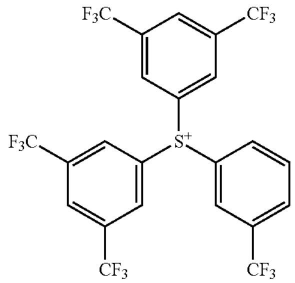
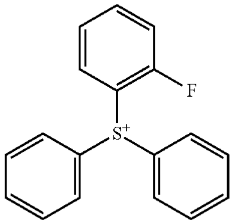
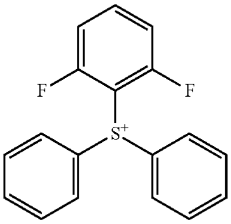
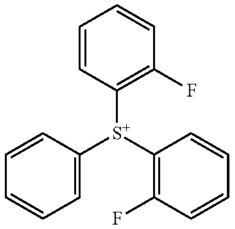
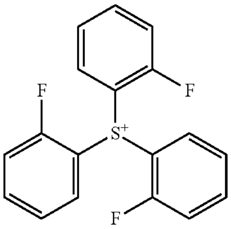
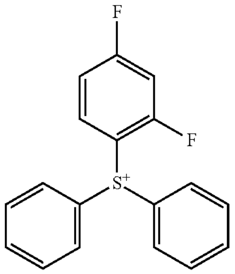
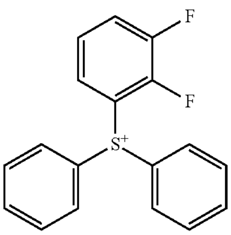
-continued
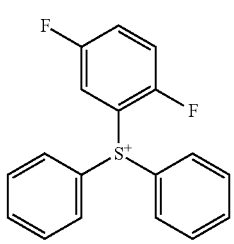
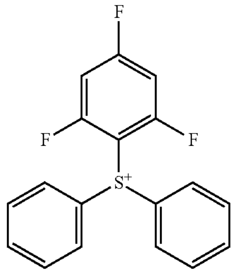
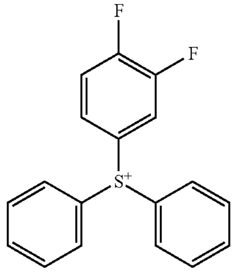
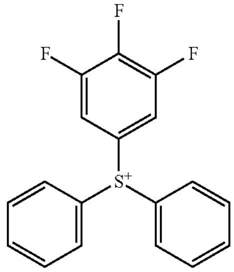
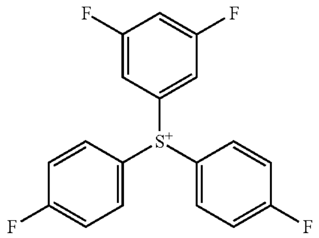
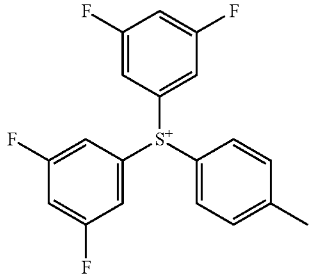
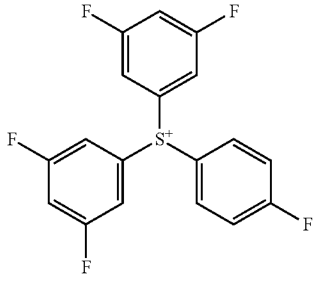
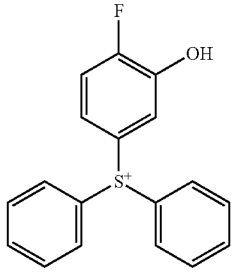
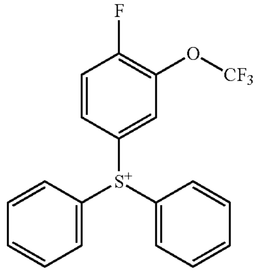

-continued
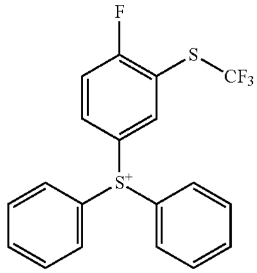
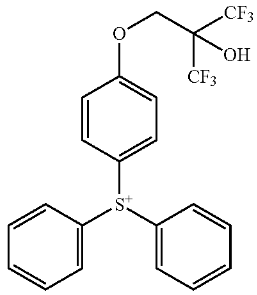
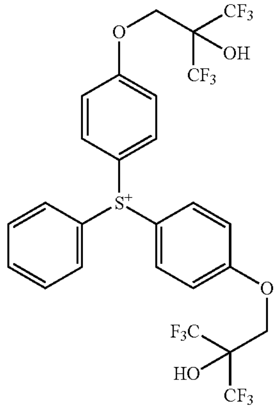
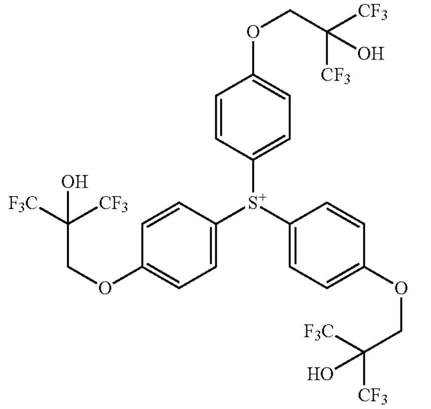
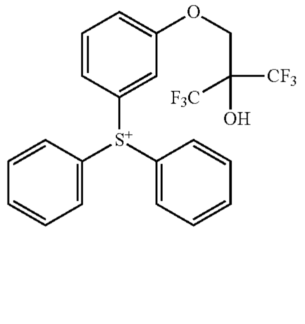
-continued
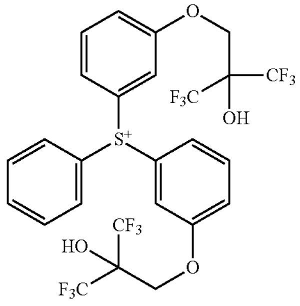
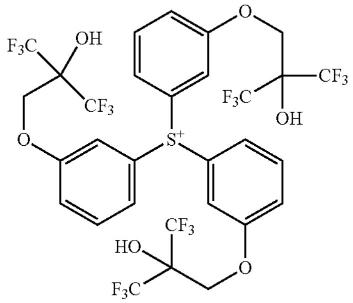
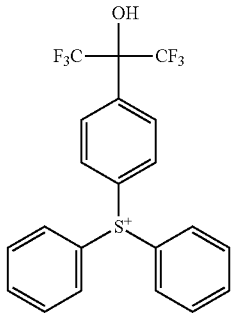
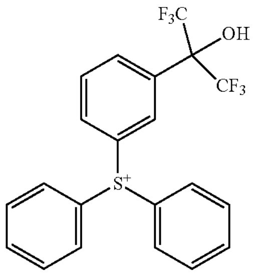
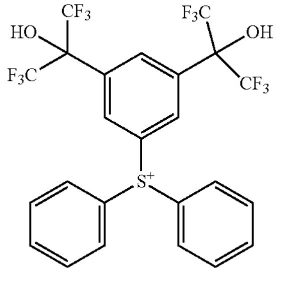
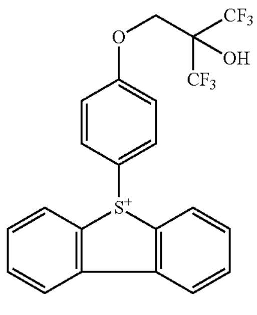

-continued
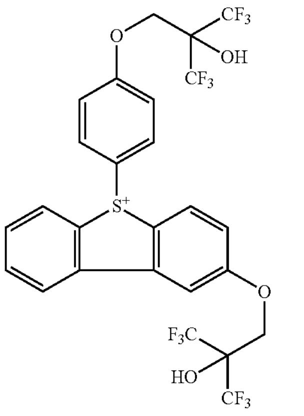
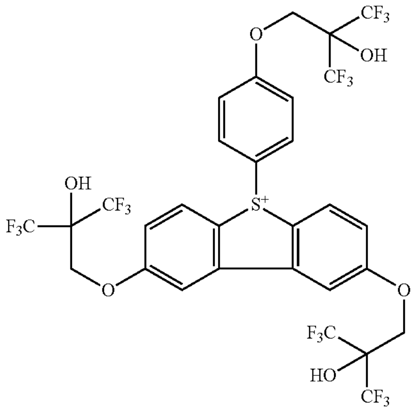
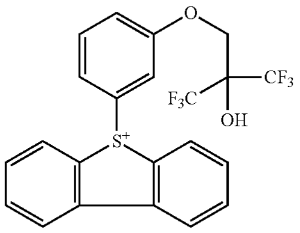
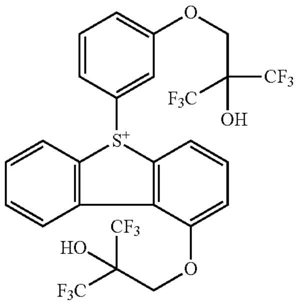
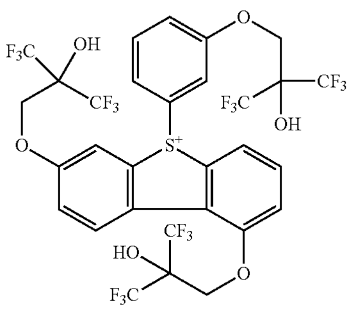
-continued
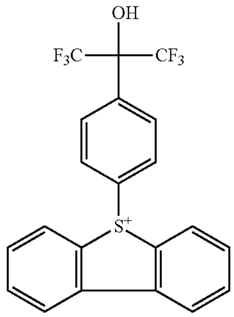
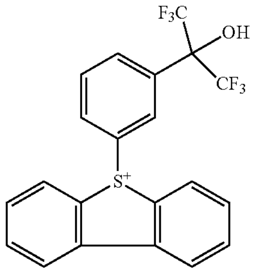
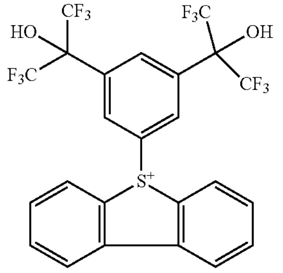
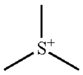
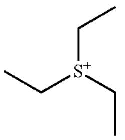
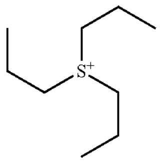
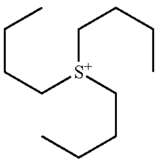
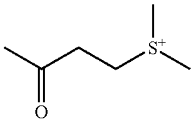
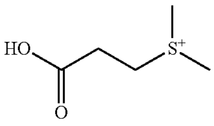
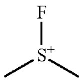
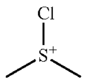
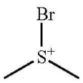
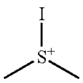
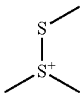
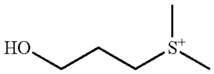
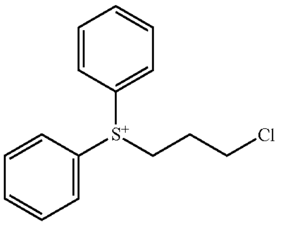
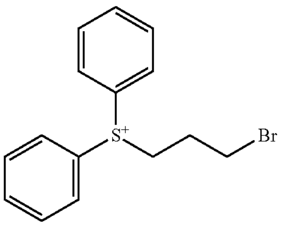

-continued
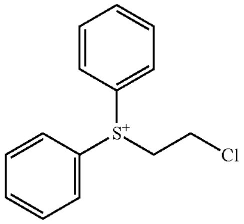
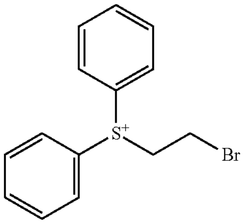
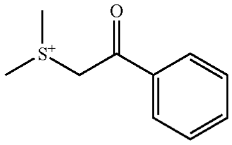
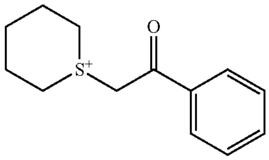
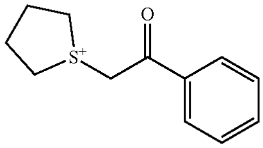
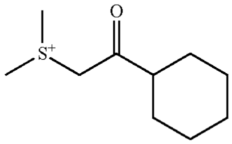
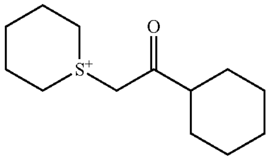
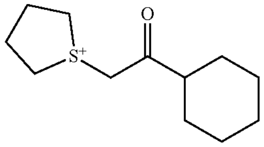
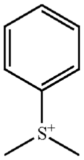
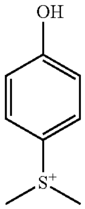
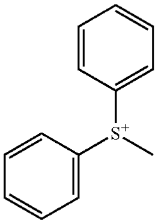
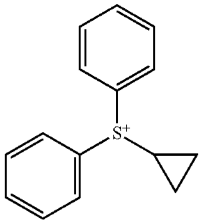
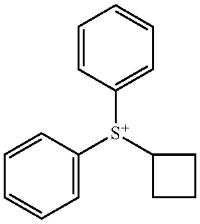
-continued
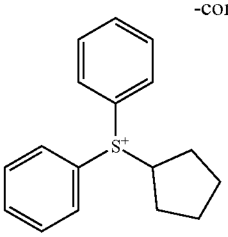
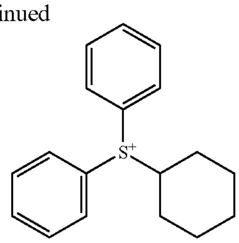
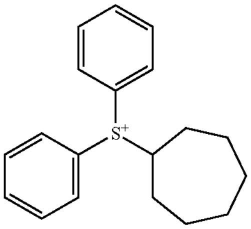
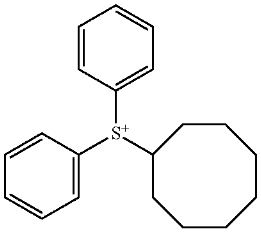
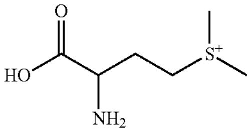
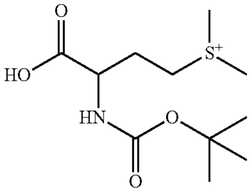
Examples of the cation in the iodonium salt having formula (2-2) are shown below, but not limited thereto.
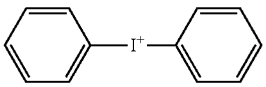
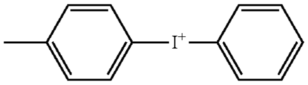
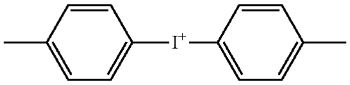
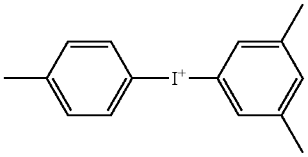
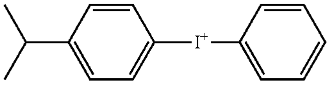
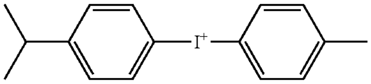

-continued
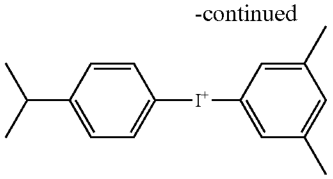
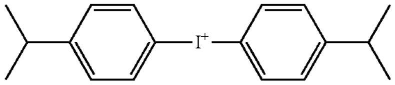
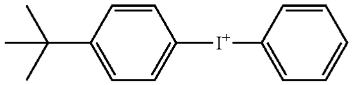
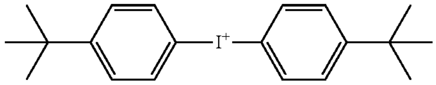
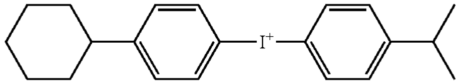
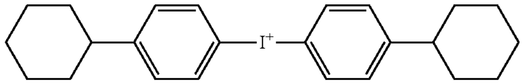
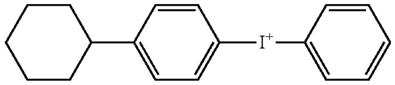
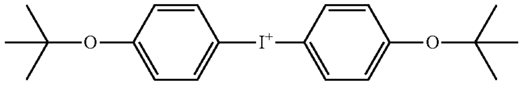
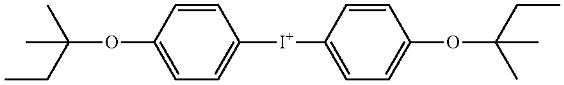
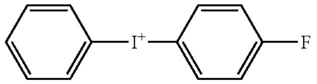
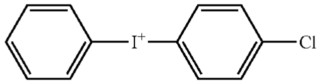
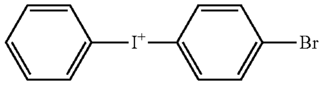
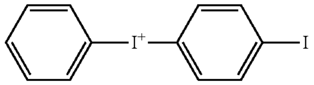
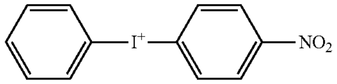
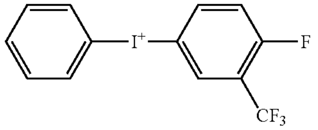
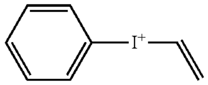
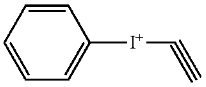
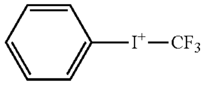
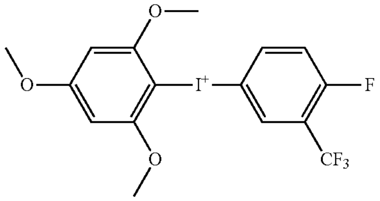
-continued
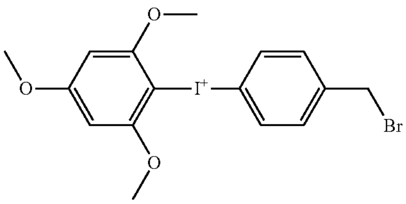
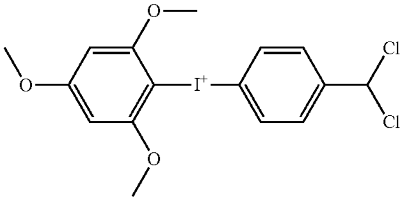
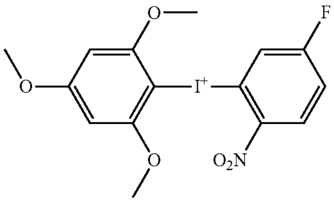
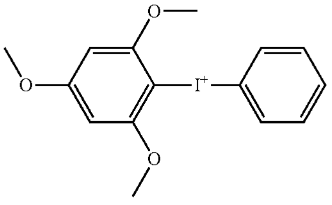
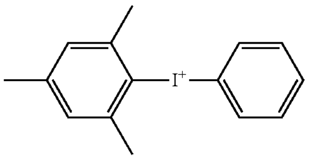
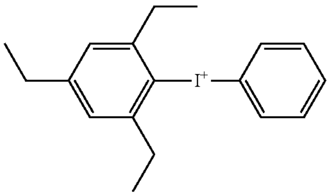
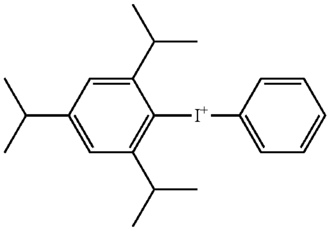
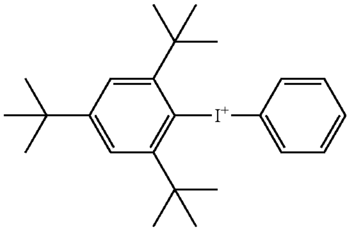
In formulae (2-1) and (2-2), $Xa^-$ is an anion of the following formula (2A), (2B), (2C) or (2D).

(2A)

$R^{fa}—CF_2—SO_3^-$ (2B)

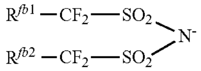

(2C)

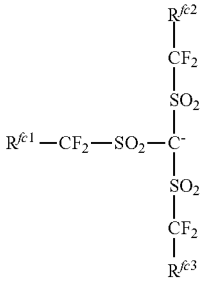

(2D)

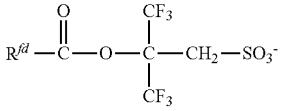

In formula (2A), $R^{fa}$ is fluorine or a $C_1$-$C_{40}$ hydrocarbyl group which may contain a heteroatom. The hydrocarbyl group may be saturated or unsaturated and straight, branched or cyclic. Examples thereof are as will be exemplified later for the hydrocarbyl group $R^{111}$ in formula (2A').

Of the anions having formula (2A), an anion having the formula (2A') is preferred.

(2A')

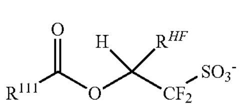

In formula (2A'), $R^{HF}$ is hydrogen or trifluoromethyl, preferably trifluoromethyl.

$R^{111}$ is a $C_1$-$C_{38}$ hydrocarbyl group which may contain a heteroatom. As the heteroatom, oxygen, nitrogen, sulfur and halogen atoms are preferred, with oxygen being most preferred. Of the hydrocarbyl groups represented by $R^{111}$, those groups of 6 to 30 carbon atoms are preferred from the aspect of achieving a high resolution in forming patterns of fine feature size. The hydrocarbyl group may be saturated or unsaturated and straight, branched or cyclic. Examples thereof include $C_1$-$C_{38}$ alkyl groups such as methyl, ethyl, n-propyl, isopropyl, n-butyl, isobutyl, sec-butyl, tert-butyl, pentyl, neopentyl, hexyl, heptyl, 2-ethylhexyl, nonyl, undecyl, tridecyl, pentadecyl, heptadecyl, and icosyl; $C_3$-$C_{38}$ cyclic saturated hydrocarbyl groups such as cyclopentyl, cyclohexyl, 1-adamantyl, 2-adamantyl, 1-adamantylmethyl, norbornyl, norbornylmethyl, tricyclodecyl, tetracyclododecyl, tetracyclododecylmethyl, and dicyclohexylmethyl; $C_2$-$C_{38}$ unsaturated aliphatic hydrocarbyl groups such as allyl and 3-cyclohexenyl; $C_6$-$C_{38}$ aryl groups such as phenyl, 1-naphthyl and 2-naphthyl; $C_7$-$C_{38}$ aralkyl groups such as benzyl and diphenylmethyl; and combinations thereof.

In the foregoing hydrocarbyl groups, some or all hydrogen atoms may be substituted by a moiety containing a heteroatom such as oxygen, sulfur, nitrogen or halogen, and some constituent $—CH_2—$ may be replaced by a moiety containing a heteroatom such as oxygen, sulfur or nitrogen, so that the group may contain a hydroxy, fluorine, chlorine, bromine, iodine, cyano, nitro, carbonyl, ether bond, ester bond, sulfonic ester bond, carbonate bond, lactone ring, sultone ring, carboxylic anhydride ($—C(=O)—O—C(=O)—$), or haloalkyl moiety. Examples of the heteroatom-containing hydrocarbyl group include tetrahydrofuryl, methoxymethyl, ethoxymethyl, methylthiomethyl, acetamidemethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl.

With respect to the synthesis of the sulfonium salt having an anion of formula (2A'), reference may be made to JP-A 2007-145797, JP-A 2008-106045, JP-A 2009-007327, and JP-A 2009-258695. Also useful are the sulfonium salts described in JP-A 2010-215608, JP-A 2012-041320, JP-A 2012-106986, and JP-A 2012-153644.

Examples of the anion having formula (2A) include those exemplified as the anion having formula (1A) in JP-A 2018-197853.

In formula (2B), $R^{fb1}$ and $R^{fb2}$ are each independently fluorine or a $C_1$-$C_{40}$ hydrocarbyl group which may contain a heteroatom. The hydrocarbyl group may be saturated or unsaturated and straight, branched or cyclic, and examples thereof are as exemplified above for $R^{111}$ in formula (2A'). Preferably $R^{fb1}$ and $R^{fb2}$ are fluorine or $C_1$-$C_4$ straight fluorinated alkyl groups. Also, $R^{fb1}$ and $R^{fb2}$ may bond together to form a ring with the linkage: $—CF_2—SO_2—N^-—SO_2—CF_2—$ to which they are attached. It is preferred that a combination of $R^{fb1}$ and $R^{fb2}$ be a fluorinated ethylene or fluorinated propylene group.

In formula (2C), $R^{fc1}$, $R^{fc2}$ and $R^{fc3}$ are each independently fluorine or a $C_1$-$C_{40}$ hydrocarbyl group which may contain a heteroatom. The hydrocarbyl group may be saturated or unsaturated and straight, branched or cyclic, and examples thereof are as exemplified above for $R^{111}$ in formula (2A'). Preferably $R^{fc1}$, $R^{fc2}$ and $R^{fc3}$ are fluorine or $C_1$-$C_4$ straight fluorinated alkyl groups. Also, $R^{fc1}$ and $R^{fc2}$ may bond together to form a ring with the linkage: $—CF_2—SO_2—C^-—SO_2—CF_2—$ to which they are attached. It is preferred that a combination of $R^{fc1}$ and $R^{fc2}$ be a fluorinated ethylene or fluorinated propylene group.

In formula (2D), $R^{fd}$ is a $C_1$-$C_{40}$ hydrocarbyl group which may contain a heteroatom. The hydrocarbyl group may be saturated or unsaturated and straight, branched or cyclic, and examples thereof are as exemplified above for $R^{111}$ in formula (2A').

With respect to the synthesis of the sulfonium salt having an anion of formula (2D), reference may be made to JP-A 2010-215608 and JP-A 2014-133723.

Examples of the anion having formula (2D) include those exemplified as the anion having formula (1D) in U.S. Pat. No. 11,022,883 (JP-A 2018-197853).

Notably, the compound having the anion of formula (2D) does not have fluorine at the α-position relative to the sulfo group, but two trifluoromethyl groups at the β-position. For this reason, it has a sufficient acidity to sever the acid labile groups in the base polymer. Thus the compound is an effective PAG.

Another preferred PAG is a compound having the formula (3).

(3)

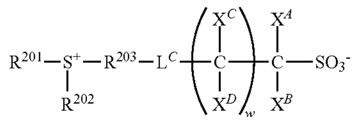

In formula (3), $R^{201}$ and $R^{202}$ are each independently fluorine, chlorine, bromine, iodine or a $C_1$-$C_{30}$ hydrocarbyl group which may contain a heteroatom. $R^{203}$ is a $C_1$-$C_{30}$ hydrocarbylene group which may contain a heteroatom. $R^{201}$ and $R^{202}$, or $R^{201}$ and $R^{203}$ may bond together to form a ring with the sulfur atom to which they are attached. Examples of the ring are as exemplified above for the ring that $R^{101}$ and $R^{102}$ in formula (2-1), taken together, form with the sulfur atom to which they are attached.

The hydrocarbyl groups $R^{201}$ and $R^{202}$ may be saturated or unsaturated and straight, branched or cyclic. Examples thereof include $C_1$-$C_{30}$ alkyl groups such as methyl, ethyl, n-propyl, isopropyl, n-butyl, isobutyl, sec-butyl, tert-butyl, n-pentyl, tert-pentyl, n-hexyl, n-octyl, 2-ethylhexyl, n-nonyl, and n-decyl; $C_3$-$C_{30}$ cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, tricyclo[5.2.1.$0^{2,6}$]decyl, and adamantyl; $C_6$-$C_{30}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, tert-butylnaphthyl, and anthracenyl; and combinations thereof. In the foregoing hydrocarbyl groups, some or all of the hydrogen atoms may be substituted by a moiety containing a heteroatom such as oxygen, sulfur, nitrogen or halogen, and some constituent —$CH_2$— may be replaced by a moiety containing a heteroatom such as oxygen, sulfur or nitrogen, so that the group may contain a hydroxy, fluorine, chlorine, bromine, iodine, cyano, nitro, carbonyl, ether bond, ester bond, sulfonic ester bond, carbonate bond, lactone ring, sultone ring, carboxylic anhydride (—C(=O)—O—C(=O)—) or haloalkyl moiety.

The hydrocarbylene group $R^{203}$ may be saturated or unsaturated and straight, branched or cyclic. Examples thereof include $C_1$-$C_{30}$ alkanediyl groups such as methanediyl, ethane-1,1-diyl, ethane-1,2-diyl, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; $C_3$-$C_{30}$ cyclic saturated hydrocarbylene groups such as cyclopentanediyl, cyclohexanediyl, norbornanediyl and adamantanediyl; $C_6$-$C_{30}$ arylene groups such as phenylene, methylphenylene, ethylphenylene, n-propylphenylene, isopropylphenylene, n-butylphenylene, isobutylphenylene, sec-butylphenylene, tert-butylphenylene, naphthylene, methylnaphthylene, ethylnaphthylene, n-propylnaphthylene, isopropylnaphthylene, n-butylnaphthylene, isobutylnaphthylene, sec-butylnaphthylene, and tert-butylnaphthylene; and combinations thereof. In the hydrocarbylene groups, some or all of the hydrogen atoms may be substituted by a moiety containing a heteroatom such as oxygen, sulfur, nitrogen or halogen, or some constituent —$CH_2$— may be replaced by a moiety containing a heteroatom such as oxygen, sulfur or nitrogen, so that the group may contain a hydroxy, fluorine, chlorine, bromine, iodine, cyano, nitro, carbonyl, ether bond, ester bond, sulfonic ester bond, carbonate bond, lactone ring, sultone ring, carboxylic anhydride (—C(=O)—O—C(=O)—) or haloalkyl moiety. Of the heteroatoms, oxygen is preferred.

In formula (3), $L^C$ is a single bond, ether bond or a $C_1$-$C_{20}$ hydrocarbylene group which may contain a heteroatom. The hydrocarbylene group may be saturated or unsaturated and straight, branched or cyclic. Examples thereof are as exemplified above for $R^{203}$.

In formula (3), $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl, and w is an integer of 0 to 3.

Of the PAGs having formula (3), those having formula (3') are preferred.

(3')

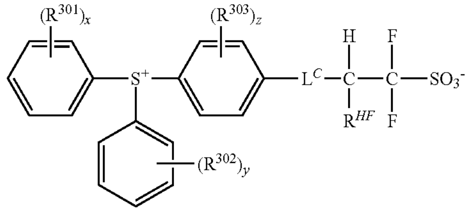

In formula (3'), $L^C$ is as defined above. $R^{HF}$ is hydrogen or trifluoromethyl, preferably trifluoromethyl. $R^{301}$, $R^{302}$ and $R^{303}$ are each independently hydrogen or a $C_1$-$C_{20}$ hydrocarbyl group which may contain a heteroatom. The hydrocarbyl group may be saturated or unsaturated and straight, branched or cyclic. Examples thereof are as exemplified above for $R^{111}$ in formula (2A'). The subscripts x and y are each independently an integer of 0 to 5, and z is an integer of 0 to 4.

Examples of the PAG having formula (3) are as exemplified as the PAG having formula (2) in U.S. Pat. No. 9,720,324 (JP-A 2017-026980).

Of the foregoing PAGs, those having an anion of formula (2A') or (2D) are especially preferred because of reduced acid diffusion and high solubility in the solvent. Also those having formula (3') are especially preferred because of extremely reduced acid diffusion.

A sulfonium or iodonium salt having an iodized or brominated aromatic ring-containing anion may also be used as the PAG. Suitable are sulfonium and iodonium salts having the formulae (4-1) and (4-2).

(4-1)

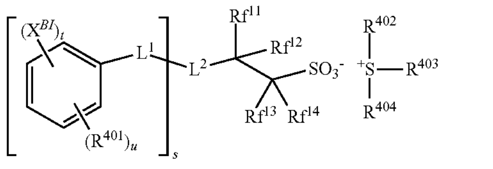

(4-2)

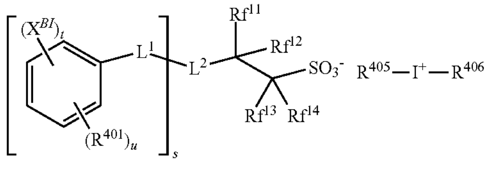

In formulae (4-1) and (4-2), s is an integer of 1 to 3, t is an integer of 1 to 5, u is an integer of 0 to 3, and $1 \le t+u \le 5$. Preferably, t is an integer of 1 to 3, more preferably 2 or 3, and u is an integer of 0 to 2.

$X^{BI}$ is iodine or bromine, and may be the same or different when s and/or t is 2 or more.

$L^1$ is a single bond, ether bond, ester bond, or a $C_1$-$C_6$ saturated hydrocarbylene group which may contain an ether bond or ester bond. The saturated hydrocarbylene group may be straight, branched or cyclic.

In case of s=1, $L^2$ is a single bond or a $C_1$-$C_{20}$ divalent linking group. In case of s=2 or 3, $L^2$ is a $C_1$-$C_{20}$ (p+1)-valent linking group. The linking group may contain an oxygen, sulfur or nitrogen atom.

$R^{401}$ is a hydroxy group, carboxy group, fluorine, chlorine, bromine, amino group, or a $C_1$-$C_{20}$ hydrocarbyl, $C_1$-$C_{20}$ hydrocarbyloxy, $C_2$-$C_{20}$ hydrocarbylcarbonyl. $C_2$-$C_{20}$ hydrocarbyloxycarbonyl, $C_2$-$C_{20}$ hydrocarbylcarbonyloxy or $C_1$-$C_{20}$ hydrocarbylsulfonyloxy group, which may contain fluorine, chlorine, bromine, hydroxy, amino or ether bond, or —$N(R^{401A})(R^{401B})$, —$N(R^{401C})$—(═O)—$R^{401D}$ or —$N(R^{401C})$—C(═O)—O—$R^{401D}$. $R^{401A}$ and $R^{401B}$ are each independently hydrogen or a $C_1$-$C_6$ saturated hydrocarbyl group. $R^{401C}$ is hydrogen or a $C_1$-$C_6$ saturated hydrocarbyl group which may contain halogen, hydroxy, $C_1$-$C_6$ saturated hydrocarbyloxy, $C_2$-$C_6$ saturated hydrocarbylcarbonyl or $C_2$-$C_6$ saturated hydrocarbylcarbonyloxy moiety. $R^{401D}$ is a $C_1$-$C_{16}$ aliphatic hydrocarbyl, $C_6$-$C_{12}$ aryl or $C_7$-$C_{18}$ aralkyl group, which may contain halogen, hydroxy, $C_1$-$C_6$ saturated hydrocarbyloxy, $C_2$-$C_6$ saturated hydrocarbylcarbonyl or $C_2$-$C_6$ saturated hydrocarbylcarbonyloxy moiety. The aliphatic hydrocarbyl group may be saturated or unsaturated and straight, branched or cyclic. The hydrocarbyl, hydrocarbyloxy, hydrocarbylcarbonyl, hydrocarbyloxycarbonyl, hydrocarbylcarbonyloxy, and hydrocarbylsulfonyloxy groups may be straight, branched or cyclic. A plurality of $R^{401}$ may be the same or different when s and/or u is 2 or more. Of these, $R^{401}$ is preferably hydroxy, —$N(R^{401C})$—C(═O)—$R^{401D}$, —$N(R^{401C})$—C(═O)—O—$R^{401D}$, fluorine, chlorine, bromine, methyl or methoxy.

In formulae (4-1) and (4-2), $Rf^{11}$ to $Rf^{14}$ are each independently hydrogen, fluorine or trifluoromethyl, at least one of $Rf^{11}$ to $Rf^{14}$ is fluorine or trifluoromethyl, or $Rf^{11}$ and $Rf^{12}$ taken together, may form a carbonyl group. Preferably, both $Rf^{13}$ and $Rf^{14}$ are fluorine.

$R^{402}$ to $R^{406}$ are each independently fluorine, chlorine, bromine, iodine or a $C_1$-$C_{20}$ hydrocarbyl group which may contain a heteroatom. The hydrocarbyl group may be saturated or unsaturated and straight, branched or cyclic. Examples thereof are as exemplified above for the hydrocarbyl groups $R^{101}$ to $R^{105}$ in formulae (2-1) and (2-2). In these groups, some or all of the hydrogen atoms may be substituted by hydroxy, carboxy, halogen, cyano, nitro, mercapto, sultone ring, sulfo, or sulfonium salt-containing moiety, and some constituent —$CH_2$— may be replaced by an ether bond, ester bond, carbonyl moiety, amide bond, carbonate bond or sulfonic ester bond. $R^{402}$ and $R^{403}$ may bond together to form a ring with the sulfur atom to which they are attached. Exemplary rings are the same as described above for the ring that $R^{101}$ and $R^{102}$ in formula (2-1), taken together, form with the sulfur atom to which they are attached.

Examples of the cation in the sulfonium salt having formula (4-1) include those exemplified above as the cation in the sulfonium salt having formula (2-1). Examples of the cation in the iodonium salt having formula (4-2) include those exemplified above as the cation in the iodonium salt having formula (2-2).

Examples of the anion in the onium salts having formulae (4-1) and (4-2) are shown below, but not limited thereto. Herein $X^{BI}$ is as defined above.

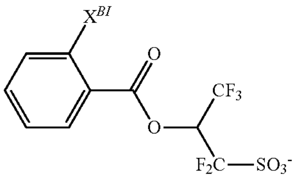

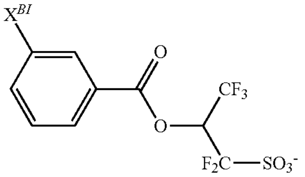

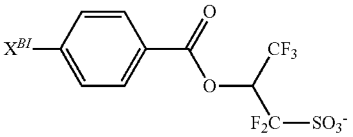

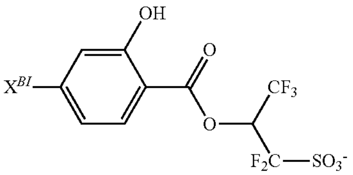

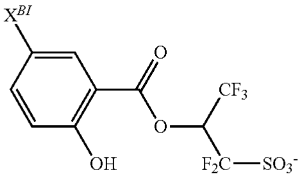

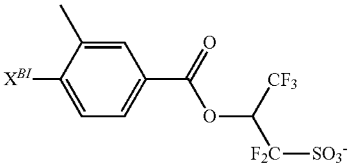

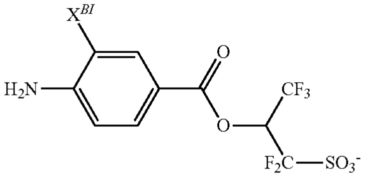

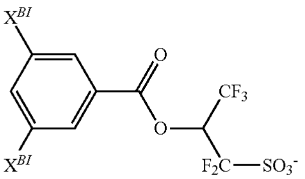

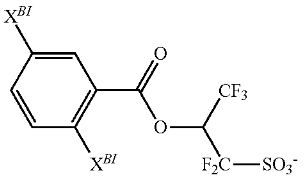

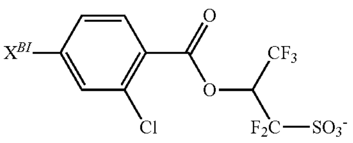

-continued
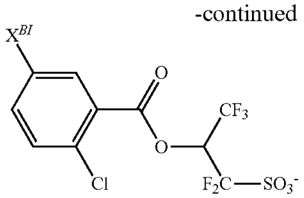
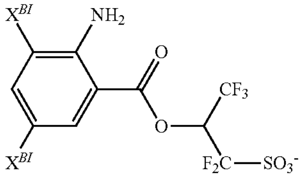
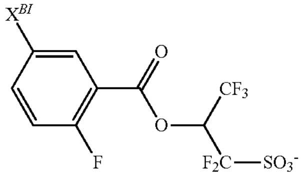
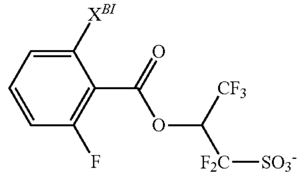
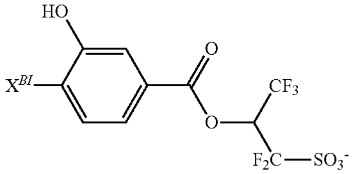
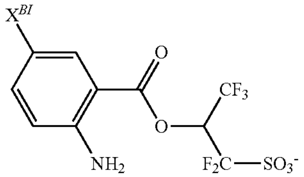
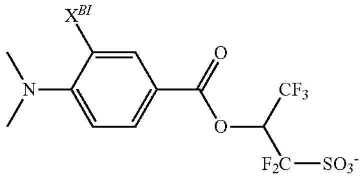
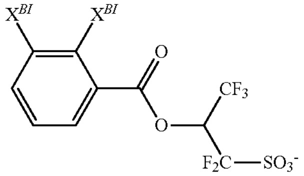
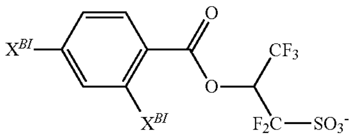
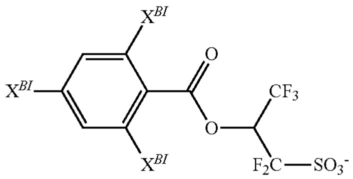
-continued
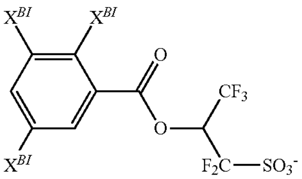
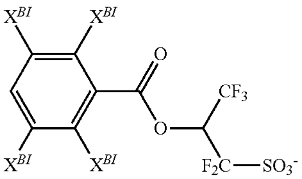
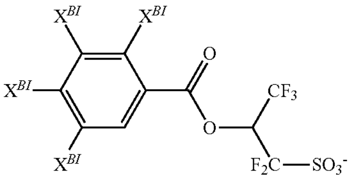
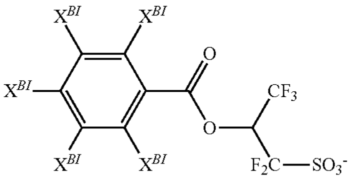
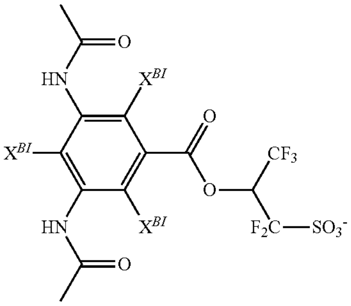
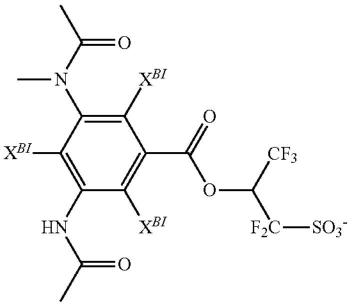
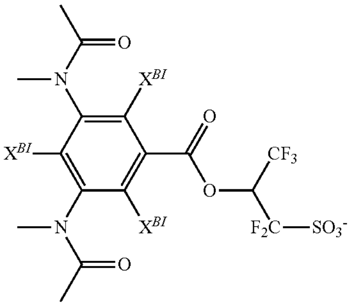

-continued
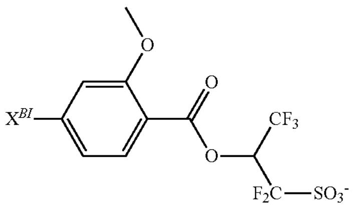
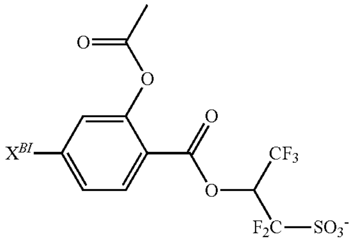
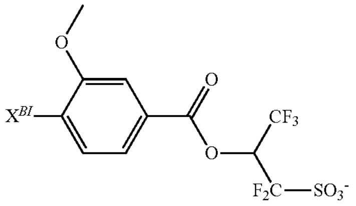
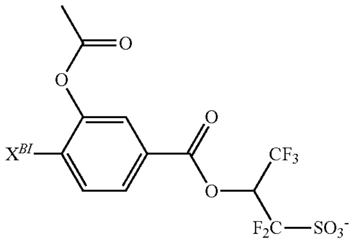
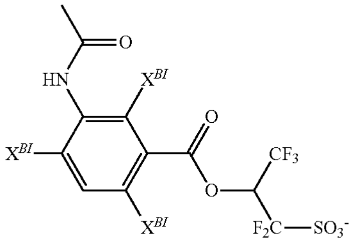
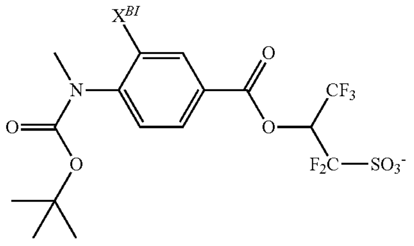
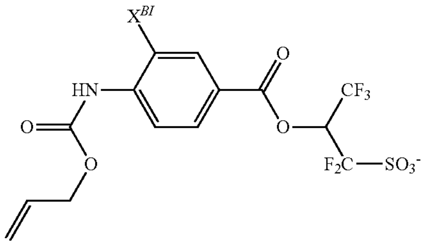
-continued
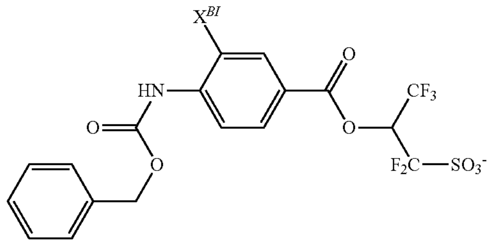
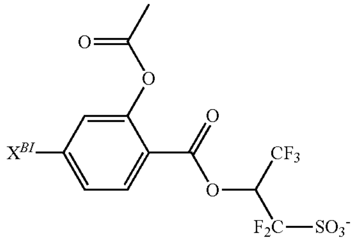
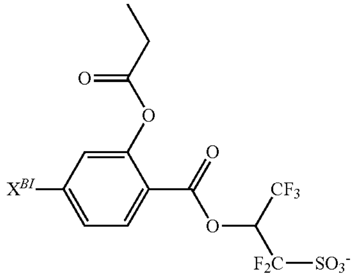
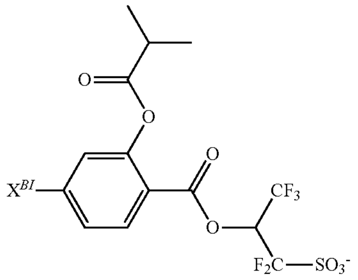
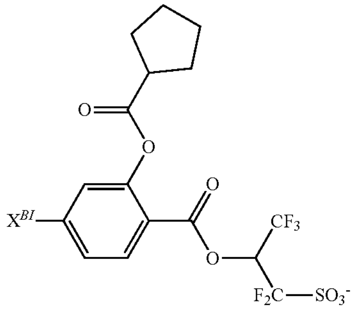
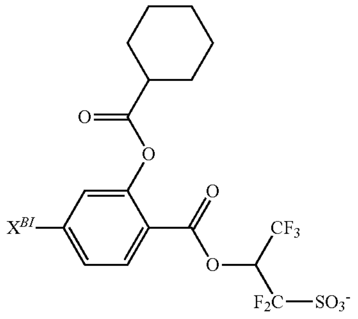

-continued
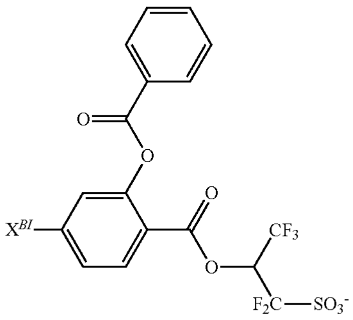
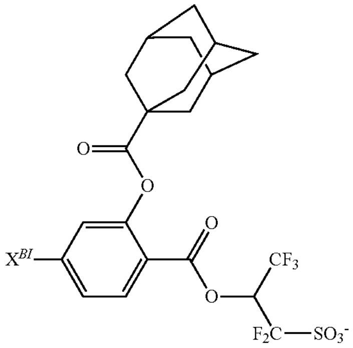
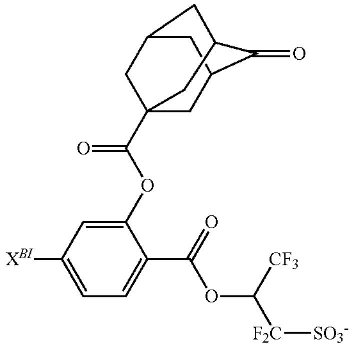
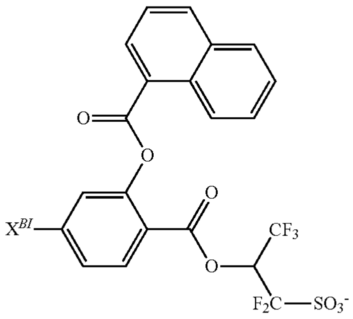
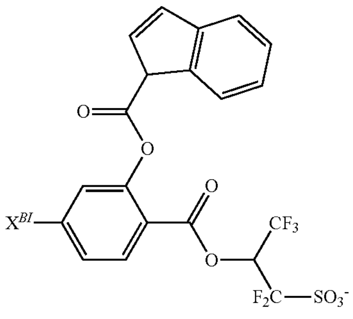
-continued
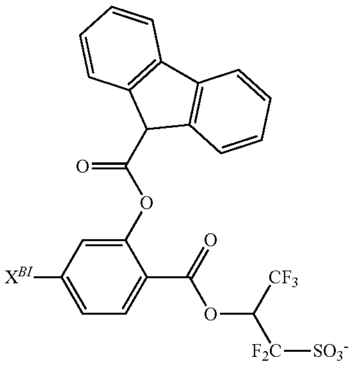
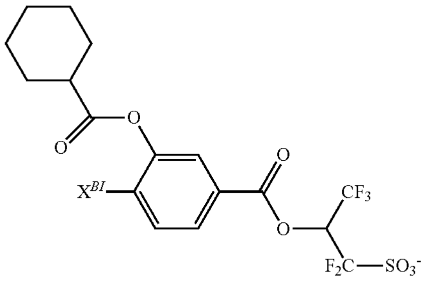
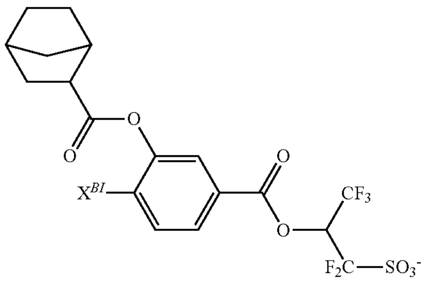
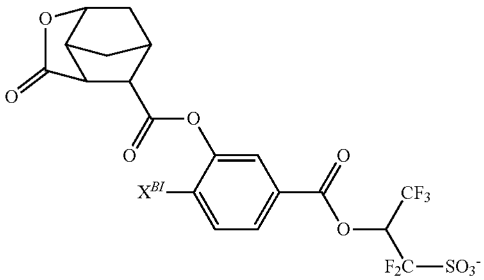
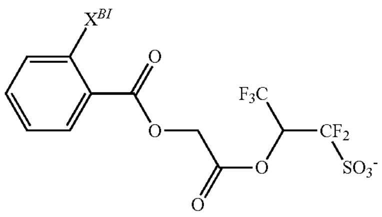
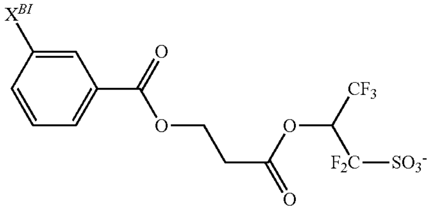

-continued
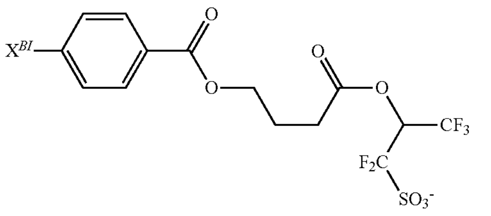
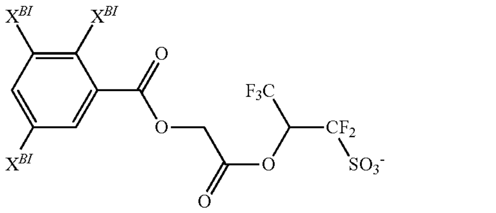
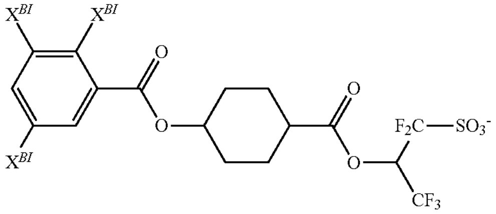
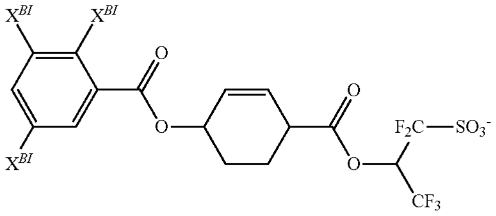
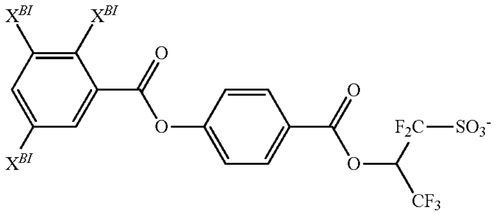
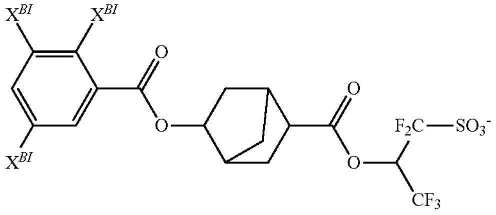
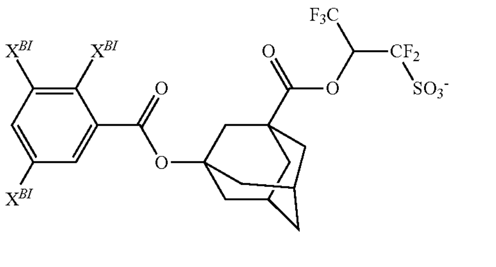
-continued
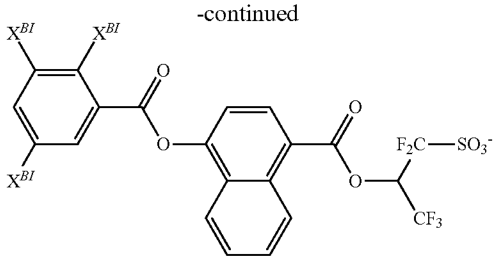
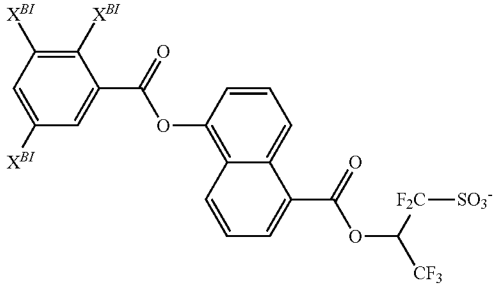
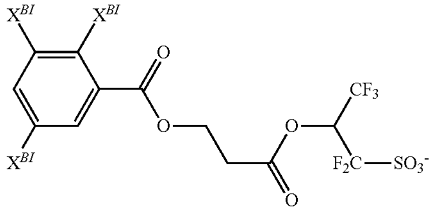
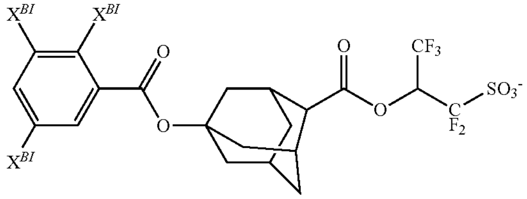
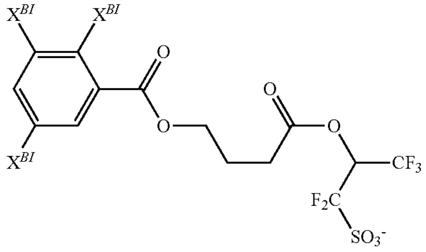
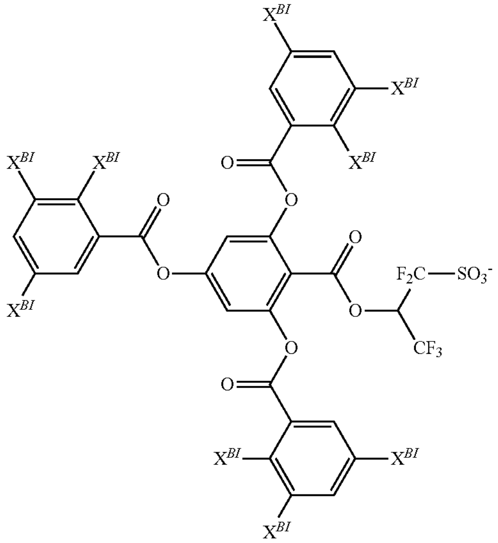

-continued
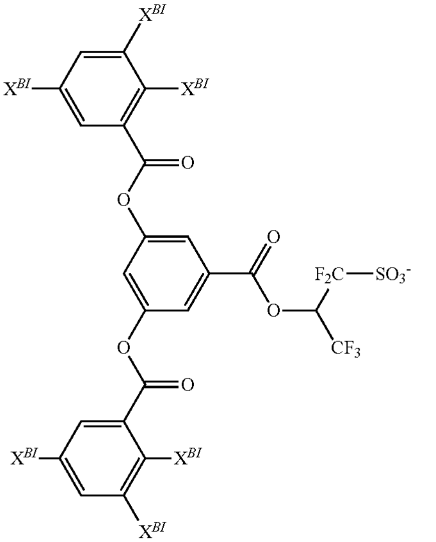
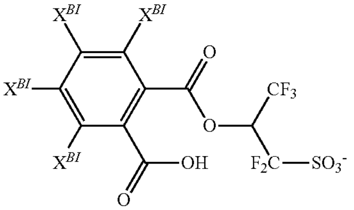
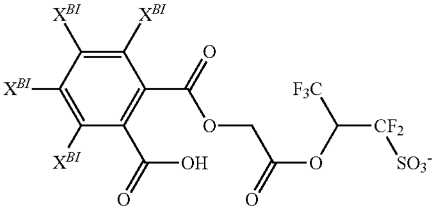
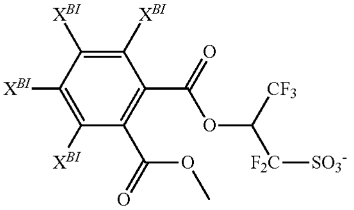
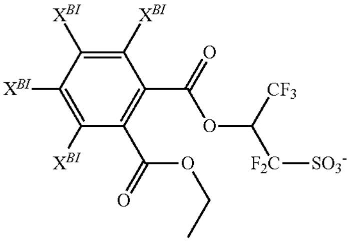
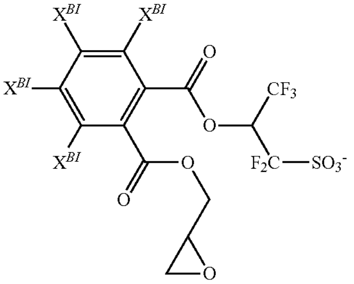
-continued
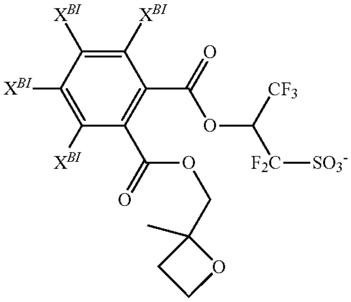
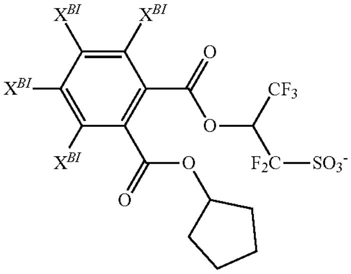
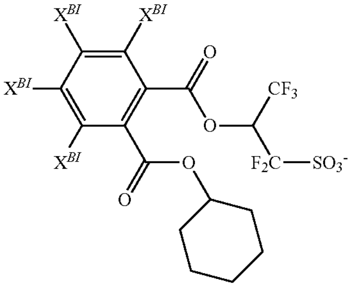
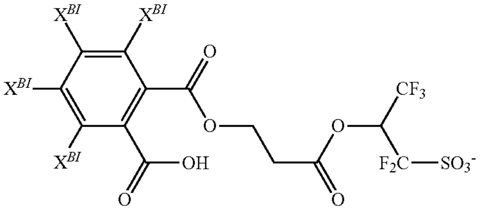
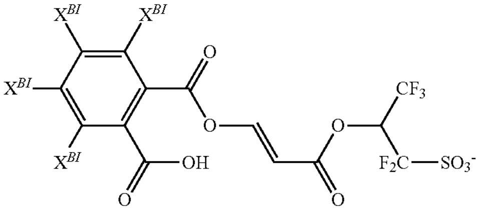
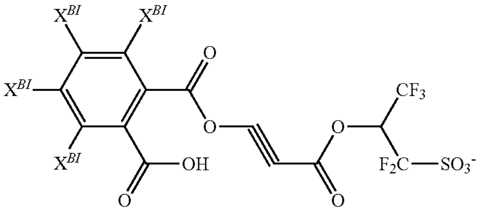
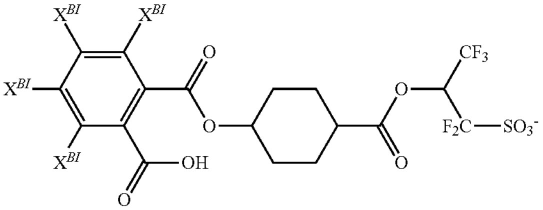

-continued
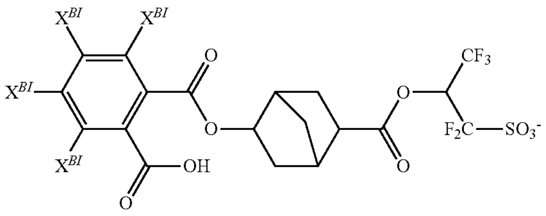
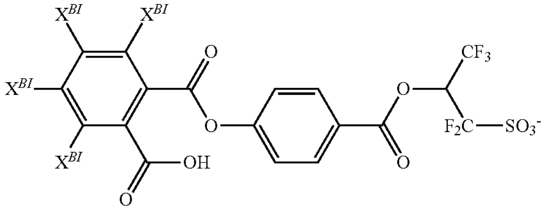
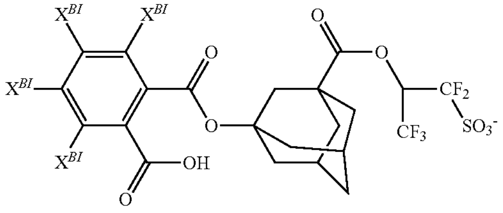
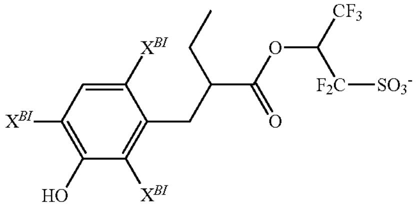
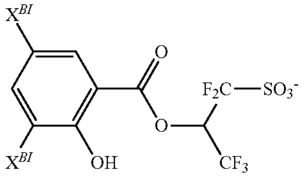
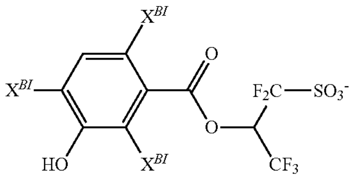
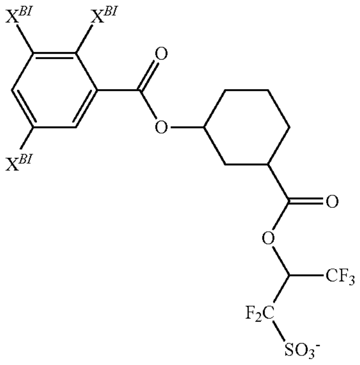
-continued
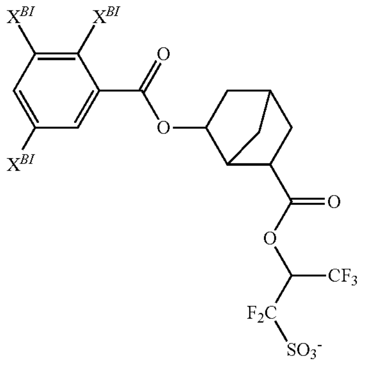
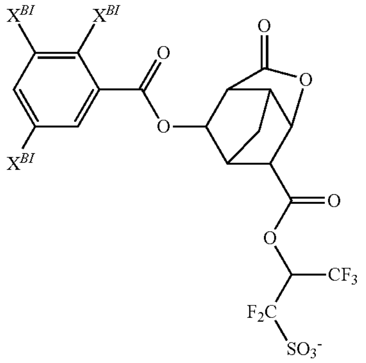
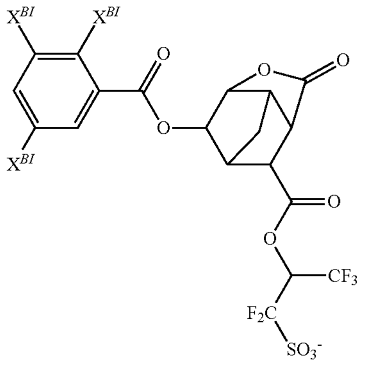
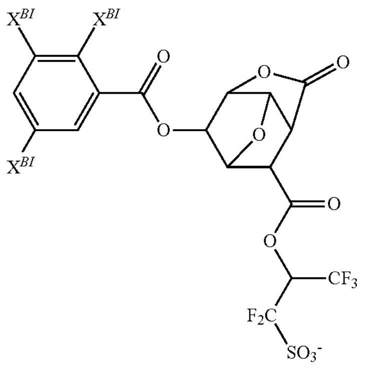

-continued
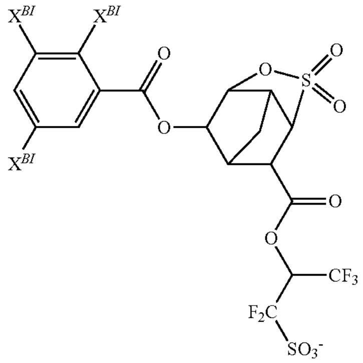
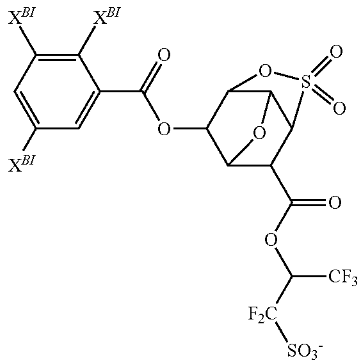
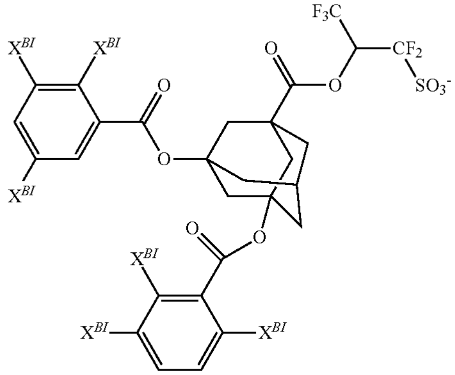
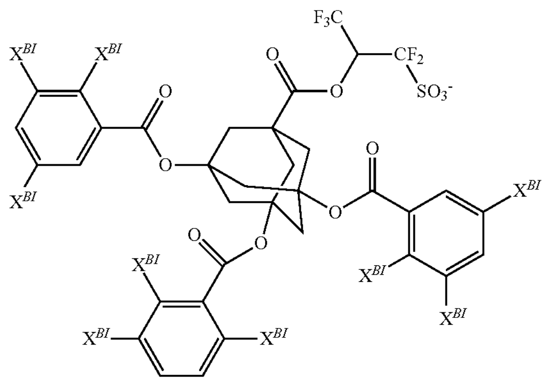
-continued
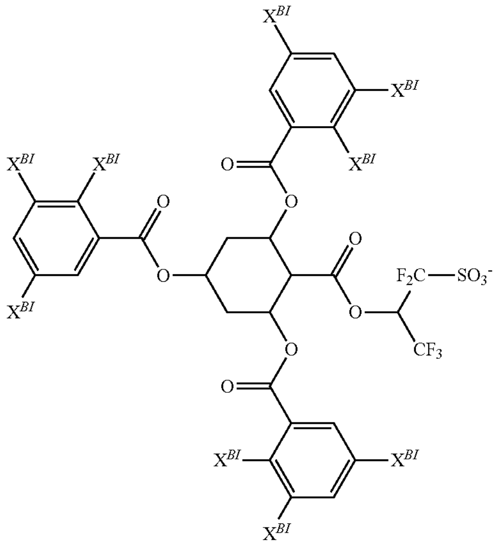
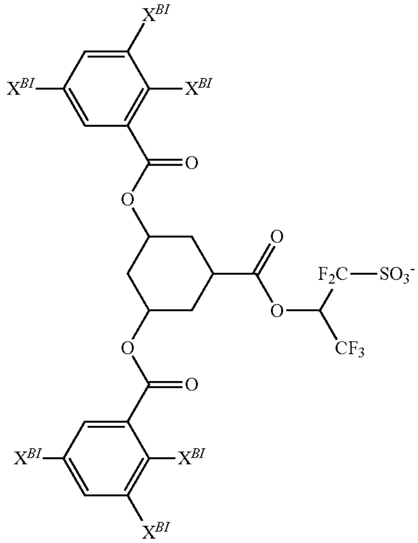
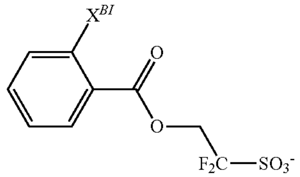
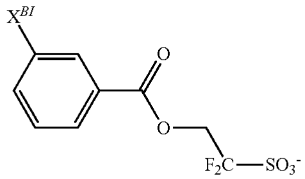
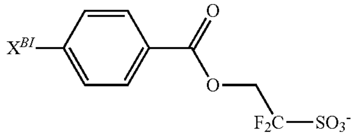

-continued
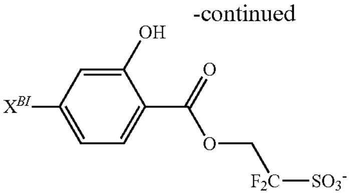
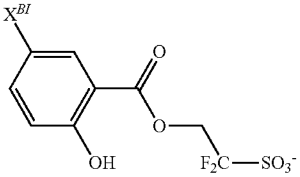
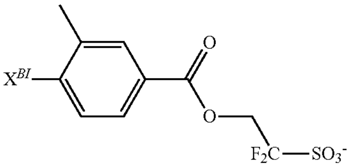
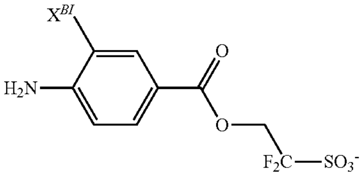
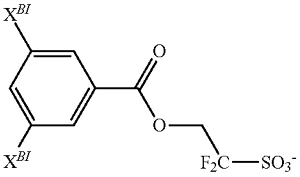
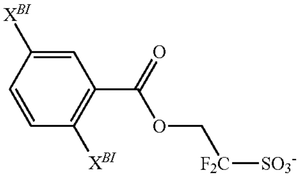
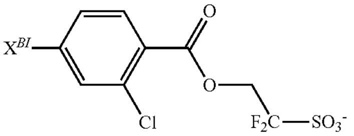
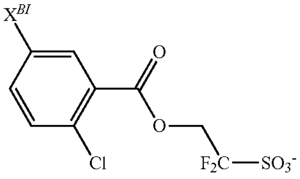
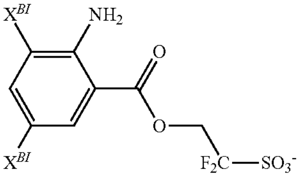
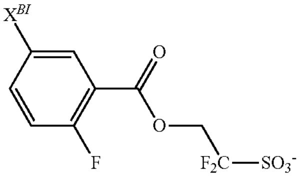
-continued
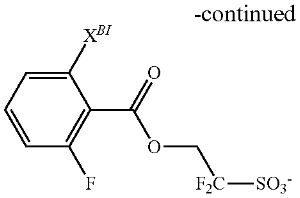
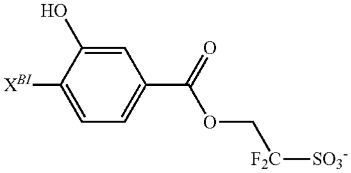
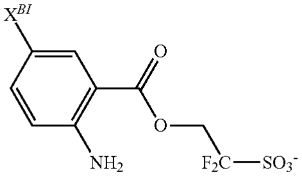
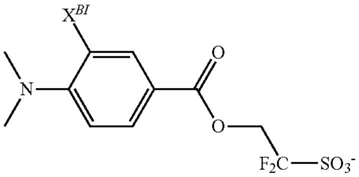
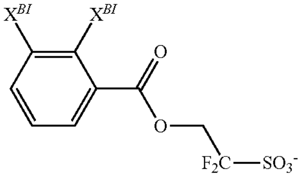
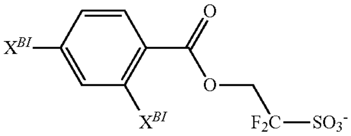
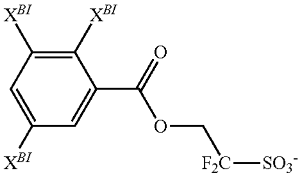
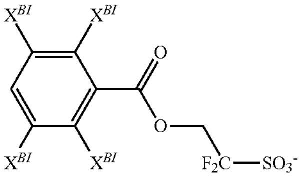
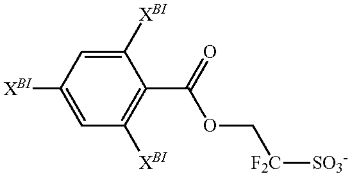
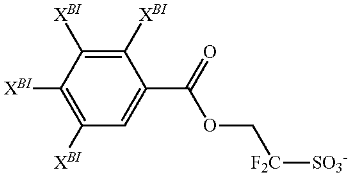

-continued
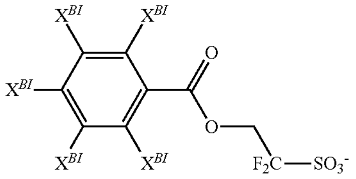
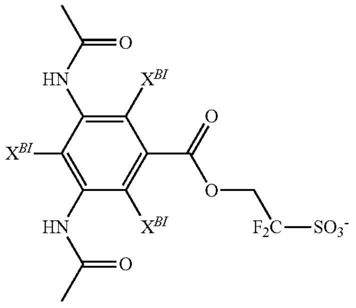
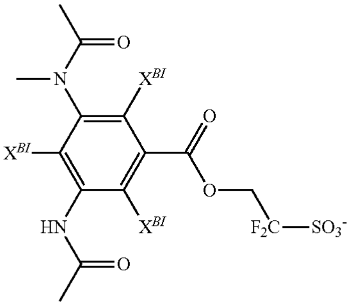
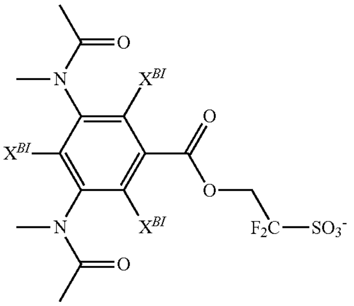
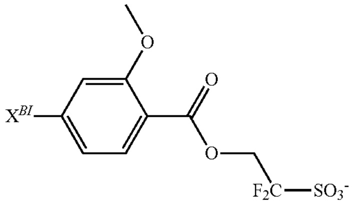
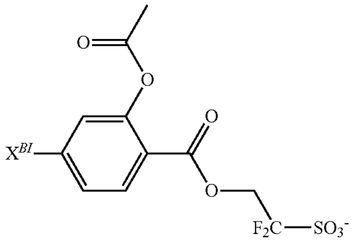
-continued
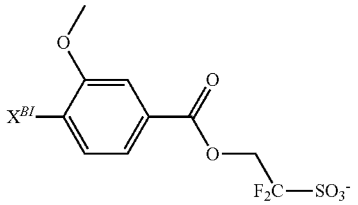
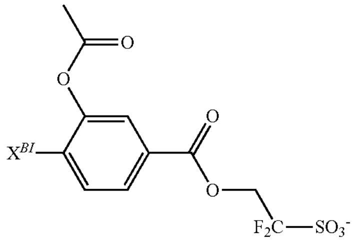
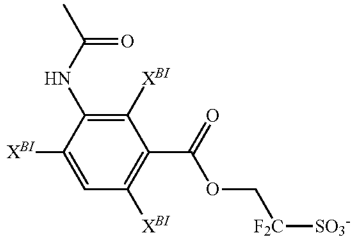
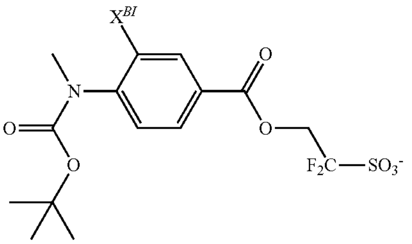
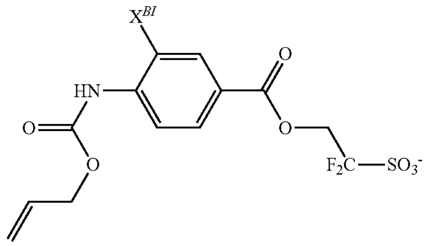
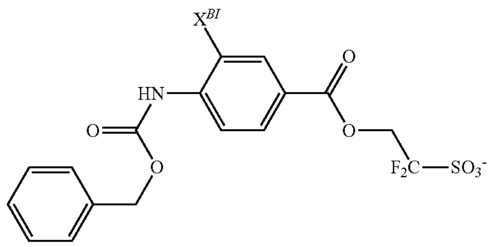
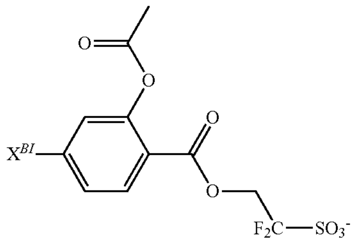

-continued
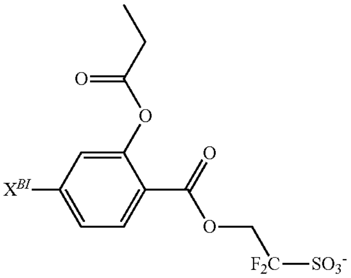
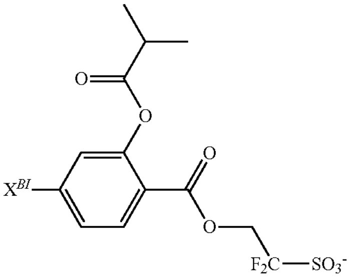
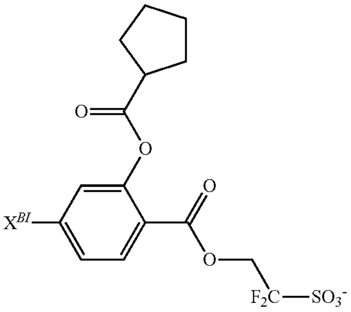
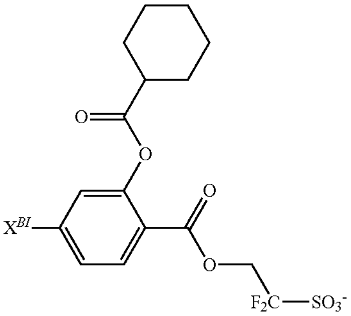
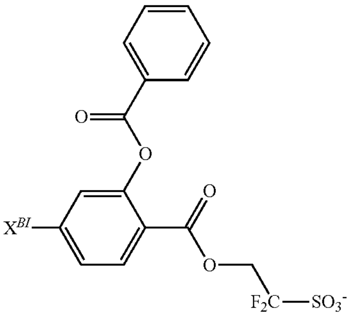
-continued
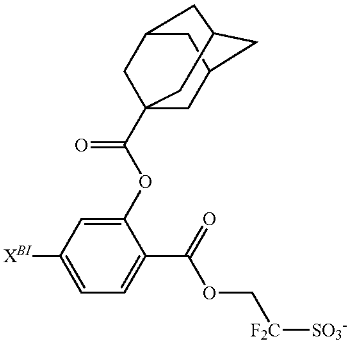
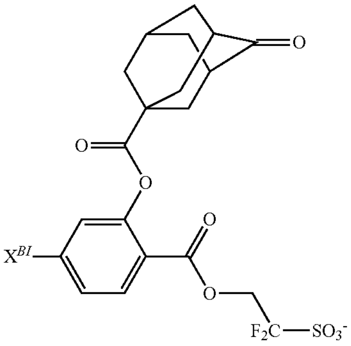
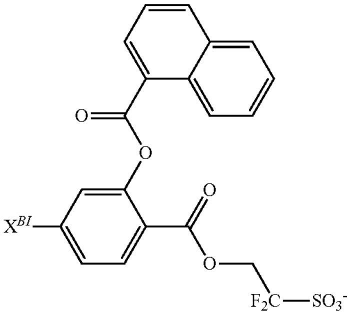
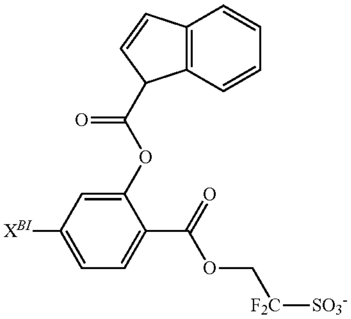
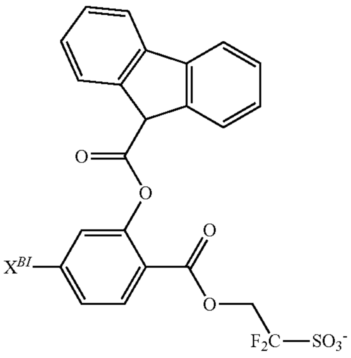

-continued
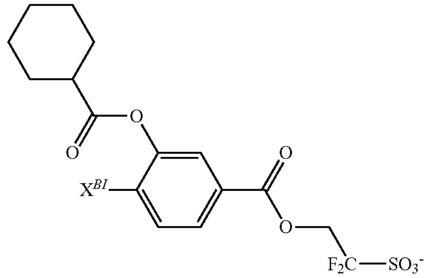
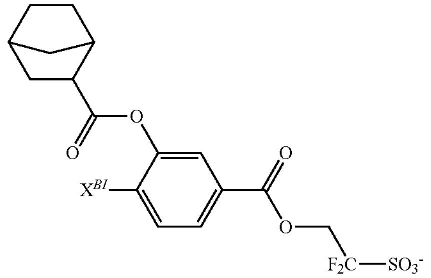
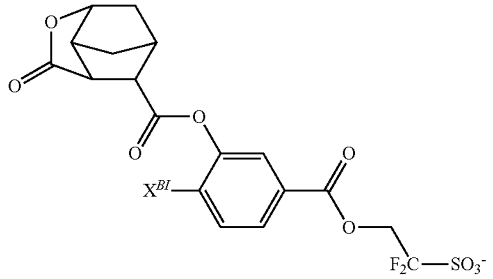
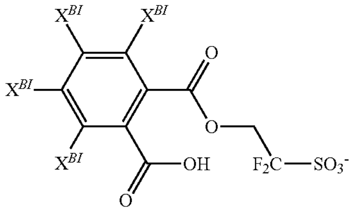
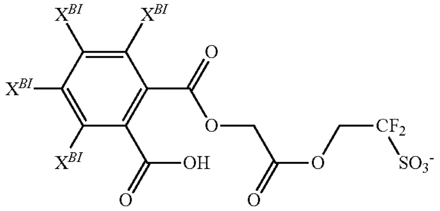
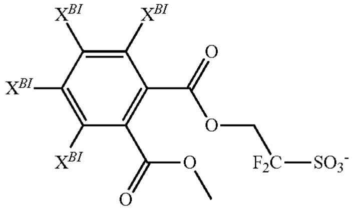
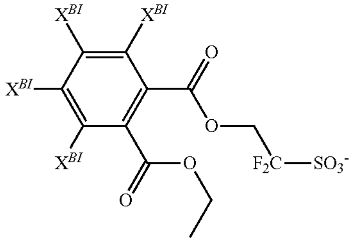
-continued
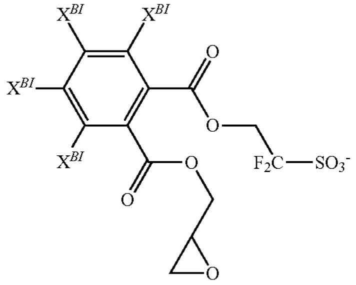
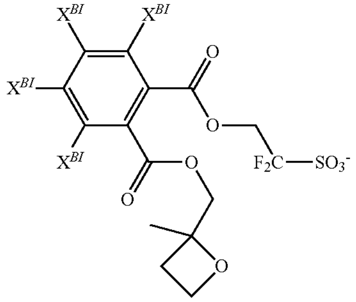
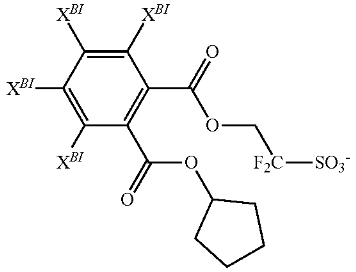
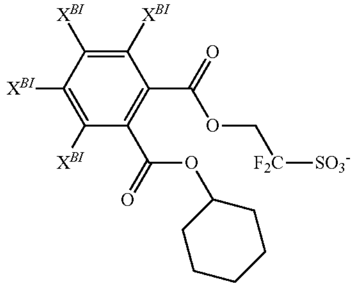
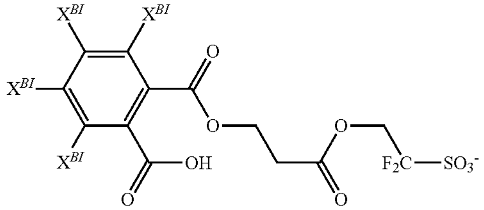
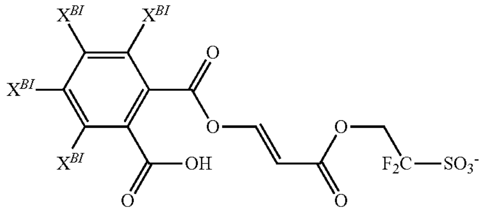

-continued
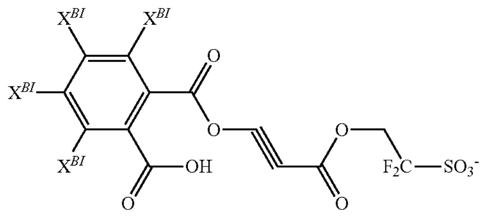
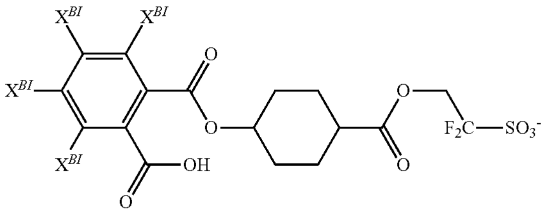
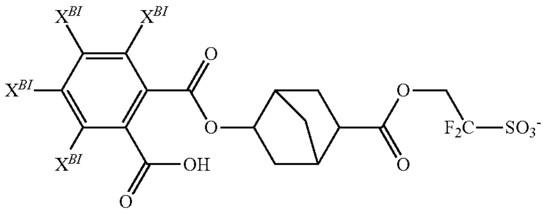
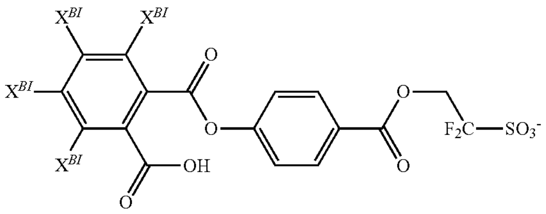
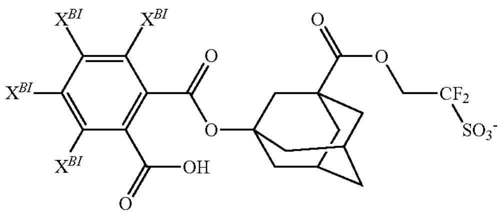
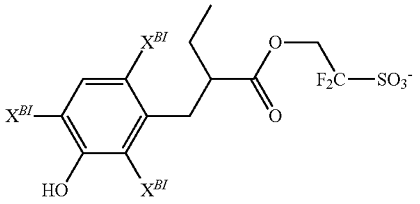
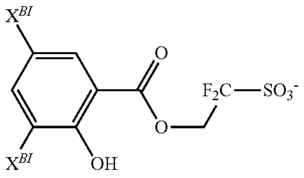
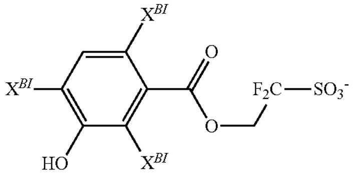
-continued
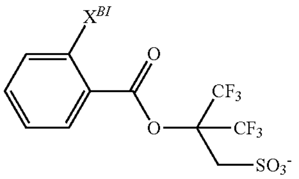
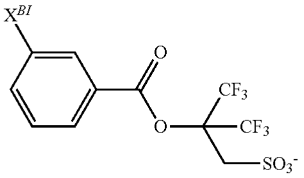
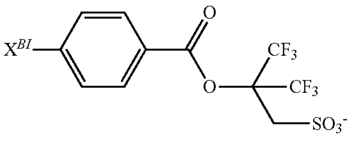
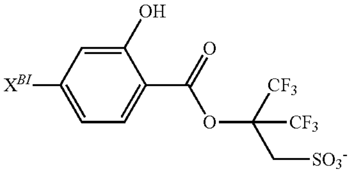
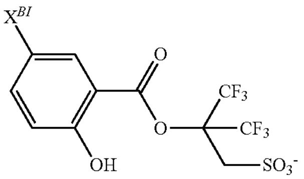
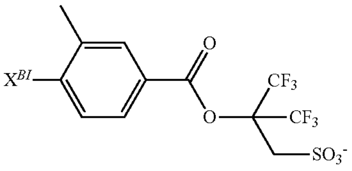
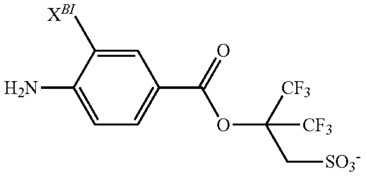
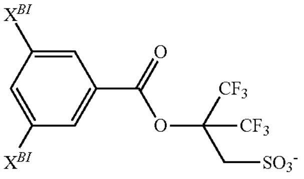
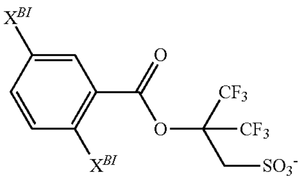
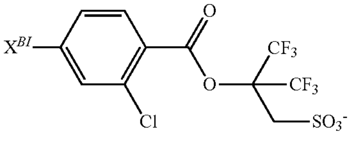

-continued
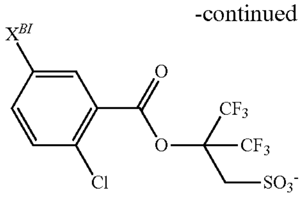
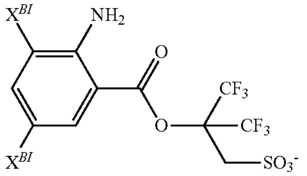
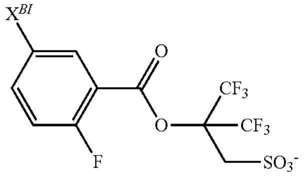
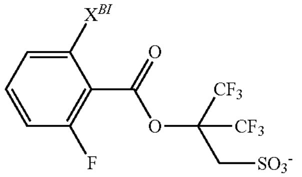
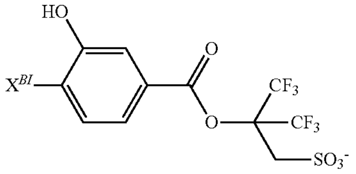
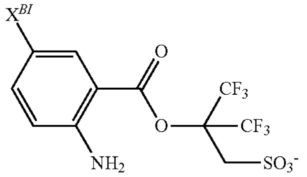
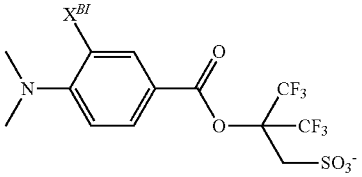
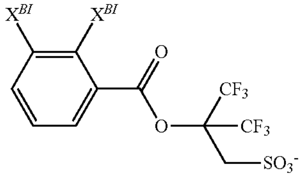
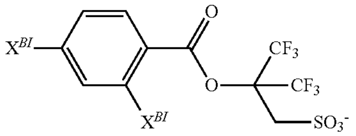
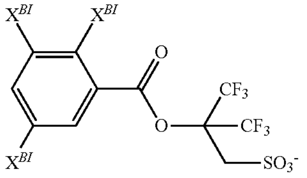
-continued
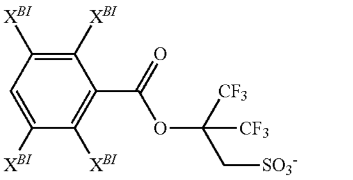
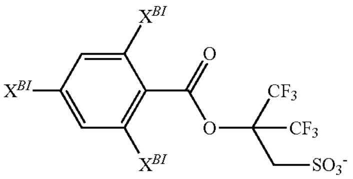
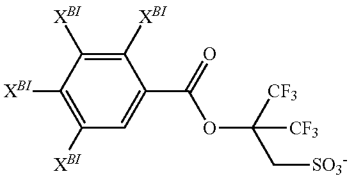
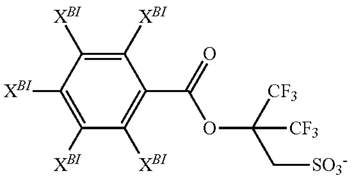
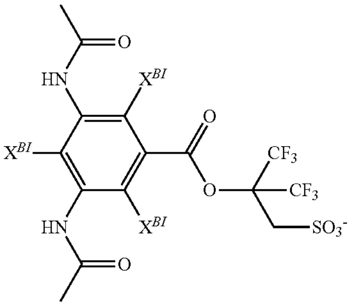
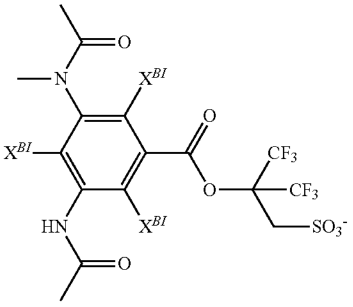
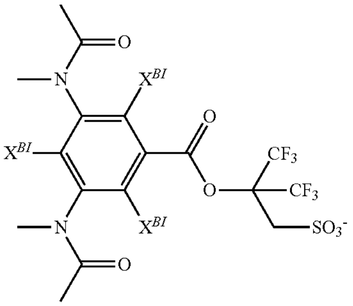

-continued
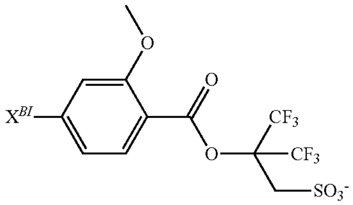
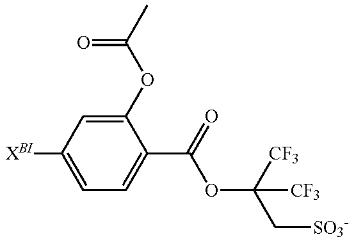
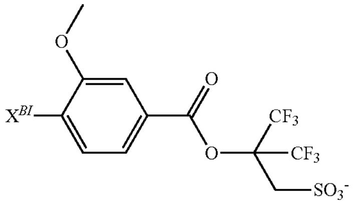
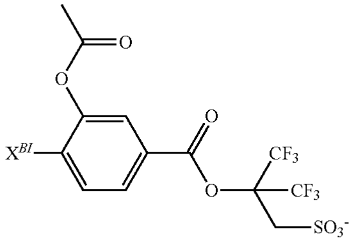
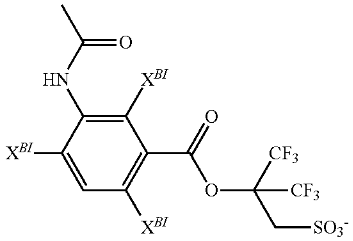
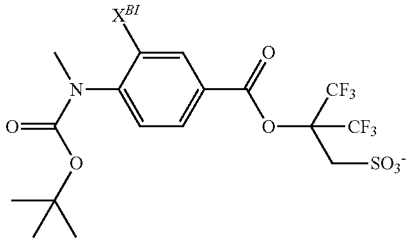
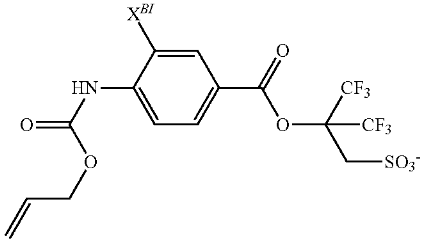
-continued
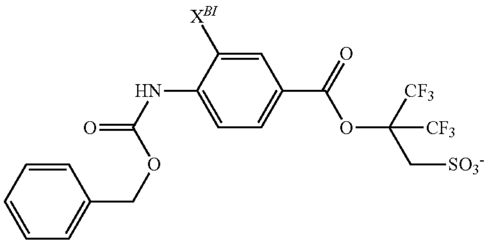
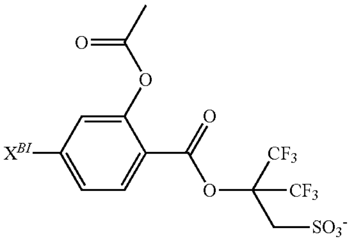
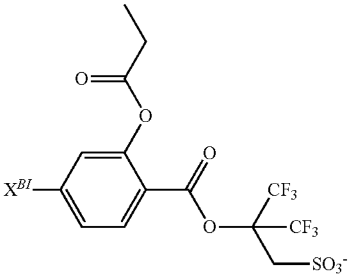
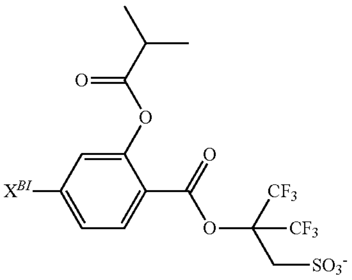
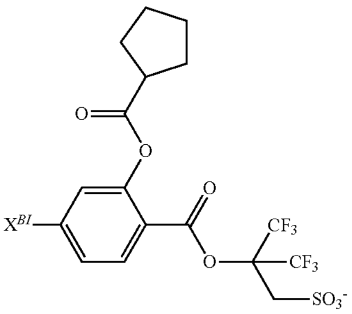
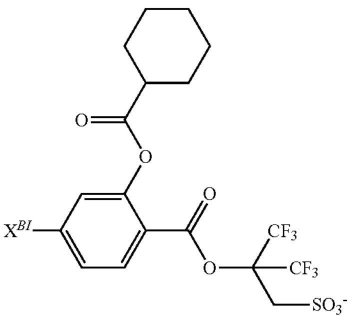

-continued
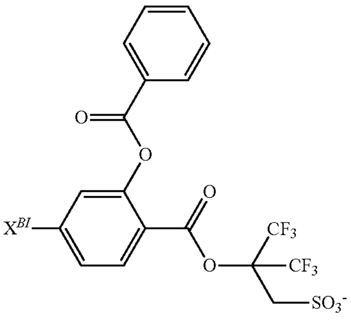
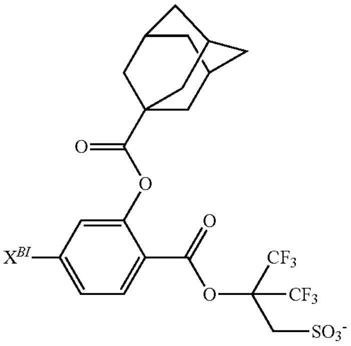
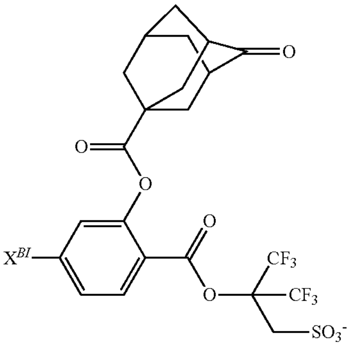
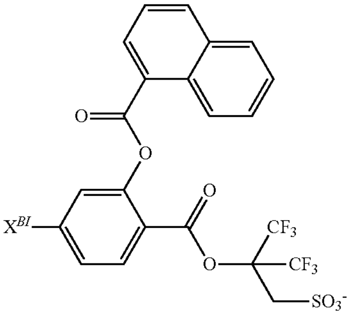
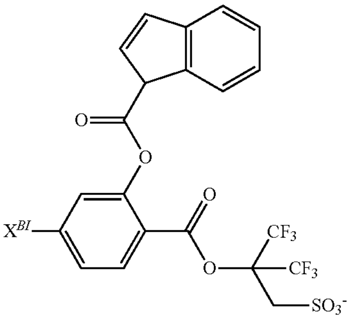
-continued
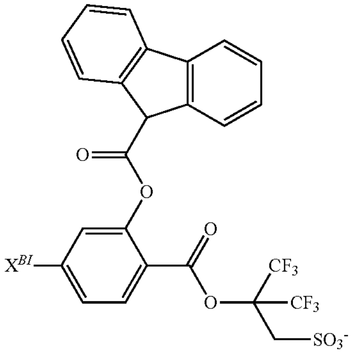
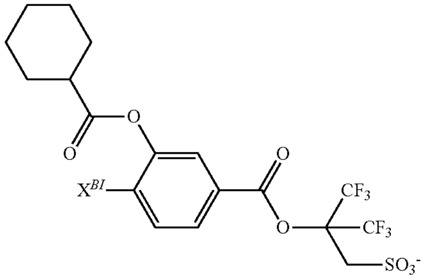
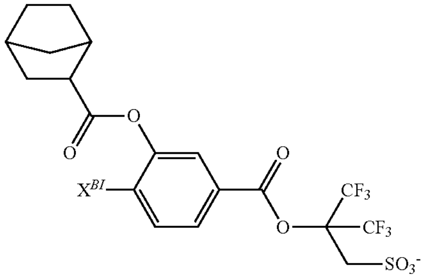
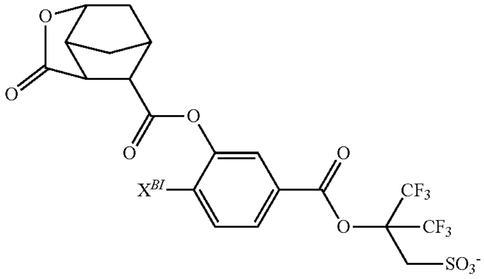
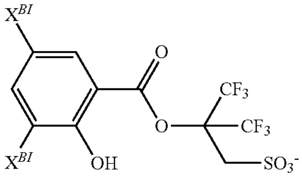
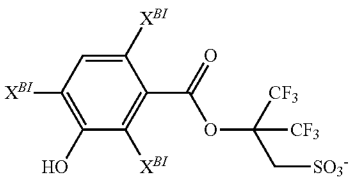

-continued
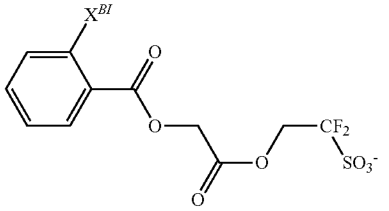
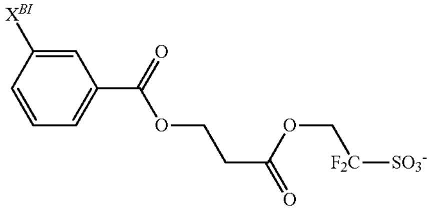
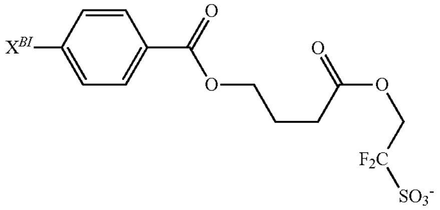
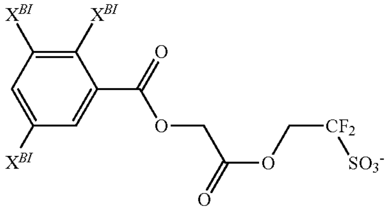
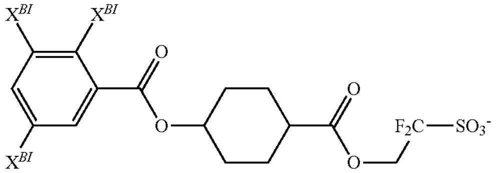
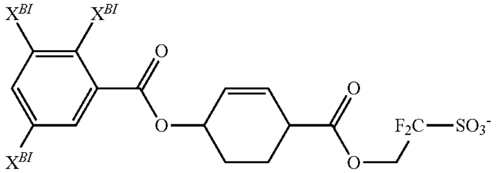
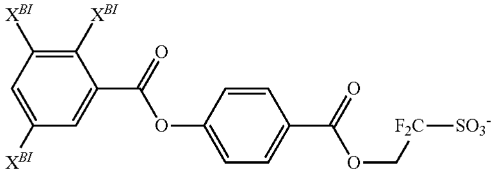
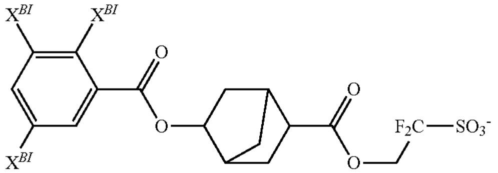
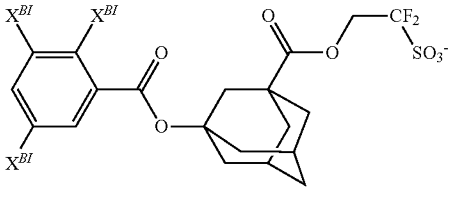
-continued
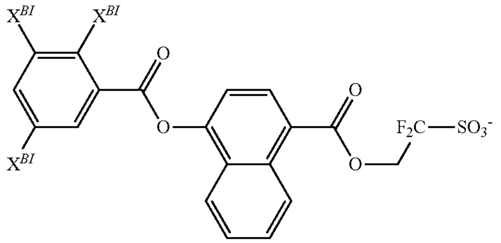
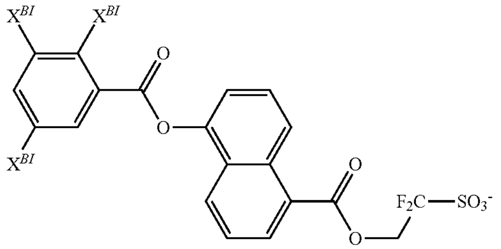
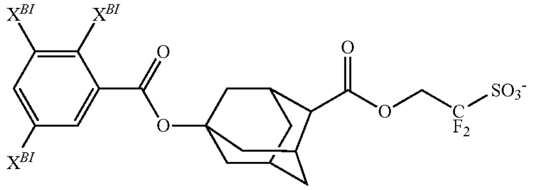
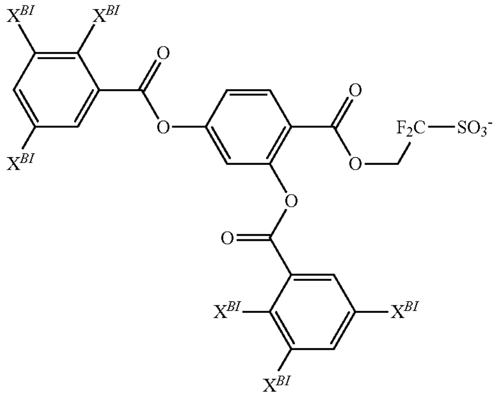
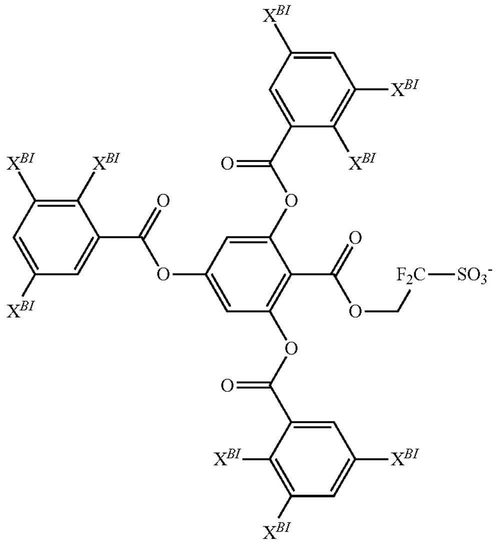

-continued
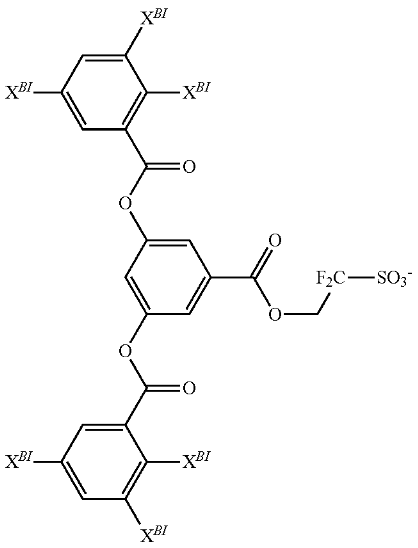
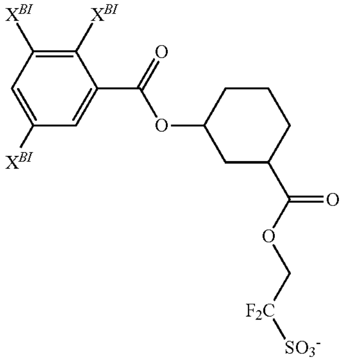
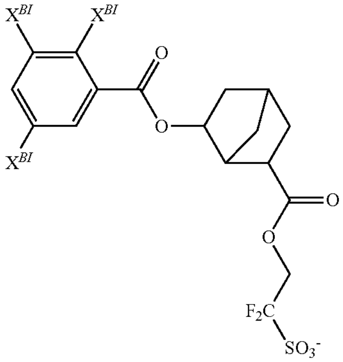
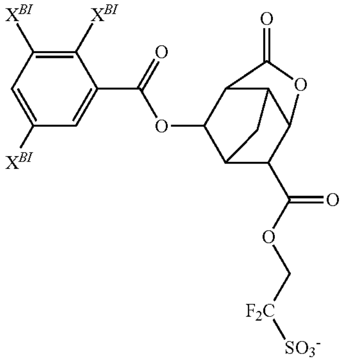
-continued
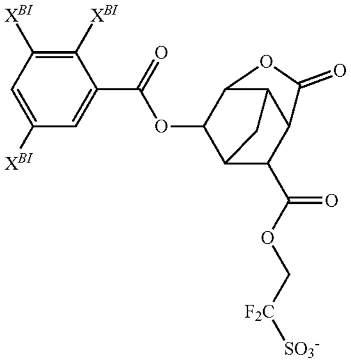
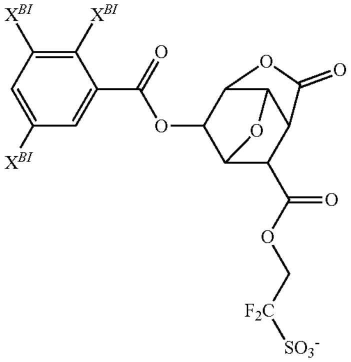
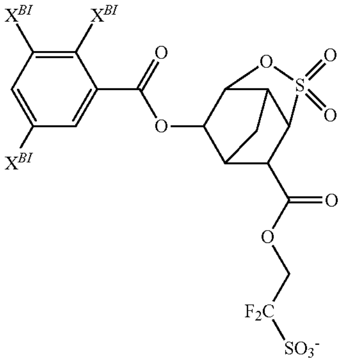
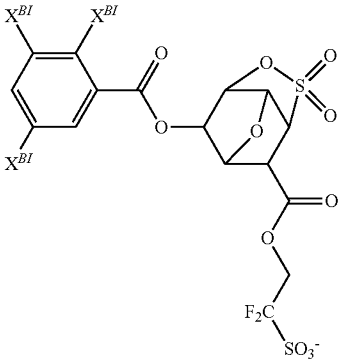

-continued
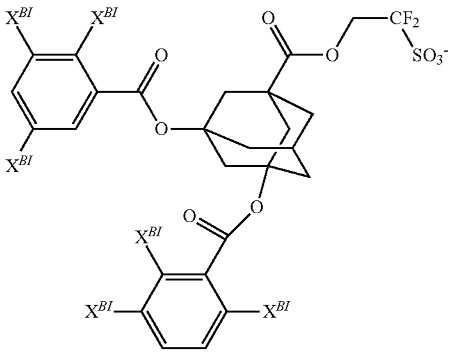
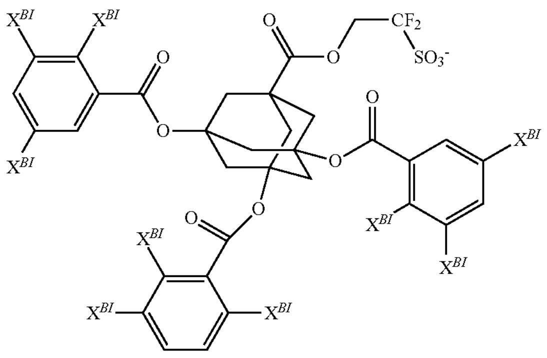
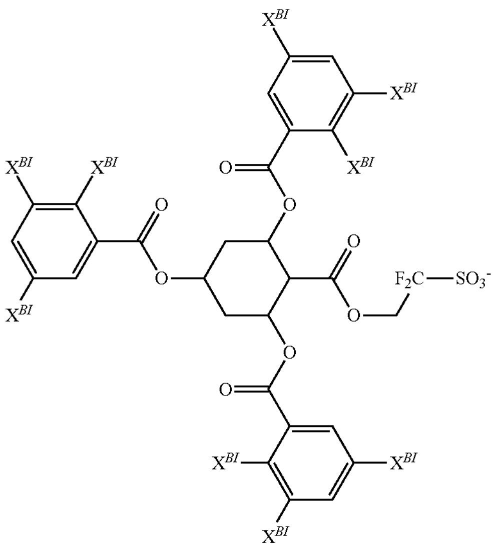
-continued
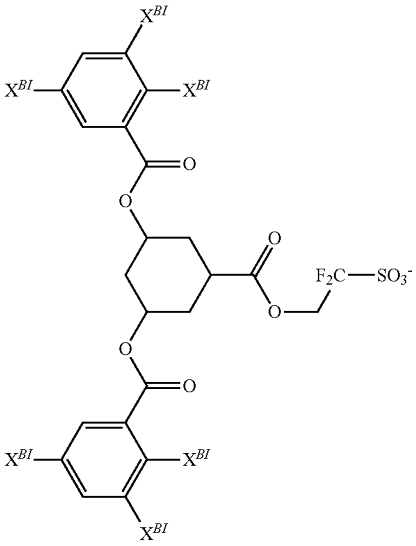
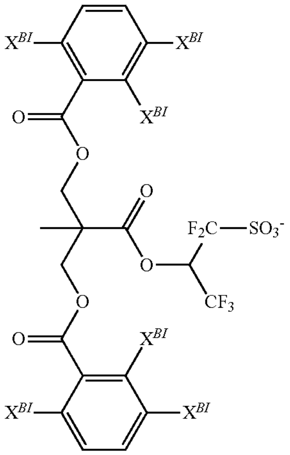
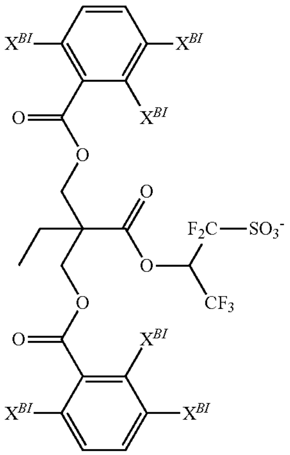

-continued
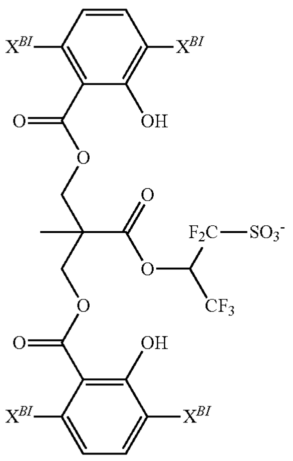
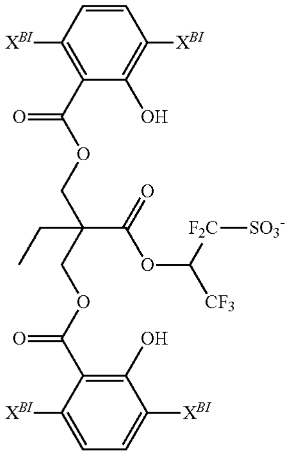
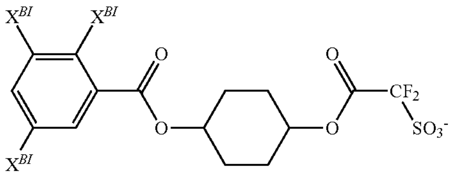
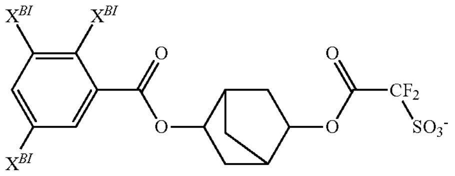
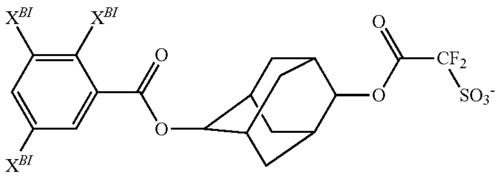
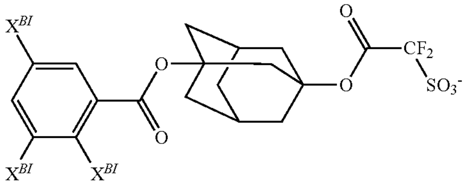
-continued
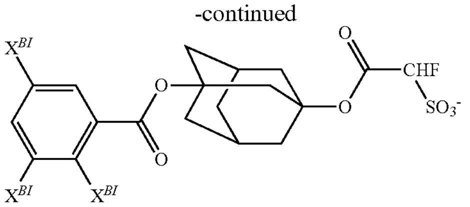
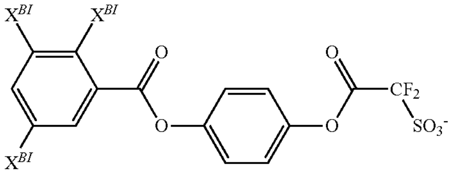
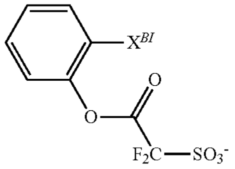
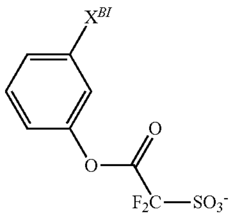
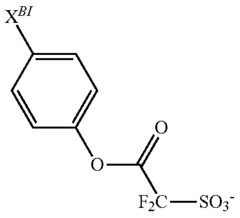
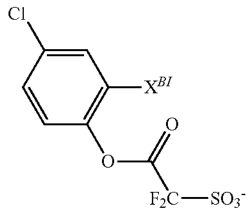
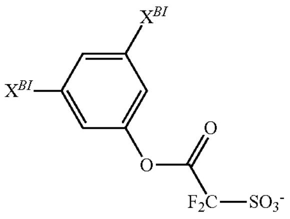
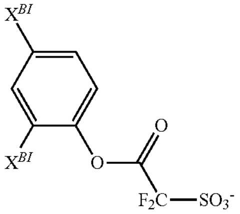
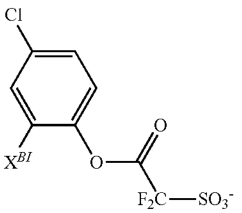
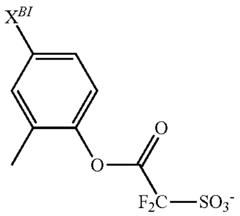
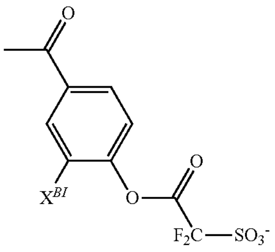
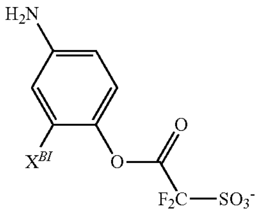

-continued
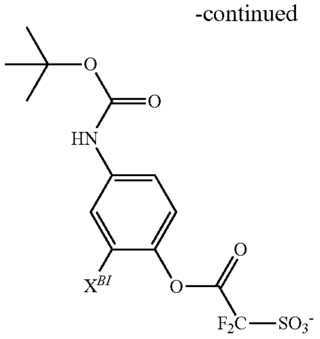
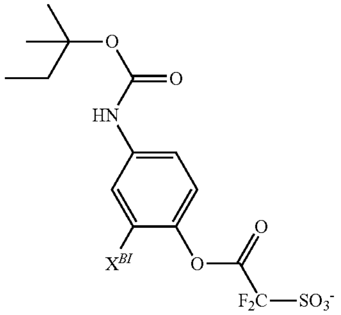
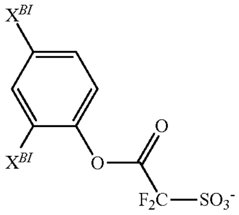
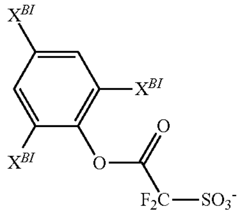
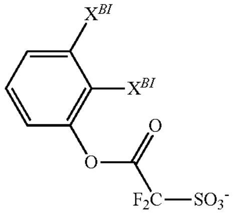
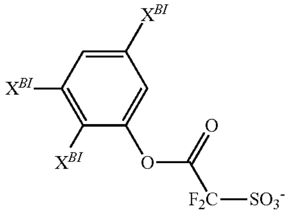
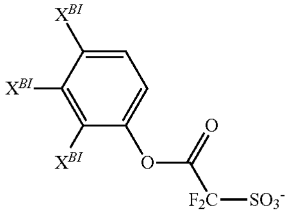
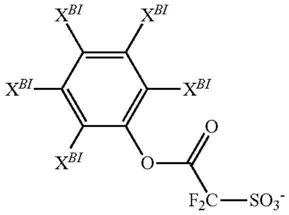
-continued
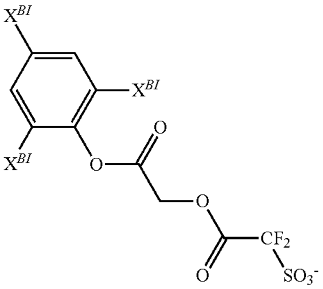
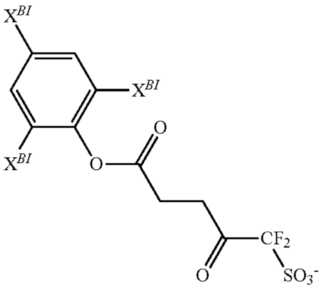
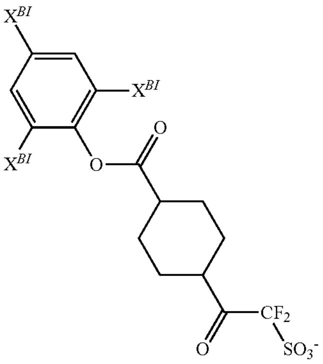
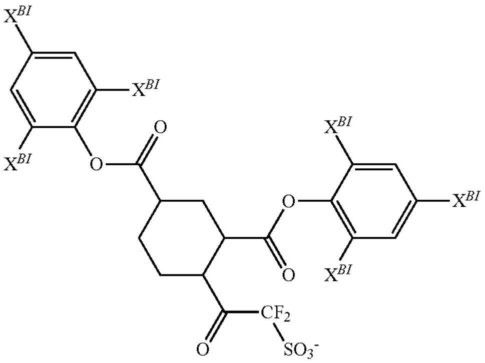
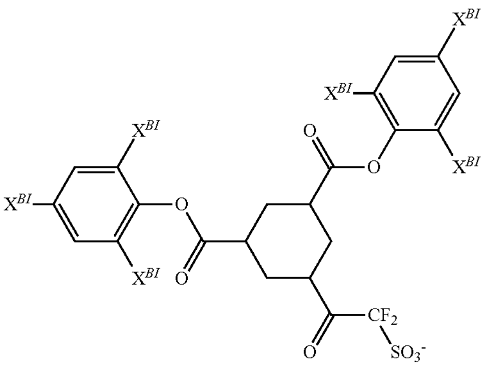

-continued
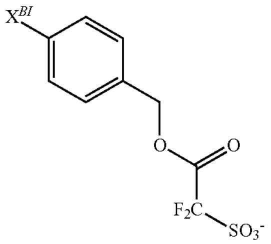
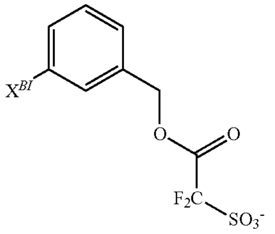
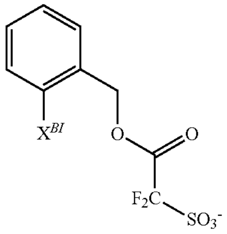
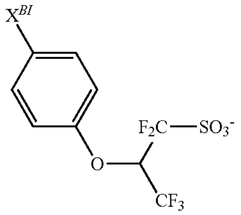
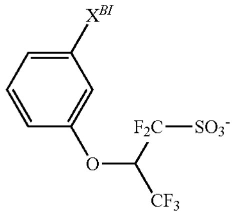
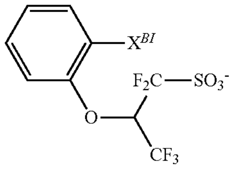
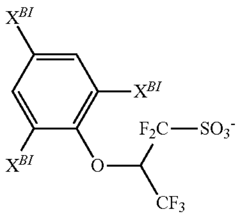
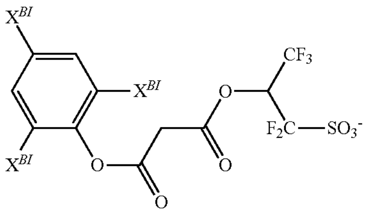
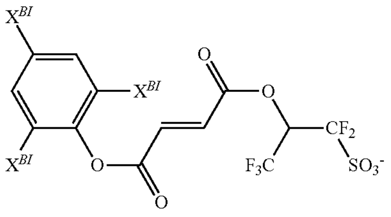
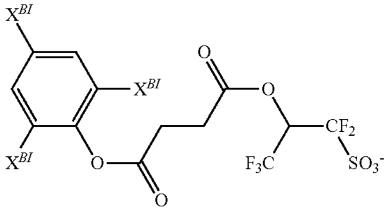
-continued
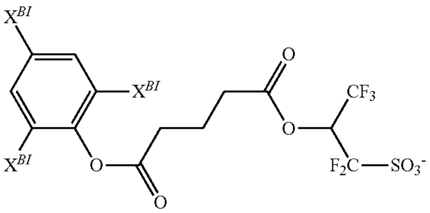
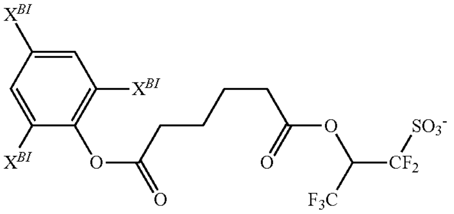
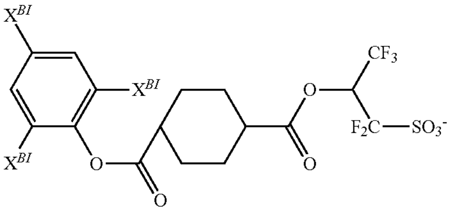
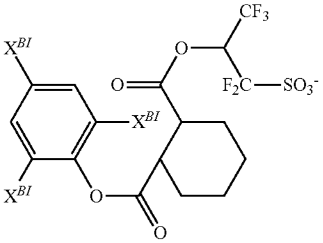
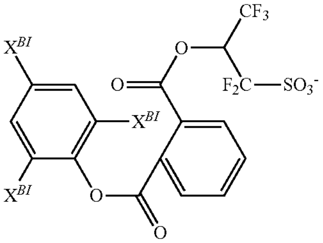
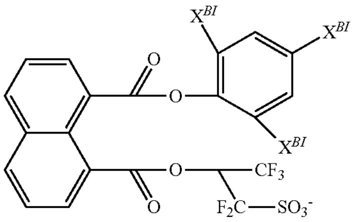
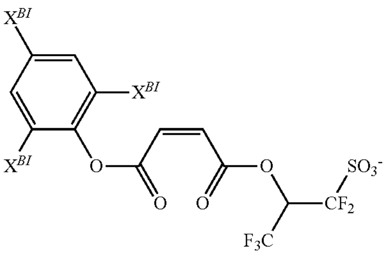

-continued
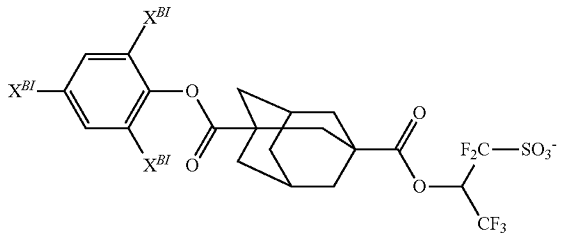
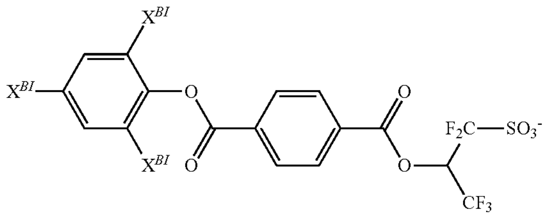
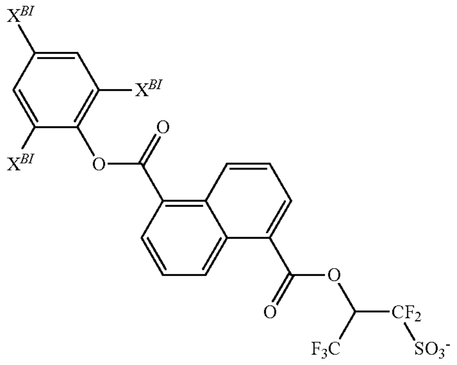
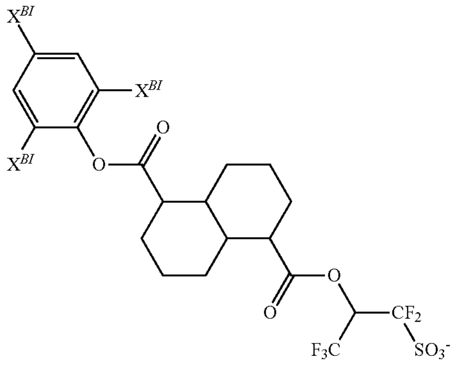
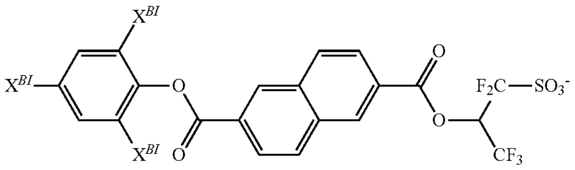
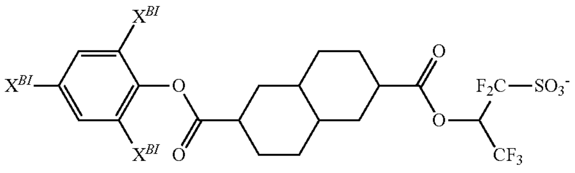
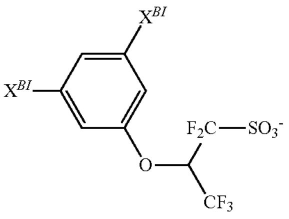
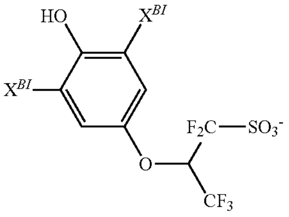
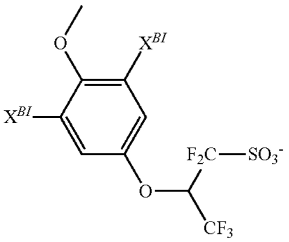
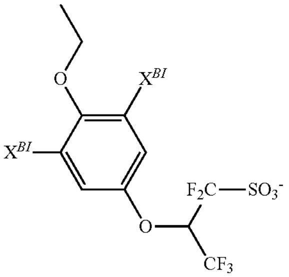
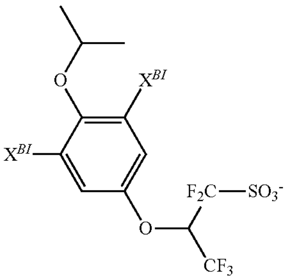
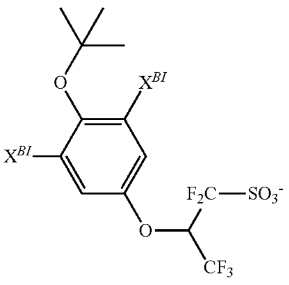

-continued
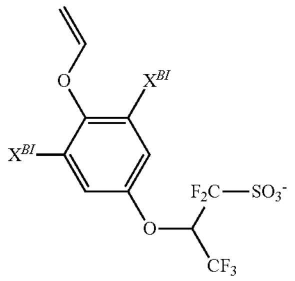
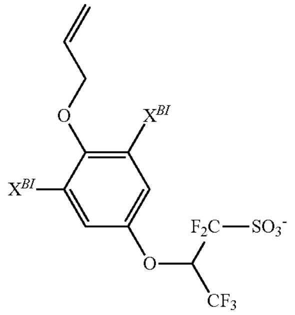
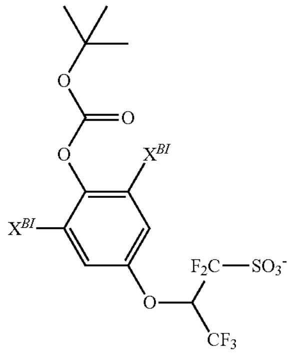
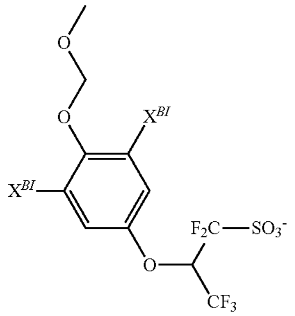
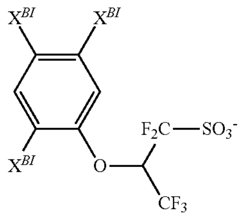
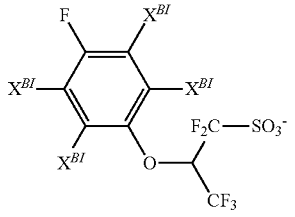
-continued
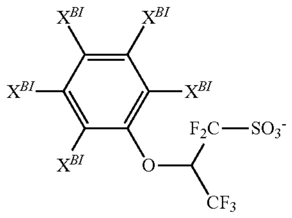
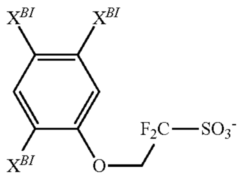
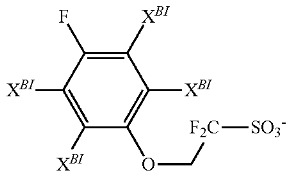
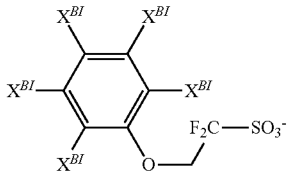
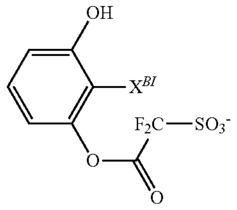
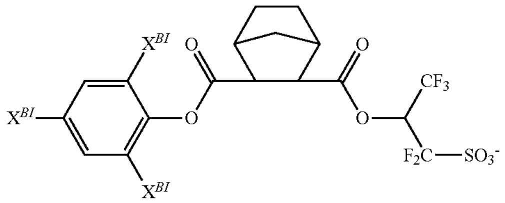
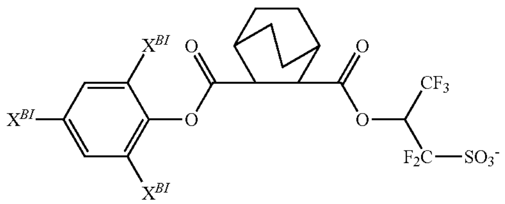
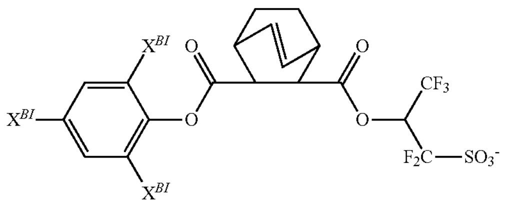

-continued
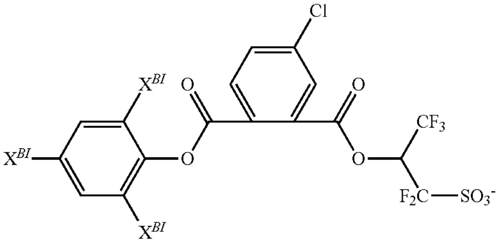
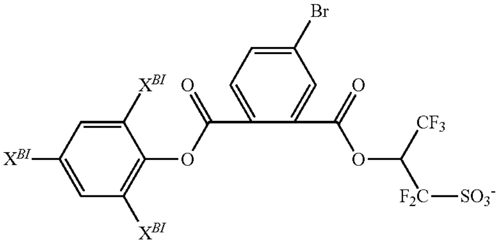
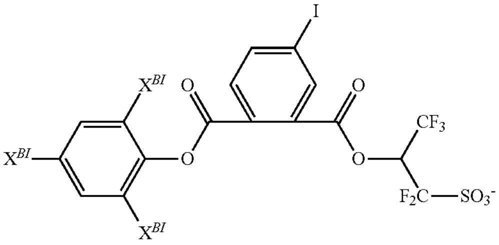
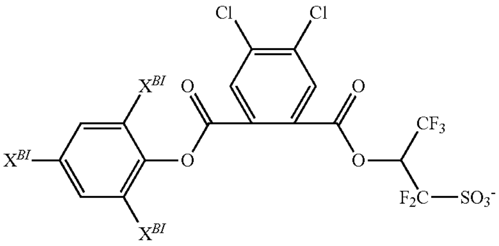
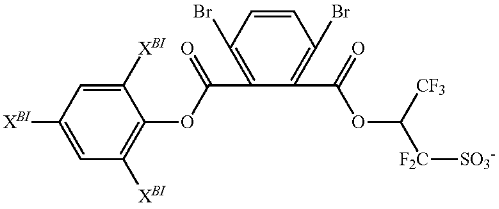
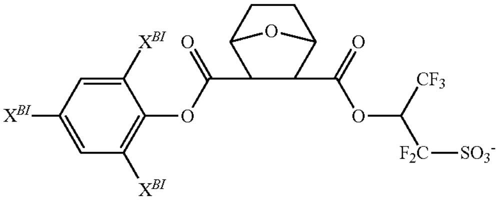
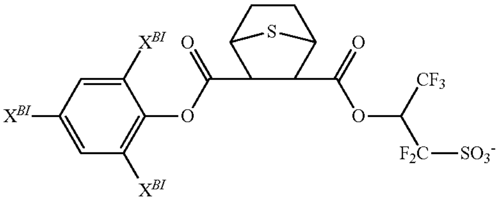
-continued
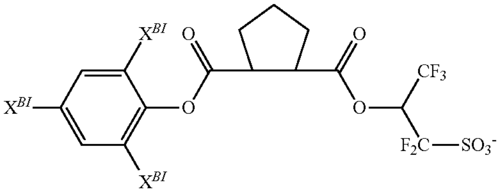
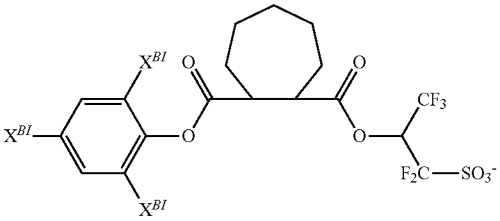
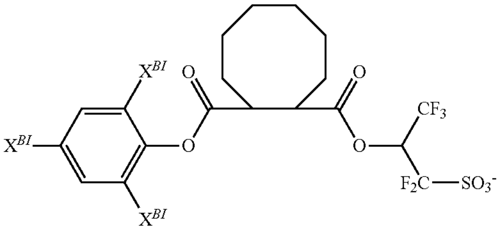
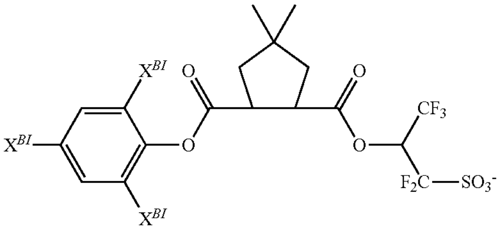
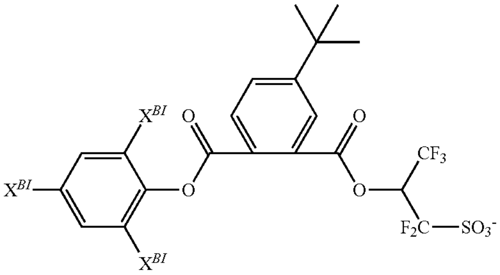
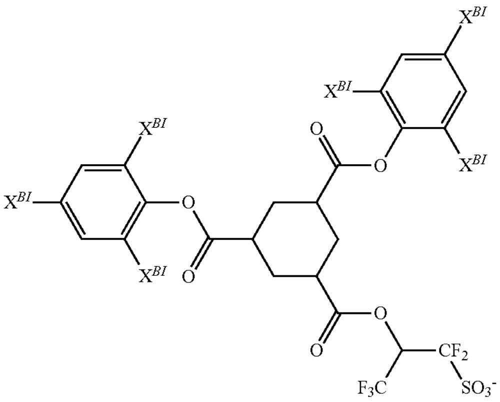

-continued
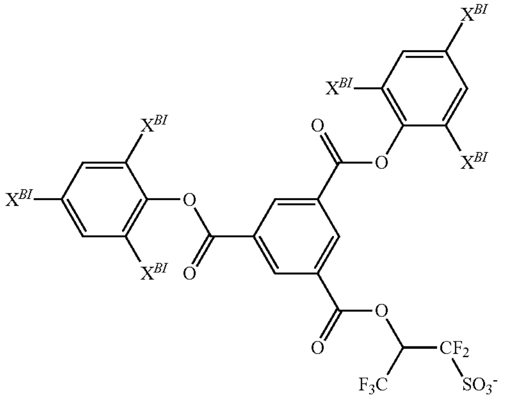
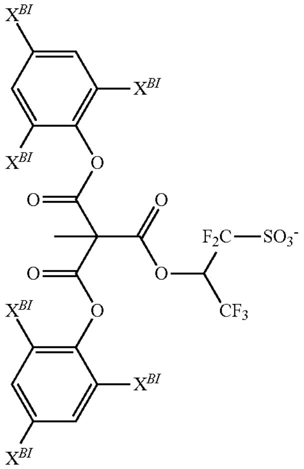
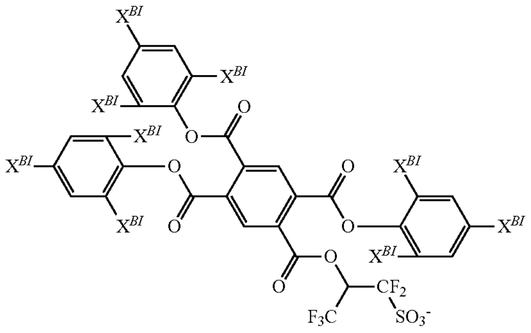
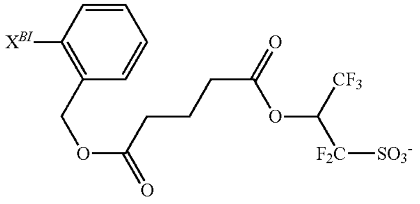
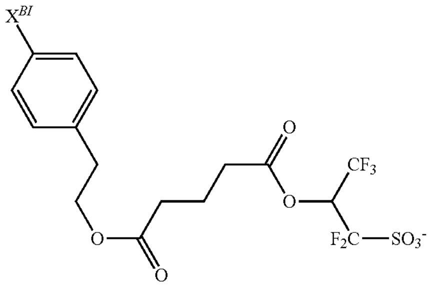
-continued
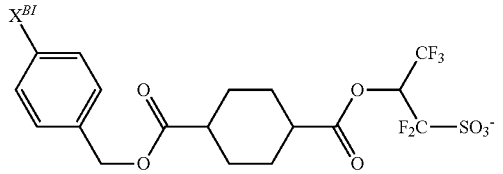
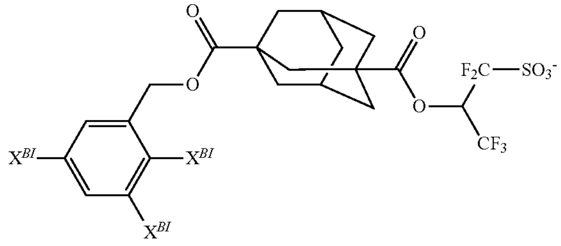
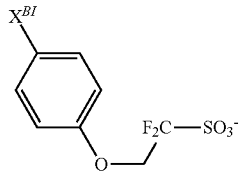
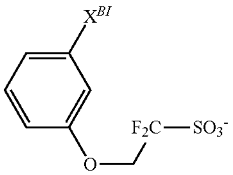
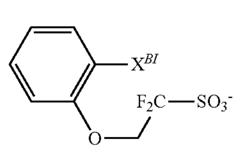
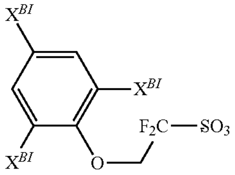
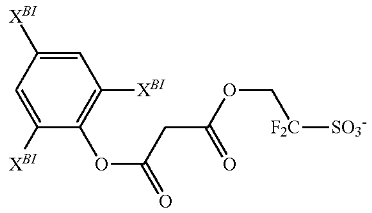
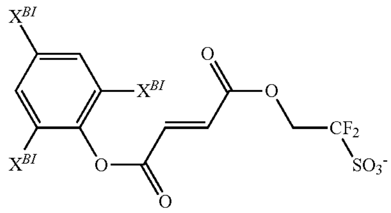
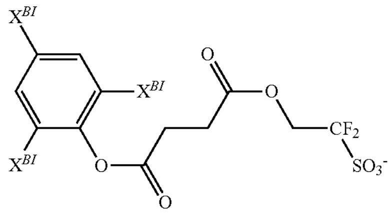
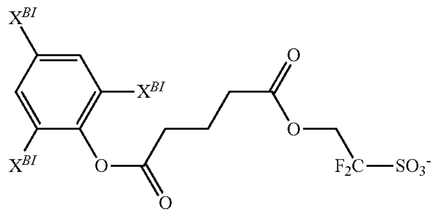

-continued
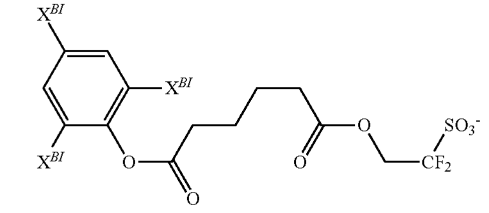
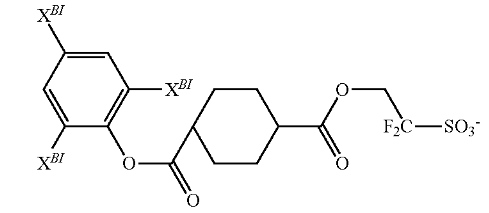
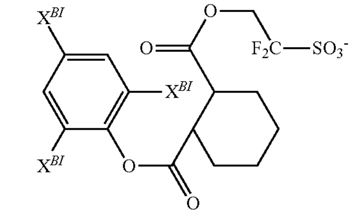
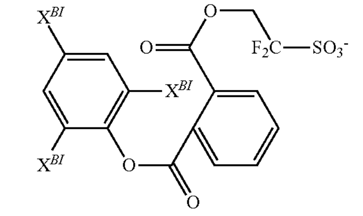
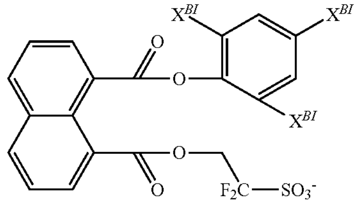
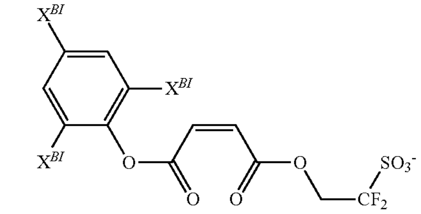
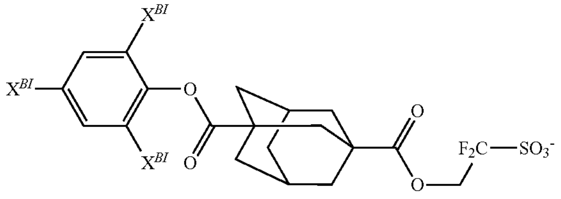
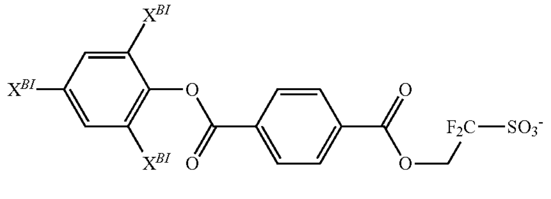
-continued
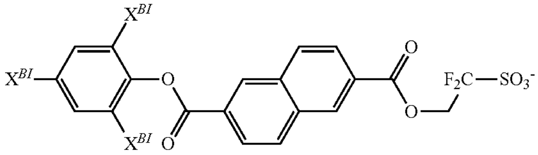
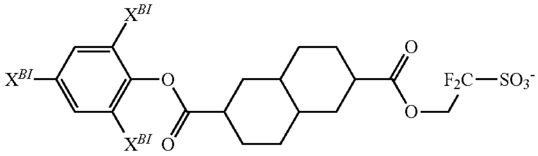
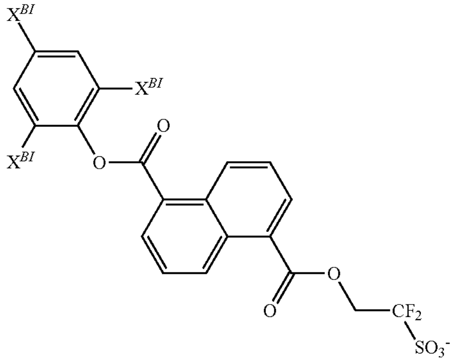
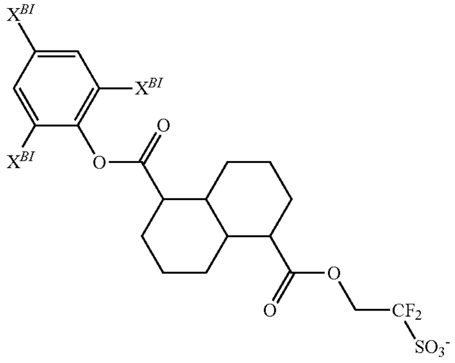
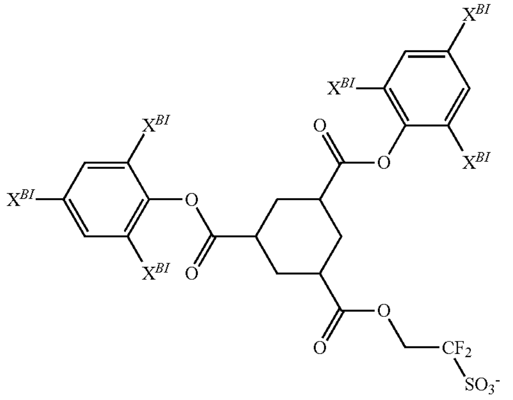

-continued
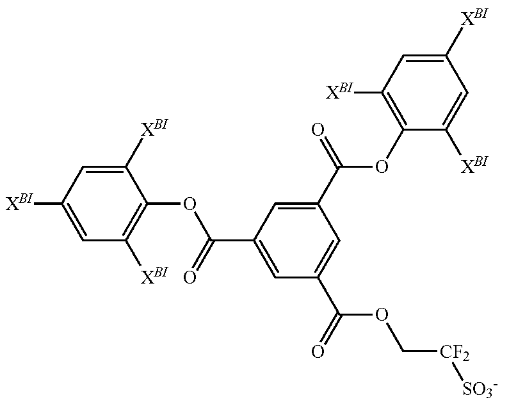
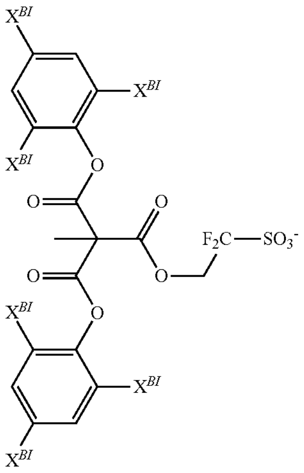
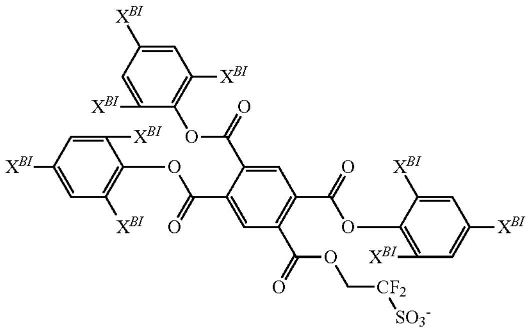
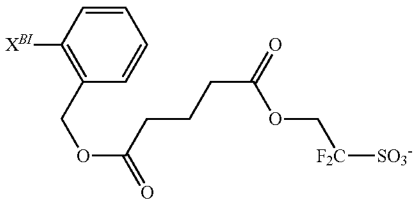
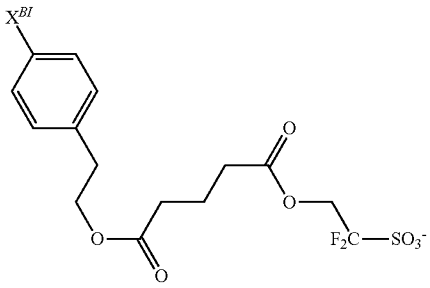
-continued
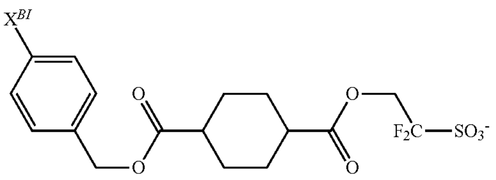
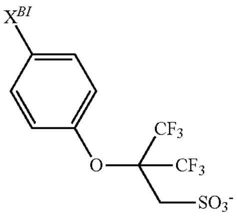
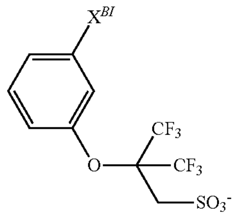
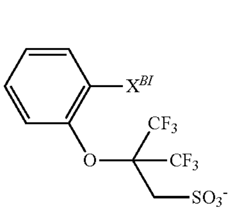
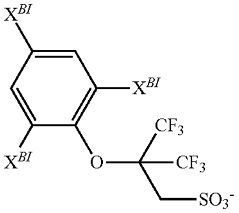
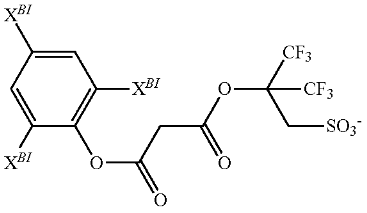
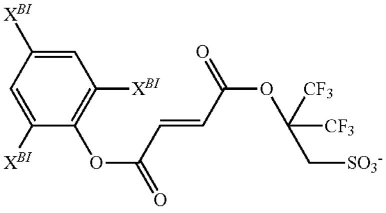
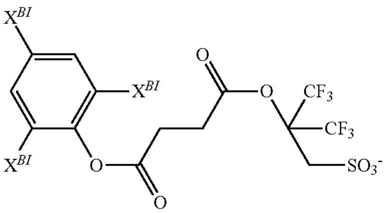
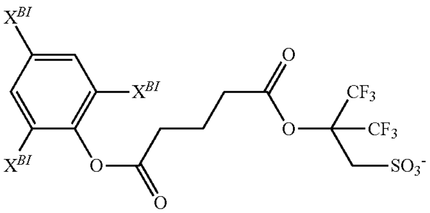
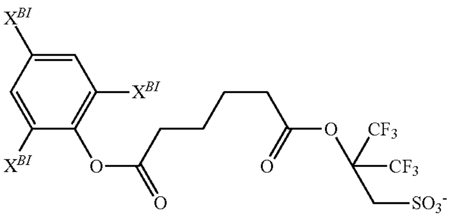

-continued
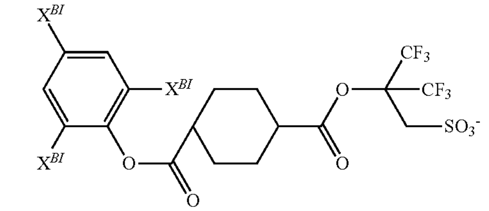
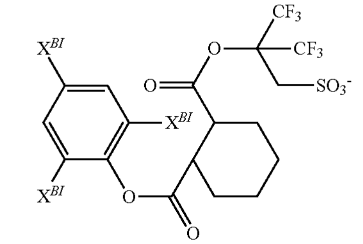
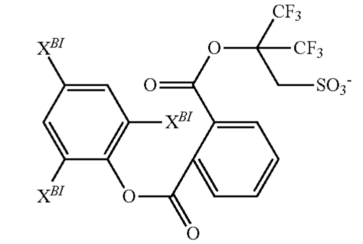
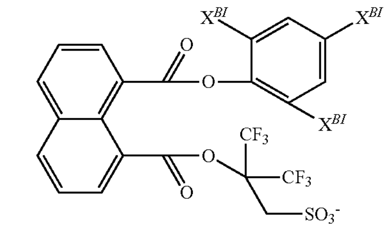
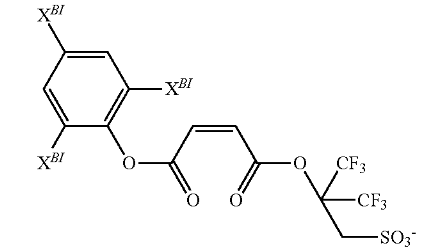
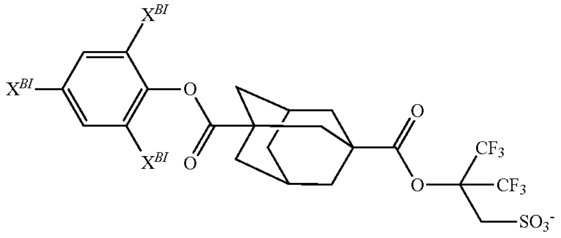
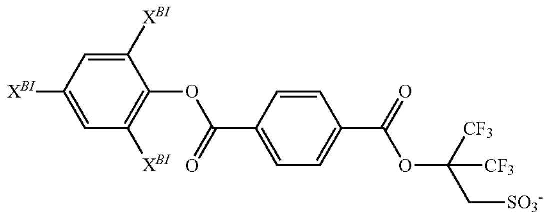
-continued
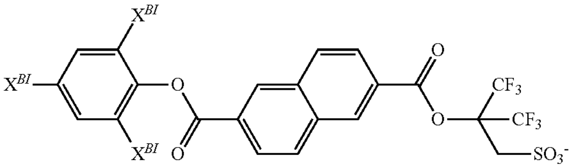
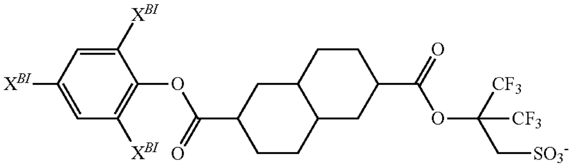
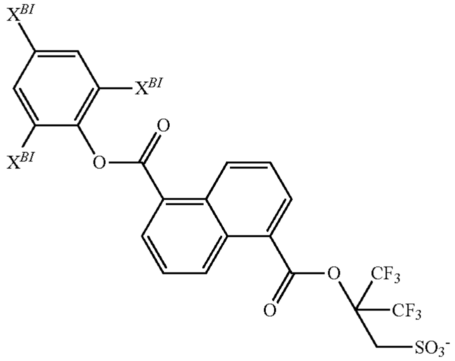
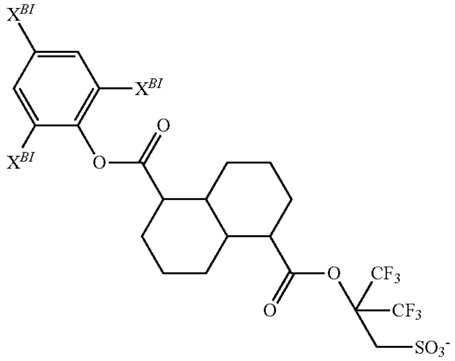
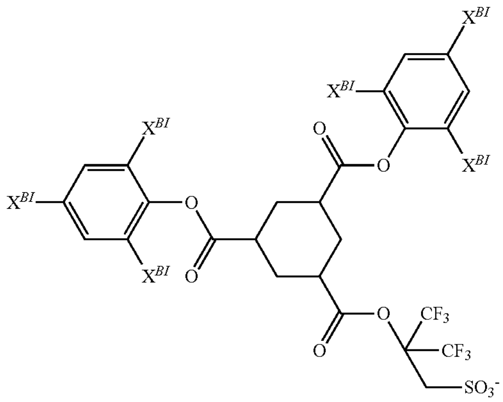

-continued

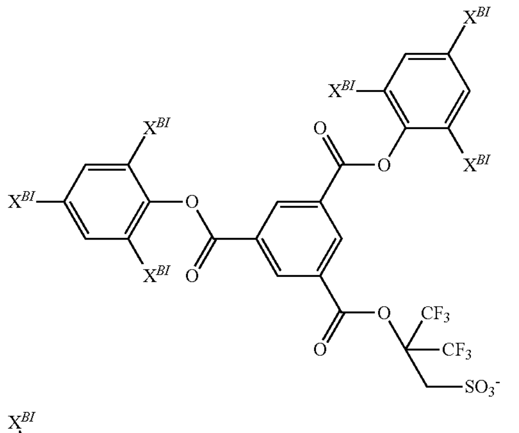

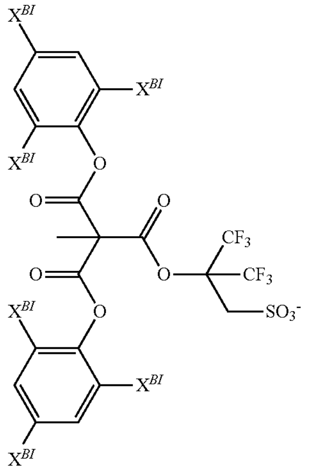

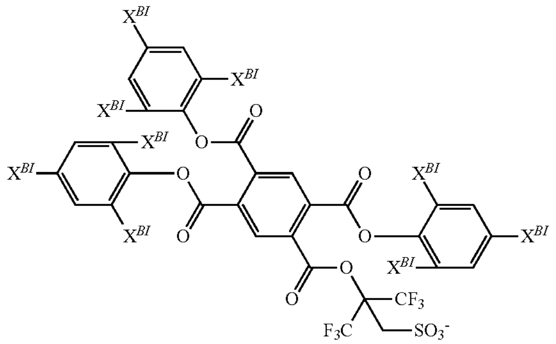

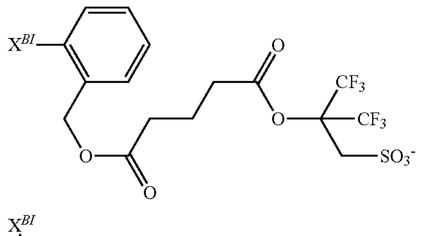

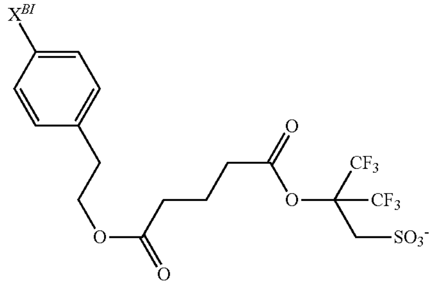

-continued

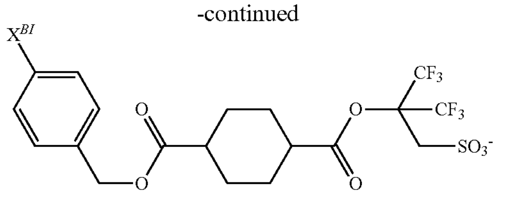

In the embodiment wherein the resist composition does not contain a base polymer, the acid generator of addition type is preferably added in an amount of 0.1 to 50 parts by weight, and more preferably 1 to 40 parts by weight per 100 parts by weight of the nitrobenzyl ester compound. In the other embodiment wherein the resist composition contains a base polymer, the acid generator of addition type is preferably added in an amount of 0.1 to 50 parts by weight, and more preferably 1 to 40 parts by weight per 100 parts by weight of the nitrobenzyl ester compound and the base polymer combined. The resist composition functions as a chemically amplified positive resist composition when the base polymer includes repeat units (c) and/or the resist composition contains the acid generator of addition type.

Organic Solvent

The positive resist composition may contain an organic solvent. The organic solvent used herein is not particularly limited as long as the foregoing and other components are soluble therein. Examples of the organic solvent are described in JP-A 2008-111103, paragraphs [0144]-[0145] (U.S. Pat. No. 7,537,880). Exemplary solvents include ketones such as cyclohexanone, cyclopentanone, methyl-2-n-pentyl ketone and 2-heptanone; alcohols such as 3-methoxybutanol, 3-methyl-3-methoxybutanol, 1-methoxy-2-propanol, I-ethoxy-2-propanol and diacetone alcohol (DAA); ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in admixture.

In the embodiment wherein the resist composition does not contain a base polymer, the organic solvent is preferably used in an amount of 100 to 10,000 parts by weight, and more preferably 200 to 8,000 parts by weight per 100 parts by weight of the nitrobenzyl ester compound. In the other embodiment wherein the resist composition contains a base polymer, the organic solvent is preferably used in an amount of 100 to 10,000 parts by weight, and more preferably 200 to 8,000 parts by weight per 100 parts by weight of the nitrobenzyl ester compound and the base polymer combined.

Quencher

The positive resist composition may further comprise a quencher. As used herein, the quencher refers to a compound capable of trapping the acid generated by the PAG to prevent the acid from diffusing into the unexposed region of the resist film.

The quencher is typically selected from conventional basic compounds. Conventional basic compounds include primary, secondary, and tertiary aliphatic amines, mixed amines, aromatic amines, heterocyclic amines, nitrogen-containing compounds with carboxy group, nitrogen-containing compounds with sulfonyl group, nitrogen-containing compounds with hydroxy group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxy group, ether bond, ester bond, lactone ring, cyano group, or sulfonic ester bond as described in JP-A 2008-111103, paragraphs [0146]-[0164], and compounds having a carbamate group as described in JP 3790649. Addition of a basic compound may be effective for further suppressing the diffusion rate of acid in the resist film or correcting the pattern profile.

Suitable other quenchers also include onium salts such as sulfonium salts, iodonium salts and ammonium salts of sulfonic acids which are not fluorinated at α-position and similar onium salts of carboxylic acid, as described in U.S. Pat. No. 8,795,942 (JP-A 2008-158339). While an α-fluorinated sulfonic acid, imide acid, and methide acid are necessary to deprotect the acid labile group of carboxylic acid ester, an α-non-fluorinated sulfonic acid or a carboxylic acid is released by salt exchange with an α-non-fluorinated onium salt. An α-non-fluorinated sulfonic acid and a carboxylic acid function as a quencher because they do not induce deprotection reaction.

Examples of the quencher include a compound having the formula (5), i.e., onium salt of α-non-fluorinated sulfonic acid and a compound having the formula (6), i.e., onium salt of carboxylic acid.

$$R^{501}-SO_3^-Mq^+ \quad (5)$$

$$R^{502}-CO_2^-Mq^+ \quad (6)$$

In formula (5), $R^{501}$ is hydrogen or a $C_1$-$C_{40}$ hydrocarbyl group which may contain a heteroatom, exclusive of the hydrocarbyl group in which the hydrogen bonded to the carbon atom at α-position of the sulfo group is substituted by fluorine or fluoroalkyl moiety.

The hydrocarbyl group may be saturated or unsaturated and straight, branched or cyclic. Examples thereof include $C_1$-$C_{40}$ alkyl groups such as methyl, ethyl, n-propyl, isopropyl, n-butyl, sec-butyl, tert-butyl, tert-pentyl, n-pentyl, n-hexyl, n-octyl, 2-ethylhexyl, n-nonyl, n-decyl; $C_3$-$C_{40}$ cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, tricyclo[5.2.1.$0^{2,6}$]decyl, adamantyl, and adamantylmethyl; $C_2$-$C_{40}$ alkenyl groups such as vinyl, allyl, propenyl, butenyl and hexenyl; $C_3$-$C_{40}$ cyclic unsaturated aliphatic hydrocarbyl groups such as cyclohexenyl; $C_6$-$C_{40}$ aryl groups such as phenyl, naphthyl, alkylphenyl groups (e.g., 2-methylphenyl, 3-methylphenyl, 4-methylphenyl, 4-ethylphenyl, 4-tert-butylphenyl, 4-n-butylphenyl), dialkylphenyl groups (e.g., 2,4-dimethylphenyl and 2,4,6-triisopropylphenyl), alkylnaphthyl groups (e.g., methylnaphthyl and ethylnaphthyl), dialkylnaphthyl groups (e.g., dimethylnaphthyl and diethylnaphthyl); $C_7$-$C_{40}$ aralkyl groups such as benzyl, 1-phenylethyl and 2-phenylethyl; and combinations thereof.

In these hydrocarbyl groups, some or all hydrogen may be substituted by a moiety containing a heteroatom such as oxygen, sulfur, nitrogen or halogen, and some constituent $—CH_2—$ may be replaced by a moiety containing a heteroatom such as oxygen, sulfur or nitrogen, so that the group may contain a hydroxy moiety, fluorine, chlorine, bromine, iodine, cyano moiety, carbonyl moiety, ether bond, ester bond, sulfonic ester bond, carbonate bond, lactone ring, sultone ring, carboxylic anhydride (—C(═O)—O—C(═O)—), or haloalkyl moiety. Suitable heteroatom-containing hydrocarbyl groups include heteroaryl groups such as thienyl and indolyl; alkoxyphenyl groups such as 4-hydroxyphenyl, 4-methoxyphenyl, 3-methoxyphenyl, 2-methoxyphenyl, 4-ethoxyphenyl, 4-tert-butoxyphenyl, 3-tert-butoxyphenyl; alkoxynaphthyl groups such as methoxynaphthyl, ethoxynaphthyl, n-propoxynaphthyl and n-butoxynaphthyl; dialkoxynaphthyl groups such as dimethoxynaphthyl and diethoxynaphthyl; and aryloxoalkyl groups, typically 2-aryl-2-oxoethyl groups such as 2-phenyl-2-oxoethyl, 2-(1-naphthyl)-2-oxoethyl and 2-(2-naphthyl)-2-oxoethyl.

In formula (6), $R^{502}$ is a $C_1$-$C_{40}$ hydrocarbyl group which may contain a heteroatom. Examples of the hydrocarbyl group $R^{502}$ are as exemplified above for the hydrocarbyl group $R^{501}$. Also included are fluorinated alkyl groups such as trifluoromethyl, trifluoroethyl, 2,2,2-trifluoro-1-methyl-1-hydroxyethyl, 2,2,2-trifluoro-1-(trifluoromethyl)-1-hydroxyethyl, and fluorinated aryl groups such as pentafluorophenyl and 4-trifluoromethylphenyl.

In formulae (5) and (6), $Mq^+$ is an onium cation. The onium cation is preferably selected from sulfonium, iodonium and ammonium cations, more preferably sulfonium and iodonium cations. Exemplary sulfonium cations are as exemplified above for the cation in the sulfonium salt having formula (2-1). Exemplary iodonium cations are as exemplified above for the cation in the iodonium salt having formula (2-2).

A sulfonium salt of iodized benzene ring-containing carboxylic acid having the formula (7) is also useful as the quencher.

(7)

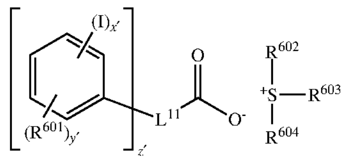

In formula (7), $R^{601}$ is hydroxy, fluorine, chlorine, bromine, amino, nitro, cyano, or a $C_1$-$C_6$ saturated hydrocarbyl, $C_1$-$C_6$ saturated hydrocarbyloxy, $C_2$-$C_6$ saturated hydrocarbylcarbonyloxy or $C_1$-$C_4$ saturated hydrocarbylsulfonyloxy group, in which some or all hydrogen may be substituted by halogen, or $—N(R^{601A})—C(═O)—R^{601B}$, or $—N(R^{601A})—C(═O)—O—R^{601B}$. $R^{601A}$ is hydrogen or a $C_1$-$C_6$ saturated hydrocarbyl group. $R^{601B}$ is a $C_1$-$C_6$ saturated hydrocarbyl or $C_2$-$C_8$ unsaturated aliphatic hydrocarbyl group.

In formula (7), x' is an integer of 1 to 5, y' is an integer of 0 to 3, and z' is an integer of 1 to 3. $L^{11}$ is a single bond, or a $C_1$-$C_{20}$ (z'+1)-valent linking group which may contain at least one moiety selected from ether bond, carbonyl moiety, ester bond, amide bond, sultone ring, lactam ring, carbonate bond, halogen, hydroxy moiety, and carboxy moiety. The saturated hydrocarbyl, saturated hydrocarbyloxy, saturated hydrocarbylcarbonyloxy, and saturated hydrocarbylsulfonyloxy groups may be straight, branched or cyclic. A plurality of $R^{601}$ may be the same or different when y' and/or z' is 2 or 3.

In formula (7), $R^{602}$, $R^{603}$ and $R^{604}$ are each independently fluorine, chlorine, bromine, iodine, or a $C_1$-$C_{20}$ hydrocarbyl group which may contain a heteroatom. The hydrocarbyl group may be saturated or unsaturated and straight, branched or cyclic. Examples thereof are as exemplified above for the hydrocarbyl groups $R^{101}$ to $R^{105}$ in formulae (2-1) and (2-2). In the hydrocarbyl groups, some or all hydrogen may be substituted by hydroxy, carboxy, halogen, oxo, cyano, nitro, sultone ring, sulfo, or sulfonium salt-containing moiety, or some —$CH_2$— may be replaced by an ether bond, ester bond, carbonyl moiety, amide bond, carbonate bond or sulfonic ester bond. $R^{602}$ and $R^{603}$ may bond together to form a ring with the sulfur atom to which they are attached.

Examples of the compound having formula (7) include those described in U.S. Pat. No. 10,295,904 (JP-A 2017-219836). Since iodine atoms are fully absorptive to EUV of wavelength 13.5 nm, they generate secondary electrons upon exposure. The energy of secondary electrons is transferred to the PAG to promote decomposition of the quencher for thereby enhancing sensitivity.

In the embodiment wherein the resist composition does not contain a base polymer, the quencher is preferably used in an amount of 0 to 20 parts by weight, and more preferably 0.1 to 10 parts by weight per 100 parts by weight of the nitrobenzyl ester compound. In the other embodiment wherein the resist composition contains a base polymer, the quencher is preferably used in an amount of 0 to 20 parts by weight, and more preferably 0.1 to 10 parts by weight per 100 parts by weight of the nitrobenzyl ester compound and the base polymer combined. The quencher may be used alone or in admixture.

Other Components

In addition to the foregoing components, the positive resist composition may contain other components such as a surfactant, dissolution inhibitor, water repellency improver, and acetylene alcohol.

Exemplary surfactants are described in JP-A 2008-111103, paragraphs [0165]-[0166]. Inclusion of a surfactant may improve or control the coating characteristics of the resist composition. In the embodiment wherein the resist composition does not contain a base polymer, the surfactant is preferably used in an amount of 0.0001 to 10 parts by weight per 100 parts by weight of the nitrobenzyl ester compound. In the other embodiment wherein the resist composition contains a base polymer, the surfactant is preferably used in an amount of 0.0001 to 10 parts by weight per 100 parts by weight of the nitrobenzyl ester compound and the base polymer combined. The surfactant may be used alone or in admixture.

In the positive resist composition, inclusion of a dissolution inhibitor may lead to an increased difference in dissolution rate between exposed and unexposed areas and a further improvement in resolution. The dissolution inhibitor which can be used herein is a compound having at least two phenolic hydroxy groups on the molecule, in which an average of from 0 to 100 mol % of all the hydrogen atoms on the phenolic hydroxy groups are replaced by acid labile groups or a compound having at least one carboxy group on the molecule, in which an average of 50 to 100 mol % of all the hydrogen atoms on the carboxy groups are replaced by acid labile groups, both the compounds having a molecular weight of 100 to 1,000, and preferably 150 to 800. Typical are bisphenol A, trisphenol, phenolphthalein, cresol novolac, naphthalenecarboxylic acid, adamantanecarboxylic acid, and cholic acid derivatives in which the hydrogen atom on the hydroxy or carboxy group is replaced by an acid labile group, as described in U.S. Pat. No. 7,771,914 (JP-A 2008-122932, paragraphs [0155]-[0178]).

In the embodiment wherein the resist composition does not contain a base polymer, the dissolution inhibitor is preferably used in an amount of 0 to 50 parts by weight, and more preferably 5 to 40 parts by weight per 100 parts by weight of the nitrobenzyl ester compound. In the other embodiment wherein the resist composition contains a base polymer, the dissolution inhibitor is preferably used in an amount of 0 to 50 parts by weight, and more preferably 5 to 40 parts by weight per 100 parts by weight of the nitrobenzyl ester compound and the base polymer combined. The dissolution inhibitor may be used alone or in admixture.

To the resist composition, a water repellency improver may also be added for improving the water repellency on surface of a resist film. The water repellency improver may be used in the topcoatless immersion lithography. Suitable water repellency improvers include polymers having a fluoroalkyl group and polymers having a specific structure with a 1,1,1,3,3,3-hexafluoro-2-propanol residue and are described in JP-A 2007-297590 and JP-A 2008-111103, for example. The water repellency improver to be added to the resist composition should be soluble in the alkaline developer and organic solvent developer. The water repellency improver of specific structure with a 1,1,1,3,3,3-hexafluoro-2-propanol residue is well soluble in the developer. A polymer having an amino group or amine salt copolymerized as repeat units may serve as the water repellency improver and is effective for preventing evaporation of acid during PEB, thus preventing any hole pattern opening failure after development.

In the embodiment wherein the resist composition does not contain a base polymer, the water repellency improver is preferably used in an amount of 0 to 20 parts by weight, and more preferably 0.5 to 10 parts by weight per 100 parts by weight of the nitrobenzyl ester compound. In the other embodiment wherein the resist composition contains a base polymer, the water repellency improver is preferably used in an amount of 0 to 20 parts by weight, and more preferably 0.5 to 10 parts by weight per 100 parts by weight of the nitrobenzyl ester compound and the base polymer combined. The water repellency improver may be used alone or in admixture.

Also, an acetylene alcohol may be blended in the resist composition. Suitable acetylene alcohols are described in JP-A 2008-122932, paragraphs [0179]-[0182]. In the embodiment wherein the resist composition does not contain a base polymer, the acetylene alcohol is preferably used in an amount of 0 to 5 parts by weight per 100 parts by weight of the nitrobenzyl ester compound. In the other embodiment wherein the resist composition contains a base polymer, the acetylene alcohol is preferably used in an amount of 0 to 5 parts by weight per 100 parts by weight of the nitrobenzyl ester compound and the base polymer combined. The acetylene alcohol may be used alone or in admixture.

Pattern Forming Process

The positive resist composition is used in the fabrication of various integrated circuits. Pattern formation using the resist composition may be performed by well-known lithography processes. The process generally involves the steps of applying the resist composition onto a substrate to form a resist film thereon, exposing the resist film to high-energy radiation, and developing the exposed resist film in a developer. If necessary, any additional steps may be added.

Specifically, the resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, $MoSi_2$, or $SiO_2$) by a suitable coating technique such as spin coating, roll coating, flow coating, dipping, spraying or doctor coating. The coating is prebaked on a hot plate at a temperature of 60 to 150° C. for 10 seconds to 30 minutes, preferably at 80 to 120° C. for 30 seconds to 20 minutes. The resulting resist film is generally 0.01 to 2 μm thick.

The resist film is then exposed to a desired pattern of high-energy radiation such as UV, deep-UV. EB, EUV of wavelength 3 to 15 nm, x-ray, soft x-ray, excimer laser light, γ-ray or synchrotron radiation. When UV, deep-UV, EUV, x-ray, soft x-ray, excimer laser light, γ-ray or synchrotron radiation is used as the high-energy radiation, the resist film is exposed thereto directly or through a mask having a desired pattern in a dose of preferably about 1 to 200 $mJ/cm^2$, more preferably about 10 to 100 $mJ/cm^2$. When EB is used as the high-energy radiation, the resist film is exposed thereto directly or through a mask having a desired pattern in a dose of preferably about 0.1 to 100 $\mu C/cm^2$, more preferably about 0.5 to 50 $\mu C/cm^2$. It is appreciated that the inventive resist composition is suited in micropatterning using i-line of wavelength 365 nm, KrF excimer laser, ArF excimer laser, EB, EUV, x-ray, soft x-ray, γ-ray or synchrotron radiation, especially EB or EUV.

After the exposure, the resist film may be baked (PEB) on a hot plate or in an oven at 50 to 150° C. for 10 seconds to 30 minutes, preferably at 60 to 120° C. for 30 seconds to 20 minutes.

After the exposure or PEB, the resist film is developed in a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonium hydroxide (TEAH), tetrapropylammonium hydroxide (TPAH), or tetrabutylammonium hydroxide (TBAH). The resist film in the exposed area is dissolved in the developer whereas the resist film in the unexposed area is not dissolved. In this way, the desired positive pattern is formed on the substrate.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is preferably at a temperature of 70 to 180° C., more preferably 80 to 170° C., for a time of 10 to 300 seconds. The extra shrink agent is stripped and the hole pattern is shrunk.

EXAMPLES

Examples of the invention are given below by way of illustration and not by way of limitation. The abbreviation "pbw" is parts by weight.

[1] Synthesis of Nitrobenzyl Ester Compounds

Synthesis Examples 1-1 to 1-6, 1-14 and Comparative Synthesis Example 1 Synthesis of Nitrobenzyl Ester Compounds N-1 to N-6, N-14 and Comparative Nitrobenzyl Ester Compound CN-1

Nitrobenzyl ester compound N-1 was synthesized by esterification reaction of 3,5,6-triiodobenzoic acid with 2-nitrobenzyl alcohol. By similar reaction, nitrobenzyl ester compounds N-2 to N-6, N-14 and comparative nitrobenzyl ester compound CN-1 were synthesized.

N-1

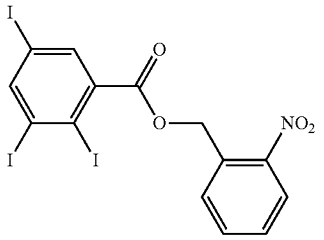

N-2

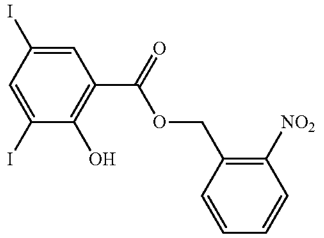

N-3

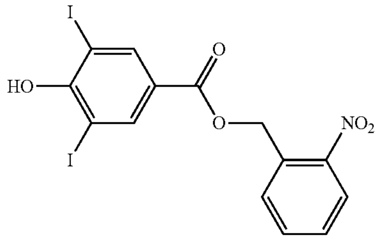

N-4

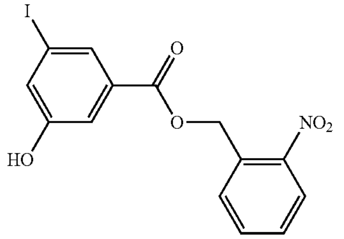

N-5

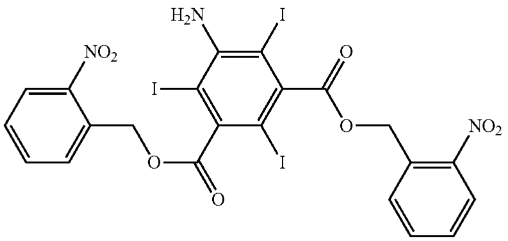

N-6

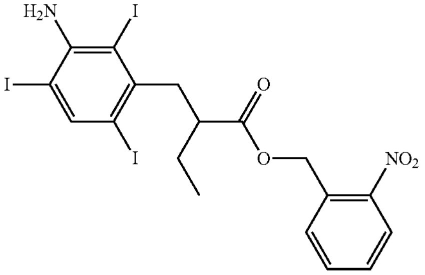

-continued
N-14
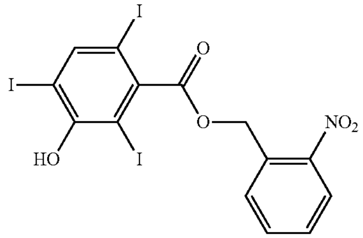
-continued
CN-1
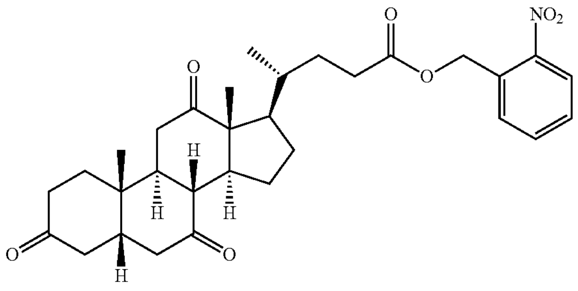
Synthesis Examples 1-7 to 1-13, 1-15 to 1-20 Synthesis of Nitrobenzyl Ester Compounds N-7 to N-13, N-15 to N-20
Nitrobenzyl ester compounds N-7 to N-13, N-15 to N-20 were synthesized by reaction of the nitrobenzyl ester compound with a carboxy-bearing compound and an acid anhydride or isocyanate compound.
N-7
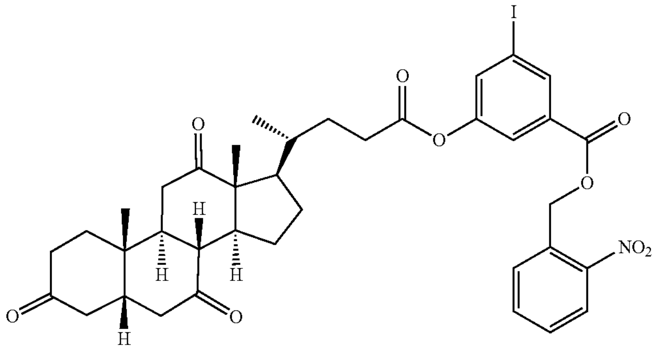
N-8
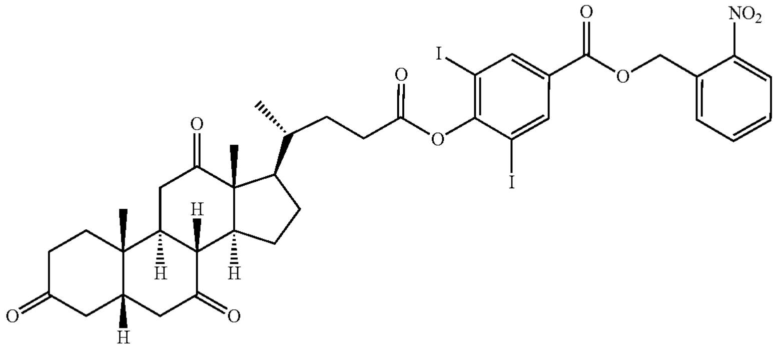

-continued
N-9
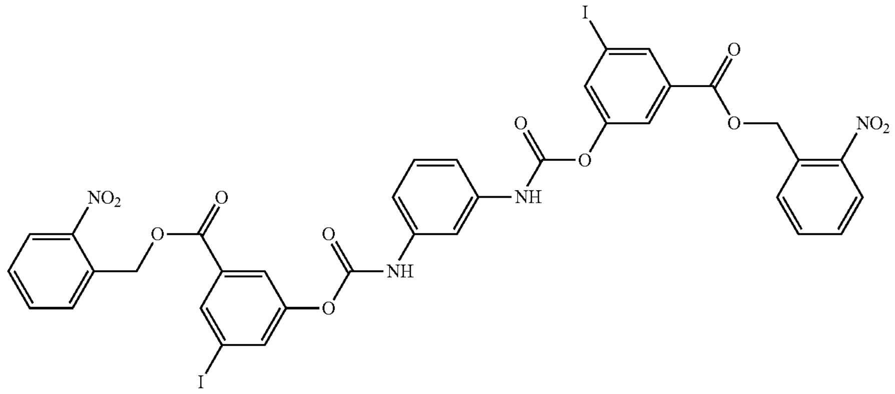
N-10
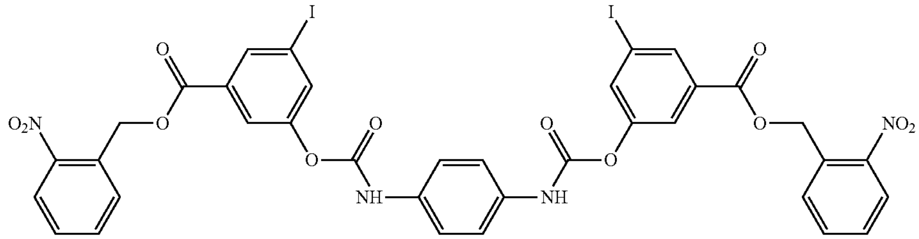
N-11
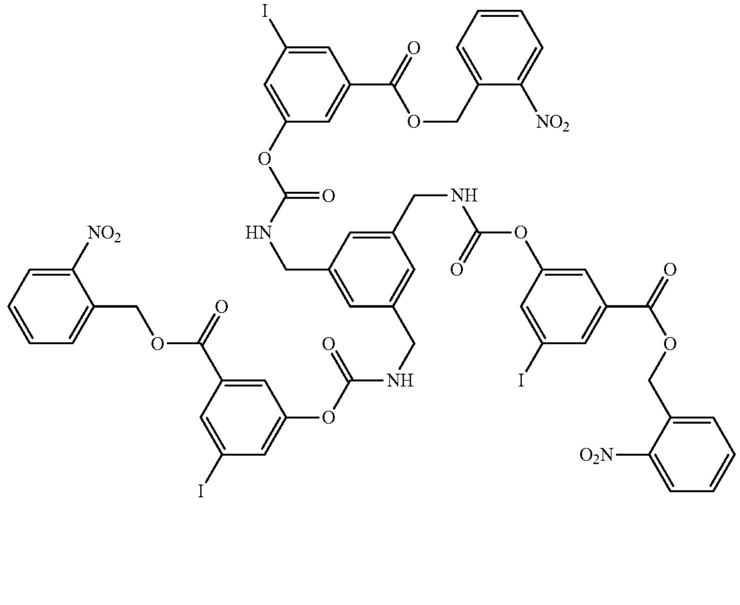

-continued
N-12
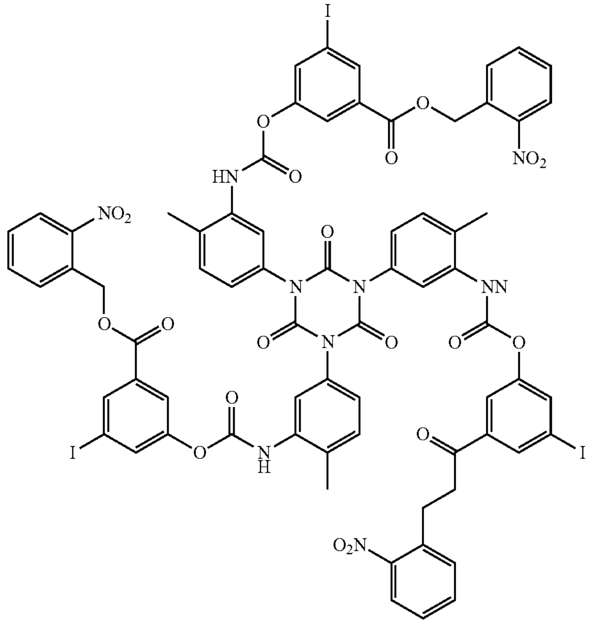
N-13
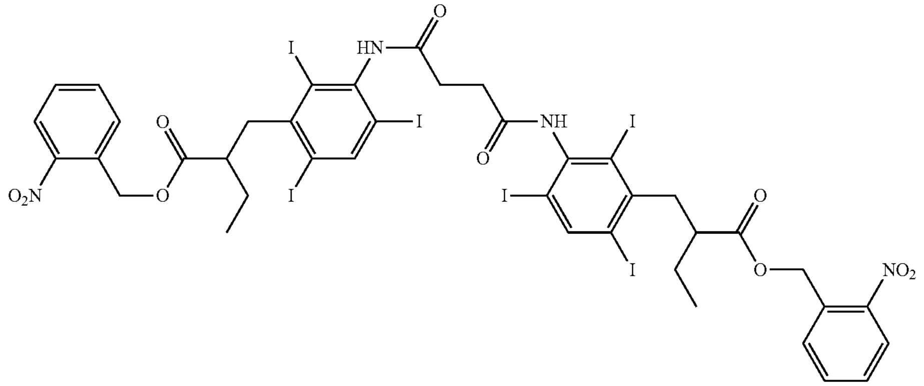
N-15
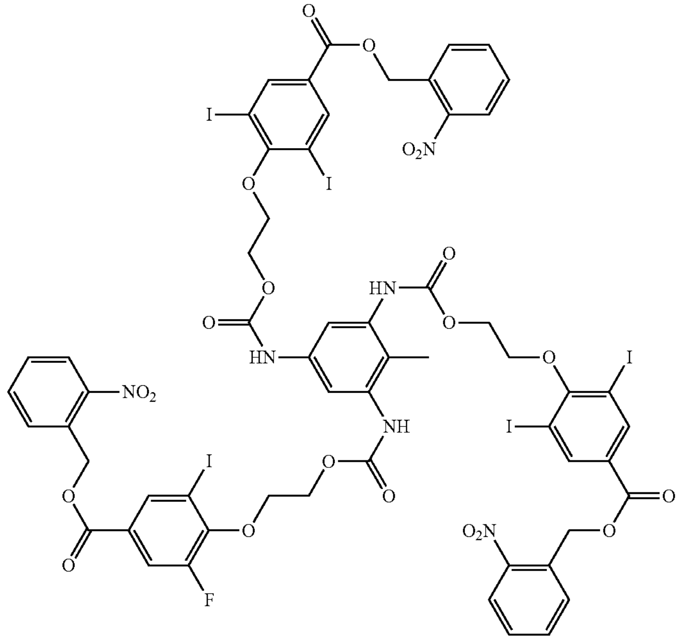

-continued
N-16
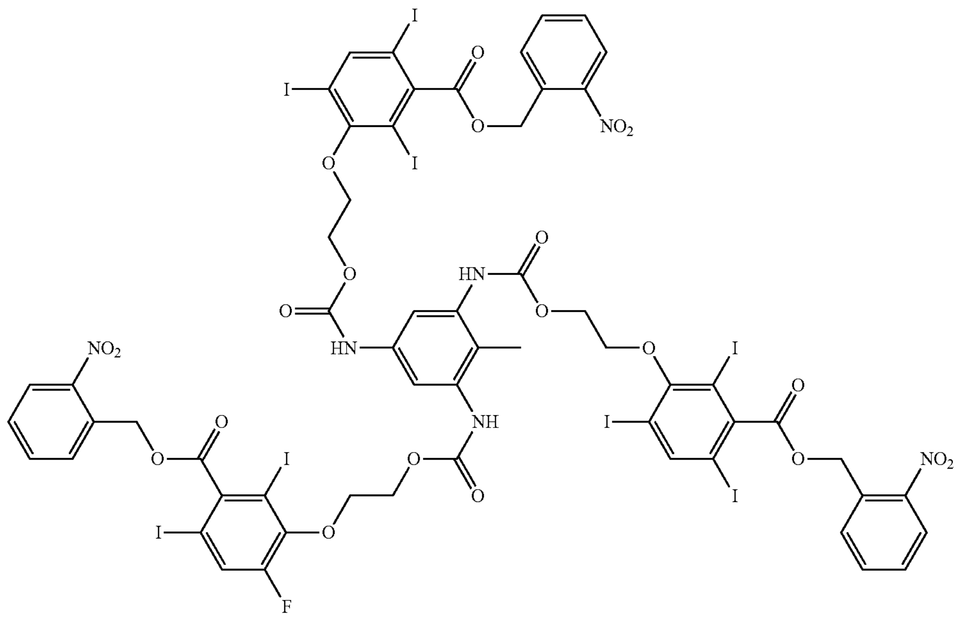
N-17
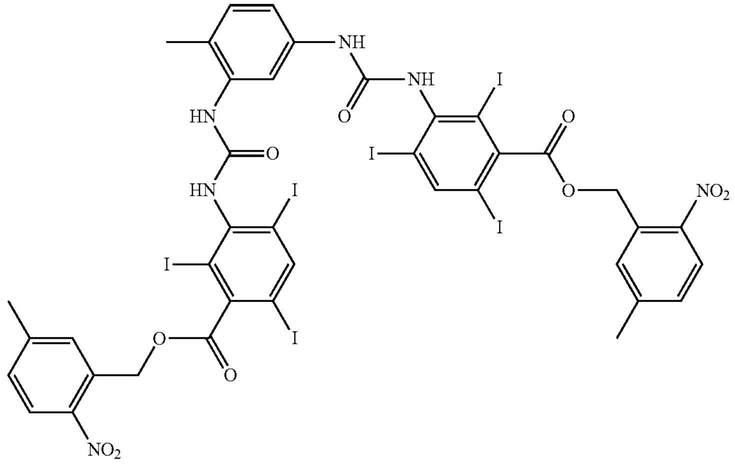
N-18
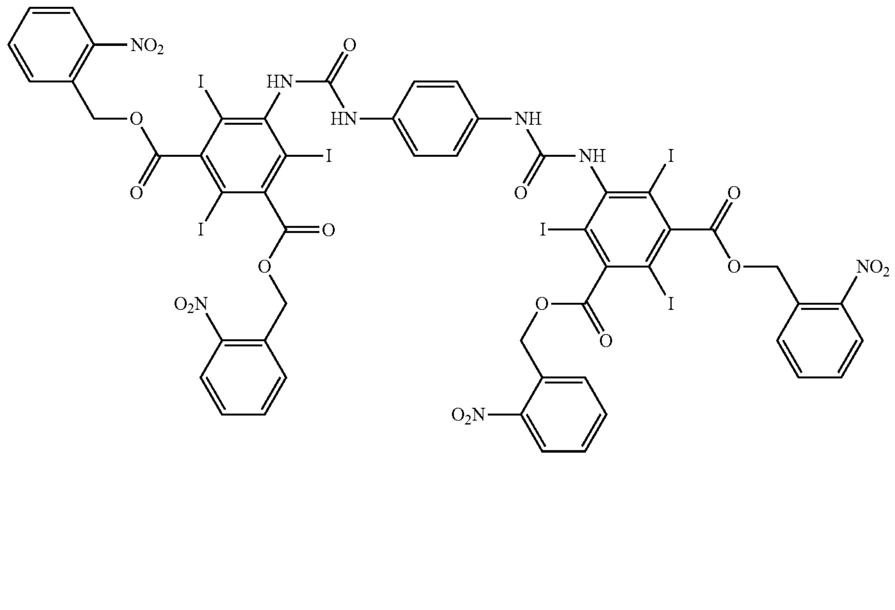

-continued

N-19

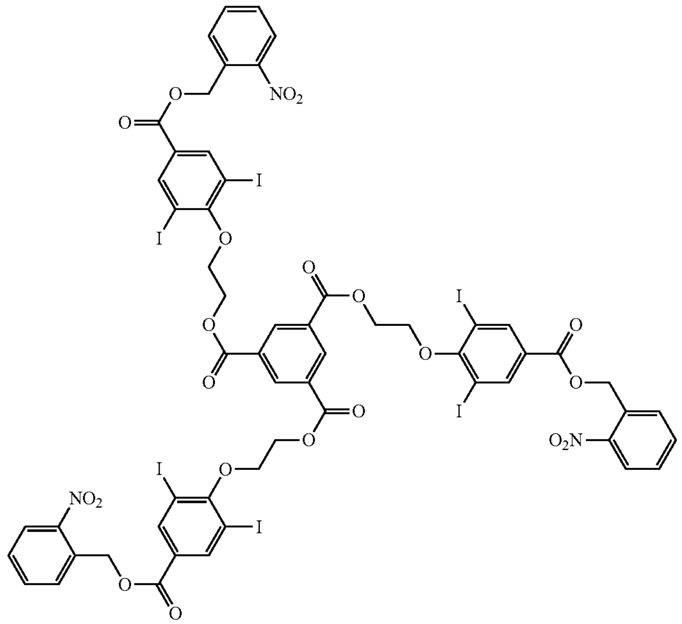

N-20

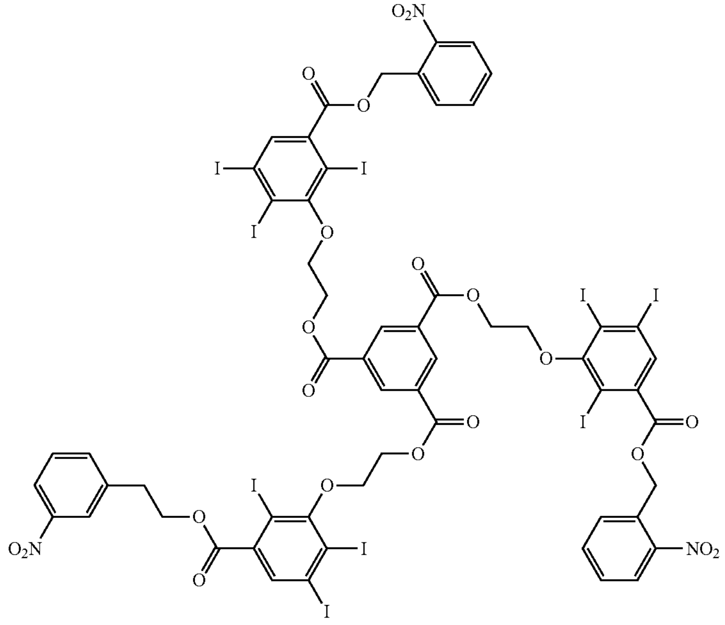

[2] Synthesis of Base Polymers

Synthesis Examples 2-1 to 2-3 Synthesis of Polymers P-1 to P-3

Each of base polymers P-1 to P-3 was prepared by combining suitable monomers, effecting copolymerization reaction thereof in tetrahydrofuran (THF) solvent, pouring the reaction solution into methanol for precipitation, washing the precipitate with hexane, isolation, and drying. The resulting polymer was analyzed for composition by $^1$H-NMR spectroscopy and for Mw and Mw/Mn by GPC versus polystyrene standards using THF solvent.

P-1

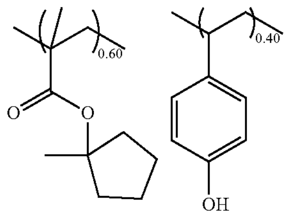

Mw = 8600
Mw/Mn = 1.73

-continued

P-2

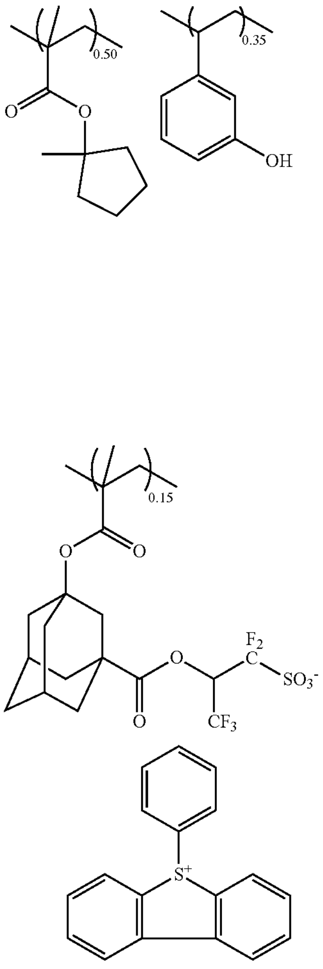

Mw = 9900
Mw/Mn = 1.99

P-3

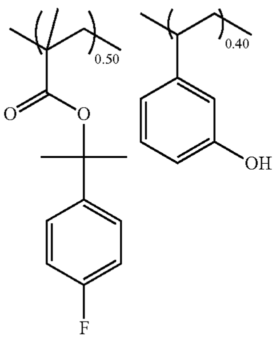

-continued

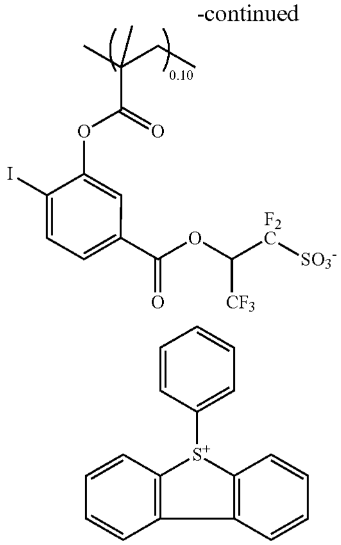

Mw = 9800
Mw/Mn = 1.82

[3] Preparation and Evaluation of Positive Resist Compositions

Examples 1 to 18 and Comparative Examples 1, 2

(1) Preparation of Positive Resist Compositions

Positive resist compositions were prepared by dissolving various components in a solvent containing 100 ppm of surfactant PolyFox PF-636 (Omnova Solutions, Inc.) in accordance with the recipe shown in Table 1, and filtering through a filter having a pore size of 0.2 μm.

The components in Table 1 are identified below.

Organic solvent:

PGMEA (propylene glycol monomethyl ether acetate)

DAA (diacetone alcohol)

EL (L form of ethyl lactate)

PAG-1

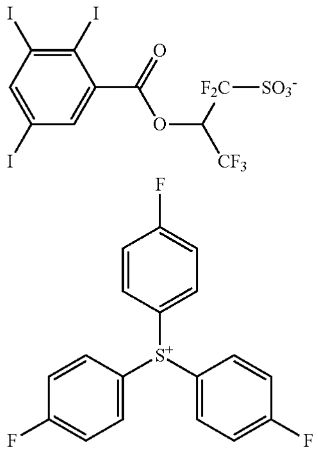

Acid generator: PAG-1

-continued

Q-1

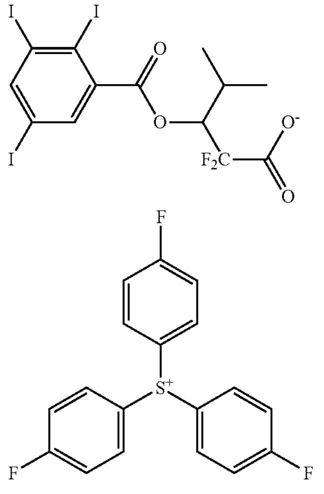

Quencher: Q-1

(2) EUV Lithography Test

Each of the resist compositions in Table 1 was spin coated on a silicon substrate having a 20-nm coating of silicon-containing spin-on hard mask SHB-A940 (Shin-Etsu Chemical Co., Ltd., Si content 43 wt %) and prebaked on a hotplate at 100° C. for 60 seconds to form a resist film of 50 nm thick. Using an EUV scanner NXE3400 (ASML, NA 0.33, σ 0.9/0.6, quadrupole illumination), the resist film was exposed to EUV through a mask bearing a hole pattern at a pitch 46 nm (on-wafer size) and +20% bias. In Examples 1 to 4 and 12 and Comparative Example 1, the resist film was baked (PEB) on a hotplate at the temperature shown in Table 1 for 60 seconds. After exposure or PEB, the resist film was developed in a 2.38 wt % TMAH aqueous solution for 30 seconds to form a hole pattern having a size of 23 nm.

The resist pattern was observed under CD-SEM (CG6300, Hitachi High-Technologies Corp.). The exposure dose that provides a hole pattern having a size of 23 nm is reported as sensitivity. The size of 50 holes printed at that dose was measured, from which a 3-fold value (3σ) of the standard deviation (σ) was computed and reported as dimensional variation or CDU.

The resist compositions are shown in Table 1 together with the sensitivity and CDU of EUV lithography.

TABLE 1

| | | Compound (pbw) | Polymer (pbw) | Acid generator (pbw) | Quencher (pbw) | Organic solvent (pbw) | PEB temp. (° C.) | Sensitivity (mJ/cm$^2$) | CDU (nm) |
|---|---|---|---|---|---|---|---|---|---|
| Example | 1 | N-1 (40) | P-1 (60) | PAG-1 (10.0) | Q-1 (2.00) | PGMEA (2000) DAA (500) | 80 | 51 | 2.4 |
| | 2 | N-2 (40) | P-1 (60) | PAG-1 (10.0) | Q-1 (2.00) | PGMEA (2000) DAA (500) | 80 | 54 | 2.3 |
| | 3 | N-3 (40) | P-2 (60) | — | Q-1 (2.00) | PGMEA (2000) DAA (500) | 80 | 52 | 2.1 |
| | 4 | N-4 (40) | P-3 (60) | — | Q-1 (2.00) | PGMEA (2000) DAA (500) | 85 | 42 | 2.1 |
| | 5 | N-5 (50) N-7 (50) | — | — | — | PGMEA (2000) DAA (500) | — | 71 | 2.2 |
| | 6 | N-6 (40) N-8 (60) | — | — | — | PGMEA (2000) DAA (500) | — | 62 | 2.2 |
| | 7 | N-9 (100) | — | — | — | PGMEA (2000) DAA (500) | — | 58 | 2.0 |
| | 8 | N-10 (100) | — | — | — | PGMEA (2000) DAA (500) | — | 60 | 2.0 |
| | 9 | N-11 (100) | — | — | — | PGMEA (2000) DAA (500) | — | 59 | 2.2 |
| | 10 | N-12 (100) | — | — | — | PGMEA (2000) DAA (500) | — | 60 | 2.1 |
| | 11 | N-13 (100) | — | — | — | PGMEA (2000) DAA (500) | — | 51 | 2.2 |
| | 12 | N-14 (40) | P-3 (60) | — | Q-1 (2.00) | PGMEA (2000) DAA (500) | 85 | 45 | 2.3 |
| | 13 | N-15 (100) | — | — | — | EL (2000) DAA (500) | — | 63 | 2.2 |
| | 14 | N-16 (100) | — | — | — | EL (2000) DAA (500) | — | 62 | 2.4 |
| | 15 | N-17 (100) | — | — | — | EL (2000) DAA (500) | — | 59 | 2.2 |
| | 16 | N-18 (100) | — | — | — | EL (2000) DAA (500) | — | 58 | 2.4 |
| | 17 | N-19 (100) | — | — | — | EL (2000) DAA (500) | — | 57 | 2.4 |
| | 18 | N-20 (100) | — | — | — | EL (2000) DAA (500) | — | 56 | 2.4 |
| Comparative Example | 1 | — | P-1 (100) | PAG-1 (25.0) | Q-1 (5.00) | PGMEA (2000) DAA (500) | 80 | 31 | 3.3 |
| | 2 | CN-1 (100) | — | — | — | PGMEA (2000) DAA (500) | — | 120 | 3.2 |

It is demonstrated in Table 1 that positive resist compositions comprising the nitrobenzyl ester compound offer a high sensitivity and excellent CDU.

Japanese Patent Application No. 2022-111900 is incorporated herein by reference. Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A positive resist composition comprising a compound having a nitrobenzyl ester group bonded to an iodized aromatic ring, wherein the compound having a nitrobenzyl ester group bonded to an iodized aromatic ring has the formula (1):

(1)

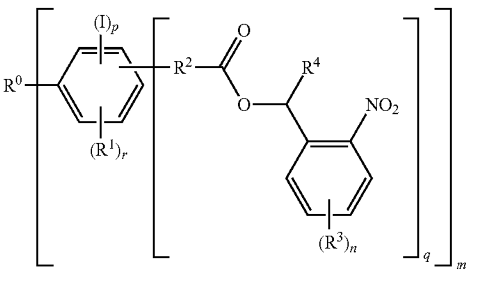

wherein m is an integer of 1 to 3, n is an integer of 0 to 4, p is an integer of 0 to 4, or an integer of 1 to 4 when m is 2 or 3, q is 1 or 2, r is an integer of 0 to 3, meeting $1 \le p+q+r \le 5$, in case of m=1, $R^0$ is hydrogen, iodine, or a $C_{20}$-$C_{40}$ hydrocarbyl group having a steroid skeleton and optionally containing a heteroatom, in case of m=2, $R^0$ is an ether bond, thioether bond, ester bond, thioester bond, amide bond, urethane bond, urea bond, carbonate bond, or a $C_1$-$C_{40}$ hydrocarbylene group which may contain a heteroatom, and in case of m=3, $R^0$ is a $C_1$-$C_{40}$ trivalent hydrocarbon group which may contain a heteroatom; the hydrocarbyl, hydrocarbylene or trivalent hydrocarbon group may bond to the benzene ring in the formula via an ether bond, thioether bond, ester bond, thioester bond, amide bond, urethane bond, urea bond or carbonate bond, with the proviso that $R^0$ is iodine in case of m=1 and p=0, $R^1$ is each independently hydroxy, $C_1$-$C_6$ saturated hydrocarbyl group, $C_1$-$C_6$ saturated hydrocarbyloxy group, $C_2$-$C_6$ saturated hydrocarbylcarbonyloxy group, $C_1$-$C_4$ saturated hydrocarbylsulfonyloxy group, fluorine, chlorine, bromine, amino, nitro, cyano, —$N(R^{1A})(R^{1B})$, —$N(R^{1C})$—C(═O)—$R^{1D}$, —$N(R^{1C})$—C(═O)—O—$R^{1D}$, or —$N(R^{1C})$—S(═O)$_2$—$R^{1D}$, wherein $R^{1A}$ is a $C_1$-$C_6$ saturated hydrocarbyl group, $R^{1B}$ is hydrogen or a $C_1$-$C_6$ saturated hydrocarbyl group, $R^{1C}$ is hydrogen or a $C_1$-$C_6$ saturated hydrocarbyl group, $R^{1D}$ is a $C_1$-$C_8$ aliphatic hydrocarbyl group or $C_6$-$C_{10}$ aryl group, the saturated hydrocarbyl group, saturated hydrocarbyloxy group, saturated hydrocarbylcarbonyloxy group, saturated hydrocarbylsulfonyloxy group, and aliphatic hydrocarbyl group may have some or all of the hydrogen atoms substituted by halogen and may have an ether bond or ester bond intervening in a carbon-carbon bond, and the aryl group may have some or all of the hydrogen atoms substituted by halogen or hydroxy, $R^2$ is a single bond or $C_1$-$C_6$ saturated hydrocarbylene group, $R^3$ is nitro, halogen, a $C_1$-$C_{10}$ aliphatic hydrocarbyl group, or $C_1$-$C_{10}$ aliphatic hydrocarbyloxy group, in case of n=2, 3 or 4, two $R^3$ may bond together to form a ring with the carbon atoms to which they are attached, and $R^4$ is hydrogen or a $C_1$-$C_4$ alkyl group.

2. The positive resist composition of claim 1 further comprising a base polymer.

3. The positive resist composition of claim 2 wherein the base polymer comprises repeat units having a carboxy group whose hydrogen is substituted by an acid labile group and/or repeat units having a phenolic hydroxy group whose hydrogen is substituted by an acid labile group.

4. The positive resist composition of claim 3 wherein the repeat units having a carboxy group whose hydrogen is substituted by an acid labile group have the formula (a1) and the repeat units having a phenolic hydroxy group whose hydrogen is substituted by an acid labile group has the formula (a2):

(a1)

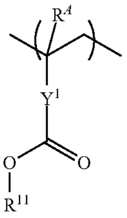

(a2)

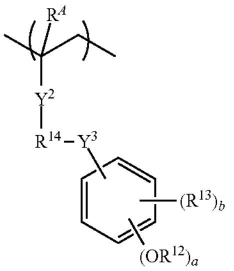

wherein $R^A$ is each independently hydrogen or methyl, $Y^1$ is a single bond, phenylene group, naphthylene group or a $C_1$-$C_{12}$ linking group containing at least one moiety selected from an ether bond, ester bond, and lactone ring, $Y^2$ is a single bond, ester bond or amide bond, $Y^3$ is a single bond, ether bond or ester bond, $R^{11}$ and $R^{12}$ are each independently an acid labile group, $R^{13}$ is fluorine, trifluoromethyl, cyano or a $C_1$-$C_6$ saturated hydrocarbyl group, $R^{14}$ is a single bond or a $C_1$-$C_6$ saturated hydrocarbylene group in which some —$CH_2$— may be replaced by an ether bond or ester bond, a is 1 or 2, b is an integer of 0 to 4, and a+b is from 1 to 5.

5. The positive resist composition of claim 2 wherein the base polymer further comprises repeat units (b) containing an adhesive group selected from hydroxy, carboxy, lactone ring, carbonate bond, thiocarbonate bond, carbonyl, cyclic acetal, ether bond, ester bond, sulfonic ester bond, cyano, amide bond, —O—C(═O)—S—, and —O—C(═O)—N(H)—.

6. The positive resist composition of claim 2 wherein the base polymer further comprises repeat units having any one of the formulae (c1) to (c3):

(c1)

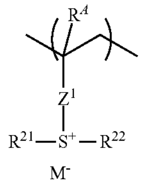

(c2)

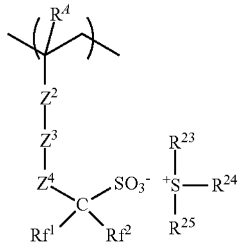

(c3)

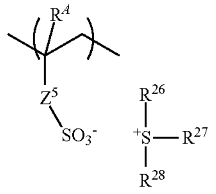

wherein $R^A$ is each independently hydrogen or methyl, $Z^1$ is a single bond, phenylene group, naphthylene group, —O—$Z^{11}$—, —C(═O)—O—$Z^{11}$—, or —C(═O)—N(H)—$Z^{11}$—, $Z^{11}$ is a $C_1$-$C_6$ aliphatic hydrocarbylene group, phenylene group, naphthylene group, or a $C_7$-$C_{18}$ group obtained by combining the foregoing, which may contain a carbonyl moiety, ester bond, ether bond or hydroxy moiety, $Z^2$ is a single bond or ester bond, $Z^3$ is a single bond, —$Z^{31}$—C(═O)—O—, —$Z^{31}$—O—, or —$Z^{31}$—O—C(═O)—, $Z^{31}$ is a $C_1$-$C_{12}$ aliphatic hydrocarbylene group, phenylene group or a $C_7$-$C_{18}$ group obtained by combining the foregoing, which may contain a carbonyl moiety, ester bond, ether bond, iodine or bromine, $Z^4$ is a single bond, methylene, or 2,2,2-trifluoro-1,1-ethanediyl, $Z^5$ is a single bond, methylene, ethylene, phenylene, fluorinated phenylene, trifluoromethyl-substituted phenylene group, —O—$Z^{51}$—, —C(═O)—O—$Z^{51}$— or —C(═O)—N(H)—$Z^{51}$—, $Z^{51}$ is a $C_1$-$C_6$ aliphatic hydrocarbylene group, phenylene group, fluorinated phenylene group, trifluoromethyl-substituted phenylene group, or a $C_7$-$C_{18}$ group obtained by combining the foregoing, which may contain a carbonyl moiety, ester bond, ether bond or hydroxy moiety, $Rf^1$ and $Rf^2$ are each independently hydrogen, fluorine or trifluoromethyl, at least one of $Rf^1$ and $Rf^2$ being fluorine, $R^{21}$ to $R^{28}$ are each independently fluorine, chlorine, bromine, iodine or a $C_1$-$C_{20}$ hydrocarbyl group which may contain a heteroatom, a pair of $R^{23}$ and $R^{24}$ or $R^{26}$ and $R^{27}$ may bond together to form a ring with the sulfur atom to which they are attached, and $M^-$ is a non-nucleophilic counter ion.

7. The positive resist composition of claim 1 further comprising an acid generator.

8. The positive resist composition of claim 1 further comprising an organic solvent.

9. The positive resist composition of claim 1 further comprising a quencher.

10. The positive resist composition of claim 1 further comprising a surfactant.

11. A pattern forming process comprising the steps of applying the positive resist composition of claim 1 onto a substrate to form a resist film thereon, exposing the resist film to high-energy radiation, and developing the exposed resist film in a developer.

12. The process of claim 11 wherein the high-energy radiation is i-line, KrF excimer laser, ArF excimer laser, EB, or EUV of wavelength 3 to 15 nm.

* * * * *